(12) United States Patent
Das et al.

(10) Patent No.: US 10,242,968 B2
(45) Date of Patent: Mar. 26, 2019

(54) INTERCONNECT STRUCTURE AND SEMICONDUCTOR STRUCTURES FOR ASSEMBLY OF CRYOGENIC ELECTRONIC PACKAGES

(71) Applicant: Massachusetts Institute of Technology, Cambridge, MA (US)

(72) Inventors: Rabindra N. Das, Lexington, MA (US); Eric A. Dauler, Acton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/684,393

(22) Filed: Aug. 23, 2017

(65) Prior Publication Data

US 2017/0373044 A1 Dec. 28, 2017

Related U.S. Application Data

(63) Continuation-in-part of application No. 15/342,444, filed on Nov. 3, 2016, now Pat. No. 10,121,754.
(Continued)

(51) Int. Cl.
*H01L 23/00* (2006.01)
*H01L 25/065* (2006.01)
(Continued)

(52) U.S. Cl.
CPC ....... *H01L 25/0657* (2013.01); *G06N 99/002* (2013.01); *H01L 21/02063* (2013.01);
(Continued)

(58) Field of Classification Search
CPC . H01L 25/0657; H01L 23/5226; H01L 25/50; H01L 23/53209; H01L 2225/06541; H01L 2225/06513
See application file for complete search history.

(56) References Cited

U.S. PATENT DOCUMENTS

| | | |
|---|---|---|
| 4,316,200 A | 2/1982 | Ames et al. |
| 4,612,083 A | 9/1986 | Yasumoto et al. |

(Continued)

FOREIGN PATENT DOCUMENTS

| | | |
|---|---|---|
| WO | WO 2016/025451 A1 | 2/2016 |
| WO | WO 2016/025478 A1 | 2/2016 |

(Continued)

OTHER PUBLICATIONS

U.S. Appl. No. 15/342,478, filed Nov. 3, 2016, Oliver, et al.
(Continued)

*Primary Examiner* — David Vu
(74) *Attorney, Agent, or Firm* — Daly, Crowley, Mofford & Durkee, LLP

(57) ABSTRACT

A cryogenic electronic package includes at least two superconducting and/or conventional metal semiconductor structures. Each of the semiconductor structures includes a substrate and a superconducting trace. Additionally, each of the semiconductor structures includes a passivation layer and one or more under bump metal (UBM) structures. The cryogenic electronic package also includes one or more superconducting and/or conventional metal interconnect structures disposed between selected ones of the at least two superconducting semiconductor structures. The interconnect structures are electrically coupled to respective ones of the UBM structures of the semiconductor structures to form one or more electrical connections between the semiconductor structures. A method of fabricating a cryogenic electronic package is also provided.

22 Claims, 33 Drawing Sheets

Related U.S. Application Data

(60) Provisional application No. 62/406,510, filed on Oct. 11, 2016, provisional application No. 62/251,248, filed on Nov. 5, 2015.

(51) Int. Cl.
| | |
|---|---|
| *H01L 25/00* | (2006.01) |
| *H01L 23/532* | (2006.01) |
| *H01L 23/522* | (2006.01) |
| *G06N 99/00* | (2010.01) |
| *H01L 21/02* | (2006.01) |
| *H01L 21/66* | (2006.01) |
| *H01L 27/18* | (2006.01) |

(52) U.S. Cl.
CPC .. *H01L 21/02282* (2013.01); *H01L 21/02345* (2013.01); *H01L 22/26* (2013.01); *H01L 23/5226* (2013.01); *H01L 23/53209* (2013.01); *H01L 24/05* (2013.01); *H01L 24/13* (2013.01); *H01L 25/50* (2013.01); *H01L 24/11* (2013.01); *H01L 24/81* (2013.01); *H01L 25/0652* (2013.01); *H01L 25/0655* (2013.01); *H01L 27/18* (2013.01); *H01L 2224/0401* (2013.01); *H01L 2224/04042* (2013.01); *H01L 2224/0558* (2013.01); *H01L 2224/05111* (2013.01); *H01L 2224/05116* (2013.01); *H01L 2224/05169* (2013.01); *H01L 2224/05609* (2013.01); *H01L 2224/05644* (2013.01); *H01L 2224/06181* (2013.01); *H01L 2224/08503* (2013.01); *H01L 2224/10126* (2013.01); *H01L 2224/10145* (2013.01); *H01L 2224/11001* (2013.01); *H01L 2224/11005* (2013.01); *H01L 2224/117* (2013.01); *H01L 2224/1111* (2013.01); *H01L 2224/1147* (2013.01); *H01L 2224/11462* (2013.01); *H01L 2224/11472* (2013.01); *H01L 2224/11474* (2013.01); *H01L 2224/11902* (2013.01); *H01L 2224/13023* (2013.01); *H01L 2224/13082* (2013.01); *H01L 2224/13109* (2013.01); *H01L 2224/16013* (2013.01); *H01L 2224/16145* (2013.01); *H01L 2224/16146* (2013.01); *H01L 2224/16148* (2013.01); *H01L 2224/17181* (2013.01); *H01L 2224/32145* (2013.01); *H01L 2224/48091* (2013.01); *H01L 2224/48137* (2013.01); *H01L 2224/48227* (2013.01); *H01L 2224/73204* (2013.01); *H01L 2224/73207* (2013.01); *H01L 2224/80896* (2013.01); *H01L 2224/8181* (2013.01); *H01L 2224/81815* (2013.01); *H01L 2224/92125* (2013.01); *H01L 2225/0651* (2013.01); *H01L 2225/06513* (2013.01); *H01L 2225/06517* (2013.01); *H01L 2225/06531* (2013.01); *H01L 2225/06541* (2013.01); *H01L 2225/06568* (2013.01); *H01L 2225/06572* (2013.01)

(56) References Cited

U.S. PATENT DOCUMENTS

| | | | |
|---|---|---|---|
| 5,057,877 | A | 10/1991 | Briley et al. |
| 5,156,997 | A | 10/1992 | Kumar et al. |
| 5,179,070 | A | 1/1993 | Harada et al. |
| 5,371,328 | A | 12/1994 | Gutierrez et al. |
| 5,650,353 | A | 7/1997 | Yoshizawa et al. |
| 5,773,875 | A | 6/1998 | Chan |
| 6,108,214 | A | 8/2000 | Fuse |
| 6,297,551 | B1 | 10/2001 | Dudderar et al. |
| 6,324,755 | B1 | 12/2001 | Borkowski et al. |
| 6,346,469 | B1 | 2/2002 | Greer |
| 6,355,501 | B1 | 3/2002 | Fung et al. |
| 6,396,371 | B2 | 5/2002 | Streeter et al. |
| 6,436,740 | B1 | 8/2002 | Jen et al. |
| 6,485,565 | B1 | 11/2002 | Springer |
| 6,678,167 | B1 | 1/2004 | Degani et al. |
| 6,819,000 | B2 | 11/2004 | Magerlein et al. |
| 6,825,534 | B2 | 11/2004 | Chen et al. |
| 6,838,774 | B2 | 1/2005 | Patti |
| 7,427,803 | B2 | 9/2008 | Chao et al. |
| 7,589,390 | B2 | 9/2009 | Yao |
| 7,624,088 | B2 | 11/2009 | Johnson et al. |
| 7,932,515 | B2 | 4/2011 | Bunyk |
| 7,939,926 | B2 | 5/2011 | Kaskoun et al. |
| 7,993,971 | B2 * | 8/2011 | Chatterjee ............... H01L 24/11 257/778 |
| 8,202,785 | B2 | 6/2012 | Castex et al. |
| 8,354,746 | B2 | 1/2013 | Huang et al. |
| 8,466,036 | B2 | 6/2013 | Brindle et al. |
| 8,487,444 | B2 | 7/2013 | Law et al. |
| 8,492,911 | B2 | 7/2013 | Bachman et al. |
| 8,519,543 | B1 | 8/2013 | Song et al. |
| 8,546,188 | B2 | 10/2013 | Liu et al. |
| 8,564,955 | B2 | 10/2013 | Schmidt et al. |
| 8,736,068 | B2 | 5/2014 | Bartley et al. |
| 8,754,321 | B2 | 6/2014 | Schroeder et al. |
| 8,828,860 | B2 | 9/2014 | Gruber et al. |
| 8,928,128 | B2 | 1/2015 | Karikalan et al. |
| 8,954,125 | B2 | 2/2015 | Gonzalez et al. |
| 9,076,658 | B1 | 7/2015 | Brown et al. |
| 9,171,792 | B2 | 10/2015 | Sun et al. |
| 2001/0016383 | A1 | 8/2001 | Chen et al. |
| 2002/0094661 | A1 | 7/2002 | Enquist et al. |
| 2003/0067073 | A1 | 4/2003 | Akram et al. |
| 2004/0124538 | A1 | 7/2004 | Reif et al. |
| 2004/0188845 | A1 | 9/2004 | Iguchi et al. |
| 2006/0191640 | A1 | 8/2006 | Johnson |
| 2007/0087544 | A1 | 4/2007 | Chang et al. |
| 2007/0119812 | A1 | 5/2007 | Kerdiles et al. |
| 2007/0207592 | A1 | 9/2007 | Lu et al. |
| 2008/0093747 | A1 | 4/2008 | Enquist et al. |
| 2008/0122115 | A1 | 5/2008 | Popa et al. |
| 2008/0169559 | A1 | 7/2008 | Yang |
| 2008/0230916 | A1 | 9/2008 | Saito et al. |
| 2008/0290790 | A1 | 11/2008 | Jin |
| 2008/0316714 | A1 | 12/2008 | Eichelberger et al. |
| 2009/0078966 | A1 | 3/2009 | Asai et al. |
| 2009/0173936 | A1 | 7/2009 | Bunyk |
| 2009/0186446 | A1 | 7/2009 | Kwon et al. |
| 2009/0233436 | A1 | 9/2009 | Kim et al. |
| 2010/0001399 | A1 | 1/2010 | Topacio |
| 2010/0026447 | A1 | 2/2010 | Keefe et al. |
| 2010/0122762 | A1 | 5/2010 | George |
| 2010/0130016 | A1 | 5/2010 | DeVilliers |
| 2010/0148371 | A1 | 6/2010 | Kaskoun et al. |
| 2010/0171093 | A1 | 7/2010 | Kabir |
| 2011/0049675 | A1 | 3/2011 | Nagai et al. |
| 2011/0140271 | A1 | 6/2011 | Daubenspeck et al. |
| 2011/0189820 | A1 | 8/2011 | Sasaki et al. |
| 2011/0204505 | A1 | 8/2011 | Pagaila et al. |
| 2011/0237069 | A1 | 9/2011 | Miyazaki |
| 2011/0248396 | A1 | 10/2011 | Liu et al. |
| 2012/0032340 | A1 | 2/2012 | Choi et al. |
| 2012/0074585 | A1 | 3/2012 | Koo et al. |
| 2012/0217642 | A1 | 8/2012 | Sun et al. |
| 2012/0228011 | A1 | 9/2012 | Chang et al. |
| 2012/0231621 | A1 | 9/2012 | Chang et al. |
| 2012/0252189 | A1 | 10/2012 | Sadaka et al. |
| 2012/0292602 | A1 | 11/2012 | Guo et al. |
| 2013/0029848 | A1 | 1/2013 | Gonzalez et al. |
| 2013/0093104 | A1 | 4/2013 | Wu et al. |
| 2013/0099235 | A1 | 4/2013 | Han |
| 2013/0147036 | A1 | 6/2013 | Choi et al. |
| 2013/0153888 | A1 | 6/2013 | Inoue et al. |
| 2013/0187265 | A1 | 7/2013 | Shih et al. |
| 2013/0244417 | A1 | 9/2013 | Markunas et al. |
| 2014/0001604 | A1 | 1/2014 | Sadaka |
| 2014/0065771 | A1 | 3/2014 | Gruber et al. |
| 2014/0113828 | A1 | 4/2014 | Gilbert et al. |
| 2014/0246763 | A1 | 9/2014 | Bunyk |

(56) References Cited

U.S. PATENT DOCUMENTS

| | | |
|---|---|---|
| 2014/0264890 A1 | 9/2014 | Breuer et al. |
| 2015/0041977 A1 | 2/2015 | Daubenspeck et al. |
| 2015/0054151 A1 | 2/2015 | Choi et al. |
| 2015/0054167 A1 | 2/2015 | Pendse |
| 2015/0054175 A1 | 2/2015 | Meinhold et al. |
| 2015/0348874 A1 | 12/2015 | Tsai et al. |
| 2016/0364653 A1 | 12/2016 | Chow et al. |
| 2017/0040296 A1 | 2/2017 | Das et al. |
| 2017/0092621 A1 | 3/2017 | Das et al. |
| 2017/0098627 A1 | 4/2017 | Das et al. |
| 2017/0133336 A1 | 5/2017 | Oliver et al. |
| 2017/0162507 A1 | 6/2017 | Das et al. |
| 2017/0162550 A1 | 6/2017 | Das et al. |
| 2017/0194248 A1 | 7/2017 | Das |
| 2017/0200700 A1 | 7/2017 | Das et al. |

FOREIGN PATENT DOCUMENTS

| | | | |
|---|---|---|---|
| WO | WO 2016/073049 | A1 | 5/2016 |
| WO | WO 2017/015432 | A1 | 1/2017 |
| WO | WO 2017/079394 | A1 | 5/2017 |
| WO | WO 2017/079417 | A1 | 5/2017 |
| WO | WO 2017/079424 | A1 | 5/2017 |
| WO | WO 2017/131831 | A2 | 8/2017 |

OTHER PUBLICATIONS

U.S. Appl. No. 15/342,517, filed Nov. 3, 2016, Oliver, et al.
U.S. Appl. No. 15/342,589, filed Nov. 3, 2016, Oliver, et al.
Burns, et al.; "3D Circuit Integration Technology for Multiproject Fabrication;" MIT Lincoln Laboratory Presentation; Apr. 7, 2000; 15 pages.
Courtland; "Google Aims for Quantum Computing Supremacy;" Spectrum.IEEE.Org; North America; Jun. 2017; 2 pages.
Ohya, et al.; "Room Temperature Deposition of Sputtered TiN Films for Superconducting Coplanar Waveguide Resonators;" IOP Publishing—Superconductor Science and Technology; vol. 27; Mar. 26, 2014; 10 pages.
Tarniowy, et al.; "The Effect of Thermal Treatment on the Structure, Optical and Electrical Properties of Amorphous Titanium Nitride Thin Films;" Thin Solid Films 311; 1997; 8 pages.
Notice of Allowance for U.S. Appl. No. 15/327,235 dated Jun. 30, 2017; 17 pages.
PCT Search Report of the ISA for PCT Appl. No. PCT/US2015/044608 dated Dec. 31, 2015; 5 pages.
PCT Written Opinion of the ISA for PCT Appl. No. PCT/US2015/044608 dated Dec. 31, 2015; 7 pages.
International Preliminary Report dated Feb. 23, 2017 for PCT Application No. PCT/US2015/044608; 9 pages.
PCT Search Report of the ISA for PCT Appl. No. PCT/US2015/044679 dated Apr. 13, 2016; 3 pages.
PCT Written Opinion of the ISA for PCT Appl. No. PCT/US2015/044679 dated Apr. 13, 2016; 7 pages.
International Preliminary Report dated Feb. 23, 2017 for PCT Application No. PCT/US2015/044679; 9 pages.
Restriction Requirement dated May 16, 2017 for U.S. Appl. No. 15/327,249; 6 pages.
Response to Restriction Requirement dated May 16, 2017 for U.S. Appl. No. 15/327,249, filed Jun. 27, 2017; 1 page.
PCT Search Report of the ISA for PCT Appl. No. PCT/US2015/044651 dated Nov. 4, 2015; 3 pages.
PCT Written Opinion of the ISA for PCT Appl. No. PCT/US2015/044651 dated Nov. 4, 2015; 12 pages.
International Preliminary Report dated Feb. 23, 2017 for PCT Application No. PCT/US2015/044651; 10 pages.
Restriction Requirement dated Jun. 8, 2017 for U.S. Appl. No. 15/271,755; 1 page.
Response to Restriction Requirement dated Jun. 8, 2017 for U.S. Appl. No. 15/271,755, filed Jun. 19, 2017; 1 page.
Office Action dated Jul. 7, 2017 for U.S. Appl. No. 15/271,755; 26 pages.
PCT Search Report of the ISA for PCT/US2016/052824 dated Feb. 3, 2017; 6 pages.
PCT Written Opinion of the ISA for PCT/US2016/052824 dated Feb. 3, 2017; 6 pages.
Office Action dated Mar. 3, 2017 for U.S. Appl. No. 14/694,540; 16 pages.
Response to Office Action dated Mar. 3, 2017 for U.S. Appl. No. 14/694,540, filed Jun. 1, 2017; 24 pages.
Notice of Allowance for U.S. Appl. No. 14/694,540 dated Jul. 31, 2017; 9 pages.
Office Action dated Mar. 24, 2017 for U.S. Appl. No. 15/303,800; 39 pages.
Response to Office Action dated Mar. 24, 2017 for U.S. Appl. No. 15/303,800, filed Jun. 26, 2017; 22 pages.
PCT Search Report of the ISA for PCT Appl. No. PCT/US2015/059181 dated Sep. 7, 2016; 5 pages.
PCT Written Opinion of the ISA for PCT Appl. No. PCT/US2015/059181 dated Sep. 7, 2016; 12 pages.
PCT International Preliminary Report on Patentability dated May 18, 2017 for PCT Appl. No. PCT/US2015/059181; 11 pages.
Notice of Allowance for U.S. Appl. No. 15/312,063 dated Aug. 2, 2017; 17 pages.
PCT Search Report of the ISA for PCT Appl. No. PCT/US2015/059200 dated Jul. 21, 2016; 3 pages.
PCT Written Opinion of the ISA for PCT Appl. No. PCT/US2015/059200 dated Jul. 21, 2016; 13 pages.
PCT International Preliminary Report on Patentability dated May 18, 2017 for PCT Appl. No. PCT/US2015/059200; 11 pages.
PCT Search Report of the ISA for PCT/US2016/043266 dated Dec. 5, 2016; 5 pages.
PCT Written Opinion of the ISA for PCT/US2016/043266 dated Dec. 5, 2016; 9 pages.
PCT Search Report of the ISA for PCT/US2016/060296 dated Mar. 10, 2017; 5 pages.
PCT Written Opinion of the ISA for PCT/US2016/060296 dated Mar. 10, 2017; 5 pages.
PCT Search Report of the ISA for PCT Appl. No. PCT/US2016/060343 dated Jul. 18, 2017; 3 pages.
PCT Written Opinion of the ISA for PCT Appl. No. PCT/US2016/060343 dated Jul. 18, 2017; 12 pages.
Restriction Requirement dated Apr. 28, 2017 for U.S. Appl. No. 15/342,444; 9 pages.
Response to Restriction Requirement and Preliminary Amendment dated Apr. 28, 2017 for U.S. Appl. No. 15/342,444, filed May 19, 2017; 6 pages.
PCT Search Report of the ISA for PCT Appl. No. PCT/US2016/060263 dated Jan. 10, 2017; 3 pages.
PCT Written Opinion of the ISA for PCT Appl. No. PCT/US2016/060263 dated Jan. 10, 2017; 6 pages.
PCT Search Report of the ISA for PCT/US2016/060309 dated Mar. 24, 2017; 6 pages.
PCT Written Opinion of the ISA for PCT/US2016/060309 dated Mar. 24, 2017; 10 pages.
U.S. Appl. No. 15/684,269, filed Aug. 23, 2017, Das, et al.
U.S. Appl. No. 15/684,337, filed Aug. 23, 2017, Das, et al.
Notice of Allowance dated Oct. 12, 2017 for U.S. Appl. No. 15/303,800; 16 pages.
Restriction Requirement for U.S. Appl. No. 15/271,755 dated Jun. 8, 2017; 6 pages.
Response to Jul. 7, 2017 Office Action for U.S. Appl. No. 15/271,755, filed Oct. 10, 2017; 33 pages.
Office Action dated Aug. 11, 2017 for U.S. Appl. No. 15/342,444; 22 pages.
Response to Aug. 11, 2017 Office Action for U.S. Appl. No. 15/342,444, filed Sep. 15, 2017; 20 pages.
U.S. Appl. No. 15/745,914, filed Jan. 18, 2018, Oliver, et al.
Office Action dated Jan. 11, 2018 for U.S. Appl. No. 15/327,239; 33 pages.
PCT International Preliminary Report on Patentability dated Feb. 1, 2018 for PCT Appl. No. PCT/US2016/043266; 11 pages.

(56) References Cited

OTHER PUBLICATIONS

Response to Final Office Action dated Dec. 6, 2017 for U.S. Appl. No. 15/342,444; Response filed Mar. 2, 2018; 16 pages.
Response to Restriction Requirement dated Oct. 23, 2017 for U.S. Appl. No. 15/342,517, filed Dec. 22, 2017; 1 pages.
Restriction Requirement dated Jan. 3, 2018 for U.S. Appl. No. 15/342,478; 6 pages.
Response to Restriction Requirement dated Jan. 3, 2018 for U.S. Appl. No. 15/342,478, filed Mar. 2, 2018; 6 pages.
Advisory Action dated Mar. 20, 2018 for U.S. Appl. No. 15/342,444; 3 pages.
U.S. Non-Final Office Action dated Mar. 21, 2018 for U.S. Appl. No. 15/342,589; 25 pages.
Office Action dated Oct. 20, 2017 for U.S. Appl. No. 15/327,249; 30 pages.
Final Office Action dated Dec. 6, 2017 for U.S. Appl. No. 15/342,444; 18 pages.
Final Office Action dated Dec. 20, 2017 for U.S. Appl. No. 15/271,755; 25 pages.
Restriction Requirement dated Oct. 23, 2017 for U.S. Appl. No. 15/342,517; 6 pages.
U.S. Non-Final Office Action dated Apr. 23, 2018 for U.S. Appl. No. 15/342,478; 11 Pages.
U.S. Non-Final Office Action dated Apr. 19, 2018 for U.S. Appl. No. 15/342,517; 8 Pages.
Response to U.S. Non-Final Office Action dated Jan. 11, 2018 for U.S. Appl. No. 15/327,239; Response filed Apr. 9, 2018; 25 Pages.
Response to U.S. Non-Final Office Action dated Oct. 20, 2017 for U.S. Appl. No. 15/327,249; Response filed Apr. 19, 2018; 19 Pages.
Response to U.S. Final Office Action dated Dec. 20, 2017 for U.S. Appl. No. 15/271,755; Response filed Apr. 23, 2018; 23 Pages.
U.S. Final Office Action dated May 9, 2018 for U.S. Appl. No. 15/327,239; 25 Pages.
Response to U.S. Final Office Action dated Dec. 6, 2017 for U.S. Appl. No. 15/342,444; Response filed May 4, 2018; 18 Pages.
PCT International Preliminary Report dated May 17, 2018 for International Application No. PCT/US2016/060296; 7 Pages.
PCT International Preliminary Report dated May 17, 2018 for International Application No. PCT/US2016/060343; 9 Pages.
PCT International Preliminary Report dated May 17, 2018 for International Application No. PCT/US2016/060263; 8 Pages.
PCT International Preliminary Report dated May 17, 2018 for International Application No. PCT/US2016/060309; 8 Pages.
Response to Non-Final Office Action dated Apr. 23, 2018 for U.S. Appl. No. 15/342,478, filed Aug. 23, 2018; 18 Pages.
Notice of Allowance dated Jul. 9, 2018 for U.S. Appl. No. 15/327,249; 15 Pages.
Notice of Allowance dated Jul. 18, 2018 for U.S. Appl. No. 15/342,444; 11 Pages.
Office Action dated Aug. 9, 2018 for U.S. Appl. No. 15/271,755; 29 Pages.
Response to Office Action dated Apr. 19, 2018 for U.S. Appl. No. 15/342,517, filed Jul. 17, 2018; 14 Pages.

* cited by examiner

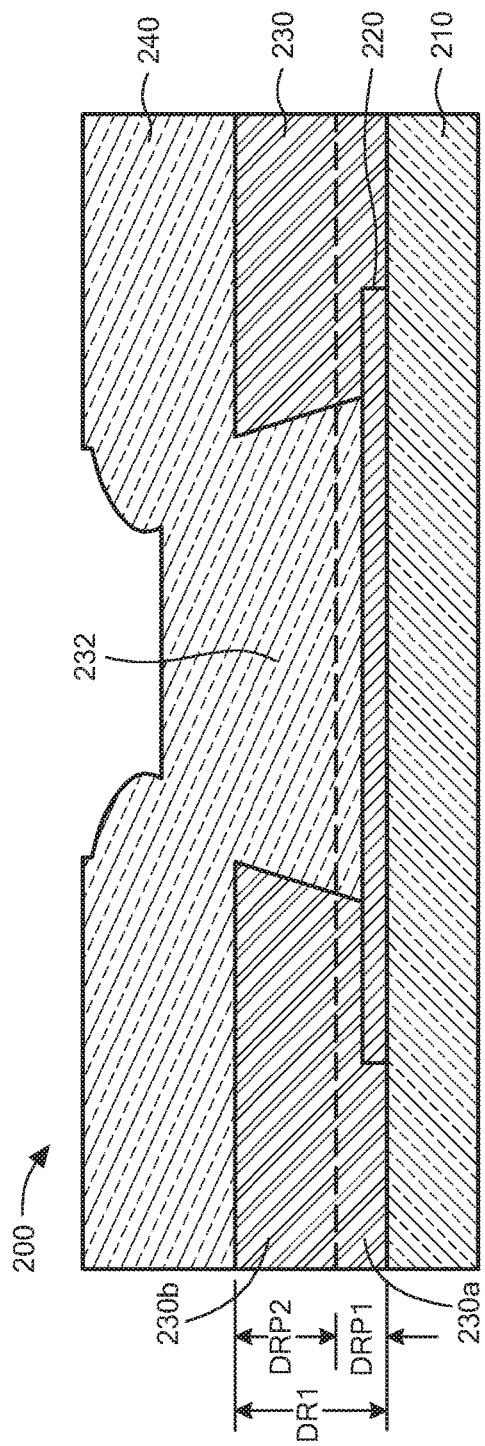
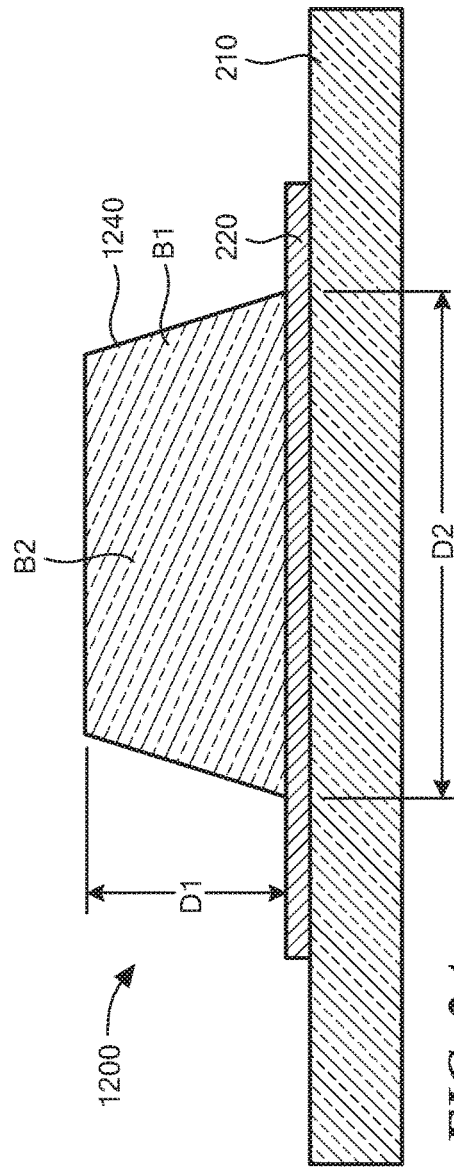
FIG. 2
FIG. 2A

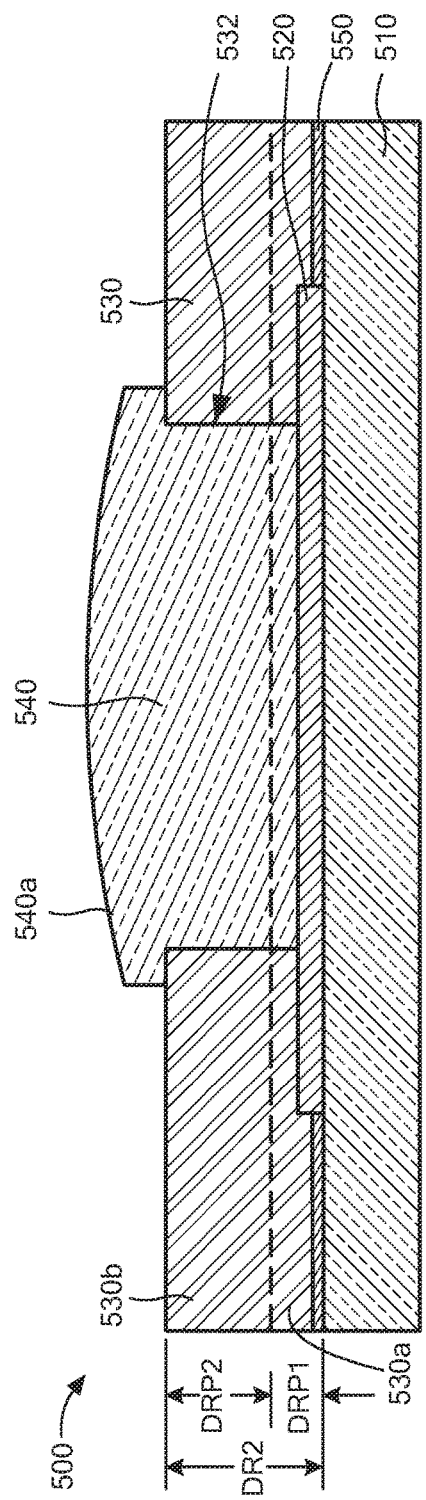
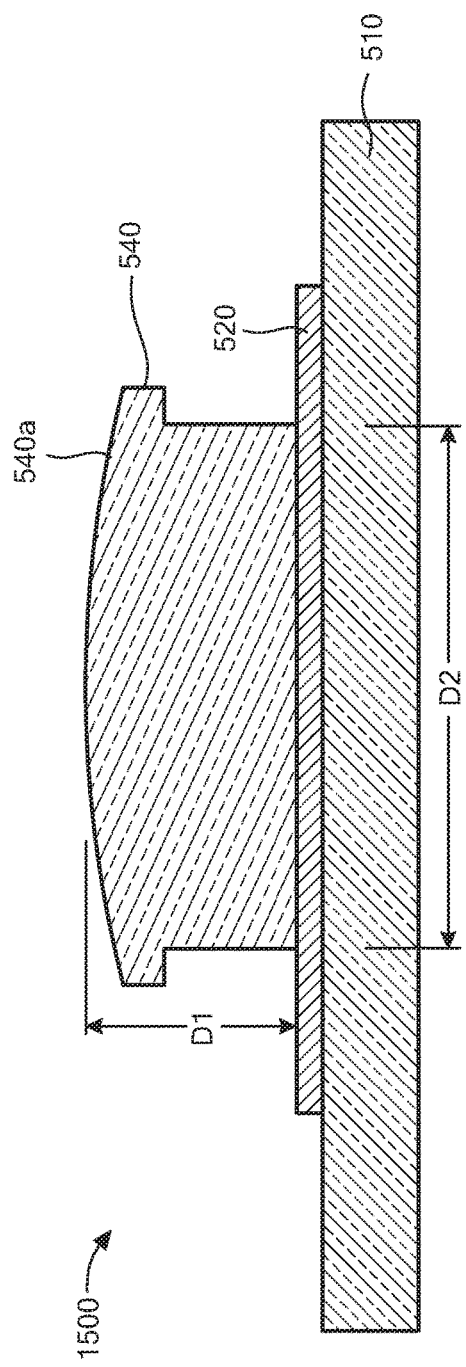
FIG. 5
FIG. 5A

INTERCONNECT STRUCTURE AND SEMICONDUCTOR STRUCTURES FOR ASSEMBLY OF CRYOGENIC ELECTRONIC PACKAGES

CROSS REFERENCE TO RELATED APPLICATIONS

This application is a continuation-in-part application of U.S. Utility application Ser. No. 15/342,444, filed on Nov. 3, 2016, which application claims the benefit of and priority to U.S. Provisional Application No. 62/251,248 filed on Nov. 5, 2015 under 35 U.S.C. § 119(e), which applications are hereby incorporated herein by reference in their entirety. This application also claims the benefit of U.S. Provisional Application No. 62/406,510 filed on Oct. 11, 2016 under 35 U.S.C. § 119(e) which application is hereby incorporated herein by reference in its entirety.

GOVERNMENT RIGHTS

This invention was made with Government support under Contract No. FA8721-05-C-0002 awarded by the U.S. Air Force. The Government has certain rights in the invention.

FIELD

This disclosure relates generally to cryogenic electronic packages, and more particularly, to interconnect structures and semiconductor structures for assembly of cryogenic electronic packages.

BACKGROUND

As is known, there is trend toward miniaturization of electronic products such as mobile phones, tablets, digital cameras, and the like. There is also a demand for development of electronic products which have an increased number of functionalities and have increased electronic capabilities (e.g., increased speed, memory, and operational life). These trends have resulted in a demand for integrated circuits which enable these and other increased capabilities (e.g., increased density, computing power and extended operational life). As is known, integrated circuits may be fabricated using a variety of technologies, including complementary metal-oxide-semiconductor (CMOS) technology.

As CMOS technology reaches the end of Moore's Law scaling and power consumption of integrated circuits fabricated using such technology continues to increase, there is a need to develop "beyond-CMOS" device technologies (e.g., to achieve high-performance exascale computing). As is known, CMOS technology may be used in fabricating processors, for example, and processors are often constructed on a chip using integrated circuit techniques. As is also known, CMOS processors are typically used logic elements in current high performance computing applications. As is additionally known, a significant amount of the power consumption of the CMOS processors is due to moving information between logic elements (e.g., CMOS processors) rather than actual logic operations performed by the processors.

As is known, superconducting technology and superconducting semiconductor structures (e.g., integrated circuits) fabricated using such technology are a leading candidate technology for high performance computing applications (e.g., due to the energy efficiency of superconducting technology). Although many studies have been conducted on superconducting semiconductor structures and their use in high performance computing applications, a major technical challenge is integrating the superconducting semiconductor structures and other components of high performance computing circuits into a cryogenic chamber. This is typically due to the large number of individual chips and associated hardware often required to build high performance computing circuits, and limited cryogenic space of the cryogenic chamber used to cool or refrigerate the circuits.

SUMMARY

Described herein are concepts, systems, circuits and techniques related to interconnect structures and semiconductor structures for assembly of cryogenic electronic packages. The described interconnect structures and semiconductor structures may provide for assembly of cryogenic electronic packages having increased critical current capabilities compared to conventional cryogenic electronic circuits and packages. Additionally, the described interconnect structures and semiconductor structures may provide for assembly of cryogenic electronic packages having a maximum number of superconducting semiconductor structures in a given space (e.g., a cryogenic space in a cryogenic chamber). The foregoing provides for the ability to design circuitry (e.g., high performance computing circuitry) to fit in a given cryogenic space (e.g., a conventional cryogenic space), rather than adjusting or designing the space (e.g., cryogenic space) to fit the circuitry.

In one aspect of the concepts described herein, a cryogenic electronic package includes at least two superconducting and/or conventional (non-superconducting) metal semiconductor structures (e.g., superconducting integrated circuits (ICs) or devices). Each of the semiconductor structures includes a substrate (e.g., a superconducting substrate) having first and second opposing surfaces. Additionally, each of the semiconductor structures includes a superconducting trace or interconnect pad having first and second opposing surfaces. The first surface of the superconducting trace is disposed over the second surface of the substrate. Each of the semiconductor structures also includes a passivation layer having first and second opposing surfaces and one or more openings formed in selected portions of the passivation layer. The first surface of the passivation layer is disposed over the second surface of the superconducting trace. Additionally, the passivation layer openings extend from the second surface of the passivation layer to the second surface of the superconducting trace over which the first surface of the passivation layer is disposed.

Each of the semiconductor structures additionally includes one or more under bump metal (UBM) structures disposed in respective ones of the passivation layer openings. The UBM structures are electrically coupled to the second surface of the superconducting trace. Additionally, the UBM structures have a surface disposed over selected portions of the second surface of the passivation layer surrounding edges of the passivation layer openings.

The cryogenic electronic package also includes one or more superconducting and/or conventional metal interconnect structures disposed between selected ones of the at least two superconducting semiconductor structures. The interconnect structures are electrically coupled to respective ones of the UBM structures of the semiconductor structures to form one or more electrical connections between the semiconductor structures.

A first respective one of the electrical connections formed between a first one of the semiconductor structures and a second one of the semiconductor structures of the cryogenic electronic package includes: the superconducting trace of the first one of the semiconductor structures, a first one of the UBM structures of the first one of the semiconductor structures, a second one of the UBM structures of the second one of the semiconductor structures, the superconducting trace of the second one of the semiconductor structures, and a first respective one of the interconnect structures coupled to the first and second ones of the UBM structures.

A contact area between the interconnect structures and the respective ones of the UBM structures of the semiconductor structures to which the interconnect structures are coupled is larger than a width of the semiconductor trace of the semiconductor structures such that the interconnect structures maintain a substantially same critical current capability as the superconducting trace.

The cryogenic electronic package may include one or more of the following features individually or in combination with other features. The UBM structures of the cryogenic electronic packages may include a first pad portion having a surface disposed over the second surface of the superconducting trace. Additionally, the UBM structures may include one or more second pad portions having a surface disposed over the selected portions of the second surface of the passivation layer. Further, the UBM structures may include one or more pad interconnects extending from the first pad portion to the second pad portions.

The UBM structures of the cryogenic electronic package may have openings shaped to receive the interconnect structures. The openings may extend between the first and second pad portions of the UBM structures. The interconnect structures may be received in the UBM structure openings. The UBM structure openings may have a first associated diameter, and the interconnect structures may have a second associated diameter that is substantially less than the first diameter.

The semiconductor structures may include an interconnect pad disposed between the second surface of the substrate and the first surface of the superconducting trace. The interconnect pad may have first and second opposing surfaces. The first surface of the interconnect pad may be disposed proximate to the second surface of the substrate. Additionally, the second surface of the interconnect pad may be disposed proximate to the first surface of the superconducting trace. The first pad portion of the UBM structure may have first and second opposing surfaces. The first surface of the first pad portion may correspond to the surface of the first pad portion disposed over the second surface of the superconducting trace. The first and second surfaces of the interconnect pad may each have a first associated diameter. Additionally, the first and second surfaces of the first pad portion may each have a second associated diameter that is substantially less than the first diameter. The interconnect pad may include a superconducting and/or a partially superconducting material.

The interconnect structures may be disposed over and coupled to first selected ones of the UBM structures of the selected ones of the semiconductor structures prior to coupling the first selected ones of the UBM structures to second selected ones of the UBM structures of the semiconductor structures to form the electrical connections. At least one of the interconnect structures may include a superconducting, partially superconducting and/or conventional metal bump.

The interconnect structures may include a first interconnect portion and a second interconnect portion. The first interconnect portion may be disposed over and coupled to first selected ones of the UBM structures of the selected ones of the semiconductor structures. The second interconnect portion may be disposed over and coupled to second selected ones of the UBM structures of the selected ones of the semiconductor structures. The first interconnect portion may have a first melting point. The second interconnect portion may have a second melting point. The interconnect structures including the first interconnect portion and the second interconnect portion may have a third melting point that is different from both the first melting point and the second melting point when the first and second interconnect portions are coupled together during coupling of the semiconductor structures. At least one of the first and second interconnect portions may include a superconducting bump.

The interconnect structures may have a substantially same critical current density as the superconducting trace of the semiconductor structures to which the UBM structures are coupled. The cryogenic electronic package may have a critical current capability based, at least in part, upon a minimum width value of the width of the superconducting trace.

The superconducting trace may have one or more first characteristics selected such that the superconducting trace has a first predetermined critical current density. The interconnect structures may have one or more second characteristics selected such that the interconnect structures have a second predetermined critical current density that is substantially similar to the first predetermined critical current density. The first characteristics may include materials and/or dimensions of the superconducting trace. The second characteristics may include materials and/or dimensions of the interconnect structures. The first and second predetermined critical current densities may include a range of critical currents and the range of critical currents is based upon at least one of the selected first and second characteristics.

The interconnect structures may have first and second opposing portions, and a distance between the first and second portions may correspond to a height of the interconnect structures. The interconnect structures may have third and fourth opposing portions that are substantially perpendicular to the first and second portions, and a distance between the third and fourth portions may correspond to a diameter, width or length of the interconnect structures.

The interconnect structures may have a first height and a first diameter prior to coupling the semiconductor structures together, and at least a second height that is less than the first height subsequent to coupling the semiconductor structures together. The first height may be less than or equal to about six micron, the first diameter may be less than or equal to about fifteen micron, and the second height may be between about two micron and about four micron. The first height may be between about eight micron and about twelve micron, the first diameter may be less than or equal to about fifteen micron, and the second height may be between about two micron and about four micron. The critical current capability of the interconnect structure may be based, at least in part, upon the second height of the interconnect structures.

The height of the interconnect structures may be selected to be greater than a predetermined threshold. The predetermined threshold may be based upon a maximum acceptable non-uniformity between the semiconductor structures to which are interconnect structures are coupled, and a predetermined misalignment tolerance of the cryogenic electronic package. The semiconductor structures may each have an associated package pitch, and the height of the interconnect structures may be selected based upon the package pitches of the semiconductor structures between which the interconnect structures are disposed.

The at least two semiconductor structures of the cryogenic electronic package may include three semiconductor structures. A selected one of the three semiconductor structures may include one or more through via structures. Each of the through via structures may include at least a through via extending from selected portions of the first surface of the substrate of the selected one of the semiconductor structures to selected portions of the second surface of the substrate. Remaining ones of the three semiconductor structures may be disposed over opposing surfaces of the selected one of the semiconductor structures and coupled to each other through an electrical connection including at least one of the through via structures of the selected one of the semiconductor structures.

The first one of the semiconductor structures may include one or more first through vias. Each of the first through vias may extend from selected portions of the first surface of the substrate of the first one of the semiconductor structures to selected portions of the second surface of the substrate of the first one of the semiconductor structures. The first through vias may include one or more conventional and/or superconducting and/or partially superconducting metals. At least one of the first through vias may be electrically coupled to the superconducting trace of the first one of the semiconductor structures.

The second one of the semiconductor structures may include one or more through via structures. Each of the through via structures may including a first trace interconnect, a second trace interconnect and a second through via. The first and second trace interconnects may each extend from selected portions of the first surface of the substrate of the second one of the semiconductor structures to selected portions of the second surface of the substrate of the second one of the semiconductor structures. The second through via may be disposed or otherwise provided in a cavity formed between the first and second trace interconnects. The first trace interconnect, the second trace interconnect and the second through via of the through via structures may each include one or more conventional and/or superconducting and/or partially superconducting metals. At least one of the through via structures may be electrically coupled to the superconducting trace of the second one of the semiconductor structures.

In another aspect of the concepts described herein, a method of fabricating a cryogenic electronic package includes providing at least two superconducting and/or conventional metal semiconductor structures. Each of the semiconductor structures includes a substrate having first and second opposing surfaces. Additionally, each of the semiconductor structures includes a superconducting trace having first and second opposing surfaces. The first surface of the superconducting trace is disposed over the second surface of the substrate. Each of the semiconductor structures also includes a passivation layer having first and second opposing surfaces and one or more openings formed in selected portions of the passivation layer. The first surface of the passivation layer is disposed over the second surface of the superconducting trace. Additionally, the passivation layer openings extend from the second surface of the passivation layer to the second surface of the superconducting trace over which the first surface of the passivation layer is disposed.

Each of the semiconductor structures also includes one or more UBM structures disposed in respective ones of the passivation layer openings. The UBM structures are electrically coupled to the second surface of the superconducting trace. Additionally, the UBM structures have a surface disposed over selected portions of the second surface of the passivation layer surrounding edges of the passivation layer openings.

The method also includes forming one or more superconducting and/or conventional metal interconnect structures on at least a first selected one of the semiconductor structures. The interconnect structures are coupled to respective ones of the UBM structures of the first selected one of the semiconductor structures.

The method further includes coupling the first selected one of the semiconductor structures to at least a second selected one of the semiconductor structures through the interconnect structures. The interconnect structures are coupled to respective ones of the UBM structures of the second selected one of the semiconductor structures. Additionally, the interconnect structures form one or more electrical connections between the first and second selected ones of the semiconductor structures.

The method may include one or more of the following features individually or in combination with other features. Forming interconnect structures on at least a first selected one of the semiconductor structures includes performing a spin resist cycle on the first selected one of the semiconductor structures. The spin resist cycle includes applying a predetermined amount of a resist material over one or more portions of the first selected one of the semiconductor structures. The spin resist cycle also includes disposing the resist material over one or more surfaces of the passivation layer and the UBM structures of the first selected one of the semiconductor structures using spin coating techniques. The spin resist cycle further includes baking the first selected one of the semiconductor structures to form a resist layer having a first surface disposed over the passivation layer and the UBM structures.

Forming interconnect structures on at least a first selected one of the semiconductor structures also includes forming one or more openings in selected portions of the resist layer. The resist layer openings are aligned with the passivation layer openings. Additionally, the resist layer openings extend from the first surface of the resist layer to a second opposing surface of the resist layer. Forming interconnect structures on at least a first selected one of the semiconductor structures additionally includes depositing a conductive material in the resist layer openings. Forming interconnect structures on at least a first selected one of the semiconductor structures further includes forming interconnect structures from the conductive material such that the interconnect structures are electrically coupled to respective ones of the UBM structures of the first selected one of the semiconductor structures.

Subsequent to forming the openings in the selected portions of the resist layer, one or more surfaces of the first selected one of the semiconductor structures may be cleaned through a plasma cleaning process. Subsequent to forming the interconnect structures, remaining portions of the resist layer may be removed from the surfaces of the passivation layer and the UBM structure. Forming interconnect structures from the conductive material may include forming interconnect structures from the conductive material using resist lift off techniques.

Forming one or more openings in selected portions of the resist layer may include forming one or more openings having a predetermined shape in selected portions of the resist layer. The resist layer openings may be aligned with the passivation layer openings of the first selected one of the semiconductor structures. Additionally, the resist layer openings may extend from the first surface of the resist layer to a second opposing surface of the resist layer. The predetermined shape of the resist layer openings may be selected based upon a shape of the interconnect structures to be formed in the openings.

Forming one or more openings in selected portions of the resist layer may include disposing a mask over the resist layer and exposing the resist layer to an exposure energy to form one or more openings in selected portions of the resist layer. The resist layer openings may be aligned with the passivation layer openings of the first selected one of the semiconductor structures. Additionally, the resist layer openings extend from the first surface of the resist layer to a second opposing surface of the resist layer. Forming the resist layer openings may also include developing the resist layer.

Coupling the first selected one of the semiconductor structures to at least a second selected one of the semiconductor structures through the interconnect structures may include coupling the first selected one of the semiconductor structures to the at least second semiconductor structures through the interconnect structures using flip chip bonding techniques. The interconnect structures may be coupled to respective ones of the UBM structures of the second selected one of the semiconductor structures. Additionally, the interconnect structures may form one or more electrical connections between the first and second selected ones of the semiconductor structures.

Forming interconnect structures on a first selected one of the semiconductor structures may include forming interconnect structures on a first selected one of the semiconductor structures such that the interconnect structures are coupled to respective ones of the UBM structures of the first selected one of the semiconductor structures. The interconnect structures may also be formed such that the interconnect structures have a substantially same critical current density as the superconducting trace of the first selected one of the semiconductor structures to which the UBM structures are coupled.

In a further aspect of the concepts described herein, a superconducting system includes at least first and second superconducting devices. Each of the first and second superconducting devices include at least one superconducting trace and at least one under bump metal (UBM) structure deposited on top of the superconducting trace. At least one of the superconducting devices includes a superconducting and/or conventional bump deposited on the UBM structure. The superconducting and/or conventional bump electrically interconnects the first and second superconducting devices through a first superconducting trace of the first superconducting device-a first UBM structure of the first superconducting device-the bump-a second UBM structure of the second superconducting device-a second superconducting trace of the second superconducting device. The superconducting and/or conventional bump substantially covers the superconducting traces and UBM structures of the first and second superconducting devices. A critical current of the superconducting system going through the first superconducting trace-the first UBM structure-the bump-the second UBM structure-the second superconducting trace is substantially determined by a minimum width of superconducting trace.

In another aspect of the concepts described herein, a superconducting system includes first and second superconducting devices. The first superconducting device includes a first superconducting trace having first and second opposing surfaces. The second superconducting device includes a second superconducting trace having first and second opposing surfaces. A passivation layer is disposed on a surface (e.g., the first surface) of the first superconducting trace and a surface (e.g., the second surface) of the second superconducting trace. An opening is formed in selected portions of the passivation layer, and extends onto portions of the surface of the first superconducting trace and onto portions of the surface of the second superconducting trace on which the passivation layer is disposed. A first under bump metal (UBM) structure is disposed in the passivation layer opening and onto the surface of the first superconducting trace. Additionally, a second UBM structure is disposed in the passivation layer opening and onto the surface of the second superconducting trace.

A conventional and/or superconducting microbump is disposed on a surface of the first UBM structure and coupled to the first superconducting trace (e.g., via the first UBM structure). The microbump is also bonded with a surface of the second UBM structure (e.g., via a coupling process) and coupled to the second superconducting trace (e.g., via the second UBM structure). The microbump substantially covers the first UBM structure and the second UBM structure and/or at least portions of the passivation layer opening in which the first UBM structure is disposed and/or at least portions of the passivation layer opening in which the second UBM structure is disposed. The microbump on the first superconducting trace of the first superconducting device is electrically interconnected with the second superconducting trace of the second superconducting device and maintains a substantially same critical current of the superconducting traces.

In one embodiment, an interconnect includes a bump (i.e., an interconnect structure) and a under bump metallurgy (UBM) where the bump reacts with at least part of the UBM at an interface to create a lower temperature melt interface. In one embodiment, the interface melts at a lower temperature than the bump and the UBM. It is also possible to create a concentration gradient at the interface which melts at a lower temperature than bump materials. In embodiments, the Interconnect includes a multiple melt composition. The interconnect interface may melt at lower temperature and a bulk of the interconnect may melt at a higher temperature than the interface. This way it is possible to create an interconnect which will have opportunity to do double assembly for rework and, if necessary, to create a more reliable interconnect. In some embodiments, the bump is a superconducting bump. Additionally, in some embodiments the UBM is a superconducting UBM.

In another embodiment, an interconnect includes two separate bumps/studs coated with different metal/alloys attached with each other where they create lower temperature melt interface.

In another embodiment, an interconnect includes a bump and an under bump metallurgy (UBM) where the bump reacts with at least part of the UBM at an interface to create a higher temperature melt interface. In one embodiment, the interface melts at a higher temperature than at least one of a portion of the bump and/or UBM. It is also possible to create a concentration gradient at the interface which melts at a higher temperature than the bump and/or UBM.

At least part of an interconnect may include a low melt phase metal and at least part of low melt phase metal may be surrounded (e.g., in an X-Y and/or Z direction) with a low surface energy metal (or metals). The low surface energy metal (or metals) may substantially reduce (or ideally prevent) melt flow (e.g., solder flow) during reflow to prevent X-Y shorts and create a finer pitch interconnect.

In a further aspect of the concepts described herein, a superconducting system includes at least first and second superconducting devices. Each of the first and second superconducting devices includes at least one superconducting trace, at least one superconducting pad, and at least one under bump metal (UBM) structure deposited on top of the superconducting trace and the superconducting pad. In embodiments, the at least one superconducting trace is attached or otherwise coupled to single and/or multiple resistors (e.g., a Molybdenum (Mo) or Molybdenum nitride (MoN) trace). At least one of the first and second superconducting devices includes a superconducting and/or conventional bump deposited on the UBM structure of the semiconductor devices.

The superconducting and/or conventional bump electrically interconnects the first and second superconducting devices through a first superconducting trace of the first superconducting device-a first UBM structure of the first superconducting device-the bump-a second UBM structure of the second superconducting device-a second superconducting trace of the second superconducting device. The superconducting and/or conventional bump substantially covers the superconducting pads and the UBM structures of the first and second superconducting devices. A critical current of the superconducting system going through the first superconducting trace-the first UBM structure-the bump-the second UBM-the second superconducting trace is substantially determined by a minimum width of the superconducting traces (and corresponding attached resistors in some embodiments).

In another aspect of the concepts described herein, a superconducting system includes at least first and second superconducting devices. Each of the first and second superconducting devices includes at least one superconducting trace, at least one superconducting pad and at least one under bump metal (UBM) structure deposited on top of the superconducting trace and the superconducting pad. At least one of the first and second superconducting devices includes a superconducting and/or conventional bump deposited on a respective UBM structure of the semiconductor devices.

The superconducting and/or conventional bump electrically interconnects the first and second superconducting devices through a first superconducting trace of the first superconducting device-a first superconducting pad of the first superconducting device-a first UBM structure of the first superconducting device-the bump-a second UBM structure of the second superconducting device-a second superconducting pad of the second superconducting device-a second superconducting trace of the second superconducting device. The superconducting and/or conventional bump substantially covers the superconducting pads and respective UBM contact areas of the UBM structures of the first and second superconducting devices on which the bump is coupled. A critical current of the superconducting system going through the first superconducting trace-the first superconducting pad-the first UBM-the bump-the second UBM-the second superconducting pad-the second superconducting trace is substantially determined by a minimum width of the superconducting traces when bump-UBM contact diameter and/or width and/or area is sufficiently larger than the minimum width of the superconducting traces.

In a further aspect of the concepts described herein, a superconducting system includes at first and second superconducting devices. The first superconducting device includes multiple superconducting traces and each trace includes at least a single and or double superconducting pad (e.g., a multi-layer superconducting pad or multiple superconducting pads) attached to the trace. The second superconducting device includes multiple superconducting traces and each trace includes at least a single and or double superconducting pad attached to the trace. A passivation layer is disposed on top of the multiple traces of the first superconducting device and on top of the multiple traces of the second superconducting device. An opening is formed in selected portions of the passivation layer, and extends onto portions of the traces of the first superconducting device and onto portions of the traces of the second superconducting device. A first under bump metal (UBM) structure is disposed in the passivation layer opening and onto the traces of the first superconducting device. Additionally, a second UBM structure is disposed in the passivation layer opening and onto the traces of the second superconducting device. One or more openings may also be formed in selected portions of the superconducting pads attached to the superconducting traces of the first and second superconducting devices, and the first and second UBM structures may be disposed over or into the pad openings in embodiments.

A conventional and/or superconducting microbump is disposed on a surface of the first UBM structure and coupled to traces of the first superconducting device (e.g., via the first UBM structure). The microbump is also bonded with a surface of the second UBM structure (e.g., via a coupling process) and coupled to the traces of the second superconducting device to electrically interconnect the first superconducting device with the second superconducting device in such a way that bonding will create a bump interrupted continuous superconducting trace and maintain a substantially similar critical current of individual superconducting traces (i.e., superconducting traces of the first and second superconducting devices).

In one embodiment, the bonded microbumps substantially cover the first UBM structure of the first superconducting device and the second UBM structure of the second superconducting device. In another embodiment, the bonded microbumps substantially cover at least the passivation layer opening in which the first UBM structure is disposed and the passivation layer opening in which the second UBM structure is disposed.

In one embodiment, the microbumps have a diameter (e.g., a first diameter) of about 15 micron or less and a height (e.g., a first height) of about 6 micron or less (i.e., a 6 micron or less tall microbump) prior to bonding, and the microbumps have a height (e.g., a second height) of between about 2 micron and about 4 micron after bonding. In another embodiment, the micobumps have a diameter of about 15 micron or less and a height of about 8-15 micron prior to bonding, and the microbumps have a height of between about 2 micron and about 4 micron after bonding. In one embodiment, a microbump having a height of between about 8 micron and about 15 micron after bonding maintains a high critical current for longer bump interrupted superconducting traces than a microbump having a height of about 6 micron or less. In embodiments, the longer bump interrupted superconducting traces include a larger number of bumps.

Additionally, in one embodiment the microbumps have a diameter of about 15 micron or less and a height of between about 6 micron and about 15 micron prior to bonding, and the microbumps have a height of between about 2 micron and about 4 micron after bonding with a bonded bump height variation of less than about 1 micron. In another embodiment, the microbumps have a diameter of about 15 micron or less and a height of between about 6 micron and about 15 micron prior to bonding, and the microbumps have a height of between about 2 micron and about 4 micron after bonding with a bonded bump height variation of less than about 0.5 micron. In another embodiment, the microbumps have a diameter of about 15 micron or less and a height of between about 6 micron and about 15 micron, and the microbumps have a height of between about 2 micron and about 4 micron after bonding with a bonded bump height variation of less than about 0.1 micron.

In another embodiment, the microbumps have a diameter of about 15 micron or less and a height of between about 6 micron and about 15 micron with an initial bump height variation of less than about 3 micron prior to bonding. The microbumps may have a height of between about 2 micron and about 4 micron after bonding with a bonded bump height variation of less than about 1 micron. In another embodiment, the microbumps have a diameter of about 20 micron or less and a height of between about 6 micron and about 20 micron with an initial bump height variation of less than about 3 micron. The microbumps may have a height of between about 2 micron and about 6 micron tall after bonding with bonded bump height variation of less than about 1 micron. In a further embodiment, the microbumps have a diameter of about 7 micron or less and a height of about 6 micron or less prior to bonding, and the microbumps have a height of between about 1 micron and about 3 micron after bonding.

In another aspect of the concepts described herein, a superconducting system includes at least first and second superconducting devices. Each of the first and second superconducting devices includes at least one superconducting trace and at least one under bump metal (UBM) structure deposited on top of the superconducting trace. Additionally, each of the first and second superconducting devices includes a superconducting bump deposited on the UBM structure. A first superconducting bump of the first superconducting device is bonded or otherwise coupled with a second superconducting bump of the second superconducting device to electrically interconnect the first and second superconducting devices. In embodiments, the first and second superconducting bumps are first and second interconnect portions of an interconnect structure including at least two interconnect portions.

In one embodiment, the first superconducting bump is different from the second superconducting bump and creates at least a third superconducting composition at a bonding interface between the first and second superconducting bumps. In another embodiment, the first superconducting bump has a different melting point than the second superconducting bump and creates at least a third superconducting composition with a third melting point at the bonding interface. In one embodiment, the at least third superconducting composition has a lower melting point than the first and second superconducting bumps. In another embodiment, the at least superconducting composition has a higher melting point than the first and second superconducting bumps. Additionally, in one embodiment the first superconducting bump of the first superconducting device is bonded with the second superconducting bump of the second superconducting device to create a third superconducting bump having a different melting point than the first and second superconducting bumps.

In a further aspect of the concepts described herein, a superconducting system includes at least first and second superconducting devices. Each of the first and second superconducting devices includes at least one superconducting trace and at least one under bump metal (UBM) structure deposited on top of the superconducting trace pad. The first superconducting device includes a superconducting and/or conventional bump deposited on the UBM structure. The second superconducting device includes a through or blind or micro via filled or partially filled with a superconducting and/or conventional metal. The UBM structure and superconducting trace of the second superconducting device has an opening that includes a through or blind or micro via filled or partially filled with a superconducting and/or conventional metal. The superconducting and/or conventional bump electrically interconnects the first and second superconducting devices through a first superconducting trace of the first superconducting device-a first UBM structure of the first superconducting device-the bump-a second UBM structure of the second superconducting device-a second superconducting trace of the second superconducting device. The first superconducting and/or conventional bump is partially bonded with the second UBM structure and partially bonded with the superconducting and or conventional via.

In one embodiment, the first superconducting and/or conventional bump is primarily bonded with the superconducting and/or conventional via. Additionally, in one embodiment the first superconducting and/or conventional bump is primarily bonded with the second UBM structure. In one example, the bump and via materials are same. In another example, the bump and via materials are different and create at least a third new composition at a bonding interface between the bump and via materials.

Additionally, in one embodiment the first UBM structure includes a first superconducting material and the second UBM structure includes a second superconducting material. Further, in one embodiment the through via is filled with at least one third superconducting material.

The first UBM structure and the through via may be bonded together to create an electrically coupled interconnect where the first superconducting material of the first UBM structure and the third superconducting material of the through via interact to create a fourth superconducting material at a coupling interface between the first UBM structure and the through via (e.g., a surface of the through via). Additionally, the second superconducting materials of the second UBM and the third superconducting materials of the through via may interact to create a fifth superconducting material at a coupling interface between the second UBM structure and the through via (e.g., a surface of the through via) when electrically coupled together. In embodiments, the second superconducting material is substantially the same as the first superconducting material, and the fourth and fifth superconducting materials are the same as or similar to each other.

In another embodiment, the first UBM structure includes or is coupled to a first superconducting bump, the second UBM structure includes or is coupled to a second superconducting bump, and the through via is partially filled with a conventional metal. The first UBM structure, the second UBM structure and the through via may be bonded and reflowed together to create an electrically coupled superconducting interconnect. In one embodiment, the first superconducting bump of the first UBM structure and the second superconducting bump of the second UBM structure are reflowed and wet the conventional metal through via to create the superconducting interconnect.

In another aspect of the concepts described herein, a cryogenic electronic package includes a first superconducting structure. The first semiconductor structure includes multiple superconducting traces and each of the traces includes at least single and/or double superconducting pad attached or otherwise coupled to the trace. The cryogenic electronic package also includes a second superconducting structure. The second superconducting structure includes multiple superconducting traces and each trace consists of at least single and/or double superconducting pad attached or otherwise coupled to the trace. A passivation layer is disposed on top of the multiple traces of the first superconducting structure and on top of the multiple traces of the second superconducting structure. An opening is formed in selected portions of the passivation layer, and extends onto portions of the traces in the first superconducting structure and onto portions of the traces in the second superconducting structure on which the passivation layer is disposed.

A first under bump metal (UBM) structure is disposed in the passivation layer opening and onto of the traces in the first superconducting structure. Additionally, a second UBM structure is disposed in the passivation layer opening and onto said the traces of the second superconducting structure. A first superconducting bump is disposed on a surface of the first UBM structure and coupled to the traces of the first superconducting structure. Additionally, a second superconducting bump is disposed on a surface of the second UBM structure and coupled to the traces of the second superconducting structure.

The first superconducting bumps of the first structure are bonded or otherwise coupled with corresponding ones of the second superconducting bumps of the second superconducting structure to create third superconducting bumps when the first semiconductor structure is coupled to the second superconducting structure. The first superconducting structure is coupled to the second superconducting structure such that the coupling creates a bump interrupted continuous superconducting trace and the third superconducting bumps (i.e., interconnect structures) maintain a substantially similar critical current of individual superconducting traces.

In one embodiment, the cryogenic electronic package further includes a third superconducting structure. The third superconducting structure may include multiple conventional metal and/or superconducting metal filled through vias. A first superconducting bump may be bonded with a first surface of one of the through vias and a second superconducting bump may be bonded with a second surface of the through vias to create electrically coupled interconnect structure such that a bump-via interrupted continuous superconducting trace if formed. The interconnect structure may maintain a substantially similar critical current of individual superconducting traces in the cryogenic electronic package.

In another aspect of the concepts described herein, a superconducting system includes a first superconducting layer having a first plurality of superconductive features. Each of the first plurality of superconductive features has one or more predetermined dimensions. The superconducting system also includes an interposer (e.g., an interposer layer) disposed on the first superconducting layer, and a second superconducting layer having a second plurality of superconductive features. Each of the second plurality of superconductive features has one or more predetermined dimensions. The second superconducting layer is disposed on the interposer. The superconducting system additionally includes a plurality of thru-holes extending through the interposer. Each of the thru-holes has a diameter greater than said the predetermined dimensions of the first and second pluralities superconductive features, resulting in a pocket of space proximate to the superconductive features. Additionally, each of the thru-holes is in alignment with a respective one of the first and second pluralities of superconductive features on the first and second superconducting layers, respectively, and includes a portion of superconducting material disposed thereon. The superconducting material is spread outside boundaries of the first and second pluralities of superconductive features to fill the pockets of space.

In one embodiment, interconnect structures in cryogenic electronic packages according to the disclosure include one or more Indium microbumps. Additionally, in one embodiment superconducting traces of superconducting semiconductor structures in the cryogenic electronic packages include superconducting Niobium (Nb) traces. The Indium microbumps may act as a resistor attached to the superconducting Niobium trace at a temperature of about 4.2 Kelvin (K), and a current-voltage (I-V) curve may be used to measure the resistance of the microbumps. Above a critical current, the superconducting Niobium trace may become a conventional conductor, and the I-V curve may become nonlinear. When current flows along a daisy chain of superconducting Niobium traces interrupted by non-superconducting microbumps, there is a power ($i^2R$) loss that results in localized heating. This causes the Niobium daisy chain to increase in temperature. The superconducting Niobium trace cools by conduction into neighboring materials and into the liquid helium environment in which the cryogenic electronic package may be placed. Equilibrium temperature is achieved when the rate of heating equals the rate of cooling. Although the daisy chain consists of superconducting niobium, a non-superconducting under bump metal, and a non-superconducting Indium microbump and their interfaces in the above described embodiment, electrically this type of daisy chain shows a well-controlled, high current carrying capacity similar to a solid niobium line system in embodiments.

BRIEF DESCRIPTION OF THE DRAWINGS

Features and advantages of the concepts, systems, circuits and techniques disclosed herein will be apparent from the following description of the embodiments taken in conjunction with the accompanying drawings in which:

FIG. 2 shows a cross-section of an example semiconductor structure as may be formed in accordance with the method of FIG. 1, for example;

FIG. 2A shows a cross-section of an example interconnect structure as may be formed in accordance with the method of FIG. 1, for example;

FIG. 5 shows a cross-section of an example semiconductor structure as may be formed in accordance with the method of FIG. 4, for example;

FIG. 5A shows a cross-section of an example interconnect structure as may be formed in accordance with the method of FIG. 4, for example;

DETAILED DESCRIPTION

Figure 1:
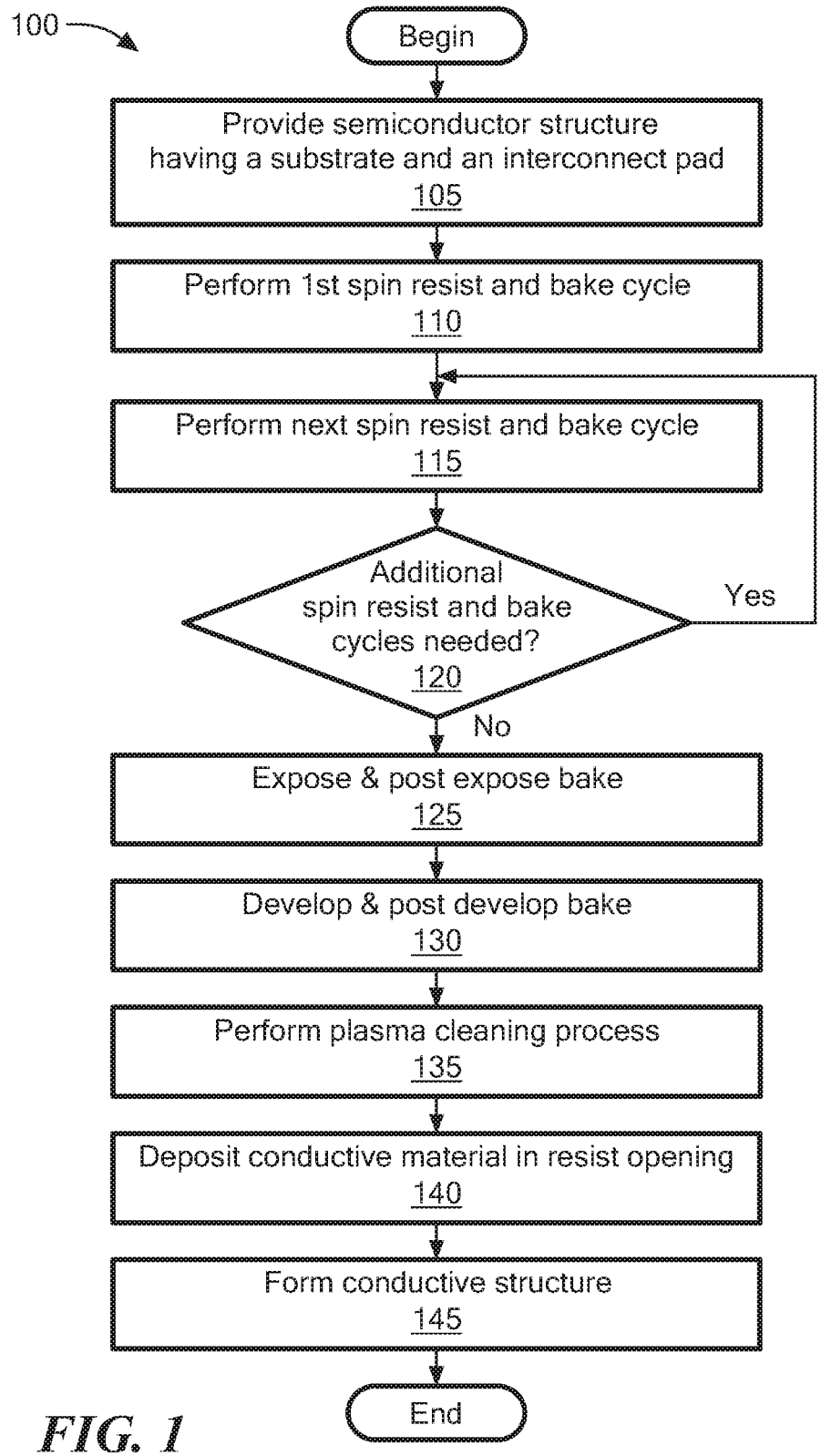
FIG. 1 is a flowchart illustrating an example method for fabricating a interconnect structure in accordance with an embodiment of the disclosure.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views. It should, of course, be appreciated that elements shown in the figures are not necessarily drawn to scale. For example, the dimensions of some elements may be exaggerated relative to other elements for clarity.

Definitions

For convenience, certain introductory concepts and terms used in the specification are collected here.

As used herein, a "high Q metal" or "high Q material" (or so-called "high Q metals" or "high Q materials") refers to materials in the 20-400 nm film form capable of producing a high quality factor and are defined as materials in a resonator and/or a superconducting resonator which produce a quality factor in the range of about a few thousands to several millions in the low power and/or single photon region. Illustrative materials include, but are not limited to: niobium (Nb), niobium nitride (NbN), titanium-niobium-nitride (TiNbN), titanium nitride (TiN), aluminum (Al), and rhenium (Re), diamond, graphene, etc.

The phrase "quality factor" can be used to describe how long stored energy remains in a resonator. It should be appreciated that there is a difference between a total quality factor and an internal quality factor Qi. Internal quality factor Qi is an intrinsic characteristic of a resonator. A total or loaded quality factor QL, on the other hand, also depends upon other properties, including, but not limited to, coupling to an environment (i.e., an environment external to the resonator) and a feedline. A coupling quality factor (Qc) describes how strong (or closely) the resonator is coupled to the feedline.

As used herein, the term "resonator" refers to a device or system that exhibits resonance at some frequencies. A resonator may be described by two characteristics: (1) a resonance frequency; and (2) a quality factor. Superconducting resonators play a significant role in qubit design, interqubit coupling, quantum information storage, and quantum-state dispersive readout because of their low signal-to-noise ratio and low power dissipation. In addition, as part of the concepts sought to be protected herein, it has been recognized that because superconducting qubits may be fabricated using the same materials and processes as resonators described herein, the study of the loss mechanisms limiting the qualify factor Q in these resonators may prove to be a useful and relatively simple tool for understanding the fabrication-dependent limits to qubit coherence times. Superconducting resonator is provided as any type of microwave resonator, including distributed—e.g., a coplanar waveguide (CPW) resonator, stripline resonator, microstrip resonator, coplanar strip resonator, puck resonator, and related structures,—and lumped element resonators comprising lumped capacitive and inductive elements coupled in parallel and/or in series, the capacitor formed by patterning a conductive layer deposited on a surface of a substrate.

A bit is the most basic unit of classical logic and can occupy one of two discrete states, 0 or 1. A quantum bit, or "qubit," on the other hand, can be an arbitrary superposition of the eighteen states |0> and |1>. A quantum computer is comprised of logic gates that operate on an ensemble of quantum bits.

Where n classical bits can only exist in one of the 2n possible states, a quantum processor with n qubits can be placed in a complex superposition state of any weighted combinations of all 2n permutations, containing an exponentially larger state space than a conventional processor.

"Superconducting qubits" are manifested as (e.g. an integrated circuit) electronic circuits comprising lithographically defined Josephson junctions, inductors, capacitors, transmission lines and interconnects. When cooled to dilution refrigerator temperatures, these circuits behave as quantum mechanical "artificial atoms," exhibiting quantized states of electronic charge, magnetic flux, or junction phase depending on the design parameters of the constituent circuit elements. The Josephson junction behaves as a non-linear dissipationless inductor.

Superconducting qubits are engineered to have discrete and harmonic spectra—an "artificial atom" fabricated using standard lithographic techniques.

"Superconducting artificial atoms" are electronic circuits comprising lithographically defined Josephson tunnel junctions, inductors (L), capacitors (C), and interconnects. Conceptually, they begin as linear LC resonant circuits (i.e., simple harmonic oscillators), which are then made anharmonic to varying degrees by adding a nonlinear inductive element, the Josephson junction (JJ). When cooled to dilution refrigerator temperatures (~20 millikelvin), these superconducting circuits behave as quantum mechanical oscillators (e.g., "artificial atoms") exhibiting quantized states of electronic charge, magnetic flux, or junction phase depending on the design parameters of the constituent circuit elements.

Three fundamental superconducting qubit modalities are: charge, flux, and phase. Each includes one or more Josephson junctions. The qubit comprises the two-lowest states and is addressed at a unique frequency, $f_{01}$. Qubit modalities represented include charge, quantronium, flux, capacitively shunted flux, 2D transmon, fluxonium, and 3D transmon qubits.

The term "superconducting qubit" generally refers to the ground and first-excited state of a superconducting artificial atom. Due to the anharmonicity imparted by the Josephson junction, the ground and first-excited states may be uniquely addressed at a frequency, $f_{01}$, without significantly perturbing the higher-excited states of the artificial atom. These two-lowest states thereby form an effective two-level system (i.e., a pseudo-"spin-1/2" system), and it is this degree of freedom that is used as the qubit, a quantum bit of information. Qubit participates in quantum annealing cycle and settle into one of two possible final states (0,1). Qubit used real valued constant (weight) which influences qubit's tendency to collapse into two possible final states. A "superconducting device," as defined herein, includes at least one of a superconducting trace, a superconducting interconnect, a partially superconducting interconnect, a Josephson junction, a superconducting qubit and a superconducting resonator during operation.

The term "coupler" as used herein refers to a physical device that allows one qubit to influence another qubit. An Inductor and/or a Josephson junction can be a part of coupler. A coupler may be characterized by a real valued constant (strength) that indicates controls or influence exerted by one qubit on another.

As quantum mechanical objects, superconducting qubits can be coherently controlled, placed into quantum superposition states, exhibit quantum interference effects, and become entangled with one another. The time scale over which a superconducting qubit maintains this type of quantum mechanical behavior, and thereby remains viable for quantum information applications, is generally called the "coherence time." The rate at which the qubit loses coherence is related to its interactions with the uncontrolled degrees of freedom in its environment.

The term "interposer" as used herein, refers to and includes a structure capable of electrically interconnecting and/or magnetically and/or inductively and/or capacitively coupling arrays of superconducting and/or non-superconducting conductors on two opposing circuitized substrates. An interposer may include superconductive and/or partially superconductive or conventional (non-superconducting) elements such as micro-bumps, solder paste or conductive paste, as well as conductive and/or superconductive thru-holes. Such an interposer, as defined herein, includes at least one dielectric layer (and may include many) and at least two external superconductive circuit layers (and possibly one or more internal superconductive circuit layers), with the layers each possibly including selective and/or a density array of contact locations. Examples of dielectric materials suitable for the at least one dielectric layer of the interposer include such materials as high resistive silicon, silicon oxide coated silicon, silicon nitride coated silicon, selective silicon oxide coated silicon, selective silicon nitride coated silicon, selective or entire low loss organic (e.g., BCB) coated silicon and combinations thereof. In one example, an interposer comprises a circuitized substrate. The circuitized substrate may be provided as a superconducting organic circuitized substrate and/or a conventional metal(s) organic circuitized substrate.

Example materials which may be used to provide conductive and/or superconductive thru-holes include, but are not limited to niobium (Nb), niobium nitride (NbN), titanium-niobium-nitride (TiNbN), titanium nitride (TiN), aluminum (Al), rhenium (Re), tungsten, silicide, diamond or any other possible superconducting metal and/or superconducting nitride and combinations thereof. In one example, conductive and/or superconductive thru-holes as defined herein include at least single and/or multilayer Titanium nitride where part of the Titanium nitride can be used as a silicon and titanium etch barrier. It is further possible to use titanium nitride single and/or multilayer materials with multiple composition and/or concentration gradient where at least one composition and/or concentration is superconducting during device operation.

A "substrate," as defined herein, refers to a chip carrier for flip-chip and/or wire bonding and/or 3D circuits. A substrate can be an active and/or a passive integrated circuit based carrier. Additionally, the substrate can be an active and/or passive TSV structure and/or an MCM and/or a single chip module-based chip carrier. The chip carrier can be Si based, organic based, ceramic based, Sapphire based or a combination thereof.

The term "superconducting multi-chip module (SMCM)" as used herein includes at least one dielectric layer (and may include many) and one or more superconductive circuit layers (and possibly one or more internal superconductive circuit layers) deposited or otherwise provided on a base substrate (e.g. Si or high resistive Si). Such superconductive circuit layers of the SMCM may be deposited, for example, using thin film technology. The SMCM may also include one or more superconductive vias and/or superconducting pads. In one embodiment, the superconducting pads may include one or more under bump metals. Examples of dielectric materials suitable for the at least one dielectric layer of the SMCM include, but are not limited to, such materials as silicon (Si), high resistive silicon, silicon oxide as dielectric on Si, silicon nitride as dielectric on Si, selective silicon oxide on silicon, selective silicon nitride on silicon, selective or entire low loss organic (e.g., BCB) coated silicon and combinations thereof.

In one example, SMCM circuits are fabricated on silicon wafers having a diameter of about 200 mm. The SMCMs may be fabricated using a niobium (Nb) based integrated-circuit fabrication process for integrating superconducting chips, for example. In one embodiment, the process includes fabricating the SMCMs using a plurality of Nb metal layers (e.g., four Nb metal layers) of interconnects which are separated or otherwise spaced apart from each other by a Plasma-enhanced chemical vapor deposition (PECVD) silicon dioxide dielectric, for example. Additionally, in one embodiment the process utilizes I-line photolithography (e.g., about 365 nm) and planarization with chemical-mechanical polishing (CMP) for feature sizes down to about 0.6 µm, for example. In one embodiment, the maximum carrier chip size for the process may be about 50 mm×about 50 mm. In embodiments, wafer size and the process may limit the size of SMCM. For example, a wafer having a diameter of about 200 mm can be used to produce an SMCM having dimensions of about 50 mm×about 50 mm. Additionally, a wafer having a diameter of about 300 mm can be used to produce an SMCM having dimensions larger than about 50 mm×about 50 mm. Similarly, for an organic SMCM, the size of the SMCM will generally be larger than about 50 mm×about 50 mm.

In one embodiment, an SMCM includes four (or more) superconducting Nb layers and one or more Gold (Au)/Platinum (Pt)/Titanium (Ti) under bump metal (UBM) layers. Additionally, in one embodiment superconducting vias are fabricated between the metal layers of the UBM. In one example process, vias are etched into a PECVD silicon dioxide ($SiO_2$) dielectric of an SMCM. Additionally, in one example process, the vias are filled with a niobium metal of a subsequent superconducting layer of the SMCM. Indium bumps may be formed on top of the UBM(s) using an evaporation and lift-off process, for example.

Examples of materials which may be used to provide superconductive circuits, vias and pads include materials as niobium (Nb), niobium nitride (NbN), titanium-niobium-nitride (TiNbN), titanium nitride (TiN), aluminum (Al), rhenium (Re), or any other possible superconducting metal and/or superconducting nitride and combination. A substrate may have a Josephson junction and/or an embedded Josephson junction. It is further possible to use integrated and/or embedded capacitors, inductors, resistors. Patterned NbN can act as inductor. Capacitor may be planer, parallel plate, interdigitate and combinations thereof. Examples of materials from which resistors may be provided include, but are not limited to: platinum, molybdenum, molybdenum nitride and combinations thereof. The substrate can further have dielectric bridges, crossovers, air bridges and combinations. The term "superconducting multi-chip module (SMCM)" may be used when at least part of the circuits are superconducting during operation and used superconducting and/or conventional via between superconducting circuits for interconnects.

Superconducting multi-chip module (SMCM) can have conventional UBM conductor for heterogeneous integration as well as to protect the superconducting pad. We defined "superconducting multi-chip module (SMCM)" when at least part of the circuit is superconducting during operation. Superconducting multi-chip module (SMCM) can have active element such as various size Josephson junctions and passive elements such as inductors, resistors, transformers, and transmission lines. In one example, Superconducting multi-chip module (SMCM) is a niobium-based integrated-circuit fabrication process appropriate for integrating superconducting chips. It is based on four Nb metal layers separated by PECVD silicon oxide dielectric. It utilizes I-line (365 nm) photolithography and planarization with chemical-mechanical polishing (CMP) for feature sizes down to 0.8 micron. There are four superconducting Nb layer and used Ti—Pt—Au as under bump metal layer.

Superconducting vias are created between metal layers. In a typical process, vias are etched into PECVD $SiO_2$ dielectric and filled with niobium metal of the subsequent superconducting layer. Superconducting multi-chip module (SMCM) may be used to assemble multiple superconducting and/or conventional chips. Similarly, superconducting single-chip module (SSCM) may be used to assemble a single superconducting or conventional chip. The term "superconducting module" or "superconducting substrate" includes both superconducting multi-chip module (SMCM) and superconducting single-chip module (SSCM). We use the term "conventional module" or "conventional substrate" which includes both multi-chip module (MCM) and single-chip module (SCM). Both superconducting and conventional module able to attach superconducting and/or conventional conducting chips.

"Cryogenic electronic packaging" is defined herein as integration and packaging of electronic components for cryogenic (77° K and below) applications. It is possible cryogenic electronic package can be used for room temperature electronics as well. For example, interface electronics which need to interface between cryo and room temperature electronics may be able to operate at both temperature zones. It also possible that cryogenic electronic package can be used for specific temperature operation (e.g., 4-10° K, below 100° mK). For example, superconducting niobium electronics generally operates below 8° K and below, whereas superconducting Aluminum electronics generally operates below 500° mK.

The term "under bump metal (UBM)" (or "under bump metallization (UBM)") as used herein refers to structures which include materials which provide a relatively low resistance electrical connection to the superconducting pad. A UBM may adhere to the underlying superconducting pad and to passivation layers of surrounding superconducting circuits, hermetically sealing the superconducting circuits from the environment. In some cases, a UBM may provide a strong barrier to prevent the diffusion of other bump metals into the superconducting circuits.

A top layer of a UBM is preferably readily wettable by the bump metals, for solder reflow. In one embodiment a UBM uses multiple different metal layers, such as an adhesion layer, a diffusion barrier layer, a solderable layer, and an oxidation barrier layer. It is further possible that the UBM layers are compatible metals which in combination have low internal mechanical stresses. Example of materials from which a UBM may be provided include, but are not limited to: 20 nm Ti-50 nmPt-150 nmAu, 10 nmTi-50 nm Au, 5 nm Ti-5 nm Pt-5 nm Au-1000 nm Indium, 5 nm Ti-5 nm Pt-5 nm Au-1000 nm Sn, 50 nm Pt-100 nm Au, 5 nm Ti-500 nm In, 20 nm Ti-1000 nm In, Ni—Au, Ni—Pd—Au, Pd—Au, Ti—TiN, Ti—TiN—Ti—Au, Ti—TiN—Ti—In, Ti—TiN—Ti—Sn, Ti—Sn—In etc.

The term "superconducting interconnect" or "partially superconducting interconnect" as used herein refers to structures including at least one superconducting bump and at least one UBM to create electrical and/or mechanical connection between two superconducting circuits. We defined "superconducting interconnect " when superconducting bump and superconducting UBM create superconducting interconnect between two superconducting circuits during operation. We also defined "superconducting interconnect" when superconducting bump and conventional UBM conductor create superconducting interconnect between two superconducting circuits during operation. Here, a conventional UBM conductor becomes superconducting due to proximity effect.

Example compositions of superconducting interconnects include, but are not limited to: (10-400)nm Al-(3-20)nm Ti-(5-40)nm Au-(1-5)μm In-(5-40)nm Au-(5-20)nm Ti-(10-400)nm Al. In such examples, Al is used as a superconducting pad and Ti—Au or Ti—Au-thin (1000 nm) Indium can act as a UBM. It is possible for Au thickness in the interconnect part to be consumed by Indium and rest of the Au will superconducting based on proximity.

Additional example compositions of superconducting interconnects include: (10-400)nm Al-(3-20)nm Ti-(1-5)μm In-(5-20)nm Ti-(10-400)nm Al, (10-400)nm Al-(1-5)μm In-(10-400)nm Al, (10-400)nm Al-(3-20)nm Ti-(5-40)nm Au-(1-5)μm In-(1-5)μm Sn -(5-40)nm Au-(5-20)nm Ti-(10-400) nm Al, and (10-400)nm Nb-(3-20)nm Ti-(5-40)nm Au-(1-5)μm In-(5-40)nm Au-(5-20)nm Ti-(10-400)nm Nb.

Further example compositions of superconducting interconnects include: (10-400)nm Nb-(3-20)nm Ti-(1-5)μm In-(5-20)nm Ti-(10-400)nm Al, (10-400)nm Nb-(1-5)μm In-(10-400)nm Nb, (10-400)nm Al-(3-20)nm Ti-(5-40)nm Au-(1-5)μm In-(1-5)μm Sn-(5-40)nm Au-(5-20)nm Ti-(10-400) nm Al, and (10-400)nm Al-(3-20)nm Ti-(5-200)nm TiN-(1-5)μm In-(5-200)nm TiN-(5-20)nm Ti-(10-400)nm Al, (10-400)nm Al-(3-20)nm Ti-(5-200)nm TiN-(5-40)nm Au-(1-5) μm In-(5-40 nm) Au-(5-200)nm TiN-(5-20)nm Ti-(10-400) nm Al. Additional example compositions of superconducting interconnects include:

(10-400)nm Nb-(3-20)nm Ti-(5-200)nm TiN-(1-5)μm In-(5-200)nm TiN-(5-20)nm Ti-(10-400)nm Nb, (10-400)nm Nb-(3-20)nm Ti-(5-200)nm TiN-(5-40)nm Au-(1-5)μm In-(5-40 nm) Au-(5-200)nm TiN-(5-20)nm Ti-(10-400)nm Al, and combinations thereof.

A "partially superconducting interconnect" is defined herein to describe a conductor interconnect between two superconducting circuits during operation provided from a superconducting bump and a conventional UBM conductor. Here, conventional UBM conductors dominate interconnect conductance although part of the interconnect is superconducting due to presence of a superconducting bump. In one example, superconducting interconnects include Al-UBM-Indium-UBM-Al or Nb-UBM-In-UBM-Nb. Examples of initial interconnect composition prior to bonding with second superconducting substrate include, but are not limited to: Ti(5 nm)-Au(20 nm)–8 um In, Ti(5 nm)-Au(100 nm)–8 um In, Ti(5 nm)-Au(50 nm)–8 um In, Ti(5 nm)/Pt(20 nm)/Au(20 nm)+8 um In, Ti(5 nm)/Pt(20 nm)/Au(20 nm)+8 um In, Ti(5 nm)/Pt(50 nm)/Au(100 nm)+8 um In, Ti(5 nm)/Pt(50 nm)/Au(150 nm)+8 um In, 8 um Indium-1 um tin, 4.5 um Indium-4.5 μm tin, 6 um Silver bump with 2 um In, 5 nmTi-6 um Ag-5 nmTi-50 nmPt-100 nmAu-2 um In, Al—In, Pb—In, Pb—Ti—In, Pb—Sn—In, Pb—Sn—In—Au(10 nm). Nb—Pb—Sn—In, Nb—Pb—In, Nb—Ti(5 nm)-Pb(8 um)-In(2-5 um), 48Sn-52In etc. In one example, a total interconnect resistance for an Al based superconducting substrate may be calculated as: interface resistance of Al-UBM+interface resistance of (UBM-In)+interface resistance of (In-UBM)+interface resistance of UBM-Al.

In this example, it is assumed that an Al pad is used for both superconducting integrated circuits and/or modules for creating superconducting and/or partially superconducting interconnects, assuming UBM resistance negligible in the range of nano ohm and Indium, aluminum superconducting during device operation. R(Al-UBM): contact resistance and R(UBM-In):interface resistance between bump and UBM. If Indium is used as a material from which to provide a UBM, then a Total Resistance (TR) may be computed as TR=2R (Al-UBM) assuming Indium to indium mixing much better and indium is superconducting. In this case, a contact resistance [R(Al-UBM)] will be superconducting due to proximity. So, keeping same materials as UBM as well as bump has many benefits other than adding multiple materials.

A Josephson junction is defined as two superconductors allowed interacting through a so-called "weak link," where the "weak link" may be provided from a thin insulating barrier, a conventional metal, or a narrow superconducting constriction—respectively referred to as an S—I—S, S—N—S, or S—C—S junction. A supercurrent flows/tunnels through this weak link, even in the absence of a voltage. The critical current of the junction is related to the superconducting gap of the electrode materials as well as the type and thickness of the insulating barrier. It is often characterized by a critical current density Jc and the area A of the junction such that Ic=Jc×A.

Josephson tunnel junctions are formed by two superconducting electrodes separated by a very thin (~1 nm) insulating barrier. In this configuration, the collective superconducting order of one electrode (parameterized by a phase $\varphi_1$) coherently connects with that of the other electrode ($\varphi_2$) via the elastic tunneling of Cooper pairs through the barrier. The resulting supercurrent, I, and junction voltage, V, are related to the superconducting phase difference, $\varphi=\varphi_1-\varphi_2$, across the junction A circuit quantum electrodynamics (circuit QED) may be used to address and measure a superconducting qubit. Circuit QED and superconducting qubits may be coupled to the electric field in a planar transmission line resonator. For cavity QED an atom in the cavity interacts with the trapped photons, and a measurement of the photons leaking out of the cavity allows one to probe the state of the atom.

In circuit QED, the cavity is replaced by a λ/2 transmission line resonator that interacts with the outside world via two capacitors, Cin and Cout. A superconducting qubit sits at a voltage anti-node in the resonator, where the capacitance between the qubit and the resonator sets the interaction strength. Measurements may determine a maximum number of photons leaking out of the resonator (RFout) when the impinging signal (RFin) is on or near resonance with the resonator-qubit system.

Superconducting quantum interference device (SQUID) may be provided from a superconducting loop interrupted by two Josephson junctions. The net critical current of the SQUID can be tuned by threading a magnetic flux through the loop. SQUID is a tunable Josephson junction, and this feature is used to make "tunable" superconducting qubits, i.e., qubits with a parameter related to the junction Ic that is tunable by the magnetic field that threads the SQUID loop.

As used herein, the term "Superconductive single-flux-quantum (SFQ) integrated circuit" is used to describe a circuit which operates at a cryogenic temperature of about 4 degrees Kelvin (K). The circuit is based on switching flux quanta in and out of superconducting loops containing Josephson junctions (JJs), for example. In embodiments, building circuits and logic gates exploiting SFQ operation involves combining loops and inductors for storing flux along with transformers and JJs for control and switching. In one relatively simple example SFQ circuit, a superconducting ring is interrupted by a single Josephson junction.

Additionally, a transformer may couple an amount of magnetic flux into the superconducting ring which is proportional to an externally applied control current, for example. In embodiments in which the control current results in a loop current IL of the superconducting ring exceeding $I_c$, for example, a relatively short voltage pulse may result across the junction along with a 2*pi phase shift. Such corresponds to a single quantum of flux passing through the junction. In one embodiment, a characteristic switching time of the junction is about 1 picosecond (ps) and a switching energy of the junction is about $10^{-19}$ Joule (J).

Another example SFQ circuit includes a D flip-flop which has a storage loop formed by first and second junctions $J_1$ and $J_2$, and an inductor $L_2$. With a bias current applied to keep junction $J_1$ close to its critical current, an input CD' pulse entering through a junction $J_0$ may switch junction $J_1$ and inject an SFQ pulse into a storage loop of the circuit. The foregoing may result in an increase in a circulating current $I_S$ passing through junction $J_2$. Readout of the circuit (and portions thereof) may be performed with an incoming clock (CLK) pulse. In a presence of a stored pulse $I_S$, for example, an incoming CLK pulse may cause junction $J_2$ to switch, resulting in an output pulse at an output 'Q' of the circuit. With no stored pulse, the CLK pulse may be insufficient to switch junction $J_2$ and there may be no output pulse at output 'Q'.

In one embodiment, superconducting SFQ circuits are fabricated using a niobium-based superconducting integrated-circuit fabrication process for superconducting circuits. In one embodiment, the process includes fabricating the SFQ circuits using one or more Niobium (Nb)/(Aluminum-Aluminum Oxide) Al—$AlO_x$/Nb Josephson junction trilayers, for example, with a junction current $J_c$ of about 10 Killoamps (kA)/$cm^2$. The process may utilize about 248-nm photolithography and planarization with chemical-mechanical polishing (CMP) for wiring-layer feature sizes down to about 350 nm and Josephson junction diameters (and/or other dimensions) down to about 500 nm, for example. In embodiments, the SFQ circuits are fabricated using the process with Nb superconducting layers, molybdenum (Mo)-based resistance layers and Nb-based superconducting interconnects between substantially all metal layers. The process may support superconducting circuits with a single Josephson junction layer, for example. In embodiments, metal wiring layers (or metal layers) of the SFQ circuits are separated by a silica-based dielectric. Additionally, in embodiments microvias are used to interconnect the metal layers to form superconducting circuits.

As used here, the term "chemically activated surface" is used to describe a surface which is minimally etched and/or damaged. The hydrophilicity or hydrophobicity of the surface may be changed with appropriate plasma and/or chemical treatment by changing or modifying surface chemistry.

As used herein, the term "circuitized substrate" is used to describe a semiconductor structure including at least one dielectric layer, the at least one dielectric layer having at least one surface on which at least one circuit is disposed. Examples of dielectric materials suitable for the at least one dielectric layer include low temperature co-fired ceramic (LTCC), ceramic (alumina), fiberglass-reinforced or non-reinforced epoxy resins (sometimes referred to simply as FR4 material, meaning its Flame Retardant rating), polytetrafluoroethylene (Teflon), polyimides, polyamides, cyanate resins, photoimagable materials, and other like materials, or combinations thereof. Examples of electrically conductive materials suitable for the at least one circuit include copper and copper alloy. If the dielectric layer is provided from a photoimagable material, it is photoimaged or photopatterned, and developed to reveal the desired circuit pattern, including the desired opening(s) as defined herein, if required. The dielectric layer may be curtain coated or screen applied, or it may be supplied as a dry film or in other sheet form.

As used herein, the term "conductive fusible metal" is used to describe a metal including one or more of tin-lead, bismuth-tin, bismuth-tin-iron, tin, indium, tin-indium, indium-gold, tin-indium-gold, tin-silver, tin-gold, indium, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. The metals may change forms (e.g., from a solid to a liquid) during a bonding or during post bonding annealing or reflow process.

As used herein, the term "conductive structure" is used to describe an interconnect structure for electrically coupling one or more interconnect pads, electrical connections, components, devices, modules, and semiconductor structures and devices. The conductive structure may include at least one of a micro via having a diameter which is between about one micrometer (μm) and about one-hundred fifty μm's and a sub-micron via having a diameter of less than about one μm.

As used herein, the term "via first" may be used to describe a micro via and/or a submicro via used to make at least one electrical connection between a first device layer and second device layer in a semiconductor structure including at least two device layers. Additionally, as described here, the term "via" first may also be used to describe a micro via and/or a submicro via passing through a dielectric material or layer (in some embodiments, only the dielectric material or layer) to make at least one electrical connection between a first device layer and a second device layer in a semiconductor structure including at least two device layers. For a via first process, the first device layer and the second device layer are completed separately. As one example, a partial via material is added on first and/or second opposing surfaces (i.e., top and/or bottom surfaces) of the first second device layers and subsequent bonding and/or post bonding process create a via first between the first and second device layers.

The via first may be filled with at least one metal or alloy having a high Coefficient of Thermal Expansion (CTE) to produce a rigid, robust, and conductive via first joint between the at least two device layers during the composite bonding process. High temperatures and/or high pressures may be applied and used to bond the two device layers and provide a three-dimensional (3D) interconnection (i.e., interconnect) among the device layers. The high CTE metal or alloy are expanded at relatively high temperatures and interdiffuse with each other to produce the 3D interconnect. Alternatively, the via first may be filled with a low temperature fusible metal which melts and interdiffuse during bonding or post bonding processes.

As used herein, the term "via last" is used to describe a micro via and/or a submicro via used to make at least one electrical connection between a first device layer and a second device layer in a semiconductor structure including at least two device layers. Fabrication of the first device layer is completed first, and the second device layer is deposited over the first device layer. The second device layer is completed with via last process. A pad layer which includes one or more interconnect pads may be added after via last process. In one embodiment, via last is filled. Additionally, in one embodiment, the via last can be unfilled or partially filled. Via last may pass through the device layers (e.g., second device layers) and, in some embodiments, one or more isolation layers or materials. A titanium (Ti) material having a thickness of about ten nanometers (nm), a metal organic chemical vapor deposition (MOCVD) Titanium Nitride (TiN) liner having a thickness of about five nm, and tungsten plugs may be used for via lasts. A MOCVD or chemical vapor deposition (CVD) TiNx, with X less than or equal to 1, is preferred for better conformal coating.

As used herein, the term "CMOS (Complementary Metal Oxide Semiconductor)" is used to describe a semiconductor technology for constructing integrated circuits (which are also sometimes referred to herein as "chips"). Examples CMOS circuits include microprocessors, microcontrollers, static random access memory (RAM) and other digital logic circuits. Example CMOS circuits also include image sensors (or CMOS sensors), data converters and highly integrated transceivers for many types of communication applications. In one embodiment, CMOS circuits use complementary and symmetrical pairs of p-type and n-type metal oxide semiconductor field effect transistors (MOSFETs). CMOS circuits can include NMOS and/or PMOS transistors. The transistor can have a gate-source threshold voltage, below which the current (or sub threshold current) through the device drops exponentially, for example. In one embodiment, CMOS circuits may operate at supply voltages which are much larger than their threshold voltages. In another embodiment, a CMOS transistor can have a near zero threshold voltage (e.g., native transistor).

Operating temperatures of CMOS circuits and devices may be determined by a number of factors, including the properties of the basic semiconductor material (e.g., Si, gallium arsenide (GaAs), gallium nitride (GaN), silicon carbide (SiC), silicon germanium (SiGe), etc.) and the type of CMOS device (diode, bipolar transistor, field-effect transistor, etc.). Operating temperatures of CMOS circuits and devices may also be determined by circuit design of the device (e.g., materials, geometry and dimensions, interconnections), CMOS packaging and type of CMOS circuit (analog or digital). In one example, CMOS circuits and devices (e.g., Si MOSFETs, enhancement type MOSFETs, etc.) can operate at relatively low cryogenic temperatures because carriers needed for conduction in a channel of the devices can be ionized by an electric field from a gate terminal (or terminals) of the devices.

In embodiments, CMOS circuits (e.g., Si MOSFETs) can operate at deep (i.e., low) cryogenic temperatures, below the freeze-out of Si, for example. Additionally, in embodiments CMOS circuits may include various types of heterostructure FETs (HEMTs or MODFETs based on III-V semiconductors) which may not need thermal energy to ionize dopants of the FETs. In embodiments, the FETs can be used over substantially the entire cryogenic temperature range down to the lowest cryogenic temperatures. In one embodiment, CMOS circuits can include a Fin Field Effect Transistor (FinFET) and/or multiple-gate field-effect transistor (MuG-FET) and/or FlexFET and/or multiple-independent-gate field-effect transistor (MIGFET) and/or heterojunction bipolar transistors (HBTs) and/or insulated-gate bipolar transistor (IGBT). In another embodiment, a CMOS device including homojunction (e.g., Ge and GaAs) and/or heterojunction bipolar transistors can operate to relatively low cryogenic temperatures and show increased performance on cooling compared, for example, to conventional transistors.

As used herein, the term "photonic integrated circuit or integrated optical circuit" is used to describe a device that integrates multiple (i.e., at least two) photonic functions into a chip and provides functions for information signals imposed on optical wavelengths (e.g., visible spectrum or near infrared about 850 nm-about 1650 nm). In one example, photonic integrated circuits are based on an indium phosphide and/or a indium gallium arsenide (InGaAs) substrate having optically active and passive functions on a same chip. In one embodiment, a photonic integrated circuit uses silicon photonics where Si is used as an optical medium. It is further possible to use $SiN_x$ based waveguide in a photonic integrated circuit. In another example, a photonic integrated circuit uses silicon electro-photonic circuits. In one example, the circuits use a $SiN_x$ based waveguide in $SiO_2$. Examples of photonic integrated circuits include monolithic tunable lasers, widely tunable lasers, externally modulated lasers and transmitters, integrated receivers, optical transceivers, etc.

As used herein, the term "superconductive adhesive" is used to describe a composite material including a nonconductive organic binder and one or more superconductive filler particles. In embodiments, the adhesive layer may also include one or more conventional metal particles. Electrical connections may be achieved using the adhesive primarily by inter-particle conduction, for example. When superconductive filler content of the adhesive is sufficiently high, for example, the adhesive may be transformed into a relatively good superconducting conductor. For electrical conduction, particles of the adhesive should make intimate contact (e.g., physical and/or tunneling contact) and form a network or conductive chain, which may help in the transfer of electrons. A conductive path may be formed at a threshold volume fraction of the superconductive filler which can be calculated using percolation theory of spherical particles, for example. In embodiments, an anisotropic conductive adhesive (ASA) may be suitable, for example, when a relatively narrow distribution superconductive spherical filler is used is and filler concentration is substantially below the threshold volume fraction.

As used herein, the term "through silicon via" (TSV) is used to describe a vertical interconnect which passes substantially through one or more of a silicon wafer, a silicon die, a silicon interposer, silicon active circuits, silicon passive circuits, or other silicon circuits, components or layers. TSVs can be fabricated by different methods and approaches. In silicon (Si) via-first approaches, for example, TSVs are fabricated prior to fabrication of active devices (i.e. bipolar or MOSFET devices) to which the TSVs may be coupled. The approach includes patterning the TSVs, lining the TSVs with a high temperature dielectric (thermal oxide or chemical vapor deposition), filling the TSVs with doped polysilicon and using chemical mechanical polishing (CMP) techniques to remove excess polysilicon from one or more surfaces of the TSVs. Si via-first approaches allow for the use of high temperature processes to insulate and fill the TSVs.

In Si via-middle approaches, TSVs are fabricated after forming the active devices to which the TSVs may be coupled, but before back end of line (BEOL) stack fabrication. The approach includes patterning the TSVs after a contact process, lining the TSVs with a low temperature dielectric deposition, and then filling the TSVs with single/multiple barrier metals. Typically the TSVs are filled with Copper (Cu) and/or W. For TSVs filled with Cu, a Cu seed layer is disposed on top of a barrier layer and a subsequent Cu electroplating fills the TSVs. The TSVs are then planarized using CMP techniques. For W, chemical vapor depositing (CVD) processes are used to fill the TSVs, and CMP techniques are used to remove excess polysilicon from one or more surfaces of the TSV. W is preferred for filling high aspect ratio TSVs (e.g., TSVs with aspect ratio of height-to-width>10:1). In general, Cu is used to fill low aspect ratio TSVs (e.g., TSVs with aspect ratio<10:1). Si via-middle process are useful for fabricating TSVs with a small via pitch, TSVs having minimal blockage of wiring channels, and TSVs having a low via resistance, for example.

In front side Si via-last approaches, TSVs are fabricated at the end of the BEOL processing of the wafer. Si via-last approaches are similar to Si via middle approaches, but Si via-last approaches use low temperature dielectric depositions (<400 C) compared to higher temperature dielectric compositions (<600 C) in Si via middle approaches. Front side Si via-last approaches may be suitable for their coarse TSV feature size, which simplifies the process of integrating TSVs into semiconductor structures. The front side Si via-last approaches may also useful for wafer-to-wafer bonding. In such approaches, TSVs can be formed at the end of the wafer-to-wafer bonding process, connecting multiple layers in the multi-layer (e.g., three-dimensional (3D)) stack of wafers or semiconductor structures.

Front side Si via-last approaches may use TSV etch as well as the entire BEOL dielectric stack. Backside Si via-last approaches also use wafer to wafer (or semiconductor structure to semiconductor structure) stacking. The wafers can be bonded together using oxide bonding or polymer adhesive bonding, either front-to-front or front-to-back. The wafers can be thinned by etching and/or polishing. Additionally, a TSV may be formed in the wafers by etching a via down to bond pads on a top wafer and a bottom wafer. The process includes patterning the TSVs after the contact process, lining the TSVs with a low temperature dielectric deposition, and then filling the TSVs with a single/multiple barrier metal (e.g., Cu and/or W). The TSVs are then planarized through a subsequent CMP process.

A number of inorganic and/organic dielectric materials having a thickness in a range of about one hundred nanometers (nm) to about one thousand nm can be used to insulate the TSVs. TSV dielectrics may be required to have good step coverage (at least 50% through the depth of the trench), good thickness uniformity (<3% variation across the wafer), high deposition rate (>100 nm/min), low stress (<200 MPa), low leakage current (<1 nA/cm2), and high breakdown voltage (>5 MV/cm).

Plasma-enhanced chemical vapor deposition (PECVD) of SiO2 or SiN, or sub-atmospheric chemical vapor depositions (SACVD) of SiO2, are some examples of insulator deposition. The most commonly used conductors to fill TSVs are doped polysilicon (180 lohm-cm), tungsten (5.6 lohm-cm), or copper (1.7 lohm-cm). W deposited by CVD has a good fill of the TSV and can be integrated with the contacts to which the TSVs are to be coupled. A TiN liner is required to ensure that the WF6 precursor does not attack the Si substrate in the TSV. A disadvantage of W compared to Cu is that it has a high intrinsic stress (1400 MPa for W, 20 MPa for Cu). TSV can be superconducting during qubit operation. A superconducting TSV comprises a Titanium Nitride (TiN) and/or poly Si and/or Al and/or high Q metal. TSV can be provided as a combination of titanium-titanium nitride-tungsten and/or titanium-titanium nitride-high Q materials-tungsten and/or titanium-titanium nitride-high Q materials and/or titanium -high Q materials-tungsten and/or high Q materials-tungsten and/or high Q materials, etc.

Reactive-ion-etching (RIE) may be used to create high aspect ratio TSVs and deep trench structures in the Si (i.e., for capacitors or for isolation) in which the TSVs are provided. In one embodiment, a TSV RIE Bosch process may be used to fabricate the TSVs, with process alternating between deposition and etching steps to fabricate deep vias. SF6 isotropic etching of Si may not be suitable for forming TSVs (which require a highly anisotropic etch). Fluorocarbon chemistry (e.g., C4F8) may be used for anisotropic etching achieved through the deposition of a chemically inert passivation on the sidewall of the TSVs.

Chemical mechanical polishing (CMP) may be used for planarization of metal filled vias (e.g., micro vias), for example. Additionally, a metal contact (i.e. pad) in an upper device layer (e.g., the second device layer) may be an annulus with an about a one point five micrometer (µm) opening that also functions as a self-aligned mask (e.g., hard mask) during the plasma etch of the oxide beneath it to reach a corresponding metal contact in a lower device layer (e.g., the first device layer). In order to fully dispose and electrically couple the via, the size of the metal contacts, and thus the pitch of the vertical interconnect, is made proportional to about twice the wafer-wafer misalignment of the wafers including the first and second device layers.

As used herein, the term "superconducting organic circuitized substrate" is used to describe a substrate structure including one or more dielectric layers and one or more conductive layers (e.g., external conductive layer). The conductive layers may be positioned or otherwise disposed on the dielectric layer. Additionally, the conductive layers may include a plurality of conductor pads as part thereof. The dielectric layers may include one or more of the following dielectric materials: fiberglass-reinforced epoxy resin ("FR-4") and polytetrafluoroethylene (e.g., Teflon), including polytetrafluoroethylene filled with inorganic particles (e.g., silica), for example, as a means of controlling the coefficient of thermal expansion of the dielectric material. The dielectric layers may also include polyimide (e.g., Kapton); polyamide, cyanate resin, photo-imageable material and other like materials. One example suitable material for the dielectric layers is currently sold under the product name "RO2800" by Rogers Corporation, Rogers, Conn. ("RO2800" is a trademark of the Rogers Corporation.)

The conductive layers, which may be provided as superconductive layer(s), preferably serve to superconduct or conduct electrical signals in the circuitized substrate. In one embodiment, the conductive layers preferably include metals such as Pb, Pb plated Cu, Pb plated Al, tin-lead or tin-lead plated copper. The conductive layers may also include or comprise additional superconducting or conventional metals (e.g., niobium, aluminum, titanium, platinum, gold etc.) or alloys thereof, example. In embodiments in which the conductive layers include conventional metals (e.g., Cu, Ni, Pt, Au, etc.) and/or alloy layers but no superconducting metals or materials, for example, a circuitized substrate may be referred to as a "conventional metal circuitized substrate."

One example superconducting circuitized substrate includes multiple superconducting and/or partial signal and/or power paths separated by an organic dielectric. The paths may be interconnected with each other by superconducting and/or partially superconducting vias, for example. In embodiments, superconducting building blocks of superconducting circuitized substrates can be laminated to achieve an electrical interconnection between adjacent blocks. Each superconducting building block can have signal, voltage, and ground planes, for example. It is also possible to use signal, voltage, and ground features on a same plane of the circuitized substrate.

Two building blocks may be used to fabricate a superconducting circuitized substrate in one embodiment. One example building block (i.e., a first building block) is a signal core that is prepared by lamination and plating approaches. A lead (Pb) and/or tin-lead plated Cu based power plane (P) may be sandwiched or otherwise disposed between two (or more) layers of a relatively low dielectric constant (Dk) and relatively low loss (Df) dielectric. Alternatively the power plane can include a High Q metal or foil or High Q metal coated Cu plane. In embodiments, the dielectric is typically filled with low Dk particles to achieve a comparable coefficient of thermal expansion (CTE) with Cu. The low dielectric constant (Dk) and low loss (Df) dielectric may be favorable for electrical, mechanical, and thermal properties in some embodiments. Example low dielectric constant and low loss materials include: liquid crystal polymer (LCP), silica particle filled polytetrafluoroethylene (PTFE) and polyphenylene ether (PPE) superconducting circuitized substrate technology.

In one embodiment, signal (S) traces of the superconducting circuitized substrate are developed using a subtractive and/or additive and/or semi-additive (pattern plating) process. Such processes have been demonstrated to produce relatively fine lines (about 1-100 um) and spaces (about 2-100 um), along with laser or mechanical drilled or etched via in the range of about 1-200 µm, and an about 10-350 um plated capture pad around the via. A Pb and/or tin-lead plated Cu based signal trace is possible in some embodiments. Additionally, single or multiple high Q metal or high Q metal coated Cu based signal trace can be used in some embodiments. Dimensions of the signal trace may be selected, for example, to allow wiring designs to have one line per channel in densely populated areas of the chip site.

Another building block (i.e., a second building block) of the example superconducting circuitized substrate may include a so-called "joining layer," as defined below. In the second building block, a Pb and/or tin-lead plated Cu copper power plane may be sandwiched or otherwise disposed between layers of a dielectric. Examples of suitable dielectric materials for the dielectric can include resin coated conventional and/or superconducting material. In embodiments, laser or mechanical drilled through holes which may be formed in the dielectric, for example, may be filled with an electrically superconducting and/or partially superconducting paste. The paste may include conventional metals and/or superconducting metals and/or low melting point superconducting nano and/or micro size particles dispersed in a polymer matrix. The polymer matrix can include a mixture of a monomer and/or an oligomer which may become polymer during lamination. It is further possible to use at least one chemical cleaning agent or flowing agent or purifying agent which become part of polymer matrix during lamination. In embodiments, the paste may form one or more superconducting and/or partially superconducting connections between adjacent blocks (e.g., first and second blocks of the circuitized substrate) during lamination.

In embodiments, by alternating signal and joining portions in layers of the circuitized substrate prior to lamination, a superconducting adhesive formed from the paste may electrically connect pads of signal paths. The superconducting paste-filled interconnect technology may require the addition of a joining layer or core between each portion to be joined in some embodiments. For example, joining three structures or sub-composites (e.g., top, middle and bottom structures) together using interconnects may require at least two joining layers having superconducting paste-filled interconnects. The superconducting paste-filled interconnects may protrude above a surface of the circuitized substrate dielectric by about 5-10 µm in some embodiments. In one embodiment, lamination may be used to melt and attach or otherwise couple the protruding interconnects to circuitized sub-composites or portions adjacent to circuitized substrate joining layers.

One example advantage of this superconducting paste-filled interconnect approach is the ability to attach multiple, multilayer, substrates having different sizes. In embodiments, superconducting paste-filled interconnection methodology may be used to fabricate large area, high density rigid substrates for chips having a relatively tight pad pitch requirement. Different size rigid substrates may be laminated together with a superconducting paste-filled filled joining layer to achieve a superconducting and/or partially superconducting interconnection in a rigid structure or substrate. Electrical connections can be formed during lamination using superconducting paste-filled interconnects. As a result, one is able to fabricate structures with different sub-composites or portions of arbitrary size and shape. In embodiments, the interconnect technology offers many advantages over the more conventional structures, for example: a reduction in total processing steps, maximum possible metal layer counts, placement of multiple size rigid structures, opportunity for joining multiple rigid and/or flex layers, and the ability to grow individual 3-D structures from a same base substrate. Several different size rigid structures can be laminated with each other to produce a single packaging substrate working as one system.

As used herein, the term "miniaturized cryogenic packaging" is used to describe a package including multi-level assembly of a superconducting IC, a superconducting MCM (SMCM), interposer, dielectric interposer, circuitized circuit, etc. In embodiments, larger SMCMs and microbump technology favor convergence of chip carrier and board, and also eliminates multilevel assembly to provide unique miniaturized solutions for complex cryogenic packaging. Relatively large passive superconducting modules may horizontally connect multiple superconducting chips, for example, with IC-scale electrical routing between chips and MCM. Superconducting MCMs may be used to route power and signals from a multilayer superconducting MCM to chips through microbumps. In an example package, one or a few superconducting chips may be attached or otherwise coupled to an MCM and subsequently attached to a board or substrate through a BGA/wirebonding connection, for example.

In embodiments, a relatively high-density, finer pitch approach is capable of reducing connections and associated parasitic resistance and capacitance values between two given points on chips to enhance data throughput and functionality within a given footprint, for example. Cryogenic package miniaturization addresses multiple challenges including component footprint reduction, integration of active and passive components, I/O miniaturization, and high density (e.g., about 0.8-1 µm lines, about 2 µm spacing and about 2 µm via) superconducting interconnects. The advanced cryogenic packaging solution described herein may be found useful to achieve significant reductions in size and weight in cryogenic electronic packages.

In one embodiment, an example design feature enabling the most significant size and weight reduction is component footprint reduction. A typical backplane board assembly incorporates components such as actives, passives, and I/O components. Superconducting active components may be available in bare die flip-chip format, which provides the most leverage for size and weight reduction. However, the associated benefit can be severely limited without an enabling high-density superconducting module technology.

In some embodiments, superconducting modules are available in wirebond attached format. Wirebonding a high-density superconducting module directly to a high-density card may, for example, generally still require a footprint substantially larger than the die itself. Passive discrete components can be manipulated for miniaturization. A bill of materials review can identify surface mount capacitors, resistors, inductors, etc., where package size reduction and enhanced electrical performance is possible by replacing surface passive components with internally embedded components.

Connectors that are classified as I/O components can occupy significant volume and mass in an assembly in some embodiments. Replacing pin-in-hole connectors with relatively low-profile surface mount connectors may, for example, be used as a miniaturization technique for cryogenic packaging (e.g., to reduce the significant volume and mass associated with I/O component connectors).

An electronic component (also sometimes referred to herein as a "component") can include a discrete device or physical entity in an electronic system used to affect system operation. Components can be classified as passive, active, or electromechanical. Example components include a connector, a capacitor, a resistor, an inductor, a battery, integrated circuits, modules, bare and packaged die, etc.

As used herein, the term "electroplating" is used to describe a process by which a metal in its ionic form is supplied with electrons to form a non-ionic coating on a desired substrate. The process may use an electroplating system including a chemical solution which contains the ionic form of the metal, an anode (positively charged) which may consist of the metal being plated (a soluble anode) or an insoluble anode (usually carbon, platinum, titanium, lead, or steel). The electroplating system may also include a cathode (negatively charged) where electrons are supplied to produce a film of non-ionic metal.

As used herein, the term "electroless plating" (also known as chemical or auto-catalytic plating) is used to describe a non-galvanic type of plating method that involves several simultaneous reactions in an aqueous solution, which occur without the use of external electrical power. The reactions may be accomplished or otherwise occur when hydrogen is released by a reducing agent (e.g., sodium hypophosphite) and oxidized, producing a negative charge on a respective surface of a part or component on which the electroplating process is applied.

As used herein, the term "joining layer" is used to describe a structure capable of forming superconducting and partially superconducting contacts between devices (e.g., integrated circuits, MCM, interposers) and circuitized substrates such as PCBs. In embodiments, the joining layer may use extremely small superconductive or partially superconductive elements such as bump or microbumps, plated vias or superconductive conductive paste quantities. A joining layer may include at least one dielectric layer. Additionally, a joining layer may include at least one superconductive and/or conventional metal conductive circuit layer. The circuit layer may include a relatively high density array of contact locations, for example. Example suitable dielectric materials for the at least one dielectric layer include such materials as fiberglass-reinforced epoxy resins and polytetrafluoroethylene, including polytetrafluoroethylene filled with inorganic particles (e.g., silica), for example, as a means of controlling the coefficient of thermal expansion of the dielectric material. Example suitable dielectric materials also include polyim ides, polyamides, cyanate resins, polyphenylene ether resins, liquid crystal polymers, photo-imageable materials, and other like materials.

In embodiments in which the dielectric material(s) for the at least one dielectric layer are photo-imageable, the material(s) may be photo-imaged (or photo-patterned) and developed to reveal a desired pattern of openings in the dielectric layer. The dielectric material(s) may be curtain-coated, spin-coated or screen-applied, or supplied as dry film, for example.

In one embodiment, the joining layer is fabricated through a process including drilling or otherwise forming openings or thru-holes in the dielectric layer(s). The joining layer may be capable of forming a containment structure between an interposer and a PCB or substrate as part of a larger multilayered circuitized substrate, for example. Thru-holes in the dielectric layer(s) (e.g., an organic insulator) may be positioned or formed such that a superconducting paste may be disposed therein. The paste may include a conventional metal and superconducting metal and/or alloy and be used to form respective superconducting and/or partially superconducting interconnects in the dielectric layer openings. In one embodiment, the interconnects each extend between conventional metal or conventional metal coated conductors in a cryogenic electronic package in which the joining layer is provided (e.g., to provide a conductor-superconductor-conductor coupling arrangement). In one embodiment, the superconducting paste is substantially constrained during lamination, for example, while the openings in the dielectric layer(s) surround the interconnects formed from the paste, without adversely affecting the superconducting and/or partially superconducting connection formed.

Referring to FIG. 1, a flowchart (or flow diagram) illustrating an example method 100 for fabricating an interconnect structure (e.g., interconnect structure 1200, shown in FIG. 2A) according to the concepts, systems, circuits and techniques sought to be protected herein is shown. The method 100 may, for example, be implemented in semiconductor manufacturing equipment used for fabricating interconnect structures.

Rectangular elements (typified by element 105 in FIG. 1), as may be referred to herein as "processing blocks," may represent computer software instructions or groups of instructions (e.g., as may be executed by a processor of semiconductor manufacturing equipment). Diamond shaped elements (typified by element 120 in FIG. 1), as may be referred to herein as "decision blocks," represent computer software instructions, or groups of instructions, which affect the execution of the computer software instructions represented by the processing blocks. The processing blocks and decision blocks can represent steps performed by functionally equivalent circuits such as a digital signal processor circuit or an application specific integrated circuit (ASIC).

The flow diagram does not depict the syntax of any particular programming language. Rather, the flow diagram illustrates the functional information one of ordinary skill in the art requires to fabricate interconnect structures or to generate computer software to perform the processing required to fabricate the interconnect structures. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including that sequential blocks can be performed simultaneously and vice versa.

As will become apparent from the description herein below, a result of the method 100 may be an interconnect structure having an increased aspect ratio (i.e., relationship between a first selected dimension and a second selected dimension of the interconnect structure) in comparison to conventional interconnect structures. Consequently, the interconnect structures provided using method 100 may be used to form or otherwise provide multi-layer semiconductor structures (e.g., 900, shown in FIG. 9) which are not otherwise possible using conventional interconnect structures. Such multi-layer semiconductor structures may, for example, include at least one superconducting semiconductor structure or integrated circuit (IC), as will be further discussed below in connection with FIG. 9.

As illustrated in FIG. 1, an example method 100 for fabricating an interconnect structure (e.g., 1200, shown in FIG. 2A) according to a first embodiment of the disclosure begins at block 105. At block 105, a semiconductor structure including a substrate (e.g., 210, shown in FIG. 2) having at least one interconnect pad (e.g., 220, shown in FIG. 2) is provided. The substrate (e.g., a silicon (Si) substrate) may be a single or multi-layer substrate. Additionally, the interconnect pad may be provided from one or more under bump metal (UBM) materials and is disposed over a surface of the substrate.

At block 110, a first spin resist and bake cycle is performed on the semiconductor structure provided at block 105. In particular, at block 110, a first predetermined amount of resist material (e.g., a photoresist material) is disposed over one or more portions (e.g., a center portion) of the semiconductor structure. The resist material may, for example, be applied or otherwise disposed over one or more portions of a surface of the interconnect pad.

At block 110, the resist material is also disposed over one or more surfaces of the semiconductor structure using spin coating techniques as may be performed in a spin coater machine for example. The spin coater machine may rotate the semiconductor structure about a platform at a predetermined rate (e.g., angular speed) and for a predetermined time period in order to spread the resist layer over interconnect pad and the substrate of the semiconductor structure. In particular, the semiconductor structure may be rotated until a desired (i.e., predetermined) thickness of the resist material (i.e., a distance between first and second surfaces of the resist material) is achieved on the semiconductor structure.

In one embodiment, the predetermined rate is about two thousand rotations per minute (RPM). Additionally, in one embodiment, the predetermined time period is about thirty seconds. It should be appreciated that the predetermined rate and the predetermined time period may be selected to provide a desired thickness of resist material over the substrate and interconnect pad. Generally, the higher the predetermined rate (i.e., angular speed) of spinning, the less the resist material thickness will be. Additionally or alternatively, a dry negative resist material (e.g., DuPont MX5000) may be applied to the semiconductor structure, and a slot die coating and/or combinations of coatings can be applied to achieve the desired resist thickness.

Further, at block 110, subsequent to the resist material being spread over the semiconductor structure, the semiconductor structure is baked (e.g., in a heat treatment oven) at a predetermined temperature and for a predetermined time period to form a resist layer (e.g., 230, shown in FIG. 2) from the resist material. In one embodiment, the predetermined temperature is about one hundred fifty degrees Celsius (C). Additionally, in one embodiment, the predetermined time period is about one minute. The resist layer formed at block 110 has first and second opposing surfaces, with the first surface of the resist layer disposed (or formed) over the second surface of the interconnect pad and over the second surface of the substrate. Generally, after the first spin resist and bake cycle, the resist layer has a non-uniform thickness. In other words, a distance between the first and second surfaces of the resist layer is generally not uniform throughout the resist layer.

At block 115, a next spin resist and bake cycle is performed on the semiconductor structure. During the next spin resist and bake cycle, a second predetermined amount of a resist material is disposed over one or more portions (e.g., a center portion) of the second surface of the resist layer formed at block 110. Additionally, during the next spin resist and bake cycle, the semiconductor structure is rotated by the spin coater machine at a second predetermined rate for a second predetermined time period. Similar to the first spin resist and bake cycle, the semiconductor structure may be rotated until a desired thickness of the resist material is achieved on the semiconductor structure (here, on the resist layer of the semiconductor structure).

At block 115, the semiconductor structure is also baked at a predetermined temperature and for a predetermined time period to form a resist layer having a thickness which is greater than a thickness of the resist layer formed at block 110. In one embodiment, the predetermined temperature is about one hundred fifty degrees Celsius (C). Additionally, in one embodiment, the predetermined time period is about one minute.

The next spin resist and bake cycle performed at block 115 may, for example, smooth resist layer surfaces (i.e., reduce non-uniformities in the resist layer). Additionally, the next spin resist and bake cycle may substantially increase (sometimes, drastically increase) the thickness of the resist layer In general, spin speeds (e.g., first and second spin speeds) may determine the total thickness of the resist layer, as described further in connection with FIG. 3.

At block 120, it is determined whether any additional spin resist and bake cycles are needed. If it is determined that additional spin resist and bake cycles are needed, the method 100 returns to block 115 and blocks 115 and 120 are repeated until it is determined that no additional spin resist and bake cycles are needed. Alternatively, if it is determined that no additional spin resist and bake cycles are needed, the method 100 may proceed to a block 125.

A number of spin resist and bake cycles performed in method 100 may, for example, be selected to achieve a resist layer having a predetermined thickness (e.g., about twenty nine μm). Additionally, the number of spin resist and bake cycles performed in method 100 may be based, at least in part, on a desired aspect ratio of a conductive structure (e.g., 1240, shown in FIG. 2A) to be formed in the interconnect structure (e.g., 1200, shown in FIG. 2A), as will be further discussed below in connection with FIGS. 2 and 2A. Let it suffice here to say that according to method 100, the resist layer should have a thickness (i.e., a distance between first and second opposing surfaces) which is less than a height (i.e., a distance between first and second opposing portions) of the conductive structure (e.g., bump) to be formed in the interconnect structure.

Referring now to block 125, at block 125 a mask is disposed over the second surface of the resist layer and the resist layer is exposed to an exposure energy (e.g., thermal energy) to form an opening (e.g., 232, shown in FIG. 2) in the resist layer. The opening, which is formed according to a pattern in the mask, has a predetermined shape which is suitable for receiving conductive materials as may be used to form a conductive structure (e.g., 1240, shown in FIG. 2A). Additionally, the exposure energy has a predetermined intensity distribution and the resist layer is exposed to the exposure energy for a predetermined time period. In one embodiment, the predetermined intensity distribution is about six hundred forty millijoules (mJ) per square centimeter ($cm^2$).

In embodiments in which the resist layer is provided from a positive photoresist material (e.g., Polymethyl methacrylate (PMMA)), exposure to the exposure energy (e.g., ultraviolet (UV) light) causes the resist layer to become more soluble (e.g., easier to dissolve when developed at block 135). In contrast, in embodiments in which the resist layer is provided from a negative photoresist material (e.g., EPON™ SU-8 epoxy resin), exposure to the exposure energy causes the resist layer to become polymerized and, thus, more difficult to dissolve.

It follows that a pattern of the mask disposed over the resist layer at block 125 is based upon the material from which the resist layer is provided. For example, the mask of a resist layer provided from a positive photoresist material should have a pattern which corresponds to a pattern of the resist layer to remain on the semiconductor structure (e.g., subsequent to development at block 130). In contrast, the mask of a resist layer provided from a negative photoresist material should have a pattern which is the inverse (i.e., a photographic negative) of a pattern of the resist layer to remain on the semiconductor structure.

At block 125, a post expose bake process is also performed on the semiconductor structure. In particular, the semiconductor structure is baked at a predetermined temperature and for a predetermined time period. In one embodiment, the predetermined temperature is about one hundred degrees C. Additionally, in one embodiment, the predetermined time period is about one minute.

At block 130, the resist layer of the semiconductor structure is developed, for example, by a resist developer, such as Resist Developer RD6 by Futurrex, Inc. The resist layer may be developed by immersing the semiconductor structure in a developer solution for a predetermined time period (e.g., about two minutes). The resist layer may also be developed by spraying the semiconductor structure with the developer solution for the predetermined time period. In embodiments in which the resist layer is provided from a positive photoresist material, exposed portions of the resist layer are generally removed (or washed away) by the developer solution. In contrast, in embodiments in which the resist layer is provided from a negative photoresist material, unexposed portions of the resist layer are generally removed by the developer solution.

At block 130, subsequent to the resist layer being developed in the developer solution, the semiconductor structure may also be rinsed (e.g., with deionized water) to remove the developer solution from the semiconductor structure. The semiconductor structure may also be rinsed to prepare the semiconductor structure for the post development bake process performed at block 130.

In particular, at block 130, the semiconductor structure is baked at a predetermined temperature and for a predetermined time period. In one embodiment, the predetermined temperature is about one hundred degrees C. Additionally, in one embodiment, the predetermined time period is about one minute. The post development bake process may, for example, be a very slow process which is performed at a low temperature to reduce (or, ideally eliminate) resist bubbles and or residual solvent that may exist on the semiconductor structure. The post development bake process is especially important for thicker resists. In one example, the post expose bake process is performed at a temperature of about one hundred degrees Celsius for about one minute and the post development bake process is performed at a temperature of about seventy degrees Celsius for about five minutes.

At block 135, one or more surfaces of the semiconductor structure are cleaned through a plasma cleaning process for a predetermined time period (e.g., about two minutes). In one embodiment, the resist process needs to use a dry cleaning and or etching process when evaporating conductor materials through the resist opening. The resist process can use liquid cleaning and or etching process when plating conductor materials through the resist opening. The cleaning and or etching process may, for example, prepare the semiconductor structure for receiving a conductive material or layer at block 140.

At block 140, a conductive material (e.g., a superconducting material) is deposited or otherwise disposed in the opening formed in the resist layer. The conductive material is also disposed or deposited over edges of the opening and the second surface of the resist layer. The conductive material may form a conductive layer (e.g., 240, shown in FIG. 2), which conductive layer may be electrically coupled to the interconnect pad.

At block 145, a conductive structure (e.g., 1240, shown in FIG. 2A) is formed from the conductive material or layer. For example, selected portions of the conductive material or layer may be lifted-off or etched (e.g., through a flash etch process) to produce the conductive structure. Additionally, at block 145, the resist layer of the semiconductor structure may be removed (e.g., stripped with a solvent, such as acetone) from the second surface of the interconnect pad and from the second surface of the substrate to expose the interconnect pad and the substrate.

Upon completion of block 145, the method 100 may end. The method 100 ending may, for example, be indicative of completion of the fabrication process of the interconnect structure (e.g., 1200, shown in FIG. 2A). The method 100 may be repeated (e.g., in response to a processor in the semiconductor manufacturing equipment receiving or generating a control signal) for fabricating additional interconnect structures. In one aspect of the disclosure, method 100 provides for an interconnect structure having a thicker conductive structure or bump (e.g., 1240, shown in FIG. 2A) than conventional interconnect structures).

Referring now to FIGS. 2 and 2A, in which like elements are provided having like reference designations, cross-sections of an example semiconductor structure (200, shown in FIG. 2) and of an example interconnect structure (1200, shown in FIG. 2A) as may be fabricated in accordance with method 100 are shown.

Referring now to FIG. 2, a semiconductor structure 200 includes a substrate 210, an interconnect pad 220, a resist layer 230 and a conductive layer 240. Substrate 210 (e.g., a Silicon (Si) substrate) has first and second opposing surfaces and a plurality of electrical connections (e.g., vias) extending between the first and second surfaces. Additionally, interconnect pad 220 (e.g., an under bump metal) has first and second opposing surfaces, with the first surface of the interconnect pad 220 disposed over or beneath (e.g., attached or otherwise coupled to) a selected portion of the second surface of the substrate 210. The first surface of the interconnect pad 220 may also be electrically coupled to selected ones of the electrical connections in substrate 210. The electrical coupling may, for example, occur through bond wires or via contacts spaced between the first surface of interconnect pad 220 and the electrical connections in a region beneath the interconnect pad 220.

The resist layer 230, which may be provided from a negative photoresist material or a positive photoresist material (or another polymer that has a property of becoming more soluble when exposed to ultraviolet light), has first and second opposing surfaces. Resist layer 230 is disposed over the second surface of interconnect pad 220 and the second surface of substrate 210. Additionally, resist layer 230 comprises a plurality of resist layer portions (here, two portions 230a, 230b). Each of the resist layer portions 230a, 230b is formed during a respective spin resist and bake cycle (e.g., first cycle 110 or next cycle 115 of method 100) of a plurality of spin resist and bake cycles (i.e., of at least two cycles). For example, resist layer portion 230a may be formed during first cycle 110 of method 100. Additionally, resist layer potion 230b may be formed during next cycle 115 of method 100.

Each of the resist layer portions 230a, 230b of resist layer 230 also has an associated height or thickness (here, distances DRP1, DRP2 between first and second opposing surfaces of resist layer portions 230a, 230b, respectively).

Additionally, a predetermined distance DR1 exists between the first and second surfaces of the resist layer 230. The predetermined distance DR1 corresponds to a height or thickness of the resist layer 230 (and a sum of the heights or thicknesses of resist layer portions 230a, 230b). In one embodiment, the predetermined distance DR1 of the resist layer 230 is selected to be less than a predetermined height or thickness of the conductive structure which will be formed in an interconnect structure according to method 100 (e.g., 1200, shown in FIG. 2A). Additionally, a number of spin and bake cycles used to produce the resist layer 230 is selected based upon the predetermined distance DR1 to be achieved.

An opening 232 having a predetermined shape is formed or otherwise provided in a selected portion of the resist layer 230 for receiving conductive materials (or a conductive layer 240, as will be discussed) as may be used to form a conductive structure (e.g., 1240, shown in FIG. 2A). In the illustrated embodiment, the opening 232 extends between the second surface of the resist layer 230 and the second surface of the interconnect pad 220 (and, thus, the first surface of the resist layer 230). Additionally, the predetermined shape of the opening 232 is selected based upon a shape of the conductive structure to be formed in the opening 232. The manner in which the opening 232 is formed may depend upon the materials from which the resist layer 230 is provided (e.g., positive or negative photoresist materials), as discussed above in connection with FIG. 1.

Conductive layer 240, which is provided from one or more superconducting materials (e.g., niobium (Nb)), is disposed in the opening 232 formed in the resist layer 230 and disposed over edges of the opening 232 and the second surface of the resist layer 230. The conductive layer 240 is electrically coupled to the second surface of interconnect pad 220. The conductive layer 240 may be disposed using one or more physical (e.g., sputter) and chemical (e.g., electroless) deposition processes. Additionally, the conductive layer 240 may be patterned using an etching (e.g., flash etching) process. The conductive layer 240 is electrically coupled to the second surface of interconnect pad 220. A conductive structure 1240 may be formed from the conductive layer 240, as will be discussed below in connection with FIG. 2A.

Referring now to FIG. 2A, interconnect structure 1200 results after the lift off technique used to remove resist 230 and all material disposed over the resist layer 230.

That is, selected portions of conductive layer 240 of structure 200 of FIG. 2 are lifted-off or etched (e.g., through a flash etch process) to produce conductive structure 1240 of FIG. 2A. Additionally, resist layer 230 of semiconductor structure 1200 is removed (e.g., stripped with a solvent) from the second surface the interconnect pad 220 and from the second surface of the substrate 210 to expose the interconnect pad 220 and the substrate 210.

Conductive structure 1240 has first and second opposing portions, with the first portion of the conductive structure 1240 disposed over and electrically coupled to the second surface of interconnect pad 220. Conductive structure 1240 also has a predetermined shape, with the predetermined shape taking the form of a trapezoidal prism in the illustrated embodiment. It follows that the cross section of the conductive structure 1240 shown in FIG. 2A takes the form of a trapezoid.

Conductive structure 1240 has a first dimension D1 corresponding to a distance between the first and second portions (here, first and second bases B1, B2) of the conductive structure 1240. Conductive structure 1240 also has a second dimension D2 corresponding to a dimension of the first portion of the conductive structure 1240 which is disposed over the second surface of the interconnect pad 220 (here, a width or length of first base B1). In one aspect of the concepts, systems, circuits and techniques sought to be protected herein, an aspect ratio of the first dimension D1 of the conductive structure 1240 to the second dimension D2 of the conductive structure 1240 is substantially greater than or equal to about one. In other words, the conductive structure 1240 has an aspect ratio of about one to one (1:1) or greater. For example, the first dimension D1 may have a value of about thirty micrometers and the second dimension D2 may have a value of about forty micrometers to provide for an aspect ratio of about four to three (4:3).

The number of spin cycles performed in method 100 to produce resist layer 230 (and subsequently the conductive structure 1240) may, for example, be based, at least in part, on a desired aspect ratio. As discussed above, in one embodiment, the predetermined distance DR1 of resist layer 230 shown in FIG. 2 is selected to be less than a predetermined height or thickness (here, dimension D1) of the conductive structure 1240 shown in FIG. 2A. In one example, double spin coated resist layer thickness around 30 micron may be used to produce a micro bump having a height in the range of about 6 to about 40 micron (e.g. a 6-40 micron tall microbump). In another example, around 10 micron thick single resist coating may be used to provide a micro bump having a height of about 15 micron (e.g. around a 15 micron tall microbumps). In another example, around 10 micron thick resist targeted for 15 micron diameter bump having a top resist opening around 10-16 and bottom resist opening around 16-22 micron able to produce 6-15 micron tall microbumps. In another example, around 6-9 micron thick resist targeted for 5-7 micron diameter bump having top resist opening around 4-8 and bottom resist opening around 6-10 micron able to produce 4-12 micron tall microbumps.

Figure 9:
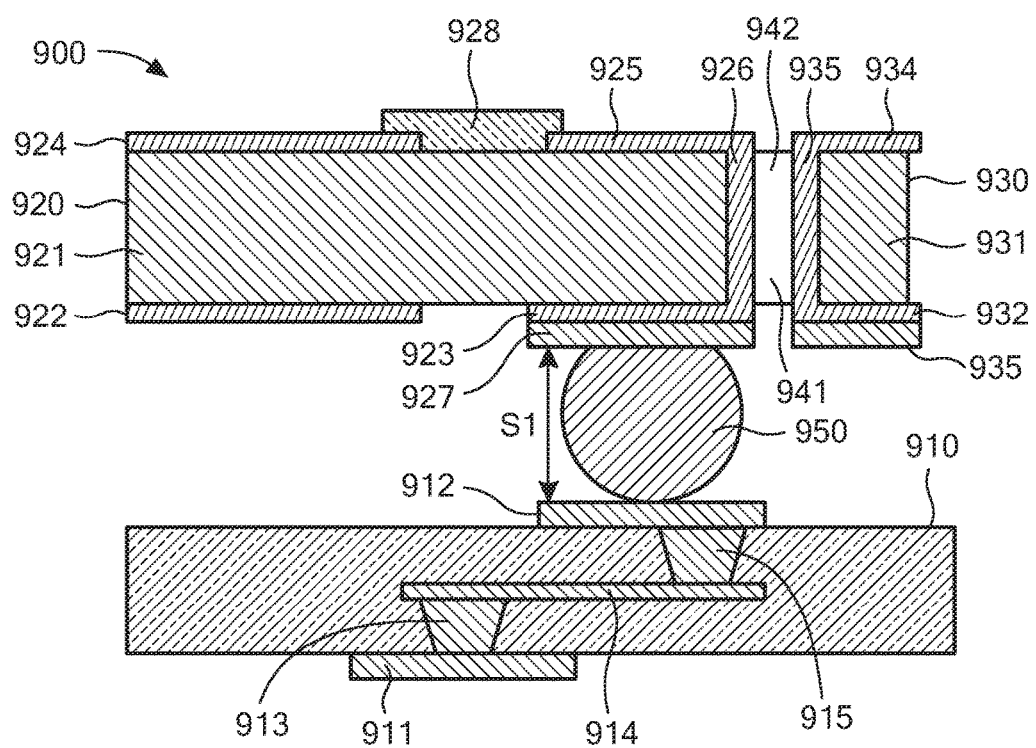
FIG. 9 is a block diagram of an example semiconductor structure as may be formed using an interconnect structure according to the disclosure.

While conductive structure 1240 is shown and described as having a generally trapezoidal prism shape in the illustrated embodiment, it should be appreciated that the conductive structure 1240 may take the form of a variety of different shapes. For example, the conductive structure 1240 may take the form of a sphere, a cube, a cylinder, a pyramid, a cone, or any number of other shapes, including irregular shapes, or shapes with fences, as will be apparent to those of ordinary skill in the art. In one embodiment, the shape of the conductive structure 1240 depends upon the fabrication process used to fabricate the conductive structure 1240. Additionally, in one embodiment, the shape of the conductive structure 1240 depends upon a shape of a conductive structure or interconnect pad to which the conductive structure 1240 may be coupled to in fabricating a multi-layer semiconductor structure (e.g., 900, as shown in FIG. 9).

The above-described conductive structure 1240, interconnect pad 220 and substrate 210 collectively form an interconnect structure (here, interconnect structure 1200) for electrically and mechanically coupling a semiconductor structure to one or more other semiconductor structures (e.g., to form a multi-layer semiconductor structure, as will be discussed).

Additional aspects of the concepts, systems, circuits and techniques sought to be protected herein, with particular emphasis on interconnect structures (e.g., 1200, shown in FIG. 2) formed according to various methods of the disclosure (e.g., 100, shown in FIG. 1), are described in conjunction with the figures below.

Figure 3:
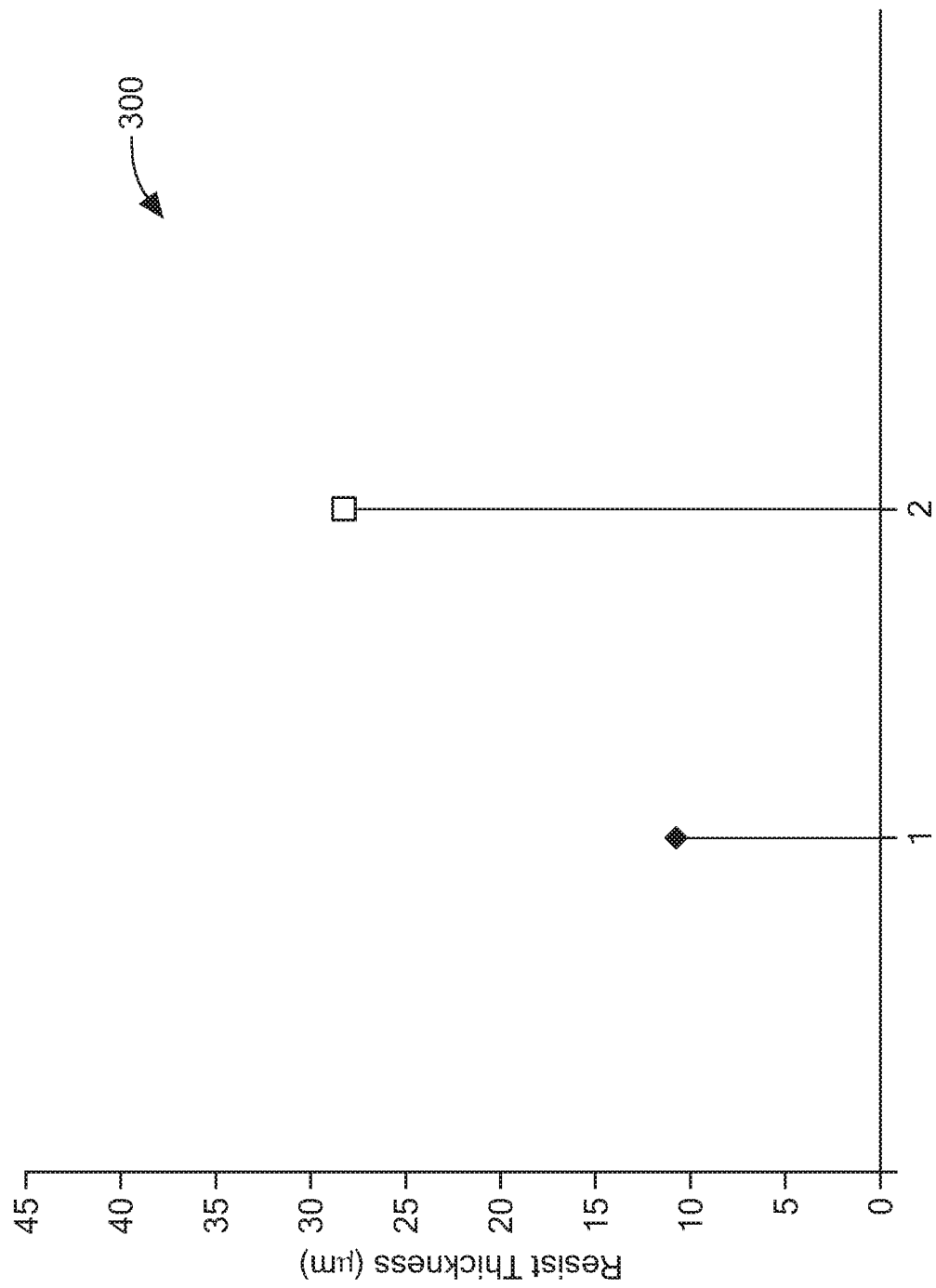
FIG. 3 is a plot illustrating an example relationship between number of spin resist and bake cycles and resist thickness.

Referring to FIG. 3, a plot 300 shows an example relationship between number of spin resist and bake cycles (e.g., first and next spin and bake cycles performed at blocks 110 and 115 of method 100) and resist thickness of a resist layer (e.g., 230, shown in FIG. 2) resulting from the spin and bake cycles. The plot 300 has a horizontal axis corresponding to the number of spin resist and bake cycles (e.g., N=1, 2, etc.). Additionally, the plot 300 has a vertical axis with a scale in resist thickness units (e.g., micrometers (μm)). Each of the spin cycles is performed at a predetermined frequency (here, a frequency of about two thousand rotations per minute) in the plot shown.

As illustrated, resist thickness of the resist layer substantially increases from about ten μm to about thirty μm when the number of spin resist and bake cycles is increased from one cycle to two cycles. In other words, the resist thickness increases in response to a corresponding increase in number of resist layer portions (e.g., resist layer portions 230a, 230b, shown in FIG. 2) provided in the resist layer. It should be appreciated that resist thickness will further increase in response to an increased number of cycles (e.g., three or more cycles) and an increased number of resist layer portions provided in the resist layer.

A first resist may, for example, experience a first bake cycle (110) and second bake cycle (115) before expose. Optimization temperatures, times and other characteristics of the bake cycles may necessary for a multiple coating process. In one example, a first bake cycle (110) is performed at a temperature of about one hundred fifty degrees Celsius for about one minute, and a second bake cycle (115) is performed at a temperature of about one hundred fifty degrees Celsius for about one minute. As discussed in FIG. 1, above, baking is the step during which almost all of the solvents are removed from the photoresist coating of the semiconductor structure and become photosensitive, or imageable. Overbaking may degrade the photosensitivity of resists by either reducing the developer solubility or actually destroying a portion of the sensitizer. Additionally, underbaking may prevent light from reaching the sensitizer.

It should also be appreciated that the resist thickness is related to the predetermined frequency. It follows that resist thickness will vary based upon the predetermined frequency. Further, it should be appreciated that the spin cycles need not be performed at a same or similar frequency.

As discussed in figures above, the number of spin cycles to be performed may be based on a desired aspect ratio of a conductive structure (e.g., 1240, shown in FIG. 2A) to be formed in an opening of the resist layer (e.g., 230, shown in FIG. 2).

Figure 4:
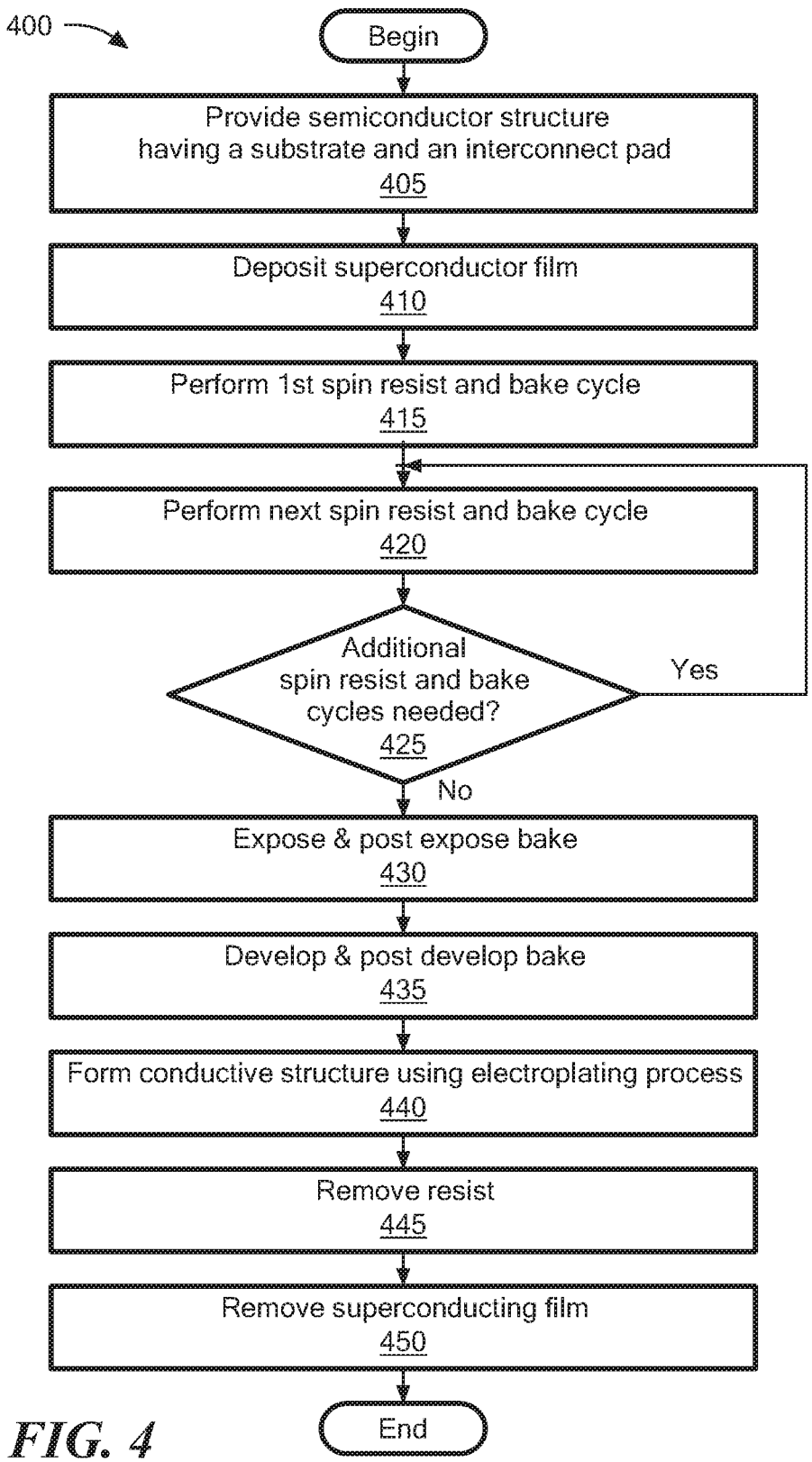
FIG. 4 is a flowchart illustrating another example method for fabricating a interconnect structure in accordance with an embodiment of the disclosure.

Another example method of fabricating an interconnect structure according to the disclosure (e.g., interconnect structure 1500, shown in FIG. 5A) is shown in FIG. 4.

As illustrated in FIG. 4, another example method 400 for fabricating a interconnect structure (e.g., 1500, shown in FIG. 5A) begins at block 405. At block 405, a semiconductor structure including a substrate (e.g., 510, shown in FIG. 5) having at least one interconnect pad (e.g., 520, shown in FIG. 5) is provided. The substrate may be a single or multi-layer substrate. Additionally, the interconnect pad may be provided from one or more UBM materials. The interconnect pad is disposed over a surface of the substrate.

At block 410, a superconducting film (e.g., 550, shown in FIG. 5) is deposited over one or more portions (e.g., interconnect portions) of the semiconductor structure provided at block 405. The superconducting film (e.g., a thin, substantially continuous film) may, for example, form an electrical connection between the interconnect pad and a power source of an electroplating circuit for an electroplating process, as will be discussed further below in connection with block 440.

At block 415, a first spin resist and bake cycle (also sometimes referred to herein as a "first cycle") is performed on the semiconductor structure. The first cycle comprises disposing a first predetermined amount of resist material over one or more portions of the semiconductor structure. Additionally, the first cycle comprises disposing (or spreading) the resist material over one or more surfaces of the semiconductor structure using spin coating techniques. The spin coating techniques may comprise rotating the semiconductor structure about a platform of a spin coater machine at a first predetermined rate and for a first predetermined time period in order to spread the resist material. The semiconductor structure may, for example, be rotated by the spin coater machine until a desired thickness of the resist material (i.e., a distance between first and second opposing surfaces of the resist material) is achieved on the semiconductor structure.

The first cycle performed at block 415 further comprises baking the semiconductor structure at a predetermined temperature and for a predetermined time period to form a first resist layer (or a first portion of a resistor layer) from the resist material disposed over the semiconductor structure. The first resist layer (e.g., 530a, shown in FIG. 5) has first and second opposing surfaces, with the first surface of the first resist layer disposed (or formed) over a surface of the interconnect pad and over a surface of the substrate. In some embodiments, the first cycle performed at block 415 is the same as or similar to the first cycle performed at block 110 of method 100.

At block 420, a next spin resist and bake cycle (also sometimes referred to herein as a "next cycle") is performed on the semiconductor structure. The next cycle comprises disposing a second predetermined amount of a resist material over one or more portions of the second surface of the first resist layer formed at block 415. Additionally, the next cycle comprises disposing (or spreading) the resist material over one or more surfaces of the first resist layer using spin coating techniques. The spin coating techniques may comprise rotating the semiconductor structure about a platform of a spin coater machine at a second predetermined rate and for a second predetermined time period in order to spread the resist material. The semiconductor structure may, for example, be rotated by the spin coater machine until a desired thickness of the resist material (i.e., a distance between first and second opposing surfaces of the resist material) is achieved on the first resist layer.

The next cycle performed at block 420 further comprises baking the semiconductor structure at a predetermined temperature and for a predetermined time period to form a next resist layer (or next portion of a resist layer) from the resist material. In one embodiment, the next resist layer has a thickness (e.g., a distance between first and second opposing surfaces) which is substantially greater than a thickness of the first resist layer formed at block 415. Additionally, the next resist layer may have a more uniform surface than the first resist layer. In some embodiments, the next cycle performed at block 420 is the same as or similar to the next cycle performed at block 115 of method 100.

At block 425, it is determined whether any additional spin resist and bake cycles are needed. If it is determined that additional spin resist and bake cycles are needed, the method 400 returns to block 420 and blocks 420 and 425 are repeated until it is determined that no additional spin resist and bake cycles are needed. Alternatively, if it is determined that no additional spin resist and bake cycles are needed, the method 400 may proceed to a block 430.

Similar to method 400, a number of spin resist and bake cycles performed in method 400 may be selected to achieve a resist layer (i.e., a resist layer comprising the first resist layer and at least one next resist layer) having a predetermined thickness. Additionally, similar to method 400, the number of spin resist and bake cycles performed in method 400 may be based, at least in part, on a desired aspect ratio of a conductive structure (e.g., 540, shown in FIG. 5A) to be formed in the interconnect structure (e.g., 1500, shown in FIG. 5A).

Referring now to block 430, at block 430 a mask is disposed over the second surface of the resist layer and the resist layer is exposed to an exposure energy (e.g., thermal energy) to form an opening (e.g., 532, shown in FIG. 5) in the resist layer. The opening, which is formed according to a pattern in the mask, has a predetermined shape which is suitable for receiving conductive materials as may be used to form a conductive structure (e.g., 540, shown in FIG. 5A).

In embodiments in which the resist layer is provided from a positive photoresist material, exposure to the exposure energy causes the resist layer to become more soluble (e.g., easier to dissolve when developed at block 435). In contrast, in embodiments in which the resist layer is provided from a negative photoresist material, exposure to the exposure energy causes the resist layer to become polymerized and, thus, more difficult to dissolve.

It follows that a pattern of the mask disposed over the resist layer at block 430 is based upon the material from which the resist layer is provided. For example, the mask of a resist layer provided from a positive photoresist material should have a pattern which corresponds to a pattern of the resist layer to remain on the semiconductor structure (e.g., subsequent to development at block 435). In contrast, the mask of a resist layer provided from a negative photoresist material should have a pattern which is the inverse (i.e., a photographic negative) of a pattern of the resist layer to remain on the semiconductor structure.

At block 430, a post expose bake (PEB) process is also performed on the semiconductor structure. In particular, the semiconductor structure is baked at a predetermined temperature and for a predetermined time period. The PEB process may, for example, be used to induce diffusion of the photogenerated compound in order to smooth out the interference effect on the resist profile.

At block 435, the resist layer of the semiconductor structure is developed. The resist layer may be developed, for example, by immersing the semiconductor structure in a developer solution for a predetermined time period. The resist layer may also be developed by spraying the semiconductor structure with the developer solution for the predetermined time period. In embodiments in which the resist layer is provided from a positive photoresist material, exposed portions of the resist layer are generally removed (or washed away) by the developer solution. In contrast, in embodiments in which the resist layer is provided from a negative photoresist material, unexposed portions of the resist layer are generally removed by the developer solution.

At block 435, subsequent to the resist layer being developed in the developer solution, the semiconductor structure may also be rinsed (e.g., with deionized water) to remove leftover developer solution from the semiconductor structure. The semiconductor structure may also be rinsed to prepare the semiconductor structure for the post development bake process performed at block 435. In particular, at block 435, the semiconductor structure is baked at a predetermined temperature and for a predetermined time period (e.g., to solidify the resist layer). The post develop bake process performed at block 435 may, for example, reduce or eliminate residual developer from the resist opening and may be necessary in order to harden the photoresist and improve adhesion of the photoresist to the wafer surface.

At block 440, a conductive structure (e.g., 540, shown in FIG. 5) is formed or otherwise provided on a surface of the interconnect pad (e.g., 520, shown in FIG. 5) using an electroplating process. The electroplating process may, for example, include forming an electroplating circuit from the interconnect pad, a structure (e.g., a rod) containing a conductive material to be deposited on the interconnect pad, and a power source (e.g., a battery). In particular, the electroplating circuit may be formed by coupling the interconnect pad to a negative terminal (i.e., an anode) of the power source (e.g., via a superconducting film, such as film 550, shown in FIG. 5). Additionally, the electroplating circuit may be formed by coupling the structure containing the conductive material to be deposited on the interconnect pad to a positive terminal (i.e., a cathode) of the power source. The structure containing the conductive material and the interconnect pad form positive and negative electrodes of the circuit, respectively.

The electroplating process may also include completing the electroplating circuit by immersing the positive and negative electrodes of the circuit (i.e., the structure containing the conductive material and the interconnect pad) into an electrolyte solution contained in a "cell" or tank. The electrolyte solution comprises a salt of a same material (e.g., Al) as the interconnect pad to be plated by the conductive material. As electricity passes through the cell, positively charged ions of the conductive material are attracted to the negatively charged interconnect pad. The foregoing results in the conductive material dissolving from the structure containing the conductive material (e.g., by oxidation) and in the conductive material being deposited on or plating one or more surfaces of the interconnect pad. Strength of the power source and concentration of the electrolyte may, for example, be increased or decreased to control a speed at which ions and electrons move through the circuit and to control a speed of the plating process.

After a predetermined time period, a predetermined amount of the conductive material is deposited on the interconnect pad to form a conductive structure (e.g., 540, shown in FIG. 5). The conductive structure has a first portion which is disposed over and coupled to a surface of the interconnect pad and a second, opposing portion. The second portion of the conductive structure may, for example, have a substantially convex (or mushroom like) surface (e.g., 540*a*, shown in FIG. 5) in embodiments in which the resist layer has a thickness which is less than a height of the conductive structure (e.g., due to spill over of the conductive materials).

It should be appreciated that the electroplating process described above is but one of many potential processes which may be used to form the conductive structure. Upon completion of block 440, the method proceeds to a block 445.

At block 445, remaining portions of the resist layer are removed from the semiconductor structure. Additionally, in some embodiments, selected portions of the conductive structure are etched with the resist stripper at block 445 to further define a shape of the conductive structure.

At block 450, the superconducting film deposited at block 410 is removed (e.g., etched through a flash etch process) from the semiconductor structure. Upon completion of block 450, the method 400 may end. Additionally, in some embodiments, selected portions of the conductive structure are etched (e.g., through a flash etch process) at block 450 to pattern the conductive structure. The method 400 ending may, for example, be indicative of completion of the fabrication process of the interconnect structure (e.g., 1500, shown in FIG. 5A). The method 400 may be repeated (e.g., in response to a processor in the semiconductor manufacturing equipment receiving or generating a control signal) for fabricating additional interconnect structures.

Alternatively, for electroplating of uniform bumps, substantially all contact (or interconnect) pads may use a continuous top Al and or Nb layer of a TSV carrier and a MCM to perform electroplating. Firstly, a UBM may be formed on a continuous top Al and or Nb layer of TSV and MCM by a lift-off process and e-beam evaporation. In one embodiment, a lift-off mask used during the lift-off process includes an AZ photoresist. After the lift-off process, a new photolithography may be performed to create substantially circular (or other shaped) openings in the photoresist for electroplating of bumps on the UBM.

In one example, indium bump electroplating uses an electrolytic cell with indium sulfamate bath and a solid Indium anode. Alternatively, tin-lead bump electroplating uses an electrolytic cell with a Rohm and Haas tin-lead electrolytic solution bath and a tin-lead rod is used as the anode. After the plating, the photoresist is removed and the wafer (or semiconductor structure) is cleaned. At the end of the process (or near the end of the process), the top Al and or Nb layer of the TSV carrier or MCM may be patterned by using photolithography and dry and or wet etching.

In another embodiment, it is possible to deposit a very thin, substantially continuous Al and or Nb layer through the passivation opening on top of patterned Al and or Nb pad of the TSV carrier or MCM. The thin continuous Al and or Nb layer may create an electrical contact wherever UBM creates an electrical contact with a patterned Al and or Nb pad of the TSV carrier or MCM. Firstly, a UBM may be formed on continuous top Al and or Nb layer of TSV and MCM by a lift-off process and e-beam evaporation. In one embodiment, a lift-off mask used during the lift-off process includes an AZ photoresist. After the lift-off process, a new photolithography may be performed to create substantially circular (or other shaped) openings in the photoresist for electroplating of bumps on the UBM.

In one example, indium bump electroplating uses an electrolytic cell with indium sulfamate bath and a solid In anode. After the plating, the photoresist may be removed and the wafer (or semiconductor structure) may be cleaned. At the end of the process (or near the end of the process), the top Al and or Nb layer of TSV carrier or MCM may be removed by dry and or wet etching. In one embodiment, Indium and a UBM may act as a mask.

In one aspect of the disclosure, method 400 is a selective plating process which is more economical than method 100. Method uses a minimum amount of material for plating whereas method 100 uses a liftoff process which may have a lot of conducive material wastage. Method 100 is a dry process which has minimum impact to the active and or passive and or superconducting circuits and or their properties. In contrast, method 400 uses (and structures fabricated used method 400 may be exposed to) various chemicals which may impact the active and or passive and or superconducting circuits and or their properties.

Referring now to FIGS. 5 and 5A, in which like elements are provided having like reference designations, cross-sections of an example semiconductor structure (500, shown in FIG. 5) and of an example interconnect structure (1500, shown in FIG. 5A) as may be fabricated in accordance with method 400 are shown.

Referring now to FIG. 5, a semiconductor structure 500 includes a substrate 510, an interconnect pad 520 and a resist layer 530. Semiconductor structure 500 also includes a conductive structure 540 and a conductive film 550. Substrate 510 (e.g., a Silicon (Si) substrate) has first and second opposing surfaces and a plurality of electrical connections (e.g., vias) extending between the first and second surfaces. Additionally, interconnect pad 520 (e.g., an under bump metal) has first and second opposing surfaces, with the first surface of the interconnect pad 520 disposed over or beneath (e.g., attached or otherwise coupled to) a selected portion of the second surface of the substrate 510.

The first surface of the interconnect pad 520 may also be electrically coupled to selected ones of the electrical connections in substrate 510. The electrical coupling may, for example, occur through bond wires or via contacts spaced between the first surface of interconnect pad 520 and the electrical connections in a region beneath the interconnect pad 520. Selected portions of the interconnect pad 520 are also coupled to conductive film 550 (e.g., a superconducting film) in the illustrated embodiment (e.g., for forming conductive structure 540, as will be discussed further below).

Resist layer 530, which may be provided from a negative photoresist material or a positive photoresist material (or another polymer that has a property of becoming more soluble when exposed to ultraviolet light), has first and second opposing surfaces. Resist layer 530 is disposed over the second surface of interconnect pad 520 and the second surface of substrate 510. Additionally, resist layer 530 comprises a plurality of resist layer portions (here, two portions 530*a*, 530*b*). Each of the resist layer portions 530*a*, 530*b* is formed during a respective spin resist and bake cycle (e.g., first cycle 415 or next cycle 420 of method 400) of a plurality of spin resist and bake cycles (i.e., of at least two cycles). For example, resist layer portion 530*a* may be formed during first cycle 415 of method 400. Additionally, resist layer potion 530*b* may be formed during next cycle 420 of method 400.

Each of the resist layer portions 530a, 530b of resist layer 530 also has an associated height or thickness (here, distances DRP1, DRP2 between first and second opposing surfaces of resist layer portions 530a, 530b, respectively).

Additionally, a predetermined distance DR2 exists between the first and second surfaces of the resist layer 530. The predetermined distance DR2 corresponds to a height or thickness of the resist layer 530 (and a sum of the heights or thicknesses of resist layer portions 530a, 530b). In one embodiment, the predetermined distance DR2 is selected to be less than a predetermined height or thickness of the conductive structure 540 formed in an interconnect structure according to method 400 (e.g., 1500, shown in FIG. 5A). Additionally, a number of spin and bake cycles used to produce the resist layer 530 is selected based upon the predetermined distance DR2 to be achieved. The predetermined distance DR2 may also be selected to achieve a particular shaped conductive structure 540, as will be discussed further below.

An opening 532 having a predetermined shape is formed or otherwise provided in a selected portion of the resist layer 530 for receiving conductive materials as may be used to form conductive structure 540. In the illustrated embodiment, the opening 232 extends between the second surface of the resist layer 530 and the second surface of the interconnect pad 520 (and, thus, the first surface of the resist layer 530). Additionally, the predetermined shape of the opening 532 is selected based upon a shape of the conductive structure to be formed in the opening 532. The manner in which the opening 532 is formed may depend upon the materials from which the resist layer 530 is provided (e.g., positive or negative photoresist materials), as discussed above in connection with FIG. 4.

Conductive structure 540, which comprises one or more superconducting materials (e.g., niobium (Nb)), is formed or otherwise provided on a surface of interconnect pad 520 exposed by resist opening 232 using an electroplating process. The electroplating process may comprise coupling conductive film 550 of semiconductor structure 500 and a structure comprising a conductive material to respective terminals of a power source. Additionally, the electroplating process may comprise immersing the semiconductor structure and the structure comprising the conductive material into an electrolyte solution. A resulting conductive structure 540 will form on the exposed interconnect pad surface after a predetermined time period.

The conductive structure 540 has a first portion which is disposed over and coupled to a surface of the interconnect pad and a second, opposing portion. As illustrated, the second portion of the conductive structure 540 may "spill over" the resist opening 232 in embodiments in which the resist layer 530 has a thickness (here, a predetermined distance DR2) which is less than a height of the conductive structure 540 (i.e., a distance between the first and second portions of conductive structure 540). Additionally, as illustrated, a result of the foregoing may be the second portion of the conductive structure 540 having a substantially convex (or mushroom like) surface 540a.

Referring now to FIG. 5A, interconnect structure 1500 results after conductive film 550, resist layer 530 and all materials disposed over the resist layer 530 are removed from semiconductor structure 500.

That is, resist layer 530 of semiconductor structure 500 is removed (e.g., stripped with a solvent) from the second surface of the interconnect pad 520 and from the second surface of the substrate 510 to expose the interconnect pad 520 and the substrate 510. Additionally, conductive film 520 is removed (e.g., etched) from semiconductor structure 500. In some embodiments, selected portions of conductive structure 540 are further etched (e.g., through a flash etch process) to produce a conductive structure having a particular shape.

Conductive structure 540 has a first dimension D1 corresponding to a distance between the first and second portions of the conductive structure 540. Conductive structure 540 also has a second dimension D2 corresponding to a dimension of the first portion of the conductive structure 540 which is disposed over the second surface of the interconnect pad 520. In one aspect of the concepts, systems, circuits and techniques sought to be protected herein, an aspect ratio of the first dimension D1 of the conductive structure 540 to the second dimension D2 of the conductive structure 540 is substantially greater than or equal to about one. In other words, the conductive structure 540 has an aspect ratio of about one to one (1:1) or greater. For example, the first dimension D1 may have a value of about thirty micrometers and the second dimension D1 may have a value of about forty micrometers to provide for an aspect ratio of about four to three (4:3).

The number of spin cycles performed in method 400 to produce resist layer 530 (and subsequently the conductive structure 540) may, for example, be based, at least in part, on a desired aspect ratio. As discussed above, in one embodiment, the predetermined distance DR1 of resist layer 530 shown in FIG. 5 is selected to be less than a predetermined height or thickness (here, dimension D1) of the conductive structure 540 shown in FIG. 5A. In one embodiment, the greater the ratio between the height or thickness D1 of the conductive structure 540 with respect to the height or predetermined distance DR2 of resist layer 530, the greater the mushroom effect (or radius of curvature of the second portion of conductive structure 540).

While conductive structure 540 is shown and described as having a particular shape in the illustrated embodiment (e.g., a mushroom like shape), it should be appreciated that the conductive structure 540 may take the form of a variety of different shapes. For example, the shape of the conductive structure 540 may depend upon a thickness of the resist layer 530 provided on semiconductor structure 500 (which may substantially reduce or increase the above-described "spill over"). Additionally, the shape of the conductive structure 540 may depend upon the electroplating process used to fabricate the conductive structure 540. Further, the shape of the conductive structure 540 may depend upon a shape of a conductive structure or interconnect pad to which the conductive structure 540 may be coupled to in fabricating a multi-layer semiconductor structure (e.g., 900, as shown in FIG. 9).

The above-described conductive structure 540, interconnect pad 520 and substrate 510 collectively form an interconnect structure (here, interconnect structure 1500) for electrically and mechanically coupling a semiconductor structure to one or more other semiconductor structures (e.g., to form a multi-layer semiconductor structure, as will be discussed).

In one embodiment, semiconductor structures to which the interconnect structure 1500 may be coupled (e.g., semiconductor structure 910 and 920, shown in FIG. 9) each have an associated semiconductor package pitch, and the interconnect structure 1500 may have one or more characteristics (e.g., dimensions) selected in accordance with the package pitch, as will be further discussed in connection with FIGS. 9-9A below.

Additional aspects of the concepts, systems, circuits and techniques sought to be protected herein, with particular emphasis on interconnect structures (e.g., 1500, shown in FIG. 5A) formed according to various methods of the disclosure (e.g., 400, shown in FIG. 4), are described in conjunction with the figures below.

Figure 6:
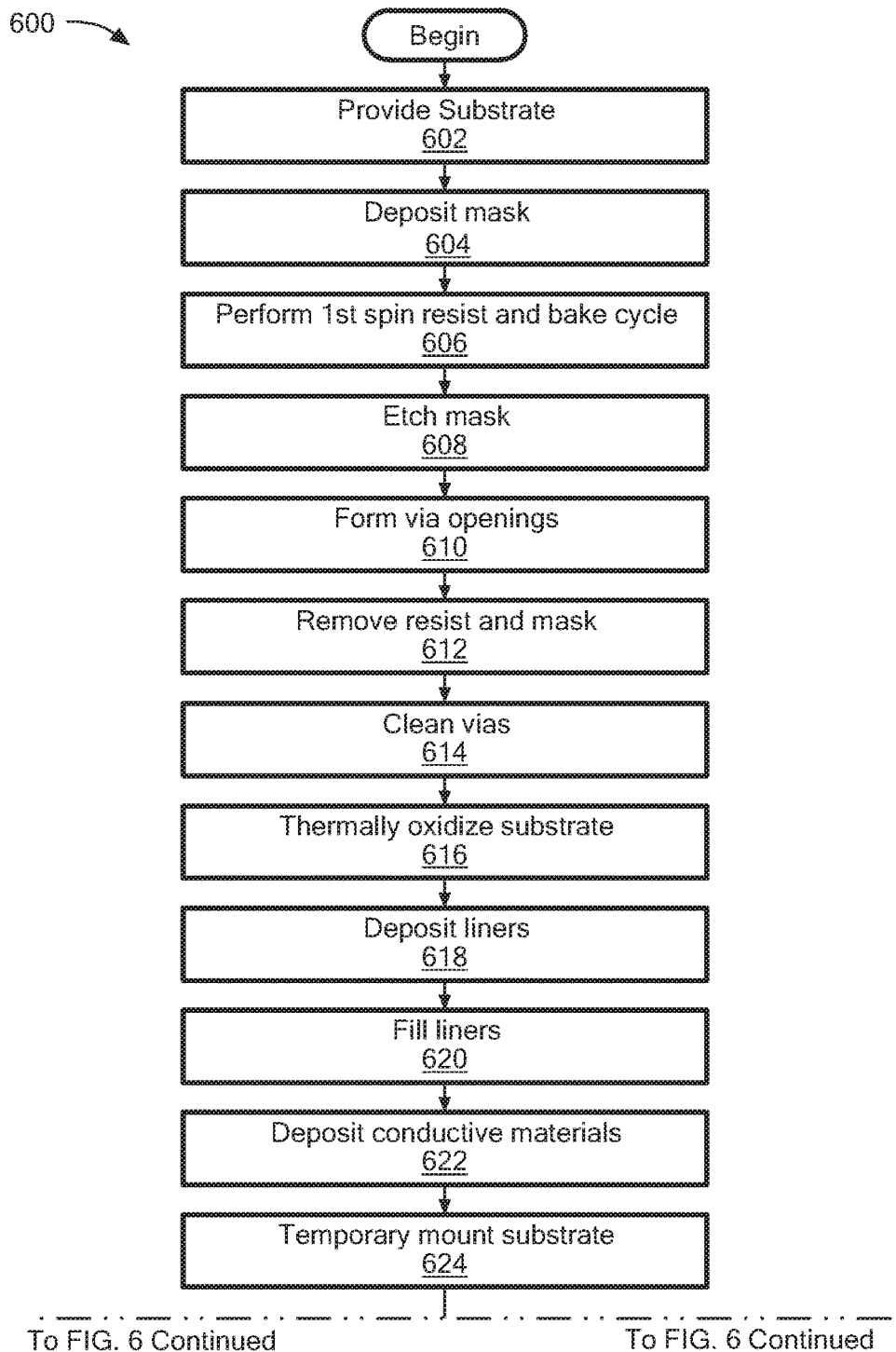
FIG. 6 is a flowchart illustrating a further example method for fabricating a interconnect structure in accordance with an embodiment of the disclosure.
Figure 6:
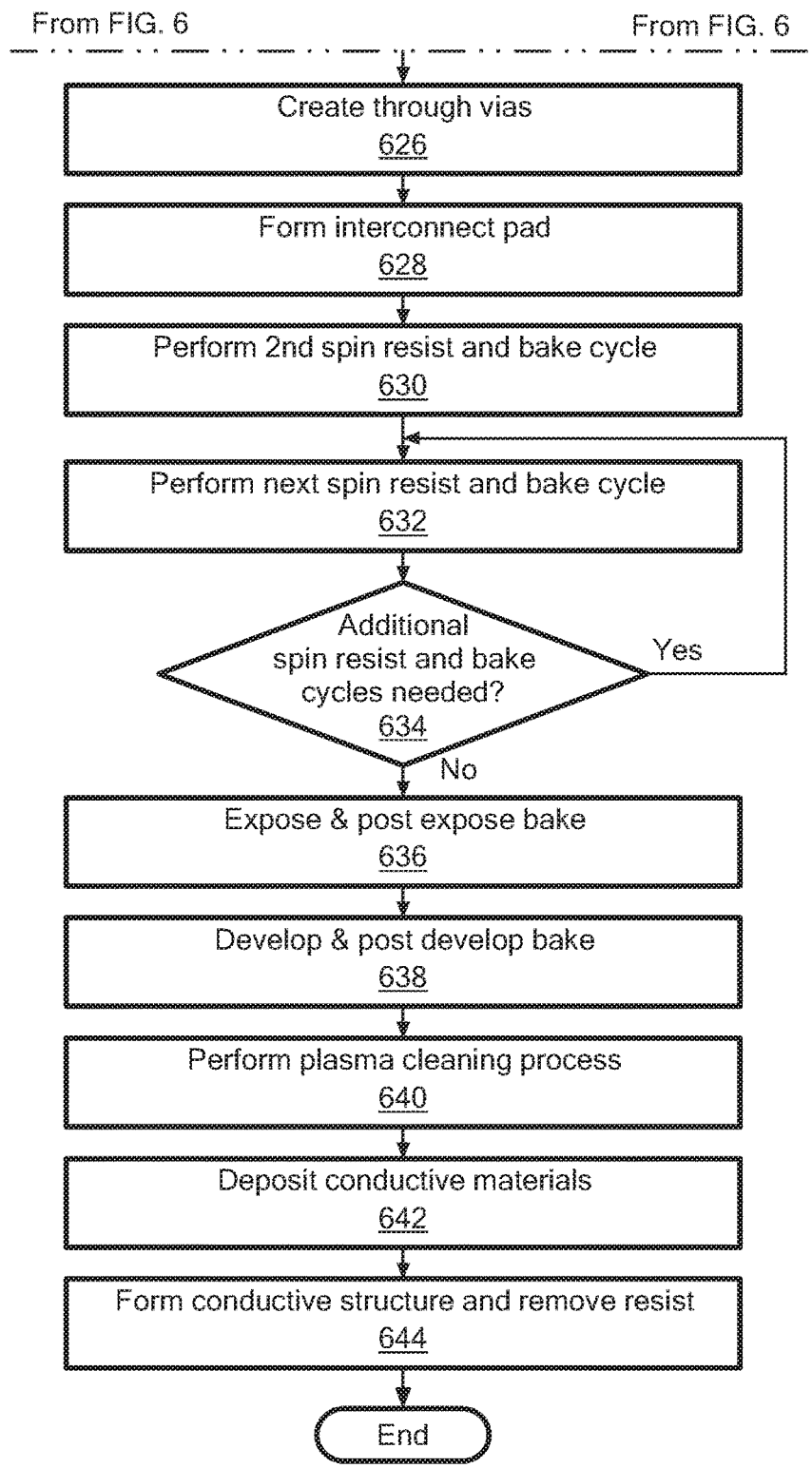

Another example method of fabricating an interconnect structure according to the disclosure (e.g., interconnect structure 1500, shown in FIG. 5A) is shown in FIG. 6.

As illustrated in FIG. 6, another example method 600 for fabricating a interconnect structure (e.g., 1500, shown in FIG. 5A) begins at block 602.

At block 602, a substrate (e.g., 510, shown in FIG. 5A) is provided. The substrate (e.g., a high resistive or regular Si substrate may be a single or multi-layer substrate. In one embodiment in which the substrate is provided as a high resistive substrate, the substrate has a resistance in a range of about three kilo-ohms to about one hundred kilo-ohms at about room temperature.

At block 604, a mask (e.g., a hard oxide mask) to be used to create opening for forming vias in the substrate is deposited or otherwise disposed over a surface of the substrate provided at block 602. The mask may be provided from a silicon oxide. Additionally, a pattern of the mask may be based upon a material (or materials) from which resist materials are provided at block 606. For example, the mask of a resist layer provided from a positive photoresist material should have a pattern which corresponds to a pattern of a resist layer to remain on the substrate (e.g., subsequent to development at block 606). In contrast, the mask of a resist layer provided from a negative photoresist material should have a pattern which is the inverse (i.e., a photographic negative) of a pattern of the resist layer to remain on the substrate.

At block 606, a first spin resist cycle and bake cycle is performed (e.g., for providing a resist layer for forming the vias in the substrate). In particular, at block 606, a first predetermined amount of resist material (e.g., a photoresist material) is disposed over one or more portions (e.g., a center portion) of the substrate. At block 606, the resist material is also disposed over or spread across one or more surfaces of the substrate using spin coating techniques as may be performed in a spin coater machine for example. The spin coater machine may, for example, rotate the substrate about a platform at a predetermined rate (e.g., angular speed) and for a predetermined time period in order to spread the resist material over the substrate. In particular, the substrate may be rotated until a desired thickness of the resist material (i.e., a distance between first and second surfaces of the resist material) is achieved on the substrate.

Additionally, at block 606, subsequent to the resist material being spread over the substrate, the substrate is baked at a predetermined temperature and for a predetermined time period to form a resist layer from the resist material disposed over the substrate. Further, at block 606, the resist layer is exposed to an exposure energy (e.g., thermal energy) to form an opening in the resist layer. The opening, which is formed according to a pattern in the mask, has a predetermined shape which is suitable for receiving conductive materials as may be used to form vias in the substrate. Additionally, the exposure energy has a predetermined intensity distribution and the resist layer is exposed to the exposure energy for a predetermined time period.

Further, at block 606, the resist layer is developed. The resist layer may be developed by immersing the substrate including the resist layer in a developer solution for a predetermined time period. The resist layer may also be developed by spraying the substrate with the developer solution for the predetermined time period. In embodiments in which the resist layer is provided from a positive photoresist material, exposed portions of the resist layer are generally removed (or washed away) by the developer solution. In contrast, in embodiments in which the resist layer is provided from a negative photoresist material, unexposed portions of the resist layer are generally removed by the developer solution.

At block 606, subsequent to the resist layer being developed in the developer solution, the substrate and remaining portions of the resist layer may also be rinsed (e.g., with deionized water) to remove the developer solution from the substrate and the resist layer. The substrate and remaining portions of the resist layer may also be rinsed to prepare the substrate and the resist layer for the mask etching process performed at block 608.

At block 608, the mask is etched through the resist opening formed at block 606 to create openings which may define via diameter. Additionally, at block 610, via openings having a predetermined shape and aspect ratio (e.g., a high aspect ratio) are formed or otherwise provided in selected portions of the substrate for receiving conductive materials as may be used to form vias. In other words, at block 610 vias (or via openings) are created or etched through the openings created at block 608. The via openings have a first dimension D1 corresponding to a height or depth of the openings. The via openings also have a second dimension D2 corresponding to a width or diameter of the openings.

In one embodiment, an aspect ratio of the first dimension D1 of the openings to the second dimension D2 of the openings is substantially greater than or equal to about one. In other words, the openings have an aspect ratio of about one to one (1:1) or greater. For example, the first dimension D1 of the openings may have a value of about ten microns to about five hundred microns and the second dimension D2 of the openings may have a value of about four microns to about two hundred microns to provide for an aspect ratio of about 1:1 to about 1:40. In one example, a 10 micron diameter and 200 micron deep via with a pitch ranging from about 20 microns to about 500 microns if formed or otherwise provided. In another example, a 50 micron diameter and 500 micron deep via with a pitch ranging from 100 microns to 1000 microns is formed or otherwise provided.

The via openings may be etched in the selected portions of the substrate. The via openings may also be drilled or grinded in the selected portions of the substrate. It should be appreciated that the manner in which the via openings are formed or otherwise provided may depend upon the materials from which the substrate is provided.

At block 612, remaining portions of the resist layer are removed (e.g., stripped with a solvent, such as acetone) from the substrate to expose the substrate. Additionally, the mask is removed from the substrate solvent and or wet and or dry etching process.

At block 614, the vias formed in blocks above are cleaned using one or more plasma and/or chemical cleaning processes. The cleaning processes may, for example, prepare the substrate for providing of an interconnect pad on the substrate.

At block 616, the substrate is thermally oxidized to produce a thin layer of oxide (e.g., silicon dioxide ($SiO_2$)) on a surface of the substrate. In one embodiment, the substrate has a thickness (e.g., a distance between first and second surfaces of the substrate) of about one hundred nanometers. A number of oxide and or nitride or inorganic or organic or a combination of dielectric materials having a thickness in a range of about one hundred nanometers (nm) to about one thousand nm can be used to insulate the via. Via dielectrics may be required in some embodiments to provide for vias having substantially good step coverage (e.g., at least 50% through the depth of the trench), substantially good thickness uniformity (e.g., <3% variation across the wafer), a high deposition rate (e.g., >100 nm/min), low stress (e.g., <200 MPa), low leakage current (e.g., <1 nA/cm2), and a high breakdown voltage (e.g., >5 MV/cm).

At block 618, a liner (e.g., a Ti or TiN liner) or insulator to be used for forming vias is deposited or otherwise disposed in each of the openings formed in the substrate.

At block 620, the liners or insulators provided at block 618 are at least partially filled with a conductive material (e.g., using via-last techniques) to form corresponding vias (or electrical connections) in the substrate. The conductive material may be a superconducting material or a non-superconducting material.

Plasma-enhanced chemical vapor deposition (PECVD) of SiO2 or SiN, or sub-atmospheric chemical vapor depositions (SACVD) of SiO2, are some examples of insulator or liner depositions at block 618. The most commonly used conductors to fill vias (e.g., at bock 620) are doped polysilicon (180 1ohm-cm), tungsten (5.6 1ohm-cm), or copper (1.7 1ohm-cm). W deposited by CVD has a good fill of the via and can be integrated with the contacts to which the vias are to be coupled. A TiN liner may be required to ensure that the WF6 precursor does not attack the Si substrate in the via. A disadvantage of W compared to Cu is that it has a high intrinsic stress (1400 MPa for W, 20 MPa for Cu).

The vias which are formed can be superconducting during qubit operation. A superconducting via comprises a Titanium Nitride (TiN) and or poly Si and or Al and or high Q metal. The vias can be provided as a combination of titanium-titanium nitride-tungsten and/or titanium-titanium nitride-high Q materials-tungsten and or titanium-titanium nitride-high Q materials and or titanium-high Q materials-tungsten and or high Q materials-tungsten and or high Q materials, etc.

Reactive-ion-etching (RIE) may be used to create high aspect ratio vias and deep trench structures in the Si (i.e., for capacitors or for isolation) in which the vias are provided. In one embodiment, a RIE Bosch process may be used to fabricate the vias, with the process alternating between deposition and etching steps to fabricate deep vias. SF6 isotropic etching of Si may not be suitable for forming vias (which require a highly anisotropic etch). Fluorocarbon chemistry (e.g., C4F8) may be used for anisotropic etching achieved through the deposition of a chemically inert passivation on the sidewall of the vias.

Chemical mechanical polishing (CMP) may be used for planarization of metal filled vias (e.g., micro vias), for example. Additionally, a metal contact (i.e. pad) in an upper device layer (e.g., the second device layer) may be an annulus with an about a one point five micrometer (µm) opening that also functions as a self-aligned mask (e.g., hard mask) during the plasma etch of the oxide beneath it to reach a corresponding metal contact in a lower device layer (e.g., the first device layer). In order to fully dispose and electrically couple the vias, the size of the metal contacts, and thus the pitch of the vertical interconnect, may be made proportional to about twice the misalignment of the wafers (or semiconductor structures).

Returning now to method 600, at block 622, one or more conductive materials are deposited over selected ones of the vias formed at block 620 to form corresponding conductive layers over the vias. The conductive layers may, for example be patterned using a photo process.

At block 624, the substrate is removably coupled to a mounting surface or structure of semiconductor manufacturing equipment used fabricate an interconnect pad and a conductive structures (or bump) of an interconnect structure at blocks 626 to 644 below.

At block 626, selected portions of the substrate are grinded, etched or planarized through a chemical mechanical planarization or polishing (CMP) process to create one or more through vias in selected portions of the substrate. In one embodiment, the vias formed from the via openings formed at block 610 are vias going through some depth of Si a wafer. Grinding, etching and CMP may reveal the vias from backside and also convert the via openings formed at block 610 to through vias at block 626.

At block 628, an electrically conductive material (e.g., a superconducting metal) is deposited or otherwise disposed over the selected portions of the substrate in which the through vias are created at block 626. At block 628, the conductive material is also patterned to form an interconnect pad over the substrate. The interconnect pad is electrically coupled to the through vias (e.g., using bond wires or via contacts spaced between the interconnect pad and the through vias). Additionally, the interconnect pad may take the form of a sphere, a cube, a cylinder, a pyramid, a cone, a rectangular prism or any number of other shapes, including irregular shapes, as will be apparent to those of ordinary skill in the art.

At block 630, a process for forming or otherwise providing one or more conductive structures or "bumps" on the substrate and the interconnect pad (collectively, a semiconductor structure) provided at block 628 begins. In particular, at block 630, a spin resist and bake cycle (here, a second spin resist and bake cycle) is performed on the semiconductor structure provided at block 628. The second spin resist and bake cycle may be the same as or similar to the first spin resist and bake cycle performed at block 110 of method 100 (as described above in connection with FIG. 1).

Specifically, during the second spin resist and bake cycle, a first predetermined amount of resist material is disposed over one or more portions of the semiconductor structure. Additionally, during the second spin resist and bake cycle, the resist material is disposed (or spread) over one or more surfaces of the semiconductor structure using spin coating techniques. The spin coating techniques may comprise the semiconductor structure being rotated about a platform of a spin coater machine at a predetermined rate and for a predetermined time period in order to spread the resist layer over interconnect pad and the substrate of the semiconductor structure. The semiconductor structure may, for example, be rotated until a desired thickness of the resist material (i.e., a distance between first and second surfaces of the resist material) is achieved on the semiconductor structure.

At block 630, subsequent to the resist material being spread over the semiconductor structure, the semiconductor structure is baked at a predetermined temperature and for a predetermined time period to form a first resist layer (or a first portion of a resistor layer) from the resist material. The first resist layer formed at block 630 (e.g., 530, shown in FIG. 2) has first and second opposing surfaces, with the first surface of the first resist layer disposed (or formed) over the second surface of the interconnect pad and over the second surface of the substrate.

At block 632, a next spin resist and bake cycle is performed on the semiconductor structure. The next spin resist and bake cycle performed at block 632 may be the same as or similar to the next spin resist and bake cycle performed at block 115 of method 100.

In particular, during the next spin resist and bake cycle, a second predetermined amount of a resist material is disposed over one or more portions of the second surface of the resist layer formed at block 630. Additionally, during the next spin resist and bake cycle, the semiconductor structure is rotated by the spin coater machine at a second predetermined rate for a second predetermined time period. Similar to the first spin resist and bake cycle, the semiconductor structure may be rotated until a desired thickness of the resist material is achieved on the semiconductor structure (here, on the resist layer of the semiconductor structure).

At block 632, the semiconductor structure is also baked at a predetermined temperature and for a predetermined time period to form a second resist layer (or second portion of a resist layer). The second resist layer has a thickness (e.g., a distance between first and second opposing surfaces) which is substantially greater than a thickness of the first resist layer formed at block 630. Additionally, the second resist layer may have a more uniform surface than the first resist layer.

At block 634, it is determined whether any additional spin resist and bake cycles are needed. If it is determined that additional spin resist and bake cycles are needed, the method 600 returns to block 630 and blocks 630 and 632 are repeated until it is determined that no additional spin resist and bake cycles are needed. Alternatively, if it is determined that no additional spin resist and bake cycles are needed, the method 600 may proceed to a block 636.

A number of spin resist and bake cycles performed in method 600 may be selected to achieve a resist layer (i.e., a resist layer comprising the first resist layer and the second resist layer) having a predetermined thickness. Additionally, the number of spin resist and bake cycles performed in method 600 may be based, at least in part, on a desired aspect ratio of a conductive structure (e.g., 540, shown in FIG. 5A) to be formed in the interconnect structure (e.g., 1500, shown in FIG. 5A).

At block 636, a mask is disposed over the second surface of the resist layer and the resist layer is exposed to an exposure energy to form an opening (e.g., 532, shown in FIG. 5) in the resist layer. The opening, which is formed according to a pattern in the mask, has a predetermined shape which is suitable for receiving conductive materials as may be used to form a conductive structure (e.g., 1540, shown in FIG. 5A). Additionally, the exposure energy has a predetermined intensity distribution and the resist layer is exposed to the exposure energy for a predetermined time period.

A pattern of the mask disposed over the resist layer at block 636 is based upon the material from which the resist layer is provided. For example, the mask of a resist layer provided from a positive photoresist material should have a pattern which corresponds to a pattern of the resist layer to remain on the semiconductor structure (e.g., subsequent to development at block 638). In contrast, the mask of a resist layer provided from a negative photoresist material should have a pattern which is the inverse (i.e., a photographic negative) of a pattern of the resist layer to remain on the semiconductor structure.

At block 636, a post expose bake process is also performed on the semiconductor structure. In particular, the semiconductor structure is baked at a predetermined temperature and for a predetermined time period.

At block 638, the resist layer of the semiconductor structure is developed through a development process (e.g., in a resist developer). The resist layer may, for example, be developed by immersing the semiconductor structure in a developer solution for a predetermined time period (e.g., about two minutes). In embodiments in which the resist layer is provided from a positive photoresist material, exposed portions of the resist layer are generally removed (or washed away) during the development process. In contrast, in embodiments in which the resist layer is provided from a negative photoresist material, unexposed portions of the resist layer are generally removed during the development process.

At block 638, subsequent to the resist layer being developed, the semiconductor structure may be rinsed to prepare the semiconductor structure for the post development bake process which is also performed at block 638. In particular, during the post development bake process performed at block 638, the semiconductor structure is baked at a predetermined temperature and for a predetermined time period. The post development (or develop) bake process performed at block 638 may, for example, substantially reduce (or, ideally eliminate) residual developer from the resist opening and may necessary in order to harden the photoresist and improve adhesion of the photoresist to the wafer surface.

At block 640, one or more surfaces of the semiconductor structure are cleaned through a cleaning process (e.g., a plasma cleaning process) for a predetermined time period. The cleaning process may, for example, prepare the semiconductor structure for receiving conductive materials or layers at block 642.

At block 642, conductive materials (e.g., superconducting materials) are deposited or otherwise disposed in the openings formed in the resist layer. The conductive materials may form a conductive layer (e.g., 240, shown in FIG. 2), which conductive layer may be electrically coupled to the interconnect pad and used to form one or more conductive structures at block 644. The conductive materials and conductive layers may also be formed using a thermal evaporation or an electroplating process.

At block 644, one or more conductive structures (e.g., 540, shown in FIG. 5A) are formed from the conductive material or layer. For example, selected portions of the conductive material or layer may be lifted-off or etched (e.g., through a flash etch process) to produce the conductive structures Shapes of the conductive structures may, for example, be based on the processes used to form the conductive structures. Methods 100 and 400, as described above in connection with FIGS. 1 and 4, respectively, will create two different shape of conductive structure.

Additionally, at block 644, the resist layer of the semiconductor structure may be removed (e.g., stripped with a solvent, such as acetone) from the second surface of the interconnect pad and from the second surface of the substrate to expose the interconnect pad and the substrate. Further, at block 644, the semiconductor structure may be removed from the temporary mounting surface or structure to which the semiconductor structure was coupled at block 624.

Upon completion of block 644, the method 600 may end. The method 600 ending may, for example, be indicative of completion of the fabrication process of the interconnect structure (e.g., 1500, shown in FIG. 5A). The method 600 may be repeated (e.g., in response to a processor in the semiconductor manufacturing equipment receiving or generating a control signal) for fabricating additional interconnect structures.

Figure 7:
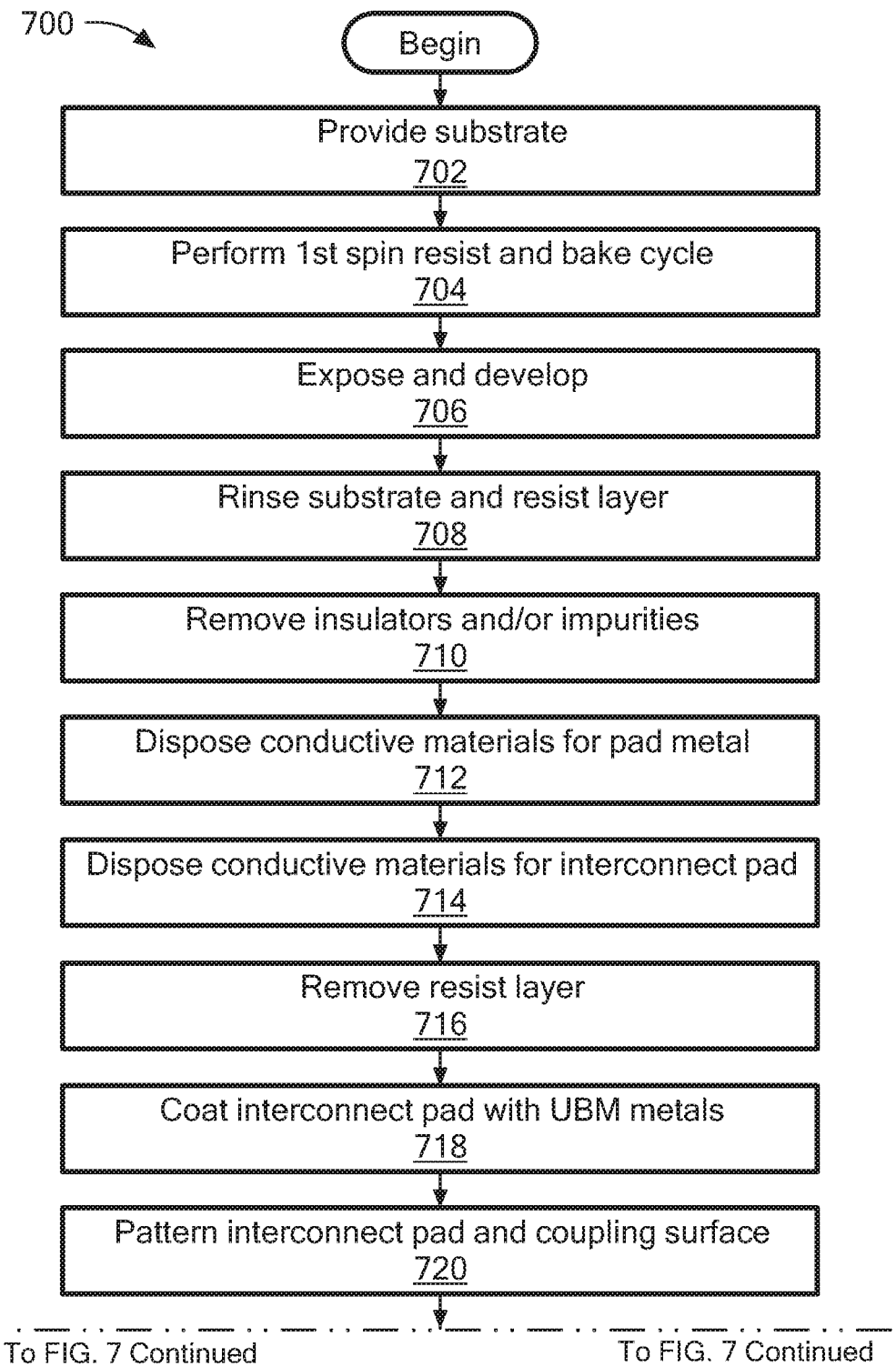
FIG. 7 is a flowchart illustrating another example method for fabricating a interconnect structure in accordance with an embodiment of the disclosure.
Figure 7:
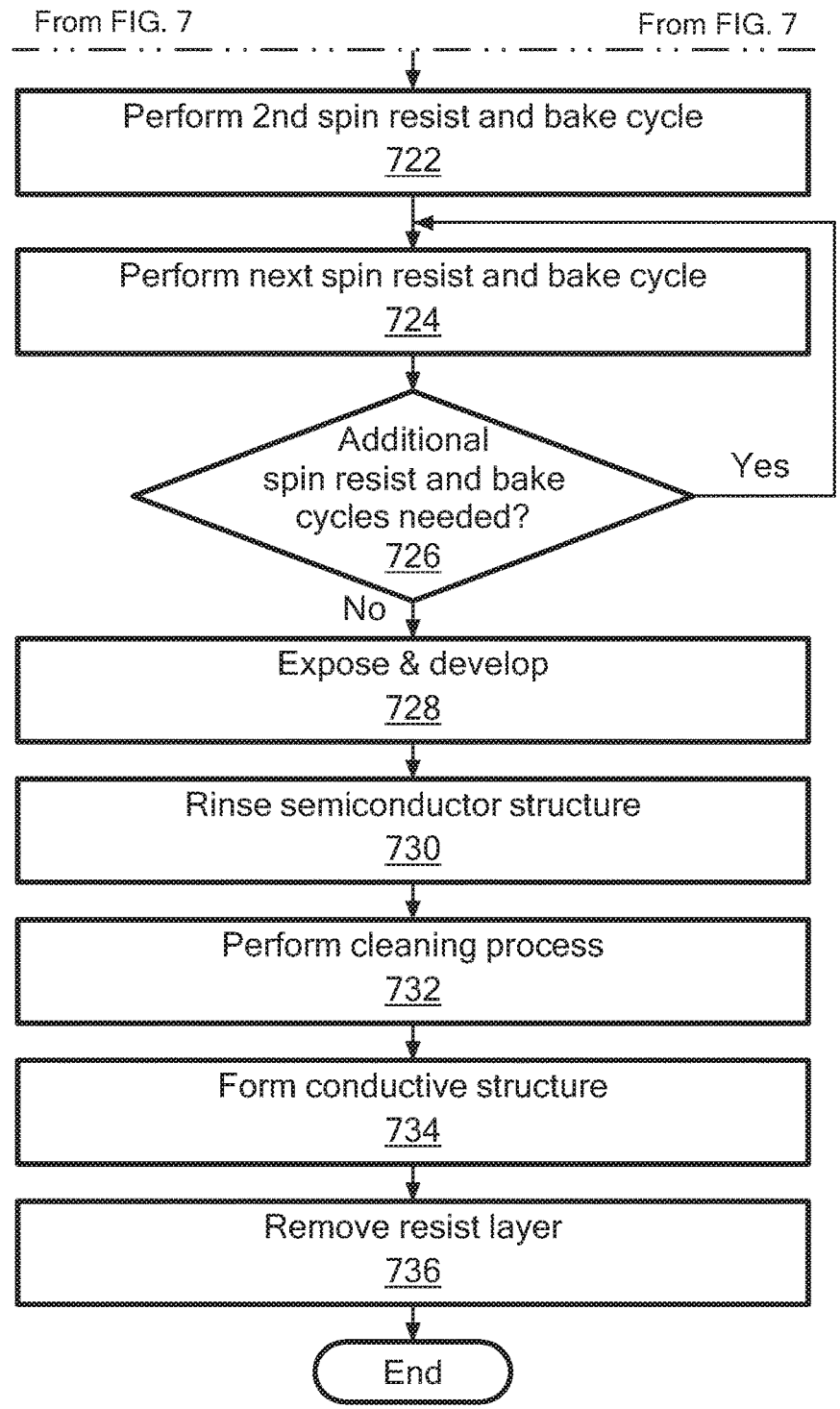

A further example method of fabricating an interconnect structure according to the disclosure (e.g., interconnect structure 1500, shown in FIG. 5A) is shown in FIG. 7.

As illustrated in FIG. 7, a method 700 for fabricating an interconnect structure (e.g., 1500, shown in FIG. 5A) begins at block 702.

At block 702, a substrate (e.g., 510, shown in FIG. 5A) is provided. The substrate (e.g., a high resistive or regular Si substrate) may be a single or multi-layer substrate. The substrate has first and second opposing surfaces and includes one or more electrical connections (or vias) disposed between the first and second surfaces.

At block 704, a first spin resist cycle and bake cycle is performed (e.g., for providing a resist layer for forming an interconnect pad on the substrate). In particular, at block 704, a first predetermined amount of resist material (e.g., a photoresist material) is disposed over one or more portions (e.g., a center portion) of the substrate. At block 704, the resist material is also disposed over or spread across one or more surfaces of the substrate using spin coating techniques as may be performed in a spin coater machine for example. The spin coater machine may, for example, rotate the substrate about a platform at a predetermined rate (e.g., angular speed) and for a predetermined time period in order to spread the resist material over the substrate.

Additionally, at block 704, subsequent to the resist material being spread over the substrate, the substrate is baked at a predetermined temperature and for a predetermined time period to form a resist layer from the resist material disposed over the substrate.

At block 706, the resist layer is exposed to an exposure energy to form an opening in the resist layer. The opening has a predetermined shape which is suitable for receiving conductive materials as may be used to form an interconnect pad on the substrate. Additionally, the exposure energy has a predetermined intensity distribution and the resist layer is exposed to the exposure energy for a predetermined time period.

At block 706, the resist layer is also developed. The resist layer may be developed by immersing the substrate in a developer solution for a predetermined time period. The resist layer may also be developed by spraying the substrate with the developer solution for the predetermined time period. In embodiments in which the resist layer is provided from a positive photoresist material, exposed portions of the resist layer are generally removed (or washed away) by the developer solution. In contrast, in embodiments in which the resist layer is provided from a negative photoresist material, unexposed portions of the resist layer are generally removed by the developer solution.

At block 708, the substrate and remaining portions of the resist layer may also be rinsed (e.g., with deionized water) to prepare the substrate for deposition of conductive materials to form the interconnect pad. Additionally, at block 710, insulators and impurities are removed from the substrate (e.g., using plasma and/or sputter etch processes).

At block 712, conductive materials as may be used to form a pad metal beneath the interconnect pad to be formed may be disposed in the opening in the resist layer. The pad metal may, for example, serve as a conductive interface between the interconnect and the pad on top of the vias in the substrate.

At block 714, conductive materials as may be used to form an interconnect pad are disposed in the opening in the resist layer. Additionally, at block 716 the resist layer may be removed from the substrate. Further, at block 718, selected portions of the interconnect pad are coated with one or more UBM metals to produce a corresponding coupling surface or structure on the interconnect pad formed at block 714.

At block 720, the interconnect pad and the coupling surface or structure of the interconnect pad are patterned and covered with UBM. For thermal or e-beam evaporation or sputtering UBM, block 718 and block 720 may be substantially the same. For electroplated UBM, there will be an etching step between block 718 and block 720. A top layer of a UBM must be readily wettable by the bump metals for solder reflow. In one embodiment, a UBM (or UBM layer(s)) uses multiple different metal layers, such as an adhesion layer, a diffusion barrier layer, a solderable layer, and an oxidation barrier layer. It is further possible that the UBM or UBM layer(s) is/are compatible metals which in combination have low internal mechanical stresses.

Examples of materials from which a UBM may be provided include, but are not limited to: 20 nm Ti-50 nmPt-150 nmAu, 10 nmTi-50 nm Au, 5 nm Ti-5 nm Pt-5 nm Au-1000 nm Indium, 5 nm Ti-5 nm Pt-5 nm Au-1000 nm Sn, 50 nm Pt-100 nm Au, 5 nm Ti-500 nm In, 20 nm Ti-1000 nm In, Ni—Au, Ni—Pd—Au, Pd—Au, Ti—TiN, Ti—TiN—Ti—Au, Ti—TiN—Ti—In, Ti—TiN—Ti—Sn, Ti—Sn—In, etc.

Block 718 may be for forming a UBM on superconducting metal pad. Additionally, block 712 may be optional. In one example, at block 712 Aluminum (Al) can be deposited on a milled Al surface through the resist. In another example, at block 712 Titanium (Ti) can be deposited on a milled Al or Nb surface through the resist and Al or Nb can be deposited on top of Ti. In one example, the conductive materials disposed at blocks 712 and 714 alone, or in combination, can be used to form structures which include materials which provide a low resistance electrical connection to the superconducting pad. The structures may adhere well both to the underlying superconducting pad and to the surrounding superconducting circuit's passivation layer, hermetically sealing the superconducting circuits from the environment. In some cases, the conductive materials disposed at blocks 712 and 714 alone, or in combination, may provide a strong barrier to prevent the diffusion of other bump metals into the superconducting circuits. In one embodiment, the conductive materials disposed at blocks 712 and 714 alone, or in combination, may provide a better electrical connection with the superconducting circuits.

At block 722, a process for forming or otherwise providing one or more conductive structures or "bumps" on the substrate and the interconnect pad (collectively, a semiconductor structure) provided at block 720 begins. In particular, at block 720, a spin resist and bake cycle (here, a second spin resist and bake cycle) is performed on the semiconductor structure provided at block 720.

The second spin resist and bake cycle (also sometimes referred to herein as "second cycle") comprises disposing a first predetermined amount of resist material over one or more portions of the semiconductor structure. Additionally, the second cycle comprises disposing (or spreading) the resist material over one or more surfaces of the semiconductor structure using spin coating techniques. The spin coating techniques may comprise rotating the semiconductor structure about a platform of a spin coater machine at a first predetermined rate and for a first predetermined time period in order to spread the resist material. The semiconductor structure may, for example, be rotated by the spin coater machine until a desired thickness of the resist material (i.e., a distance between first and second opposing surfaces of the resist material) is achieved on the semiconductor structure.

The second cycle performed at block 722 further comprises baking the semiconductor structure at a predetermined temperature and for a predetermined time period to form a first resist layer (or a first portion of a resistor layer) from the resist material disposed over the semiconductor structure. The first resist layer (e.g., 530a, shown in FIG. 5) has first and second opposing surfaces, with the first surface of the first resist layer disposed (or formed) over a surface of the interconnect pad and over a surface of the substrate.

At block 724, a next spin resist and bake cycle (also sometimes referred to herein as a "next cycle") is performed on the semiconductor structure. The next cycle comprises disposing a second predetermined amount of a resist material over one or more portions of the second surface of the first resist layer formed at block 722. Additionally, the next cycle comprises disposing (or spreading) the resist material over one or more surfaces of the first resist layer using spin coating techniques. The spin coating techniques may comprise rotating the semiconductor structure about a platform of a spin coater machine at a second predetermined rate and for a second predetermined time period in order to spread the resist material. The semiconductor structure may, for example, be rotated by the spin coater machine until a desired thickness of the resist material (i.e., a distance between first and second opposing surfaces of the resist material) is achieved on the first resist layer.

The next cycle performed at block 724 further comprises baking the semiconductor structure at a predetermined temperature and for a predetermined time period to form a next resist layer (or next portion of a resist layer) from the resist material. In one embodiment, the next resist layer has a thickness (e.g., a distance between first and second opposing surfaces) which is substantially greater than a thickness of the first resist layer formed at block 722. Additionally, the next resist layer may have a more uniform surface than the first resist layer.

At block 726, it is determined whether any additional spin resist and bake cycles are needed. If it is determined that additional spin resist and bake cycles are needed, the method 700 returns to block 722 and blocks 722 and 724 are repeated until it is determined that no additional spin resist and bake cycles are needed. Alternatively, if it is determined that no additional spin resist and bake cycles are needed, the method 700 may proceed to a block 730.

Similar to method 600, a number of spin resist and bake cycles performed in method 700 may be selected to achieve a resist layer (i.e., a resist layer comprising the first resist layer and at least one next resist layer) having a predetermined thickness. Additionally, similar to method 600, the number of spin resist and bake cycles performed in method 600 may be based, at least in part, on a desired aspect ratio of a conductive structure (e.g., 540, shown in FIG. 5A) to be formed in the interconnect structure (e.g., 1500, shown in FIG. 5A).

Referring now to block 728, at block 728 a mask is disposed over the second surface of the resist layer and the resist layer is exposed to an exposure energy (e.g., thermal energy) to form an opening (e.g., 532, shown in FIG. 5) in the resist layer. The opening, which is formed according to a pattern in the mask, has a predetermined shape which is suitable for receiving conductive materials as may be used to form a conductive structure (e.g., 540, shown in FIG. 5A).

At block 728, the resist layer is also developed. The resist layer may be developed, for example, by immersing the semiconductor structure in a developer solution for a predetermined time period. The resist layer may also be developed by spraying the semiconductor structure with the developer solution for the predetermined time period. In embodiments in which the resist layer is provided from a positive photoresist material, exposed portions of the resist layer are generally removed (or washed away) by the developer solution. In contrast, in embodiments in which the resist layer is provided from a negative photoresist material, unexposed portions of the resist layer are generally removed by the developer solution.

At block 730, the semiconductor structure is rinsed (e.g., with deionized water) to remove leftover developer solution from the semiconductor structure. The semiconductor structure may also be rinsed to prepare the semiconductor structure for a cleaning process performed at block 732. In particular, at block 732, the semiconductor structure is cleaned (e.g., using a plasma cleaning process) to prepare the semiconductor structure for receiving conductive materials for forming one or more conductive structures at block 734.

At block 734, one or more conductive structures are formed on a surface of the interconnect pad using a thermal evaporation or an electroplating process. Additionally, at block 736, remaining portions of the resist layer are removed from the semiconductor structure to form an interconnect structure.

Upon completion of block 736, the method 700 may end. The method 700 ending may, for example, be indicative of completion of the fabrication process of the interconnect structure (e.g., 1500, shown in FIG. 5A). The method 700 may be repeated (e.g., in response to a processor in the semiconductor manufacturing equipment receiving or generating a control signal) for fabricating additional interconnect structures.

Figure 8:
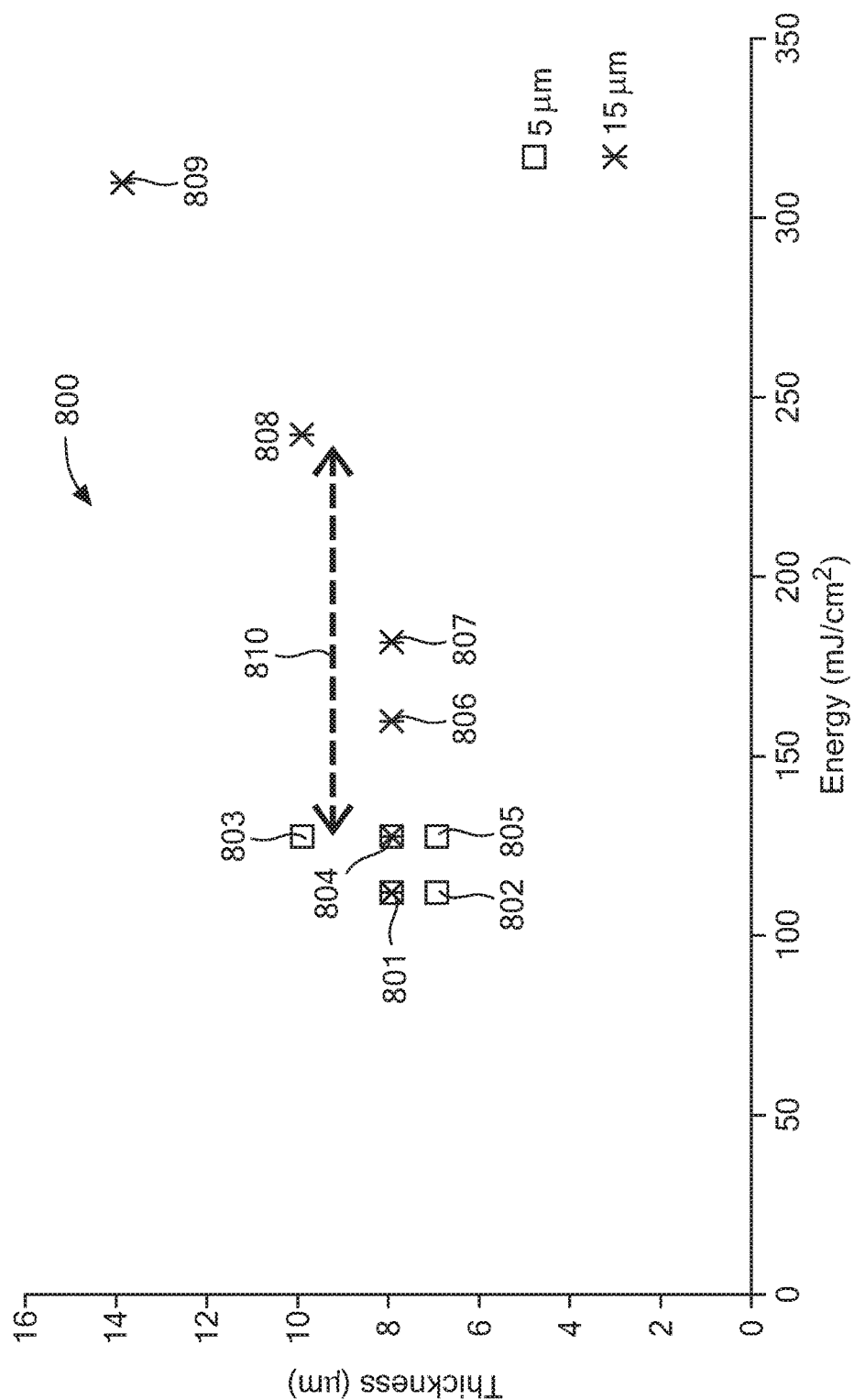
FIG. 8 is a plot illustrating an example relationship between exposure energy and resist thickness.

Referring to FIG. 8, a plot 800 shows an example relationship between exposure energy and resist thickness of a resist layer (e.g., 530, shown in FIG. 5) subjected to the exposure energy. Plot 800 also has a horizontal axis with a scale in exposure energy units (e.g., millijoule per square centimeter (mJ/cm$^2$). Additionally, plot 800 has a vertical axis with a scale in resist thickness units (e.g., micrometers μm). The vertical axis may, for example, be illustrative of resist thickness of a resist layer resulting from the spin resist and bake cycles performed at blocks 722 to 726 of method 700. Additionally, the horizontal axis may be illustrative of a level of exposure energy to which the resist layer is exposed at block 728 of method 700.

The plot 800 includes a plurality of points (e.g., 801, 802, 803, 804, 805, 806, 807, 808, 809) representative of different sized openings (e.g., 532, shown in FIG. 5) formed in the resist layer in response to different resist thicknesses and exposure energies. Point 803 may, for example, be representative of a five μm opening formed in a resist layer having a thickness of about ten μm and which is subjected to an exposure energy of about one hundred forty mJ/cm$^2$. Additionally, point 808 may be representative of a fifteen μm opening formed in a resist layer having a thickness of about ten μm and which subjected to an exposure energy of about two hundred forty mJ/cm$^2$. A larger resist opening (e.g., a fifteen μm opening versus a five μm opening) may, for example, provide for the ability for multiple conductive structures (e.g., 540, shown in FIG. 5) to be formed on an interconnect pad (e.g., 520, shown in FIG. 5) to which the resist opening leads to.

Dimensions of the resist opening may, for example, be selected based upon a size and/or shape of the interconnect pad to which the resist opening leads to and/or a number of conductive structures to be formed on the interconnect pad. For example, a twenty μm circular interconnect pad comprising three conductive structures may call for a resist opening of about five μm or less. Additionally, a fifteen μm circular interconnect pad comprising two conductive structures may call for a resist opening of about five μm or less. Further, a five μm circular pad comprising a single conductive structure may call for a resist opening of about five μm.

In one embodiment, the foregoing illustrates a variable density and pitch multi microbump approach where a photolithography process may provide a bump for a lowest pitch pad structure and a same (or similar) bump may be repeated multiple times on a same pad for larger pitch structure. This approach may minimize solder spreading in larger pads and may also minimize electrical shorts. Additionally, this approach may be capable of maintaining finer pitch and larger pitch structure. In one example, an about 15 micron pitch structure and an about 35 micron pitch structure can use an about 4-6 micron single bump for an about 15 micron pitch. Additionally, multiple 4-6 micron bumps can be used for an about 35 micron pitch. In another example, an about 15 micron pitch structure can use an about 4-6 micron single bump and an about 35 micron pitch structure can use an about 10-20 micron bump.

Referring now to FIG. 9, an example multi-layer semiconductor structure 900 as may be fabricated using interconnect structures according to the concepts, systems, circuits, and techniques sought to be protected herein is shown. Multi-layer semiconductor structure 900 includes a first semiconductor structure 910, a second semiconductor structure 920, and a third semiconductor structure 930. Multi-layer semiconductor structure 900 also includes a first interconnect structure 950 (e.g., a superconducting or partially superconducting interconnect) for coupling the second semiconductor structure 920 to the first semiconductor structure 910.

Multi-layer semiconductor structure 900 additionally includes a plurality of wire bonding structures (here, wire bonding structures 941, 942) for coupling the third semiconductor structure 930 to the second semiconductor structure 920. Here, wire bonding structures 941 and 942 show two sides of an open superconducting via attached with a superconducting and or conventional metal UBM. Additionally, semiconductor structures 920 and 930 may represent two sides of a same structure.

First semiconductor structure 910 (e.g., a multi-chip module (MCM)) has first and second opposing surfaces and includes interconnect pads 911, 912, 914 (e.g., conventional Al, Ti, Pt, and/or Au interconnect pads)which also have first and second opposing surfaces. Interconnect pad 911 has a surface disposed over or otherwise coupled to the first surface of first semiconductor structure 910. Additionally, interconnect pad 912 has a surface disposed over or otherwise coupled to the second surface of the first semiconductor structure 910. Further, interconnect pad 914 is disposed between the first and second surfaces of the first semiconductor structure 910.

First semiconductor structure 910 additionally includes a plurality of electrical connections or via structures (here, via structures 913, 915) disposed between the first and second surfaces of the first semiconductor structure 910. Via structure 913 is electrically coupled to interconnect pads 911, 914. Additionally, via structure 915 is electrically coupled to interconnect pads 914, 913.

Second semiconductor structure 920 (e.g., a superconducting IC) has first and second opposing surfaces and includes a substrate (e.g., a high resistive silicon (Si) substrate) which also has first and second opposing surfaces. The substrate, which has an associated thickness (e.g., of about two inches for a Titanium Nitride (TiN) substrate), has a plurality of electrical connections or via structures (e.g., partially filled or open vias) extending between the first and second surfaces of the substrate 921. Partially filled vias may, for example, provide for a larger pitch and filled superconducting vias may need longer deposition and processes. Open vias will provide sufficient superconductivity. The via structures may include one or more high Q metals (e.g., Niobium (Nb) or Indium (In)). Openings in which the via structures are formed may, for example, be etched in the substrate 921, and the substrate 921 may be cleaned and annealed prior to deposition of the high Q metals used to form the via structures.

High Q metals having a predetermined thickness (e.g., between about forty nanometers (nm) and about five hundred nm) are also deposited or otherwise disposed over selected portions of the second semiconductor structure 920 (e.g., using one or more physical (e.g., sputter) and chemical (e.g., electroless) processes). The predetermined thickness may, for example, be selected to provide for sufficient shielding which is substantially easy to achieve with less (or reduced) processing time. The high Q metals are patterned (e.g., using a photo process) to form a plurality of high Q metal structures (here, metal structures 922, 923, 924, 925, 926) on the substrate 921. The high Q metal structures may be electrically coupled to selected ones of the via structures formed in the substrate 921. In one embodiment, an adhesion layer (e.g., a Titanium (Ti) or Chromium (Cr) adhesion layer) is disposed between the selected portions of the second semiconductor structure 920 over which the high Q metals are disposed.

An interconnect pad 941 which may be provided from one or more under bump metal (UBM) materials (e.g., a Niobium pad) has a surface disposed over or otherwise coupled to the first surface of semiconductor structure 920. Additionally, a Josephson Junction (JJ) structure 928 (e.g., an aluminum (Al) JJ structure) is disposed over and otherwise coupled to selected portions of high Q metal structures 924, 925. In one embodiment, the substrate 921 has a "bulk" resistance of greater than about ten thousand ohms centimeter, an orientation of one hundred plus or minus zero point five degrees, and a thickness between about two hundred sixty and about three hundred micrometers.

Third semiconductor structure 930 (e.g., a superconducting IC), which may be the same as or similar to interconnect structure 920 in some embodiments, has first and second opposing surfaces and includes a substrate 931 (e.g., a high resistive silicon (Si) substrate) which also has first and second opposing surfaces. The substrate 931 has a plurality of electrical connections or via structures extending between the first and second surfaces of the substrate. Additionally, high Q metals having a predetermined thickness are deposited or otherwise disposed over selected portions of the third semiconductor structure 930. The high Q metals are patterned to form a plurality of high Q metal structures (here, metal structures 932, 933, 934) on the substrate 931. An interconnect pad 935 (e.g., a Niobium pad) has a surface disposed over or otherwise coupled to the first surface of semiconductor structure 930.

In the illustrated embodiment, second semiconductor structure 920 is coupled to first semiconductor structure 910 via interconnect structure 950 (here, a conductive structure 950). In particular, interconnect structure 950, which is a superconducting or partially superconducting interconnect structure according to the disclosure, has a first portion coupled to interconnect pad 912 of first semiconductor structure 910. Additionally, interconnect structure 950 has a second opposing portion coupled to interconnect pad 927 (e.g., a superconducting pad) of second semiconductor structure 920. In embodiments, at least one of interconnect pads 912, 927 is provided as part of the interconnect structure 950. It is further possible that interconnect pads 912 and or 927 are provided from conventional metals and make the interconnect 950 partially superconducting. It is also possible that interconnect pads 912 and 927 are superconducting and make the interconnect 950 superconducting.

Second semiconductor structure 920 is coupled to third semiconductor structure 930 via wire bonding structures 941, 942. In particular, wire bonding structure 941 has a first portion coupled to metal structure 926 of semiconductor structure 920 and a second opposing portion coupled to metal structure 934 of semiconductor structure 930. Additionally, wire bonding structure 942 has a first portion coupled to metal structure 926 of semiconductor structure 920 and a second opposing portion coupled to metal structure 934 of semiconductor structure 930.

Semiconductor structures 910 and 920 may be coupled together via interconnect structure 950 through a coupling process. In particular, during the coupling process, interconnect structure 950 may melt and form an electrical connection between interconnect pads 912, 927 of first semiconductor structure 910 and second semiconductor structure 920, respectively. In one example, interconnect pads 912 and 927 are UBMs and can create several high temperature and or low temperature melt interfaces during flip-chip bonding. It is possible that interconnect pads 912 and 927 and interconnect structure 950 have high temperature melting but create a low temperature melt interface between interconnect pad 912 and interconnect structure 950, and between interconnect pad 927 and interconnect structure 950. Thus, it is possible to bond interconnect structure 950 at a lower temperature but still can create meltable robust interface for a superconducting and or partially superconducting interconnect.

In one embodiment, the size and shape of at least one of the above-described interconnect pads (e.g., 912) and interconnect structure 950 is selected to achieve a desired pitch (e.g., a pitch requirement of semiconductor structure 910 or semiconductor structure 920). Additionally, in one embodiment, the size and shape of at least one of the above-described interconnect pads (e.g., 912) and interconnect structure 950 is selected to achieve a desired spacing S1 between semiconductor structures 910 and 920. The desired spacing S1 may be selected, for example, to achieve a predetermined inductive coupling between semiconductor structure 910 and semiconductor structure 920.

In one embodiment, the desired spacing S1 and height of the interconnect structure 950 (e.g., a bump) should generally be good enough to compensate for nonunifomity within chip+ nonunifomity within MCM+ nonunifomity among the bumps. For the structures shown in FIGS. 2 and 2A, for example, an area of atop surface of conductive structure 1240 will be less than area of resist opening which helps to maintain finer pitch even with taller conductive structure. Similarly, for the structures shown in FIGS. 5 and 5A, an area of a top surface (e.g., 540a) of conductive structure 540 will be more than area of resist opening for taller conductive structure.

In the illustrated embodiment, semiconductor structure 910 has first package pitch and semiconductor structure 920 has a second package pitch. Interconnect structure 950 has one or more characteristics (e.g., dimensions) selected in accordance with the first or second package pitches.

Figure 9A:
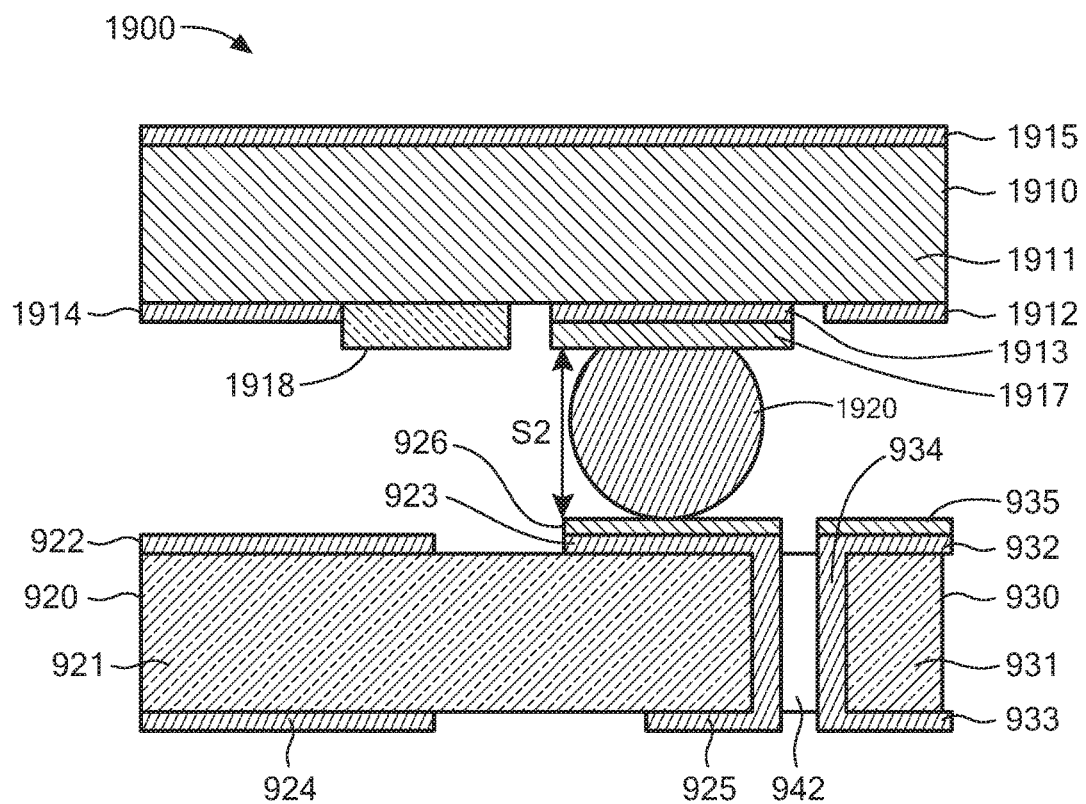
FIG. 9A is a block diagram of another example semiconductor structure as may be formed using an interconnect structure according to the disclosure.

Referring now to FIG. 9A, in which like elements of FIG. 9 are provided having like reference designations, another example multi-layer semiconductor structure 1900 as may be fabricated using interconnect structures according to the disclosure includes interconnect structure 920 (here, a first interconnect structure 920), interconnect structure 930 (here, a second interconnect structure 930) and a third interconnect structure 1910.

Third interconnect structure 1910, similar to first interconnect structure 920 and second interconnect structure 930, has first and second opposing surfaces and includes a substrate 931 (e.g., a high resistive silicon (Si) substrate) which also have first and second opposing surfaces. The substrate 1911 has a plurality of electrical connections or via structures extending between the first and second surfaces of the substrate 1911. High Q metals having a predetermined thickness are deposited or otherwise disposed over selected portions of the third semiconductor structure 1910 (e.g., using one or more physical (e.g., sputter) and chemical (e.g., electroless) processes). Additionally, the high Q metals are patterned (e.g., using a photo process) to form a plurality of high Q metal structures (here, metal structures 1912, 1913, 1914, 1915) on the substrate 1911. The metal structures 1912, 1913, 1914, 1915 may be coupled to selected ones of the via structures formed in the substrate 1911.

An interconnect pad 1917 (e.g., a Niobium pad) has a surface disposed over or otherwise coupled to a surface of metal structure 1913. Additionally, a Josephson Junction (JJ) structure 1918 (e.g., an aluminum (Al) JJ structure) is disposed over and otherwise coupled to selected portions of high Q metal structure 1914.

Third semiconductor structure 1910 is coupled to first semiconductor structure 920 via interconnect structure 1920 (here, a conductive structure 1920). Interconnect structure 1920 is a superconducting interconnect structure according to the disclosure (e.g., 1200, shown in FIG. 2A, or 1550, shown in FIG. 5A). The size and shape of at least one of the interconnect pads (e.g., 926) and interconnect structure 1920 may be selected to achieve a desired pitch (e.g., a pitch requirement of semiconductor structure 920 or semiconductor structure 1910). Additionally, the size and shape of at least one of the interconnect pads (e.g., 916) and interconnect structure 1920 is selected to achieve a desired spacing S2 between semiconductor structures 920 and 1910. Similar to spacing S1 of multi-layer semiconductor structure 900 of FIG. 9, spacing S2 may be selected to achieve a predetermined inductive coupling between semiconductor structure 920 and semiconductor structure 1910.

Provided below is a table illustrating example compositions of interconnect structures or portions thereof (e.g., conductive structures or bumps) formed according to the disclosure (e.g., as shown in FIGS. 5 and 5A). The first and second interconnect portions shown in the first two columns of the table below may, for example, be heated (e.g., with or without pressure) to form the resulting interconnect structures shown in the third column of the table.

| First Interconnect Portion | Second Interconnect Portion | Resulting Interconnect |
|---|---|---|
| 4.5 micrometer (μm) Tin (Sn) bump | 4.5 μm Indium (In) bump | <9 μm InSn bump |
| 8 μm Sn bump | 1 μm In bump/pad | <9 μm interconnect having InSn interface, InSn concentration gradient and Sn bump |

-continued

| First Interconnect Portion | Second Interconnect Portion | Resulting Interconnect |
|---|---|---|
| 8 μm Sn bump | 1 μm In bump/pad | <9 μm interconnect having InSn interface, InSn concentration gradient and In bump |
| 8 μm Lead (Pb) bump | 1 μm Sn bump/pad | <9 μm interconnect having PbSn interface, PbSn concentration gradient and Pb bump |
| 8 μm Pb coated Sn bump | 1 μm In pad | <9 μm interconnect having PbSn at Pb interface and SnIn at In pad interface, Sn concentration gradient and Sn bump |
| 4.5 μm Au (Gold) coated Tin (Sn) bump | 4.5 μm Au coated Indium (In) bump | <9 μm InSn bump, Au diffuse within matrix |
| 8 μm Au coated Sn bump | 1 μm Au coated In bump/pad | <9 μm interconnect having InSn interface, InSn concentration gradient, Sn bump, Au diffuse within matrix |
| 8 μm Au coated Sn bump | 1 μm Au coated In bump/pad | <9 μm interconnect having InSn interface, InSn concentration gradient and In bump |
| 8 μm Lead (Pb) bump | 1 μm Sn bump/pad | <9 μm interconnect having PbSn interface, PbSn concentration gradient and Pb bump |
| 8 μm Au coated Copper (Cu) bump | 1 μm Au coated In pad | <9 μm interconnect having CuSn interface, Sn concentration gradient, Cu bump, and Au diffuse within matrix |

Figure 10:
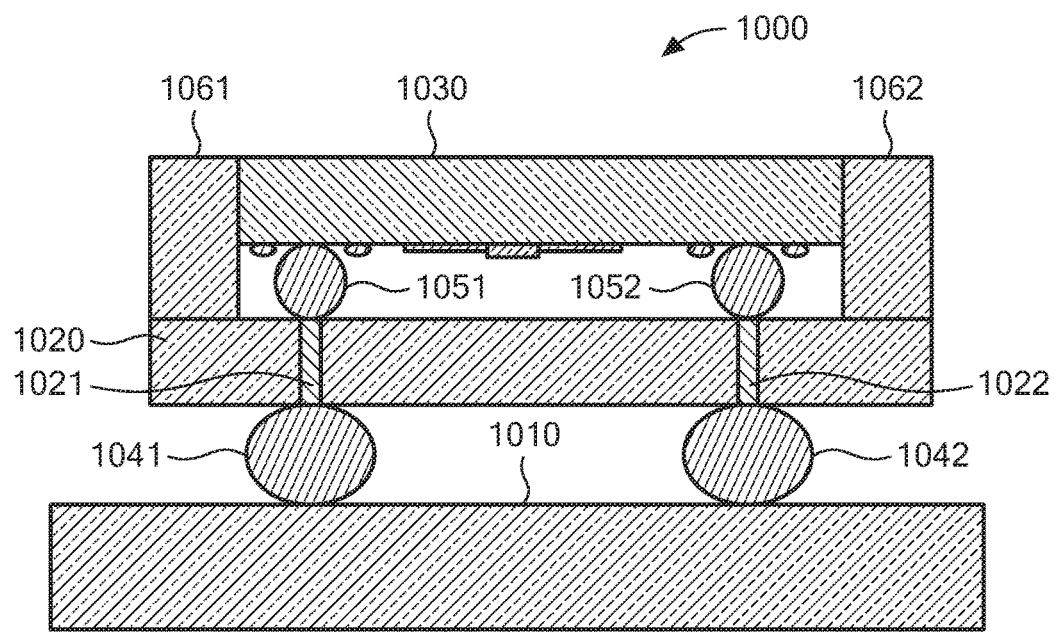
FIG. 10 is a block diagram of an example semiconductor structure as may be formed using an interconnect structure and a spacer according to the disclosure.

Referring now to FIG. 10, an example multi-layer semiconductor structure 1000 as may be fabricated using interconnect structures and interconnect spaces (also sometimes referred to herein as "spacers") according to the concepts, systems, circuits, and techniques sought to be protected herein is shown. Multi-layer semiconductor structure 1000 includes a first semiconductor structure 1010, a second semiconductor structure 1020 and a third semiconductor structure 1030. Additionally, multi-layer semiconductor structure 1000 includes first interconnect structures 1041, 1042, second interconnect structure 1051, 1052, and a plurality of spacers (here, spacers 1061, 1062).

First semiconductor structure 1010 (e.g., a functional SMCM) has first and second opposing surfaces and includes one or more electrical connections disposed between the first and second surfaces. Additionally, second semiconductor structure 1020 (e.g., a TSV substrate) has first and second opposing surfaces and includes a plurality of TSV structures (here, TSV structures 1021, 1022) disposed between the first and second surfaces. TSV structure 1021 may be coupled to first selected electrical connections in the second semiconductor structure 1020. Additionally, TSV structure 1022 may be coupled to second selected electrical connections in the second semiconductor structure 1020. The first and second electrical connections may the same as or similar to each other in some embodiments. Third semiconductor structure (e.g., a Qubit IC) has first and second opposing surfaces and one or more sides.

In the illustrated embodiment, second semiconductor structure 1020 is electrically coupled to first semiconductor structure 1010 through first interconnect structures 1041, 1042. Additionally, third semiconductor structure 1030 is electrically coupled to second semiconductor structure 1020 through second interconnect structures 1051, 1052. First interconnect structures 1041, 1042 and second interconnect structures 1051, 1052 may be the same as or similar to interconnect structures described in connection with figures above (e.g., 1200, shown in FIG. 2A).

First interconnect structures 1041, 1042 are disposed or otherwise provided (e.g., deposited) between the first surface of second semiconductor structure 1020 and the second surface of first semiconductor 1010. Interconnect structure 1041 is coupled to TSV structure 1021 in second semiconductor structure 1020. Additionally, interconnect structure 1042 is coupled to TSV structure 1022 in second semiconductor structure 1020.

Second interconnect structures 1051, 1052 are disposed between the first surface of third semiconductor structure 1030 and the second surface of second semiconductor 1020. Interconnect structure 1051 is coupled to TSV structure 1021 in second semiconductor structure 1020. Additionally, interconnect structure 1052 is coupled to TSV structure 1022 in second semiconductor structure 1020.

In the illustrated embodiment, third semiconductor structure 1030 is also coupled (e.g., mechanically and/or electrically) to second semiconductor structure 1020 through spacers 1061, 1062. The spacers 1061, 1062, which may be provided as oxide spacers, are coupled to selected portions of the first and second semiconductor structures 1020, 1030. In particular spacer 1061 has a first portion coupled to a first selected portion of the second surface of second semiconductor structure. Additionally, spacer 1061 has a second opposing portion coupled to a first side (or edge) of third semiconductor structure 1030. Spacer 1061 may, for example, be coupled to second and third semiconductor structures 1020, 1030 using an adhesive in some embodiments (e.g., a cryogenically stable adhesive).

Similarly, spacer 1062 has a first portion coupled to a second selected portion of the second surface of second semiconductor structure. Additionally, spacer 1062 has a second opposing portion coupled to a second side (or edge) of third semiconductor structure 1030. Spacer 1062 may also be coupled to second and third semiconductor structures 1020, 1030 using an adhesive in some embodiments.

In one embodiment, spacers 1061, 1062 are used to improve bond stability between second semiconductor structure 1020 and third semiconductor structure 1030, without providing or resulting in signal loss. Additionally, in one embodiment, spacers 1061, 1062 are used to protect at least one of the second and third semiconductor structures 1020, 1030 during assembly of multi-layer semiconductor structure 1000. As one example, spacers 1061, 1062 may protect Josephson junctions (or other structures) which may be provide in the third semiconductor structure 1030.

Further, in one embodiment, spacers 1061, 1062 may be used to control a thickness or distance between the second surface of second semiconductor structure 1020 and third semiconductor structure 1030. Interconnect structures (e.g., 1051, 1052) having a predetermined height or thickness (i.e., a distance between first and second opposing portions) may, for example, be established based upon a package pitch of the second semiconductor structure 1020 and/or a package pitch of the third semiconductor structure 1030. The predetermined height or thickness of the interconnect structures may control the thickness or distance between the second and third semiconductor structures 1020, 1030. In one embodiment, an interconnect structure having a height or thickness of between about six micrometers and about eight micrometers is established for an about thirty five micrometer package pitch. Additionally, in one embodiment, an interconnect structure having a height or thickness of between about four micrometers and about six micrometers is established for an about fifteen micrometer package pitch.

The predetermined height or thickness of the interconnect structures disposed between the second and third semiconductor structure 1020, 1030 may be controlled by the spacers 1061, 1062. For example, the predetermined height or thickness of the interconnect structures may be controlled by adjusting a distance between first and second opposing portions of the spacers 1061, 1062.

Additional aspects of spacers according to the disclosure, and alternative embodiments of spacers according to the disclosure, are discussed in connection with figures below.

Figure 11:
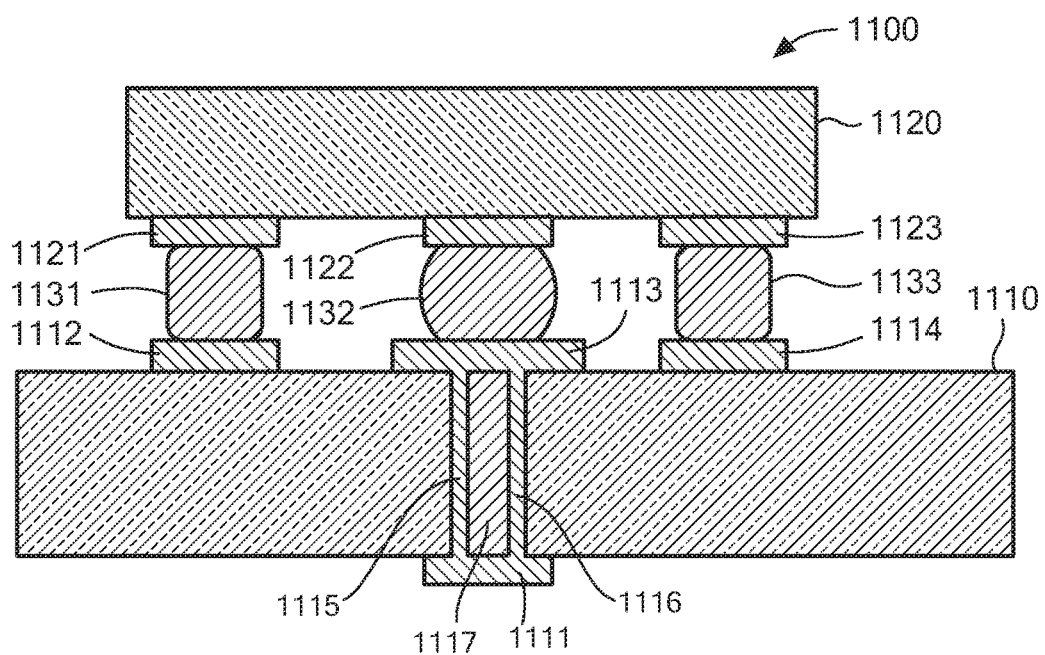
FIG. 11 is a block diagram of another example semiconductor structure as may be formed using an interconnect structure and a spacer according to the disclosure.

Referring now to FIG. 11, another example multi-layer semiconductor structure 1100 as may be fabricated using interconnect structures and spacers according to the disclosure includes a first semiconductor structure 1110, a second semiconductor structure 1120, an interconnect structure 1132 and spacers 1131, 1133.

First semiconductor structure 1110 (e.g., a TSV/MCM containing active device) has first and second opposing surfaces and includes interconnect pads 1111, 1112, 1113, 1114 which also have first and second opposing surfaces. The first surface of interconnect pad 1111 is disposed over or beneath a select portion of the first surface of first semiconductor structure 1110. Additionally, the first surface of each of interconnect pads 1112, 1113, 1114 is disposed over or beneath select portions of the second surface of first semiconductor structure 1110.

First semiconductor structure 1110 also includes a first pad interconnect 1115 which extends from a first select portion of the first surface of interconnect pad 1111 to a first select portion of interconnect pad 1113. Additionally, first semiconductor structure 1110 includes a second pad interconnect 1116 which extends from a second select portion of the first surface of interconnect pad 1111 to a second select portion of interconnect pad 1113. First semiconductor structure 1110 further includes a through silicon via (TSV) structure 1117 which is disposed in a cavity formed between the first and second pad interconnects 1115, 1116. TSV structure 1117 is electrically coupled to the first surfaces of each of interconnect pads 1111, 1113.

Second semiconductor structure 1120 (e.g., a Qubit chip) has first and second opposing surfaces and includes interconnect pads 1121, 1122, 1123 which also have first and second opposing surfaces. The first surface of each of interconnect pads 1121, 1122, 1123 is disposed over or beneath select portions of the first surface of second semiconductor structure 1120. In one embodiment, the interconnect pads 1121, 1122, 1123 are each provided from or include Aluminum (Al) and/or copper doped Al and/or an under bump material.

Interconnect structure 1132, which may be the same as or similar to interconnect structures described in figures above (e.g., 1200, shown in FIG. 2A), is provided as an interconnect (e.g., a superconducting interconnect) for electrically and mechanically coupling the second semiconductor structure 1120 to the first semiconductor structure 1110. Interconnect structure 1132 has first and second opposing portions. In the illustrated embodiment, interconnect structure 1132 has a first portion coupled to the second surface of interconnect pad 1112 of first semiconductor structure 1110 and a second opposing portion coupled to the second surface of interconnect pad 1121 of second semiconductor structure 1120. Additionally, interconnect structure 1132 may include one or more superconducting or partially superconducting materials (e.g., In).

Spacers 1131, 1133, which are provided as so-called "interconnect spacers," each have first and second opposing portions and are coupled to respective surfaces of first semiconductor structure 1110 and second semiconductor structure 1120. In particular, spacer 1131 has a first portion coupled to the second surface of interconnect pad 1112 of first semiconductor structure 1110 and a second opposing portion coupled to the second surface of interconnect pad 1121 of second semiconductor structure 1120. Additionally, spacer 1133 has a first portion coupled to the second surface of interconnect pad 1114 of first semiconductor structure 1110 and a second opposing portion coupled to the second surface of interconnect pad 1123 of second semiconductor structure 1120. In one embodiment, spacers 1131, 1133 include one or more electrically and thermally conductive materials (e.g., Au, Al and Cu).

Spacers 1131, 1133 may, for example, mechanically couple the second semiconductor structure 1120 to the first semiconductor structure 1110 and provide for efficient heat dissipation between the first and second semiconductor structures 1110, 1120 during system operation. In particular, the materials from which the spacers 1131, 1133 are provided may be efficient at low and high temperatures and at wide temperature ranges, providing for efficient heat dissipation.

Spacers 1131, 1133 may also control pitch between the first surface of second semiconductor structure 1120 and the second surface of first semiconductor structure 1110. The spacers 1131, 1133 may further control a height (e.g., a distance between first and second opposing portions) of the interconnect structure 1120 (e.g., an Indium (In) microbump) during flip-chip bonding of second semiconductor structure 1120 to first semiconductor structure 1110. The interconnect spacers may also keep a corresponding semiconductor structure (e.g., second semiconductor structure 1120) away from "lossy" Silicon (Si).

In one embodiment, at least one of spacers 1131, 1133 is a wire (e.g., an Au or Al wire) which acts as a spacer. The wire can, for example, create a 3D wall to isolate specific devices or semiconductor structures (e.g., isolate semiconductor structure 1120 from one or more other semiconductor structures). 3D wall isolation can use dielectric bridges. Additionally, an Al wire can make or provide a superconducting 3D wall. In some embodiments, it is possible for the wire to act as a spacer an inductor. The wire can be a 3D transmission line and/or a spiral and/or a solenoid inductor.

During coupling or bonding of the second semiconductor structure 1120 to the first semiconductor structure 1110, interconnect structure 1132 may melt and react with a UBM to produce a reliable interconnect with substantially no interface issues at a relatively low temperature (e.g., about two hundred fifty degrees Celsius) and, thus, create a high performance interconnect. Additionally, interconnect structure 1132 may create a low resistance interconnect between the first and second semiconductor structures 1110, 1120 (e.g., due to the material(s) from which the interconnect structure 1132 is provided).

It should be appreciated that in some embodiments at least one of spacers 1131, 1133 may be provided as an interconnect structure for electrically and mechanically coupling the second semiconductor structure 1120 to the first semiconductor structure 1110. Additionally, in other embodiments interconnect structure 1132 may be provided as an interconnect spacer as described above.

Further, in one embodiment, spacers 1131, 1132 are each coupled to or provided as part of second semiconductor structure 1110 and interconnect structure 1132 is coupled to or provided as part of first semiconductor structure 1110, or vice versa, or a combination thereof. A height of interconnect structure 1132 (i.e., a distance between first and second opposing portions in the illustrated embodiment) may be larger than a corresponding height of spacer 1131 and spacer 1133 prior to bonding. Additionally, in one embodiment, spacers 1131, 1133 are each provided as solder (e.g. Indium, tin-lead, indium-tin, etc.) coated bumps (gold, silver, etc.). Here solder will provide superconductivity and gold will provide high thermal conductivity necessary for heat dissipation. In another example gold bump can be replaced with UBM coated etched or deposited Si. In one example, around 35 micron tall, 30 micron diameter Indium bump when bonded with 12 micron tall around 60 micron diameter coined gold bump spacer, it produces flip-chip with around 12 micron spacing. In general tolerance of spacing in entire flip-chip will depend on thickness variation of spacer. In general, spacer with less than 250 nm thickness variation can produce flip-chip spacing within 1 micron variation. In one example, spacer thickness ranges from about 2 microns to about 20 microns. Wires or stacking multiple gold balls can increase spacer thickness above 20 microns.

Figure 12:
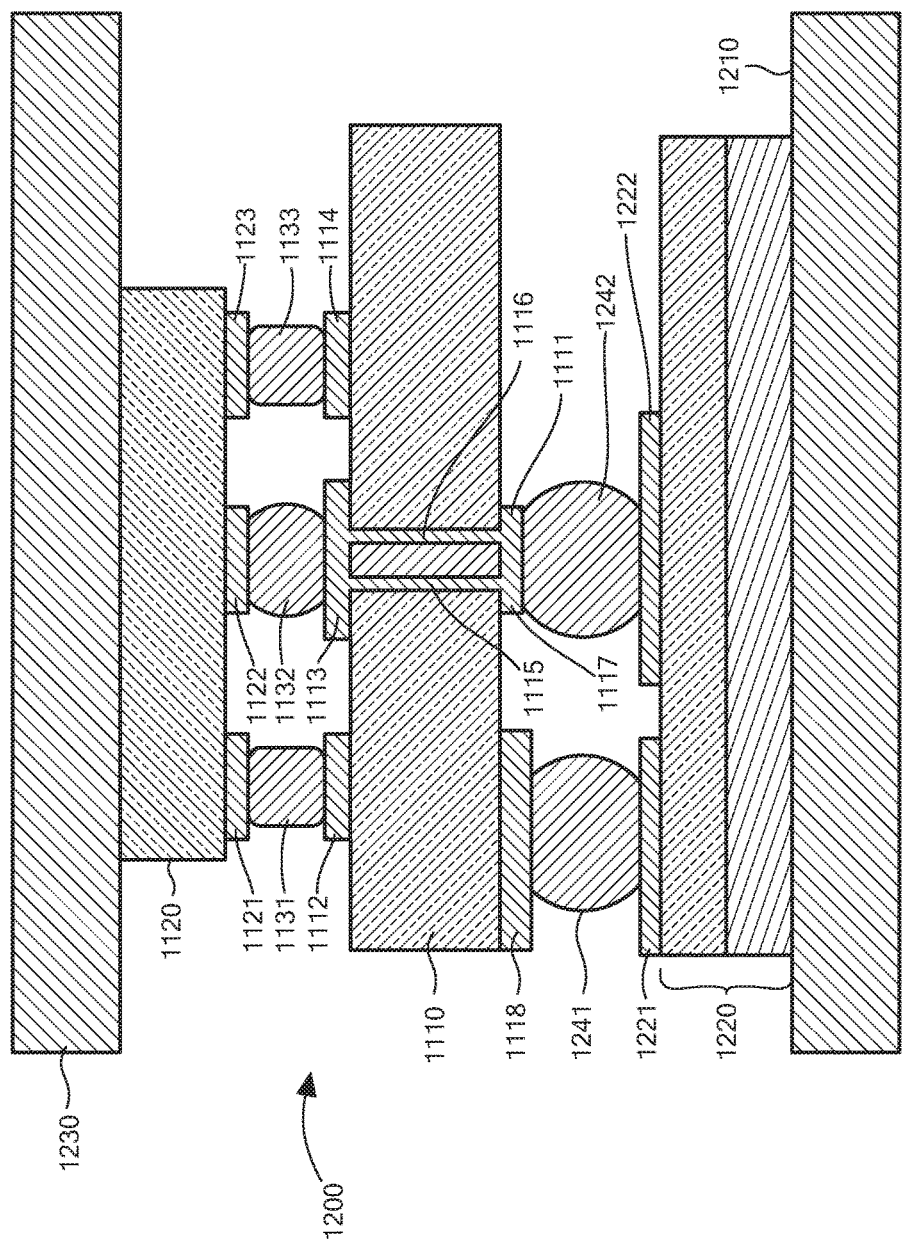
FIG. 12 is a block diagram of a further example semiconductor structure as may be formed using an interconnect structure and a spacer according to the disclosure.

Referring now to FIG. 12, in which like elements of FIG. 11 are provided having like reference designations, an example multi-layer semiconductor structure 1200 includes first semiconductor structure 1110 and second semiconductor structure 1120. Semiconductor device 1200 also includes interconnect structure 1132 and spacers 1131, 1132. In the illustrated embodiment, semiconductor structure 1200 further includes a first heat dissipation structure 1210, a third semiconductor structure 1220 and a second heat dissipation structure 1230. Additionally, semiconductor structure 1200 further includes an interconnect structure 1242 and a spacer 1241.

Third semiconductor structure 1220 (e.g., an MCM or PCB) has first and second opposing surfaces and includes interconnect pads 1221, 1222. Interconnect pad 1221, 1222, which each may be the same as or similar to interconnect pad 1121 of second semiconductor structure 1120, for example (e.g., including Cu, or Cu/Ni/Au), have a first surface which is disposed over or beneath selected portions of the second surface of third semiconductor structure 1220. The first surface of interconnect pad 1221 may be electrically coupled to first selected electrical connections in the third semiconductor structure 1220. Additionally, the first surface of interconnect pad 1222 may be electrically coupled to second selected electrical connections in the third semiconductor structure 1220.

Interconnect structure 1242, which may be the same as or similar to interconnect structure 1132, for example, is disposed between the first surface of first semiconductor structure 1110 and the second surface of third semiconductor structure 1220. Interconnect structure 1242 is also electrically coupled to the second surface of interconnect pad 1111 of first semiconductor structure 1110, and to the second surface of interconnect pad 1222 of third semiconductor structure 1220.

Additionally, spacer 1241, which may be the same as or similar to spacer 1131 and/or spacer 1133, is disposed between the first surface of first semiconductor structure 1110 and the second surface of third semiconductor structure 1220. Spacer 1241 is also electrically coupled to the second surface of an interconnect pad 1118 of first semiconductor structure 1110, and to the second surface of interconnect pad 1221 of third semiconductor structure 1220. Similar to spacers 1131 and 1133, spacer 1241 may be used to provide increased heat dissipation between the semiconductor structures.

First heat dissipation structure 1210 (e.g., a heat sink device or cold pate) has a surface (e.g., a second surface) which is disposed beneath and thermally coupled to the first surface of third semiconductor structure 1220. In one embodiment, the second surface of first heat dissipation structure 1210 is directly coupled to the first surface of third semiconductor structure 1220 (e.g., for efficient heat dissipation).

Additionally, in one embodiment, a thermal interface structure (not shown) and/or thermal interface materials (e.g., Indium (In) preform) (not shown) may be disposed between the second surface of first heat dissipation structure 1210 and the first surface of third semiconductor structure 1210. The thermal interface structures and/or thermal interface materials may, for example, provide mechanical strength to the bond(s) formed between the first heat dissipation structure 1210 and the third semiconductor structure 1220 (i.e., resulting from the coupling). The thermal interface structures and/or thermal interface materials may also reduce air gaps or spaces which may form between the first heat dissipation structure 1210 and the third semiconductor structure 1220.

Additionally, in some embodiments a thermally conductive adhesive material (e.g., a Nickel (Ni) or Gold (Au) adhesive material) (not shown) is disposed between the second surface of first heat dissipation structure 1210 and the first surface of third semiconductor structure 1220. Such may, for example, provide for increased heat dissipation between the third semiconductor structure 1220 and the first heat dissipation structure 1210.

Second heat dissipation structure 1230, which may be the same as or similar to first heat dissipation structure 1210 in some embodiments, has a surface (e.g., a first surface) which is disposed over and thermally coupled to the second surface of second semiconductor structure 1120 (e.g., a Qubit chip). Additionally, similar to first heat dissipation structure 1210, in one embodiment the second surface of second heat dissipation structure 1230 is directly coupled to the second surface of second semiconductor structure 1120 (e.g., for efficient heat dissipation). Second heat dissipation structure 1230 may, for example, remove heat from each of the first semiconductor structure 1110 and the second semiconductor structure 1120 during system operation (e.g., to minimize noise and increase performance of the first semiconductor structure 1110 and the second semiconductor structure 1120). It is to be appreciated that heat removal from the semiconductor structures during system operation may be critical to minimize noise and increase performance of the semiconductor structure 1200.

In one embodiment first semiconductor structure 1110 can be provided as an organic laminate chip carrier, and third semiconductor structure 1120 can be provided as an organic printed circuit board (PCB). Examples of organic materials suitable for use in such structures include fiberglass-reinforced or non-reinforced epoxy resins (sometimes referred to simply as FR4 material, meaning its Flame Retardant rating), poly-tetrafluoroethylene (Teflon), polyimides, polyamides, cyanate resins, photoimageable materials, and other like materials, or combinations thereof. Examples of electrically conductive materials for the circuit layers include copper or copper alloy. If the dielectric is a photoimageable material, it is photoimaged or photopatterned, and developed to reveal the desired circuit pattern, including the desired opening(s) as defined herein, if required. The dielectric material may be curtain coated or screen applied, or it may be supplied as a dry film or in other sheet form.

First semiconductor structure 1110, second semiconductor structure 1120 and third semiconductor structure 1220 can each have one or more Cu filled through vias, stacked vias, and/or staggered vias with a minimum spacing of about seventy micron between vias. Such vias may, for example, further increase heat dissipation in semiconductor structure 1200. As one example, heat may be dissipated from top and bottom portions of the semiconductor structure 1200 through use of the vias, first and second heat dissipation structures 1210, 1230, and the interconnect structures and/or spacers of semiconductor structure 1200.

Figure 13:
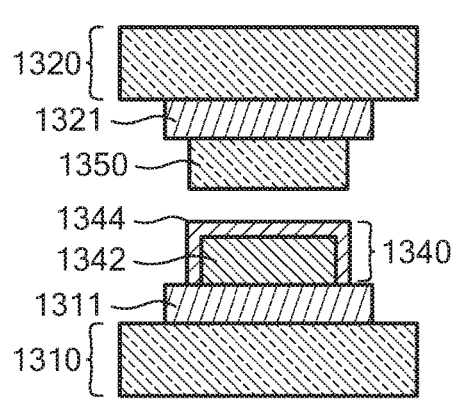
FIGS. 13-13E show cross-sections of example semiconductor structures and example interconnect structures as may be used in cryogenic electronic packages in accordance with an embodiment of the disclosure.
Figure 13A:
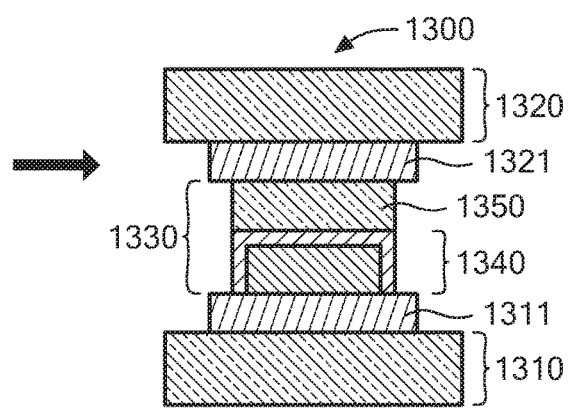
Figure 13B:
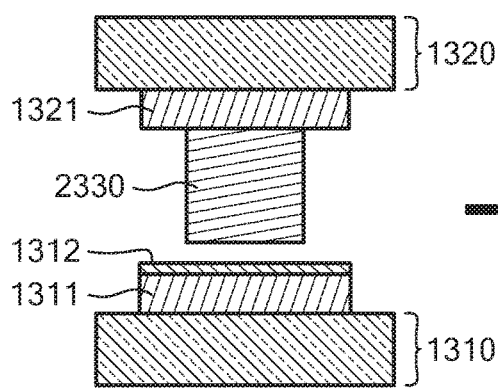
Figure 13C:
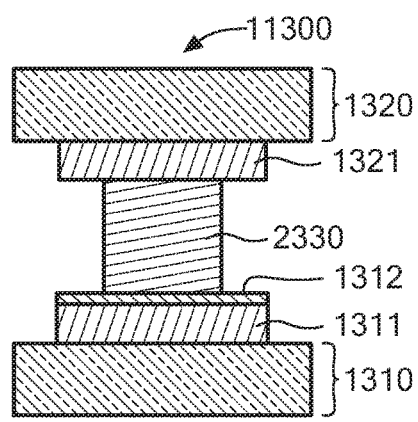
Figure 13D:
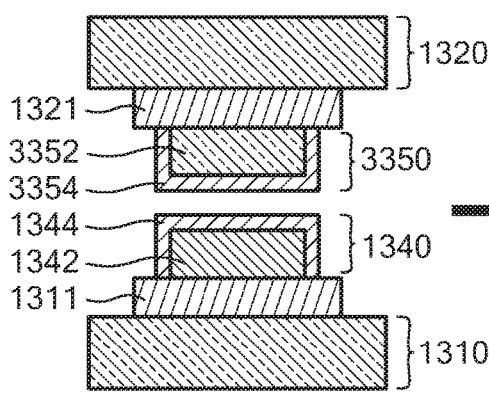
Figure 13E:
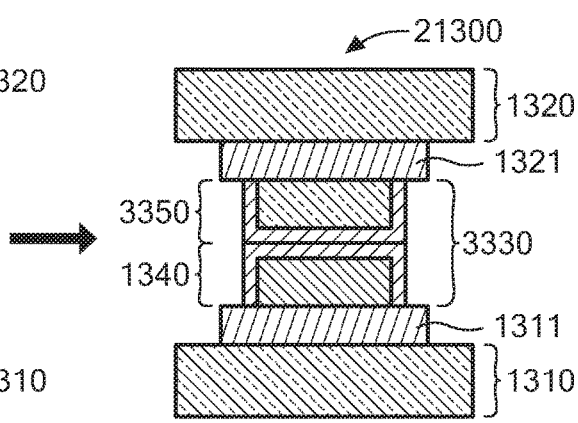

Referring to FIGS. 13-13E, cross-sections of example semiconductor structures and example interconnect structures as may be used in cryogenic electronic packages (e.g., 1300, shown in FIG. 13A) in accordance with an embodiment of the disclosure are shown. It should be appreciated that the example semiconductor structures and example interconnect structures described below are but several of many representative semiconductor structure and interconnect structures which may be used in the cryogenic electronic packages.

Referring now to FIGS. 13 and 13A, a first semiconductor structure 1310, a second semiconductor structure 1320 and an interconnect structure (here, an interconnect structure 1330 include a first interconnect portion 1340 and a second interconnect portion 1350) as may be used in a cryogenic electronic package 1300 are shown.

First semiconductor structure 1310 has first and second opposing surfaces and includes an interconnect pad 1311 which also has first and second opposing surfaces. Additionally, second semiconductor structure 1320 has first and second opposing surfaces and includes an interconnect pad 1321 which also has first and second opposing surfaces. Interconnect pad 1311 (e.g., an Aluminum (Al) or Gold (Au) interconnect pad) has a surface (e.g., a first surface) disposed over a surface (e.g., a second surface) of the first semiconductor structure 1310. Additionally, interconnect pad 1321 has a surface (e.g., a first surface) disposed over a surface (e.g., a second surface) of the second semiconductor structure 1320. In embodiments, first semiconductor structure 1310 and second semiconductor structure 1320 include one or more electrically connections (not shown) disposed between the first and second surfaces of the first semiconductor structure 1310 and second semiconductor structure 1320. Interconnect pad 1311 may be electrically coupled to one or more of the electrical connections in first semiconductor structure 1310, and interconnect pad 1321 may be electrically coupled to one or more of the electrical connections in second semiconductor structure 1320.

First interconnect portion 1340 of interconnect structure 1330 includes a first conductive structure 1342 (e.g., a metal conductive structure) having first and second opposing surfaces and one or more sides. First conductive structure 1342 has a surface (e.g., a first surface) disposed over and coupled to a surface (e.g., a second surface) of interconnect pad 1311. Additionally, a surface (e.g., a second surface) of first conductive structure 1342 and selected ones of the sides of first conductive structure 1342 are coated with a low melt metal or alloy material (e.g., Indium, tin-indium, tin-bismuth, tin-lead) to produce a corresponding fusible coupling surface or structure 1344 on the first conductive structure 1342.

Second interconnect portion 1350 of interconnect structure 1330 includes a second conductive structure (e.g., a solder ball, sphere, pillar, or micro-bump) having first and second opposing portions (here, first and second opposing surfaces) and one or more sides. Second conductive structure has a surface (e.g., a first surface) disposed over and coupled to a surface (e.g., a second surface) of interconnect pad 1321.

First interconnect portion 1340 and second interconnect portion 1350 of interconnect structure 1330 may be coupled together through a coupling process (e.g., a bonding or reflow process) to couple second semiconductor structure 1320 to first semiconductor structure 1310 (and form cryogenic electronic package 1300).

During the coupling process, the fusible coupling surface 1344 on first conductive structure 1342 of first interconnect portion 1340 may, for example, melt and form an electrical connection between the first interconnect portion 1340 and the second interconnect portion 1350. Additionally, during the coupling process at least part of the second interconnect portion 1350 may react with a surface (e.g., a second surface) of interconnect pad 1321 of second semiconductor structure 1320 to create a low or high temperature melt interface (i.e., a melt surface) between second interconnect portion 1350 and interconnect pad 1321. For example, in embodiments in which interconnect pad 1321 include Copper (Cu) and the second interconnect portion 1350 includes Tin (Sn), a high temperature melt interface may be created. Additionally, in embodiments in which interconnect pad 1321 includes Sn and second interconnect portion 1350 includes Indium (In), a low temperature melt interface may be created. In one embodiment, the melt interface melts at a temperature which is lower than a melting temperature of the second interconnect portion 1350 (e.g., by creating a concentration gradient at the interface).

In one embodiment, the size and shape of at least one of the interconnect pad 1311, the first interconnect portion 1340, the interconnect pad 1321 and the second interconnect portion 1350 is selected to achieve a desired pitch (e.g., a pitch requirement of first semiconductor structure 1310 and/or second semiconductor structure 1320). Additionally, by controlling melt characteristics of the fusible coupling surface 1344 of first interconnect portion 1340, for example, it is possible to create a finer pitch interconnect.

Additionally, in one embodiment, second interconnect portion 1350 further includes an under-bump metallization (UBM) structure (not shown) (e.g., 1940, shown in FIG. 19D below) for coupling the second conductive structure of second interconnect portion 1350 to interconnect pad 1321. The UBM structure may, for example, be disposed between interconnect pad 1321 and the second conductive structure. In one embodiment, interconnect pad 1321 is a metal interconnect pad (e.g., including Au and/or Cu), and the UBM structure is disposed over a surface (e.g., a second surface) of the interconnect pad 1321. The UBM structure may be provided from one or more electrically conductive materials (e.g., Copper (Cu), Gold (Au), Nickel (Ni), Platinum (Pt), Tin (Sn), and Titanium (Ti)). Example combinations of conductive materials for the UBM structure include Ti—Pt—Au—Sn, Ti—Pt—Au—Sn—Au, Ni—Au—Sn, and Ni—Au—Sn—Au.

Further, in one embodiment, the second conductive structure of second interconnect portion 1350 includes one or more of the following materials or combinations of materials: tin-lead, bismuth-tin, bismuth-tin-iron, tin, indium, tin-indium, indium-gold, tin-indium-gold, tin-silver, tin-gold, indium, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. Such materials and combinations of materials may, for example, melt during the coupling process.

Additionally, in one embodiment, fusible coupling surface 1344 of first interconnect portion 1340 and second conductive structure of second interconnect portion 1350 include a different metal or alloy material or combination of materials (i.e., interconnect structure 1330 has a multiple melt composition). As one example, second conductive structure of second interconnect portion 1350 may include Sn, and fusible coupling surface 1344 of first interconnect portion 1340 may be include In. In such example it is possible to create an indium and/or a tin-indium concentration gradient with tin from about 45% to about 100% at the coupling surface.

During coupling, a melt interface (i.e., a melt surface) formed between the fusible coupling surface 1344 of first interconnect portion 1340 and the second conductive structure of second interconnect portion 1350 may, for example, melt at a first temperature while remaining portions of the fusible coupling surface 1344 and second conductive structure (and other portions of interconnect structure 1330) may melt at a second, higher temperature. Such may, for example, provide for the ability to decouple and recouple the interconnect structure 1330 if rework is required during assembly of the cryogenic electronic package 1300 including semiconductor structures 1310, 1320.

Referring now to FIGS. 13B and 13C, in which like elements of FIGS. 13 and 13A are shown having like reference designations, a cryogenic electronic package 11300 includes first semiconductor structure 1310, second semiconductor structure 1320 and an interconnect structure 2330.

Interconnect pad 1311 of first semiconductor structure 1310 is coated with a low melt metal or alloy material (e.g., a solder melt) to produce a corresponding fusible coupling surface or structure 1312 on interconnect pad 1311 in the illustrated embodiment. In one embodiment, fusible coupling surface 1312 and fusible coupling surface 1344 of first interconnect portion 1340 shown in FIG. 13, for example, are similar.

Interconnect structure 2330 includes a conductive structure (e.g., a solder ball, sphere, pillar, or micro-bump) having first and second opposing portions (here, first and second opposing surfaces) and one or more sides. Interconnect structure 2330 has a surface (e.g., a first surface) disposed over and coupled to a surface (e.g., a second surface) of interconnect pad 1321 of first semiconductor structure 1320 in the illustrated embodiment.

First semiconductor structure 1310 and second semiconductor structure 1320 may be coupled together through a coupling process to form cryogenic electronic package 11300. During the coupling process, the fusible coupling surface 1312 on interconnect pad 1311 of first semiconductor structure 1310 and interconnect structure 2330 may melt and form an electrical connection between second semiconductor structure 1320 and first semiconductor structure 1310. In one embodiment, fusible coupling surface 1312 has a first melt temperature and the interconnect structure 2330 has a second melt temperature that is higher than the first melt temperature. In such embodiment, interconnect structure 2330 may melt after the fusible coupling surface 1312 during the coupling process and in some embodiments can be used to control a gap or spacing between respective surfaces of second semiconductor structure 1320 and first semiconductor structure 1310.

Referring now to FIGS. 13D and 13E, another example cryogenic electronic package 21300 includes first semiconductor structure 1310, second semiconductor structure 1320 and an interconnect structure 3330. Interconnect structure 3330 includes interconnect portion 1340 (here, a first interconnect portion 1340) and a second interconnect portion 3350.

Second interconnect portion 3350, which may be the same as or similar to first interconnect portion 1340 in embodiments, includes a second conductive structure 3352. Second conductive structure 3352 has first and second opposing surfaces and one or more sides. Second conductive structure 3352 has a surface (e.g., a first surface) disposed over and coupled to a surface (e.g., a second surface) of interconnect pad 1321 of second semiconductor structure 1320. Additionally, a surface (e.g., a second surface) of second conductive structure 3352 and selected ones of the sides of second conductive structure 3352 are coated with a low melt metal or alloy material (e.g., Tin, Indium, Tin-lead, Tin-bismuth) to produce a corresponding fusible coupling surface 3354 on the second conductive structure 3352.

First interconnect portion 1340 and second interconnect portion 3350 of interconnect structure 3330 may be coupled together through a coupling process to couple second semiconductor structure 1320 to first semiconductor structure 1310 (and form cryogenic electronic package 21300). During the coupling process, the fusible coupling surface 1344 on first conductive structure 1342 of first interconnect portion 1340 and the fusible coupling surface 3354 on second conductive structure 3352 of the second interconnect portion 3350 may, for example, melt and form an electrical connection between the first interconnect portion 1340 and the second interconnect portion 3350.

In one embodiment, fusible coupling surface 1344 and fusible coupling surface 3354 are each provided from a different metal or alloy material or combination of materials (e.g., Tin, Indium, Tin-lead, Tin-bismuth). Such may, for example, create a lower temperature melt interface between the first interconnect portion 1340 and the second interconnect portion 3350 (and semiconductor structures 1310, 1320).

FIGS. 13-13E illustrate several of many possible interconnect structures according to the disclosure. An interconnect structure according to the disclosure may include a bump and an under bump metal (UBM) structure where the bump will react with at least part of the UBM at an interface to create lower temperature melt interface. In one embodiment, the interface melts at a lower temperature than the bump and the UBM. Additionally, in embodiment it is also possible to create a concentration gradient at the interface which melts at lower temperature than bump materials. Interconnect structures according to the disclosure may have a multiple melt composition. Additionally, an interconnect interface may melt at lower temperature than other portions of the interconnect structures. This way it is possible to create an interconnect structure which will have opportunity to perform double assembly for rework and if necessary to create more reliable interconnect. Example materials for the bump and UBM include Ti—Pt—Au—Sn, Ti—Pt—Au—Sn—Au, Ni—Au—Sn, and Ni—Au—Sn—Au.

Figure 14:
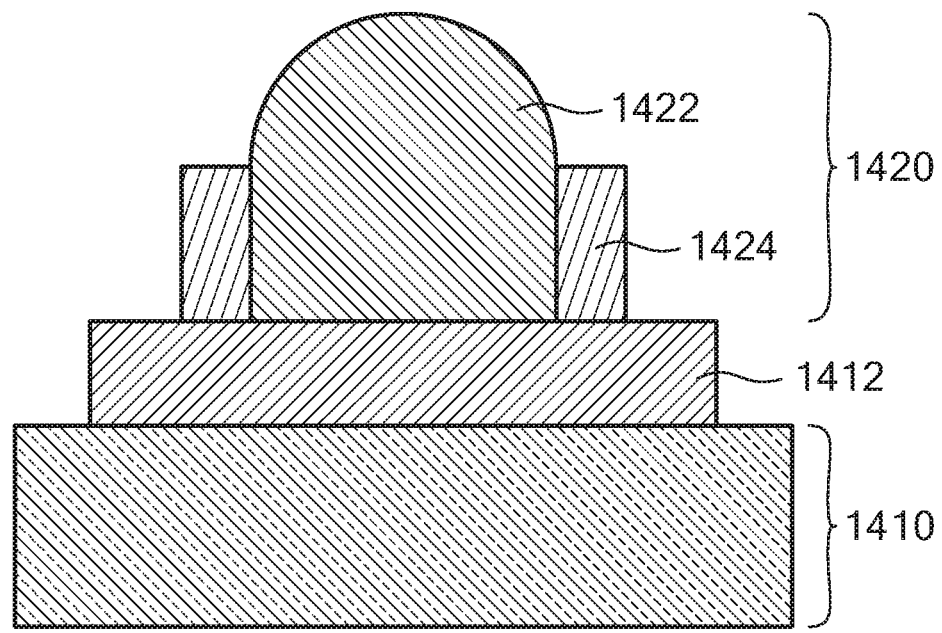
FIGS. 14-14A show cross-sections of further example semiconductor structures and example interconnect structures as may be used in cryogenic electronic packages in accordance with an embodiment of the disclosure.

Referring now to FIG. 14, cross-sections of another example semiconductor structure 1410 and another example interconnect structure 1420 as may be used in a cryogenic electronic package in accordance with an embodiment of the disclosure are shown. Semiconductor structure 1410, which may be the same as or similar to one or more of the semiconductor structures described in conjunction with the above figures (e.g., 1310, shown in FIG. 13), has first and second opposing surfaces and a predetermined package pitch. An interconnect pad 1412, which may have dimensions selected based at least in part upon the predetermined package pitch, has a surface (e.g., a first surface) disposed over and coupled to a surface (e.g., a second surface) of semiconductor structure 1410. Interconnect pad 1412 may also be coupled to one or more electrical connections (not shown) in the semiconductor structure 1410 in embodiments.

Interconnect structure 1420 includes a conductive structure 1422 and a barrier structure 1424 (e.g., to reduce or eliminate melt flow of conductive structure 1422 during reflow). The conductive structure 1422 has first and second opposing portions and one or more edges spaced between the first and second portions. The first portion of conductive structure 1422 is disposed over and coupled to first selected portions of a surface (e.g., a second surface) of interconnect pad 1412. In the illustrated embodiment, the first portion of conductive structure 1422 is substantially flat and the second portion of conductive structure 1422 is substantially curved. However, other configurations of the first and second portions of conductive structure 1422 are of course possible.

The barrier structure 1424, which may provide mechanical stability, long term reliability, and finer pitch capability to interconnect structure 1420 (e.g., acting as fence to prevent/minimize X-Y flow of conductive structure 1422 during bonding), for example, has first and surfaces and one or more sides. The first surface of barrier structure 1424 is disposed over and coupled to second selected portions of a surface (e.g., a second surface) of interconnect pad 1412. Additionally, the first surface of barrier structure 1424 surrounds corresponding edges of the conductive structure 1422 (e.g., to prevent X-Y shorts between conductive structure 1422 and other conductive structures). The second surface of barrier structure 1424 extends a predetermined distance from the surface of interconnect pad 1412 on which the barrier structure 1424 is disposed.

In one embodiment, conductive structure 1422 includes one or more materials having a first surface energy (e.g., a first melt phase), and barrier structure 1424 includes one or more materials having a second, lower surface energy (e.g., a second, lower melt phase). For example, conductive structure 1422 may include Indium and have a height of about eight micron, and barrier structure 1424 can include 20 nmAu/50 nmPt/20 nm Ti. Deposition of Ti/Pt/Au and Indium using a same or similar photoresist will favor these kinds of structures. Conductive structure 1422 and barrier structure 1424 may attach with each other by common materials. In the illustrated embodiment, for example, a gold layer may be present between In and Pt.

Additionally, in one embodiment, the barrier structure 1424 includes one or more polymer matrix composites (PMCs). Examples of polymer matrix composites suitable for use in such structures include photoimageable epoxy resins, polyamides, cyanate resins, photoimageable materials, and other like materials, or combinations thereof.

Generally there is substantially no gap between conductive structure 1422 and barrier structure 1424 when conductive structure 1422 and barrier structure 1424 are deposited together using a same or similar photoresist. However, it is possible to deposit conductive structure 1422 and barrier structure 1424 using separate photoresist processes. For separate photoresist processes, barrier structure 1424 may have a preferred photoresist thickness of between about one micron and about two micron. Additionally, for separate photoresist processes, conductive structure 1422 may have a preferred photoresist thickness of between about eight micron and about sixteen micron. For separate deposition of conductive structure 1422 and barrier structure 1424, a distance between about zero point five micron and about twenty micron may exist between barrier structure 1424 and corresponding edges of conductive structure 1422.

In one embodiment, interconnect structure 1420 is provided as a selected interconnect portion (e.g., a first or second interconnect portion) of an interconnect structure which includes two or more interconnect portions (e.g., 1330, shown in FIG. 13A). Additionally, in one embodiment interconnect pad 1412 is covered with a passivation layer having a thickness of between about one micron and about two micron. In an embodiment in which interconnect pad 1412 is provided having a diameter of about twenty micron, interconnect structure 2420 may have a diameter of between about sixteen micron and about eighteen micron and be deposited on a corresponding opening of interconnect pad 1412.

Figure 14A:
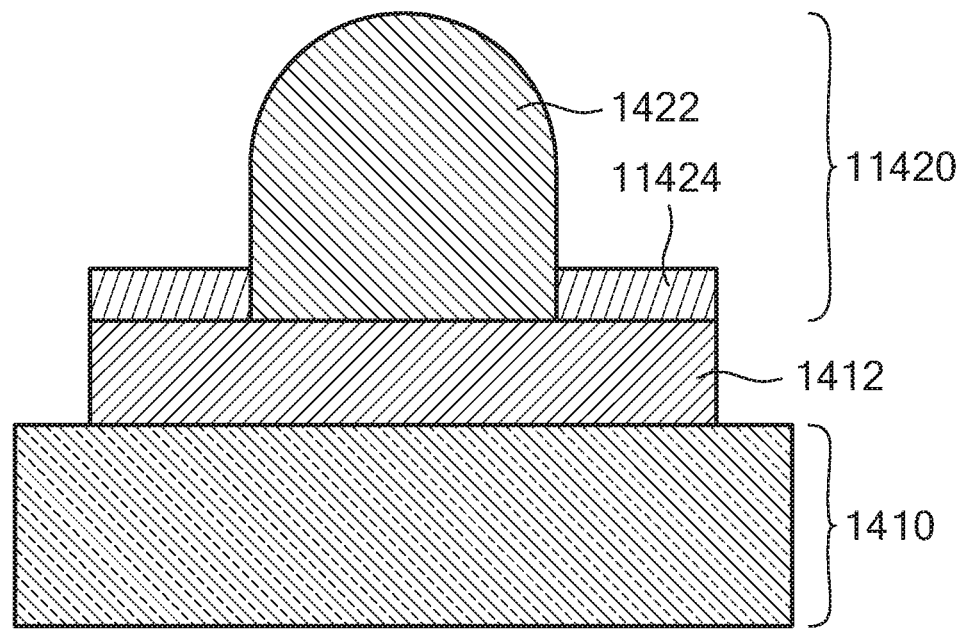

Referring now to FIG. 14A, in which like elements of FIG. 14 are shown having like reference designations, another example interconnect structure 11420 includes conductive structure 1422 and a barrier structure 11424.

A first portion of conductive structure 1422 is disposed over and coupled to first select portions of a surface (e.g., a second surface) of interconnect pad 1412. Additionally, a first portion of barrier structure 11424 is disposed over and coupled to second, remaining portions of the second surface of interconnect pad 1412 in the illustrated embodiment. In one embodiment, barrier structure 11424 includes Platinum or Nickel or Au/Pt/Ti or Au/Ni with a substantially random top surface. Additionally, in one embodiment, conductive structure 1422 includes tin-lead, tin-silver-copper, or a solder coated Cu micro bump.

Barrier structure 11424 can be directional, preventing flow of conductive structure in at least one direction. Additionally, barrier structure 11424 can have a height of between about 200 nm and a resist thickness used to create conductive structure 1422. It is further possible that barrier structure 11424 can be provided as part of interconnect pad 1412 and/or a UBM which may be disposed proximate to interconnect pad 1412 in embodiments. Further, barrier structure 11424 may be located at an end (i.e., off center) of the interconnect pad 1412. In one embodiment in which interconnect pad 1412 is surrounded by a passivation oxide or soldermask, barrier structure 11424 may be located at an opening of interconnect pad 1412 (e.g., an opening which is coupled to one or more electrical connections in a semiconductor structure). Additionally, in one embodiment conductive structure 1422 is grown or otherwise formed separately from barrier structure 11424 and interconnect pad 1412. Conductive structure 1422 may include about 5-20 nm Ti, about 50-100 nm Au and about 5-20 micron In or another low melt metal and/or alloy in embodiments. Additionally, barrier structure 11424 can include about 20 nm Ti and about 50 nm Pt in embodiments.

Figure 15:
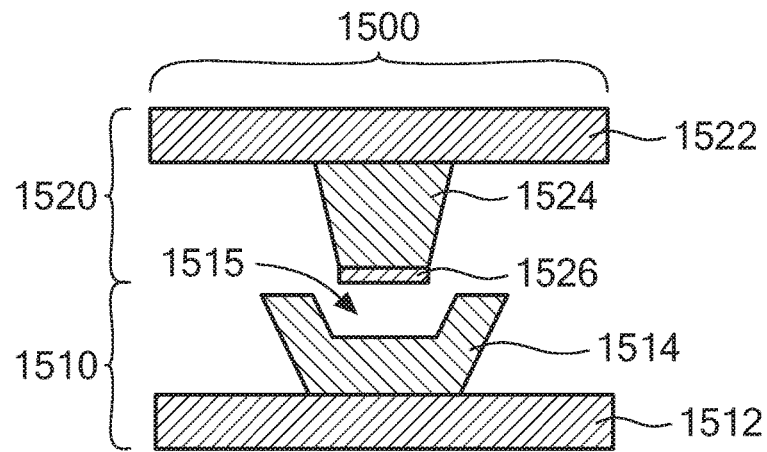
FIGS. 15-15B show cross-sections of example interconnect structures as may be used in cryogenic electronic packages in accordance with an embodiment of the disclosure.

Referring now to FIG. 15, a cross-section of another example interconnect structure 1500 as may be used in a cryogenic electronic packages in accordance with an embodiment of the disclosure is shown. Interconnect structure 1500 includes a first interconnect portion 1510 and a second interconnect portion 1520.

First interconnect portion 1510 includes an interconnect pad 1512 having first and second opposing surfaces. First interconnect portion 1510 also includes a first conductive structure 1514 (e.g., a UBM structure and/or a part of an interconnect structure provided from a metal or alloy material) which has a first portion (here, a first surface) disposed over and coupled to the second surface of interconnect pad 1512. First conductive structure 1514 also has a cavity 1515 formed in a second opposing portion (here, a second opposing surface) of the first conductive structure 1514. The cavity 1515 may, for example, have a predetermined shape and extend a predetermined distance between the second portion of first conductive structure 1514 and the first portion of first conductive structure 1514. Although the second portion of the first conductive structure 1514 is shown as having a substantially smooth surface in the illustrated embodiment, it is possible that one or more edges of the second portion of the first conductive structure 1514 can have rough edges or edges with a non-uniform roughness.

In one embodiment, the predetermined shape of the cavity 1515 is selected such that the cavity 1515 is shaped to receive at least a select portion of another conductive structure (e.g., second conductive structure 1524, as will be discussed). Additionally, in one embodiment, first conductive structure 1514 and cavity 1515 can have a same or similar composition a fusible coupling surface 1526, as will be discussed. In general, first conductive structure 1514 is prepared by creating a photoresist where a top opening of the photoresist is larger than a bottom opening of the photoresist. By depositing an interconnect material through the resist opening and subsequent photoresist liftoff, a first interconnect portion 1510 having a first conductive structure 1514 is created. Thickness of first conductive structure 1514 may be different from top and bottom. In general, cavity 1515 is thinner than the bulk of first conductive structure 1514.

Second interconnect portion 1520 of interconnect structure 1500 includes an interconnect pad 1522 having first and second opposing surfaces. Second interconnect portion 1520 also includes a second conductive structure 1524 (e.g., a micro-pillar bump) which has a first portion (here, a first surface) disposed over and coupled to the second surface of interconnect pad 1522. A second opposing portion (here, a second opposing surface) of second conductive structure 1524 is coated with a fusible conductive material (e.g., a solder melt material) to produce a fusible coupling surface 1526 (e.g., a solder tip) on the second portion of second conductive structure 1524. Fusible coupling surface 1524 may, for example, melt and react with first conductive structure 1514 to create a robust interconnect between first interconnect portion 1510 and second interconnect portion 1520. In one embodiment, fusible coupling surface 1524 is prepared by creating a photoresist having a top opening which is smaller than a bottom opening in the photoresist. By depositing an interconnect material through the resist opening and subsequent photoresist liftoff, a second interconnect portion 1520 having a second conductive structure 1525 coated with fusible coupling 1524 is created. In another embodiment, second conductive structure 1524 is prepared by a plating process in which a photoresist is created, the photoresist having a top opening which is larger than a bottom opening.

First interconnect portion 1510 and second interconnect portion 1520 may be coupled together through a coupling process (e.g., a reflow process) in which at least of portion of the second conductive structure 1524 of second interconnect portion 1520 is received in cavity 1515 of the first conductive structure 1514 of first interconnect portion 1510. During the coupling process, the fusible coupling surface 1526 on the second portion of second conductive structure 1524 may, for example, melt and remain within the cavity 1515 of first conductive structure 1514 to form an electrical connection between second conductive structure 1524 and first conductive structure 1514. Such may provide for a finer pitch and robust interconnect. As one example, a top portion of cavity 1515 may be provided having a larger surface than a bottom portion of second interconnect portion 1520 (e.g., fusible coupling surface 1526). Fusible coupling surface 1526 may melt within the cavity 1515 and stay within cavity 1515. Thus, bonding of second interconnect portion 1520 with first interconnect portion 1510 may prevent solder spreading during reflow and/or melting and maintain a finer pitch interconnect.

In one embodiment, the size and shape of at least one of the interconnect pad 1512, the first conductive structure 1514, the cavity 1515, the interconnect pad 1522 and the second conductive structure 1524 is selected to achieve a desired pitch (e.g., a pitch requirement of a semiconductor structure). For example, a 10-15 um thick photoresist having a top opening which is around 12-14 micron and bottom opening which is around 18-22 micron can create a second interconnect portion 1520 with a thickness (i.e., a distance between first and second opposing portions) of about 10 micron or less. In embodiments including fusible coupling surface 1526, second interconnect portion 1520 may have a thickness which is less or equal to about 12-14 micron, for example. Similarly, a 10-15 um thick photoresist having a top opening which is around 18-22 micron and bottom opening which is around 12-14 micron can create a first interconnect portion 1510 with a thickness of about 10 micron or less. In embodiments including cavity 1515, first interconnect portion may have a thickness which is less or equal to about 18-22 micron. In the illustrated embodiment, first conductive structure 1514 is provided having a substantially trapezoidal shape. However, it should be appreciated that the size and shape of first conductive structure 1514 may be altered to achieve the desired pitch.

Several examples of creating an interconnect structure 1500 by bonding second conductive structure 1524 with first conductive structure 1514 are described below. An about 4.5 um Sn bump (e.g., 1524) and an about 4.5 um In bump (e.g., 1514) may react with each other by applying heat with or without pressure to create a less than about 9 micron tin-indium interconnect. An about 8 um Sn bump (e.g., 1524) and an about 1 um In bump/pad (e.g., 1514) may react with each other by applying heat with or without pressure to create a less than about 9 micron tin-indium interface, InSn concentration gradient and Sn bump. An about 8 um In bump (e.g., 1524) and an about 1 um Sn bump/pad (e.g., 1514) may react with each other by applying heat with or without pressure to create a less than about 9 micron tin-indium interface, InSn concentration gradient and In bump. An about 8 um Pb bump (e.g., 1524) and an about 1 um Sn bump/pad (e.g., 1514) may react with each other by applying heat with or without pressure to create a less than about 9 micron SnPb interface, SnPb concentration gradient and Pb bump. An about 8 um Ag coated Sn bump (e.g., 1524) and an about 1 um Cu bump/pad (e.g., 1514) may react with each other by applying heat with or without pressure to create a less than about 9 micron Silver -tin-Cu interface and concentration gradient and Sn bump. An about Au coated 4.5 um Sn bump (e.g., 1524) and an about Au coated 4.5 um In bump (e.g., 1514) may react with each other by applying heat with or without pressure to create a less than about 9 micron tin-indium interface where Au diffuses within the tin-Indium matrix.

While interconnect pads 1512, 1522 are described as included in first and second interconnect portions 1510, 1520, respectively, in the illustrated embodiment, in some embodiments the interconnect pads 1512, 1522 may be provided as or coupled to respective semiconductor structures (e.g., 1310 and 1320, shown in FIG. 13). In such embodiments, first interconnect portion 1510 may consist of a first conductive structure 1514. Additionally, second interconnect portion 1520 may consist of second conductive structure 1524 and fusible coupling surface 1526. It is understood that other configurations of first interconnect portion 1510 and second interconnect portion 1520 are possible.

Figure 15A:
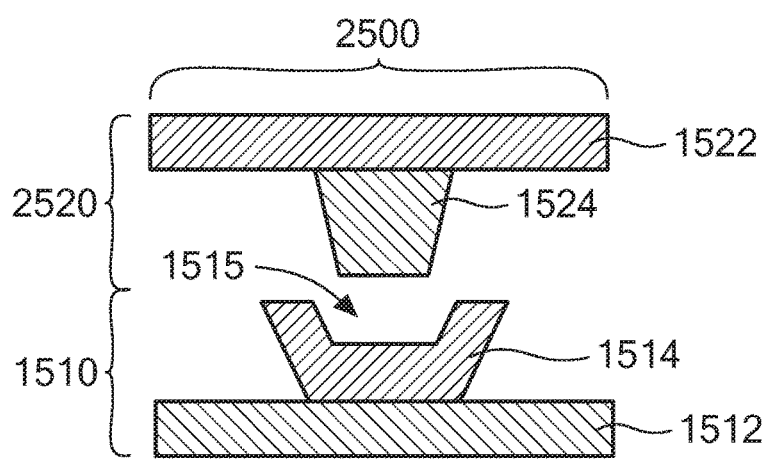

Referring to FIG. 15A, in which like elements of FIG. 15 are provided having like reference designations, an example interconnect structure 2500 as may be used in a cryogenic electronic package includes interconnect portion 1510 (here, a first interconnect portion 1510) and a second interconnect portion 2520. Second interconnect portion 2520 includes conductive structure 1524 (here, a second conductive structure 1524).

Similar to interconnect structure 1500, first interconnect portion 1510 and second interconnect portion 2520 of interconnect structure 2500 may be coupled together through a coupling process in which at least of portion of the second conductive structure 1524 of second interconnect portion 2520 is received in cavity 1515 of the first conductive structure 1514 of first interconnect portion 1510. During the coupling process, the second conductive structure 1524 is coupled to select portions of cavity 1515 of first conductive structure 1514. In one embodiment, second conductive structure 1524 is coupled to the select portions of cavity 1515 at a temperature which is less than the solder melt temperature of first conductive structure 1514.

In one embodiment, second conductive structure 1524 can be a micro pillar which can bond with first conductive structure 1514 at temperature which is less than its solder melt temperature. Additionally, in one embodiment, second conductive structure 1524 can be a microbump which includes a single or multiple Cu seed layers, or be plated with Cu, and a low melt metal and/or alloy layer can be provided within cavity 1515. In such embodiment, melt flow of the low melt metal and/or alloy will flow towards second conductive structure 1524. The low melt metal and/or alloy (e.g., Sn) may, for example, react with Cu to create at least one high melt solid solution.

Further, in one embodiment, at least part of the low melt metal and/or alloy remains unreacted and can act as healing agent (e.g., for strengthening the interconnect). Additionally, in one embodiment, at least part of the Cu plated layer can be replace by other metals such Ag, Au, Ni and the like. It is also possible to use single and/or multiple low temperature melt layer which melts and forms a multiple high melt composition. It is further possible to use low temperature melt metals and/or alloys (e.g., Tin and Indium) which reacts with each other and creates a lower melt (e.g., 48 weight % Tin and 52 weight % Tin Indium) composition. It is further possible that a low melt composition reacts with metals within the composition as well as other metals present in first conductive structure 1514 to create a higher melt composition than that of individual metals (e.g., Tin and Indium). It is further possible to create a composition gradient as well as melt temperature gradient. It is also possible to create a multi metal layer first conductive structure 1514 with at least one low temperature melt composition which melts and flows to repair opens and/or defects in the interconnect.

Figure 15B:
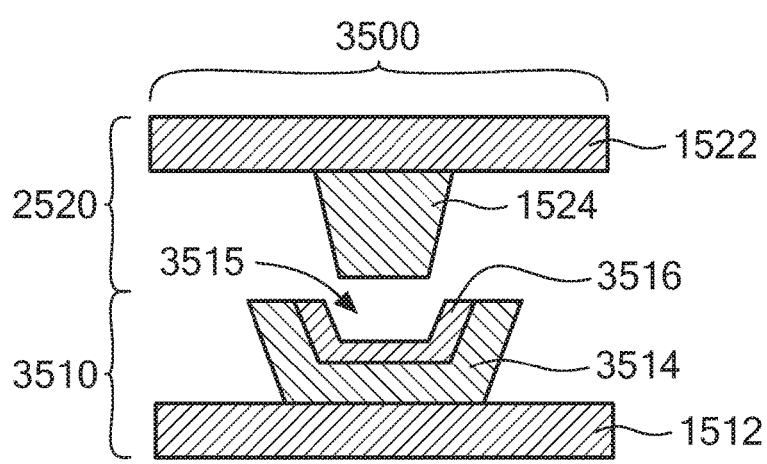

Referring to FIG. 15B, another example interconnect structure 3500 as may be used in a cryogenic electronic package includes a first interconnect portion 3510 and interconnect portion 2520 (here, a second interconnect portion 2520). First interconnect portion 3510 includes interconnect pad 1512 and a first conductive structure 3514 (e.g., a UBM structure provided from a metal or alloy material). First conductive structure 3514 has a first portion (here, a first surface) which is disposed over and coupled to the second surface of interconnect pad 1512. Additionally, a second opposing portion (here, a second opposing surface) of first conductive structure 3514 is coated with a fusible conductive material (e.g., a solder melt material) to produce a fusible coupling surface 3516 on the second portion of first conductive structure 3514.

First conductive structure 3514 also has a cavity 3515 (e.g., a solder coated cavity) formed in the second portion of the first conductive structure 3514. First interconnect portion 3510 and second interconnect portion 2520 may be coupled together through a coupling process in which at least of portion of the second conductive structure 1524 of second interconnect portion 2520 is received in the cavity 3515. During the coupling process, the second conductive structure 1524 is coupled to select portions of the cavity 3515. In one embodiment, second conductive structure 1524 is coupled to the select portions of the cavity 3515 at a temperature which is less than the solder melt temperature of the fusible coupling surface 3516.

Second conductive structure 1524, or a top surface (e.g., a second portion) of second conductive structure 1524, may have a solder wettable surface (e.g., Au or Cu). Similarly, first conductive structure 1514 and first conductive structure 3514, or top surfaces (i.e., second portions) of first conductive structure 1514 and first conductive structure 3514 may have a solder wettable surface (e.g., Au or Cu). Fusible coupling surface 3516 within cavity 3515 may, for example, help to prevent solder spreading during reflow and/or melting and maintain a finer pitch structure during bonding of first interconnect portion 3510 and second interconnect portion 2520. In one embodiment, second conductive structure 1524 includes multiple Cu—Sn, Cu—Sn—Au, Cu—Sn—Pb, or Cu—Sn—Pb—Au based micro-pillars grown on top of interconnect pad 1522 (e.g., a Cu pad). These micropillars may form multiple interconnections between second conductive structure 1524 and first conductive structure 3514. In embodiments, the interconnections (e.g., at a contact point of second conductive structure 1524 and first conductive structure 3514) may create an interlock structure which can reduce the failure risk of a resistive open circuit.

Figure 16:
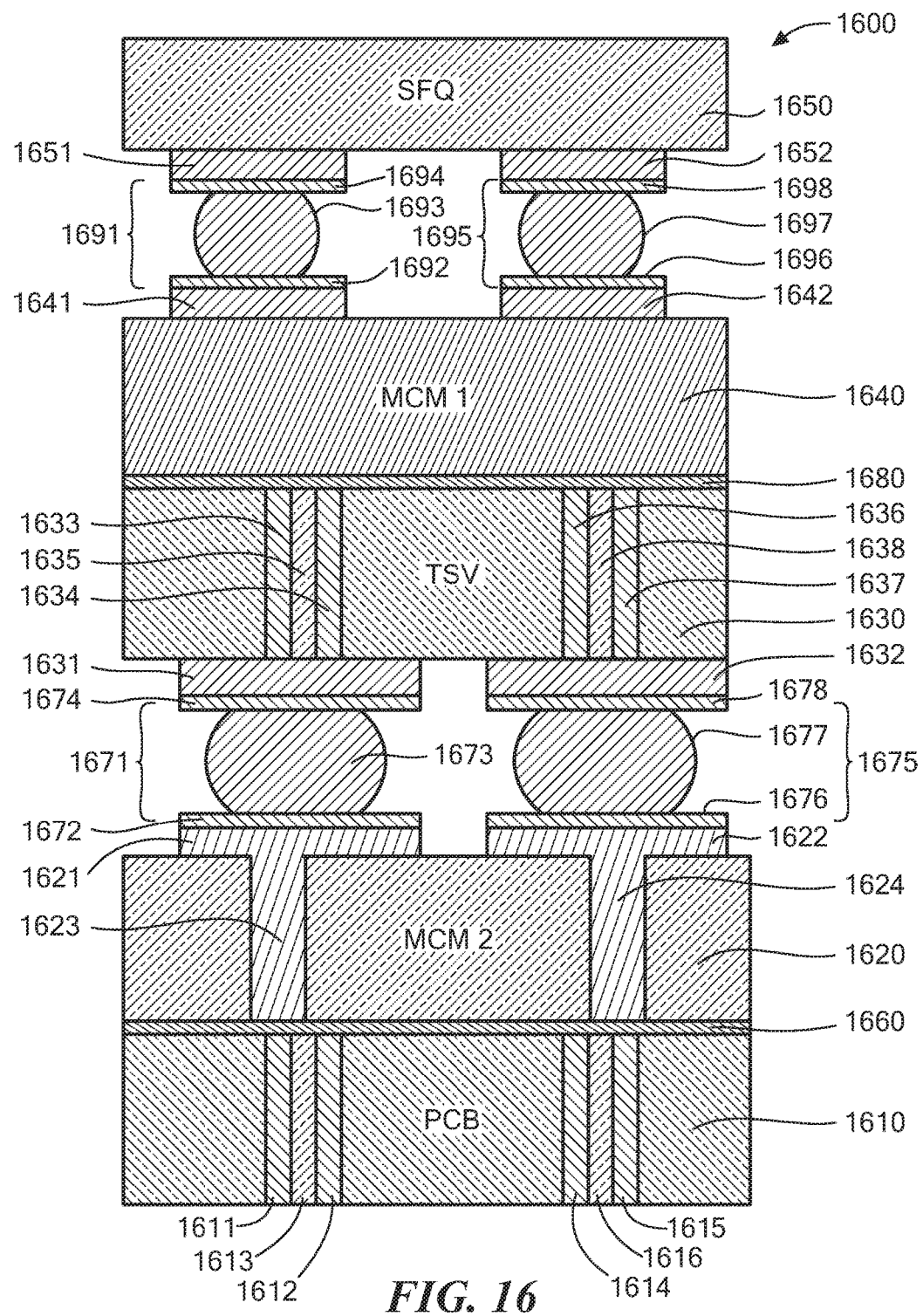
FIG. 16 shows a cross-section of an example cryogenic electronic package in accordance with an embodiment of the disclosure.

Referring to FIG. 16, a cross-section of an example cryogenic electronic package 1600 according to the disclosure is shown. Cryogenic electronic package 1600 includes a substrate 1610, a first SMCM 1620 and a superconducting interposer 1630. The cryogenic electronic package 1600 also includes a second SMCM 1640 and a superconducting semiconductor structure 1650.

Substrate 1610 (e.g., a TSV substrate) has first and second opposing surfaces and includes first and second TSV structures. The first TSV structure includes a first pad interconnect 1611, a second pad interconnect 1612 and a through via 1613. Additionally, the second TSV structure, which may be the same as or similar to the first TSV structure in embodiments, includes a first pad interconnect 1614, a second pad interconnect 1615 and a through via 1616.

First pad interconnect 1611 of the first TSV structure extends from a first selected portion of the first surface of substrate 1610 to a first selected portion of the second surface of the substrate 1610. Additionally, second pad interconnect 1612 of the first TSV structure extends from a second selected portion of the first surface of substrate 1610 to a second selected portion of the second surface of the substrate 1610. Further, through via 1613 of the first TSV structure is disposed in a cavity formed between the first and second pad interconnects 1611, 1612 of the first TSV structure.

First pad interconnect 1614 of the second TSV structure extends from a third selected portion of the first surface of substrate 1610 to a third selected portion of the second surface of the substrate 1610. Additionally, second pad interconnect 1615 of the second TSV structure extends from a fourth selected portion of the first surface of substrate 1610 to a fourth selected portion of the second surface of the substrate 1610. Further, through via 1616 of the second TSV structure is disposed in a cavity formed between the first and second pad interconnects 1614, 1615 of the second TSV structure.

First SMCM 1620 has first and second opposing surfaces and includes interconnect pads 1621, 1622 (e.g., Nb pads) which also have first and second opposing surfaces. Interconnect pad 1621 has a surface (e.g., a first surface) disposed over a first selected portion of the second surface of first SMCM 1620. Additionally, interconnect pad 1622 has a surface (e.g., a first surface) disposed over a second selected portion of the second surface of first SMCM 1620.

First SMCM 1620 additionally includes TSVs 1623, 1624 (e.g., a conducting and/or superconducting TSVs). TSV 1623 extends from a first selected portion of the first surface of first MCM 1620 to a surface (e.g., a first surface) of the interconnect pad 1621 (and the second surface of the first SMCM 1620). Additionally, TSV 1624 extends from a second selected portion of the first surface of first SMCM 1620 to a surface (e.g., a first surface) of the interconnect pad 1622 (and the second surface of the first SMCM 1620).

Interposer 1630 has first and second opposing surfaces and includes interconnect pads 1631, 1632 (e.g., Nb pads) which also have first and second opposing surfaces. Interconnect pad 1631 has a surface (e.g., a first surface) disposed over a first selected portion of the first surface of interposer 1630. Additionally, interconnect pad 1632 has a surface (e.g., a first surface) disposed over a second selected portion of the first surface of interposer 1630.

Interposer 1630 also includes first and second TSV structures. The first TSV structure of interposer 1630 includes a first pad interconnect 1633 which extends from a first selected portion of a surface (e.g., a first surface) of interconnect pad 1631 (and the first surface of the interposer 1630) to the second surface of interposer 1630. Additionally, the first TSV structure includes a second pad interconnect 1634 which extends from a second selected portion of the surface (e.g., the first surface) of interconnect pad 1631 to the second surface of interposer 1630. The first TSV structure also includes a TSV 1635 (e.g., a superconducting TSV) which is disposed in a cavity formed between the first and second pad interconnects 1633, 1634. TSV 1635 is electrically coupled to the surface (e.g., the first surface) of interconnect pad 1631.

The second TSV structure of interposer 1630 includes a first pad interconnect 1636 which extends from a first selected portion of a surface (e.g., a first surface) of interconnect pad 1632 (and the first surface of the interposer 1630) to the second surface of interposer 1630. Additionally, the second TSV structure includes a second pad interconnect 1637 which extends from a second selected portion of the surface (e.g., the first surface) of interconnect pad 1632 to the second surface of interposer 1630. The second TSV structure also includes a TSV 1638 (e.g., a superconducting TSV) which is disposed in a cavity formed between the first and second pad interconnects 1636, 1637. TSV 1638 is electrically coupled to the surface (e.g., the first surface) of interconnect pad 1632. In some embodiments, interconnect pads 1631, 1632 are provided as superconducting traces, include superconducting traces or are coupled to superconducting traces. In such embodiments, the pad interconnects 1633, 1634, 1636, 1637 may be referred to as trace interconnects.

Second SMCM 1640, which may be the same as or similar to first SMCM 1620 in embodiments, has first and second opposing surfaces and includes interconnect pads 1641, 1642 which also have first and second opposing surfaces. Interconnect pad 1641 has a surface (e.g., a first surface) disposed over a first selected portion of the second surface of second SMCM 1640. Additionally, interconnect pad 1642 has a surface (e.g., a first surface) disposed over a second selected portion of the second surface of second SMCM 1640.

Superconducting semiconductor structure 1650 (e.g., a single-flux-quantum (SFQ) integrated circuit (IC)) has first and second opposing surfaces and includes interconnect pads 1651, 1652 which also have first and second opposing surfaces. Interconnect pad 1651 has a surface (e.g., a first surface) disposed over a first selected portion of the first surface of superconducting semiconductor structure 1650. Additionally, interconnect pad 1652 has a surface (e.g., a first surface) disposed over a second selected portion of the first surface of superconducting semiconductor structure 1650.

In the illustrated embodiment, first SMCM 1620 is disposed over and coupled to substrate 1610 through an adhesive layer (or rework) 1660. Additionally, interposer 1630 is disposed over and coupled to first SMCM 1620 through interconnect structures 1671, 1675. Additionally, second SMCM 1640 is disposed over and coupled to interposer 1630 through an adhesive layer (or rework) 1680. Further, superconducting semiconductor structure 1650 is disposed over and coupled to second SMCM 1640 through interconnect structures 1691, 1695.

Interconnect structure 1671 includes a first section 1672, a second section 1673 and a third section 1674. Additionally, interconnect structure 1675 includes a first section 1676, a second section 1677 and a third section 1678. Additionally, interconnect structure 1691 includes a first section 1692, a second section 1693 and a third section 1694. Further, interconnect structure 1695 includes a first section 1696, a second section 1697 and a third section 1698.

In embodiments, cryogenic electronic package 1600 is fabricated in a plurality of processes. For example, a first portion of cryogenic electronic package 1600 including first SMCM 1620 and interposer 1630 may be fabricated in a first process. Additionally, a second portion of cryogenic electronic package 1600 including second SMCM 1640 and superconducting semiconductor structure 1650 may be fabricated in a second process. Further, a third portion of cryogenic electronic package 1600 (here, substrate 1610) may be fabricated in a third process.

Although the adhesive layers 1660, 1680 may lose their function (i.e., ability to adhere the semiconductor structures together) after wave soldering, for example, the adhesives 1660, 1680 should not degrade the reliability of the cryogenic electronic package 1600 during subsequent manufacturing processes such as cleaning and repair/rework. In embodiments, to ensure reworkability of cryogenic electronic package 1600, the adhesives 1660, 1680 should have a relatively low glass transition temperature Tg. Cured adhesives 1660, 1680 may soften (i.e., reach their Tg), for example, as they are heated during rework. For fully cured adhesives, a Tg in a range of about seventy five degrees C. to about ninety five degrees C. may, for example, be considered to accommodate reworkability.

In embodiments, temperatures to which the semiconductor structures of the cryogenic electronic package may be exposed may, for example, exceed about one hundred degrees Celsius (C.) during rework. The foregoing may be due to the materials from which the adhesive layers 1660, 1680 are provided (e.g., eutectic tin-lead solder) having a relatively high melt temperature. As long as the Tg of the cured adhesive is below about one hundred degrees C., for example, and the amount of adhesive layers 1660, 1680 is not excessive, reworkability of cryogenic electronic package 1600 may be within acceptable limits and/or tolerances.

In one embodiment, at least one of first SMCM 1620, interposer 1630, second SMCM 1640 and superconducting semiconductor structure 1650 includes one or more superconducting resonators and/or superconducting couplers and/or superconducting qubits and/or capacitors and/or inductors. The resonators, couplers, qubits, capacitors and inductors may be electrically and or inductively and capacitively coupled with each other.

Additionally, in one embodiment, superconducting semiconductor structure 1650 includes a center conductor of a superconducting resonator, interposer 1630 includes one or more superconducting resonators, and the superconducting semiconductor structure 1650 and interposer 1630 are capacitively coupled with each other during resonator operation.

In one example configuration of cryogenic electronic package 1600, SMCM 1640 has same or similar pad pitch as superconducting semiconductor structure 1650 and interposer 1630 has larger pad pitch than second SMCM 1640. Additionally, interposer 1630 may have a same or similar pad pitch as the first SMCM 1620 and first SMCM 1620 may have a larger pad pitch than second SMCM 1640. Further, substrate 1610 (e.g., an organic interposer) may have a larger pad pitch than first SMCM 1620 and substrate 1610 (e.g., an interposer) may have a larger pad pitch than interposer 1630. In other words, the example configuration of cryogenic electronic package 1600 discussed above includes a plurality of semiconductor structures with a plurality of package pitches (here, package pitches in ascending size; i.e., smallest to largest package pitch).

Additionally, in one example configuration of cryogenic electronic package 1600, the first and second TSV structures in interposer 1630 include superconducting and/or partially superconducting and/or or conventional (i.e., non-superconducting) interconnect materials. For example, in embodiments TSVs 1635, 438 in the first and second TSV structures may include one or more superconducting materials, and be provided as superconducting TSVs. Additionally, in embodiments pad interconnects 1633, 1634, 1636, 1637 in the first and second TSV structures may include one or more conventional materials.

In embodiments, the superconducting TSVs may include a low stress Titanium Nitride (TiN) superconducting or non-superconducting layer. In one embodiment, the superconducting TSV layer may consist of or includes single and/or multiple superconducting materials or multiple layers of single superconducting materials. It is further possible that at least one material and/or at least one composition of materials of the superconducting TSV layer may be superconducting. In one embodiment, the non-superconducting layer may consist of or include conventional and superconducting materials. It is also possible that the superconducting layer may consist of or include a superconducting and/or non-superconducting titanium nitride composition.

In one embodiment, the superconducting layer includes a combination of titanium-titanium nitride-tungsten and/or titanium-titanium nitride-high Q materials-tungsten and/or titanium-titanium nitride-high Q materials and/or titanium-high Q materials-tungsten and/or high Q materials-tungsten and/or high Q materials, etc. In another embodiment, the superconducting TSV layer consists of or includes single and/or multiple superconducting materials or multiple layers of high Q materials. Such materials may exist in single material phase and/or a composition of materials phases or react with each other to create a new lattice and/or modify lattice parameters.

In embodiments, the TSVs structures in interposer 1630 (here, a first TSV structure including 1633, 1634, 1635 and a second TSV structure including 1636, 1637, 1638) and the TSV structures in substrate 1610 (here, a first TSV structure including 1611, 1612, 1613 and a second TSV structure including 1614, 1615, 1616) are each filled with multiple metal and/or alloy layers. At least one of the multiple metal and/or alloy layers may have a low temperature melt composition and/or a conductive fusible metal which melts and flows to substantially reduce (or ideally eliminate) any possible electrical opens within the TSV structures. The low temperature melt metal and/or alloy layer may react with at least another metal within the TSV and/or via structures to create a high melt composition. It is possible to create a high melt composition with a melt temperature which can be higher than operational and/or processing temperatures. It is further possible that the low temperature melt composition melts and reacts with at least another metal composition within the TSV structures to create a high melt composition having a higher CTE than individual metal compositions.

It is further possible to use multiple metal or alloy layers having a low temperature melt composition within the TSV structures which melts and reacts with at least another metal and/or alloy within the TSV structures to create multiple high melt composition. It is further possible to create a melt gradient. It is also possible to use a multiple metal or alloy layer having a low temperature melt composition within the TSV structures which melts and reacts with at least another metal/and or alloy within the TSV structures to create a multiple high melt composition and a residual low melt metal which helps to heal any defects in the TSV structures which may arise during operation and/or processing.

Low Nitrogen percentages in a Ta/TaN barrier layer and/or high bias power conditions during PVD seed layer depositions in the TSV structures may, for example, help to grow more Cu seed with more Cu (111) than Cu (200) orientation. In one embodiment, Cu (111) favored Cu electroplating to fill the TSV structures a. Alternate seed layers for filling the TSV structures include CVD-Cu, CVD-W, sputtered TiW/Cu, CVD-tungsten (W) and sputtered TiW/Cu. It is also possible to use single and multiple Cu seed layers, plated Cu and low melt metals and/or alloy layers within the TSV structures where low melt metals and/or alloys will melt flow to the TSV structures and repair opens (if any) within the TSV structures. Low melt metals and/or alloys (e.g. Sn) may react with Cu and/or Au and/or Ag to create at least one high melt solid solution. It is further possible that at least part of the remaining metals in the TSV structures are unreacted and can act as healing agent. It is further possible that at least part of the Cu plated layer can be replace by another metal such as Ag, Au, and/or Ni.

It is also possible to use single and/or multiple low temperature melt layers which melt and form a multiple high melt composition. It is further possible to use low temperature melt metals and/or alloys (e.g., Tin and Indium) which react with each other and create a lower melt (e.g., 48 weight % Tin and 52 weight % Tin Indium) composition. It is further possible that a lower melt composition exposed to further heat-treatment will react with each other as well as other metals present in the TSV structures to create a higher melt composition than that of individual metals (e.g., Tin and Indium). It is further possible to create a composition gradient as well as melt temperature gradient. It is further possible to create multi metal layer TSV structures with at least one low temperature melt composition which melt and flow to repair any defects which may be present in the TSV structures.

Additionally, in some embodiments, one or more of the TSV structures can be filled with a nanoparticle conductive paste. For example, the TSV structures can be filled with a nanoparticle conductive paste through a process in which the TSV structures are filled with the paste at around 60 C under vacuum. At around 60 C the paste will have a lower viscosity than at room temperature. Low viscosity paste under vacuum will fill the TSV structures by capillary action. This process can be used multiple times to do complete the fill. After the fill, the paste will be cured and through a subsequent CMP process the cured paste will be removed from one or more surfaces of the TSV structures. It is also possible to form the TSV structures before final curing and to final cure the paste after the CMP. This process also favors to add a thin insulating layer around a wall of the TSV structures which will insulate/passivate a side wall of the TSV structures and provide a z-direction electrical connection after curing.

Further, in some embodiments, one or more of the TSV structures can be filled with a metal based nanoparticle which has a particle size less than or equal to one micron, preferably less or equal to between about two hundred nm and about five hundred nm in embodiments. The metal based nanoparticle can be a pure metal particle (e.g., Au, Ag, Cu), a low temperature melt metal and/or alloy (e.g., In), a low temperature melt metal and/or an alloy coated metal or a combination thereof. It is possible to have single and multiple metal seed based TSV structures filled with a conductive paste. Conductive paste filling may, for example, improve electrical conductivity of the TSV structures. It is further possible to use nanoparticle slurry instead of paste to fill the TSV structures.

In one example configuration, the TSV structures include a conventional metal pad and a conventional metal via with a surface (e.g., a top surface) of the conventional metal pad and/or via having at least one solder wettable metal (e.g. Au). The addition of a superconducting metal in the via and subsequent reflow will wet the conventional metal surface including the via and pad area and convert a conventional metal TSV to a superconducting TSV. It is further possible to use a cap plated and/or deposited superconducting metal (Al, Nb, TiN, NbN, Nb, TiN or combinations thereof) on a surface (e.g., a top surface) of a superconducting TSV. In one example, the cap plated superconducting metal has a single opening or multiple openings to access superconducting reflowable metals during interconnect formation.

In embodiments, cryogenic electronic package 1600 can additionally or alternatively include one or more of the semiconductor structures and/or interconnect structures described in figures above or below. For example, in one embodiment interconnect structure 1671 in cryogenic electronic package 1600 can be replaced by or include one or more portions of interconnect structure 1500 shown in FIG. 15. Additionally, in one embodiment superconducting semiconductor structure 1650 in cryogenic electronic package 1600 can be replaced by or include one or more portions (e.g., a passivation layer and/or UBM structure) of semiconductor structure 5900 shown in FIG. 19D, for example, as will be discussed below.

Figure 17:
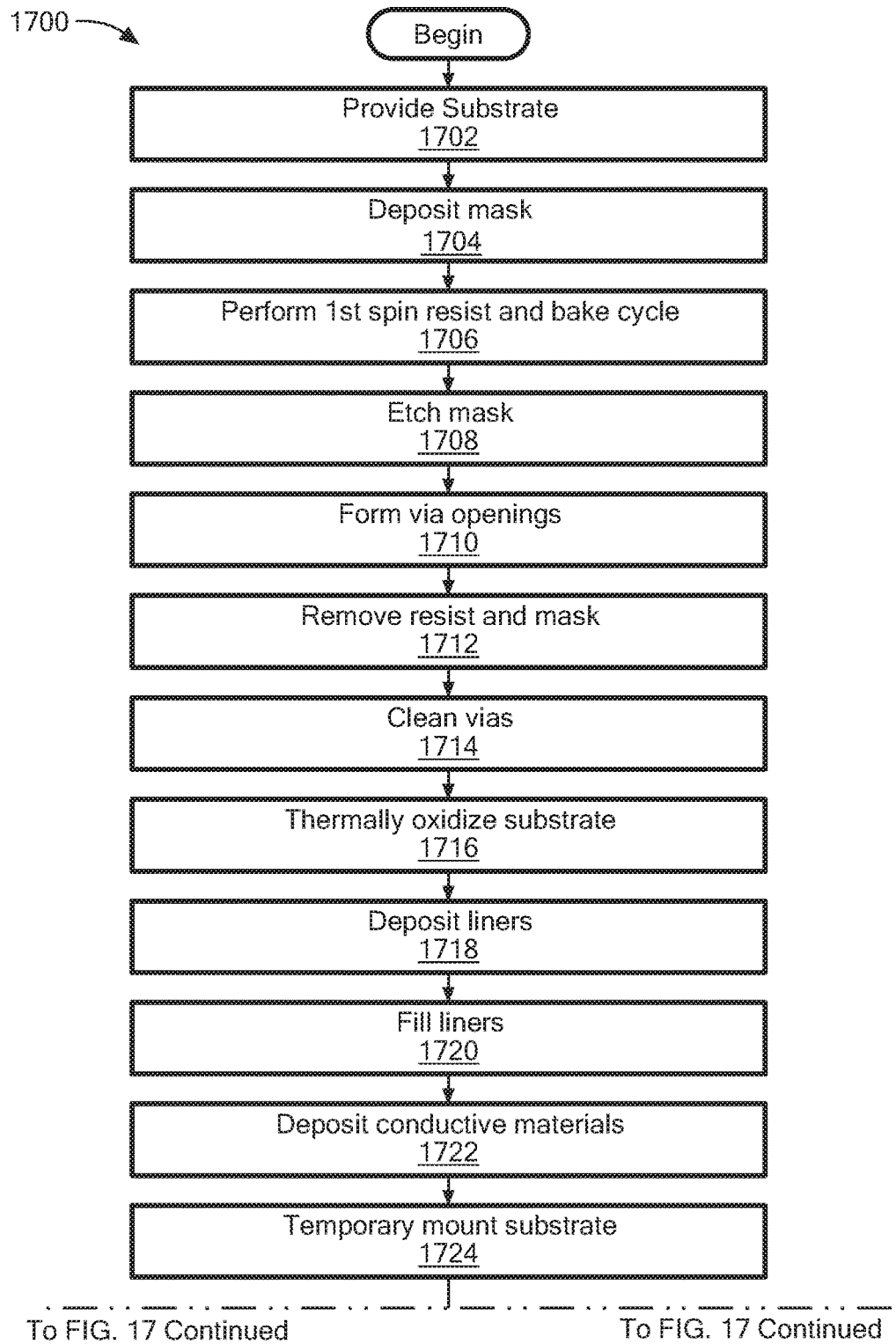
FIG. 17 is a flowchart illustrating an example method for fabricating a semiconductor structure as may be used in a cryogenic electronic package in accordance with an embodiment of the disclosure.
Figure 17:
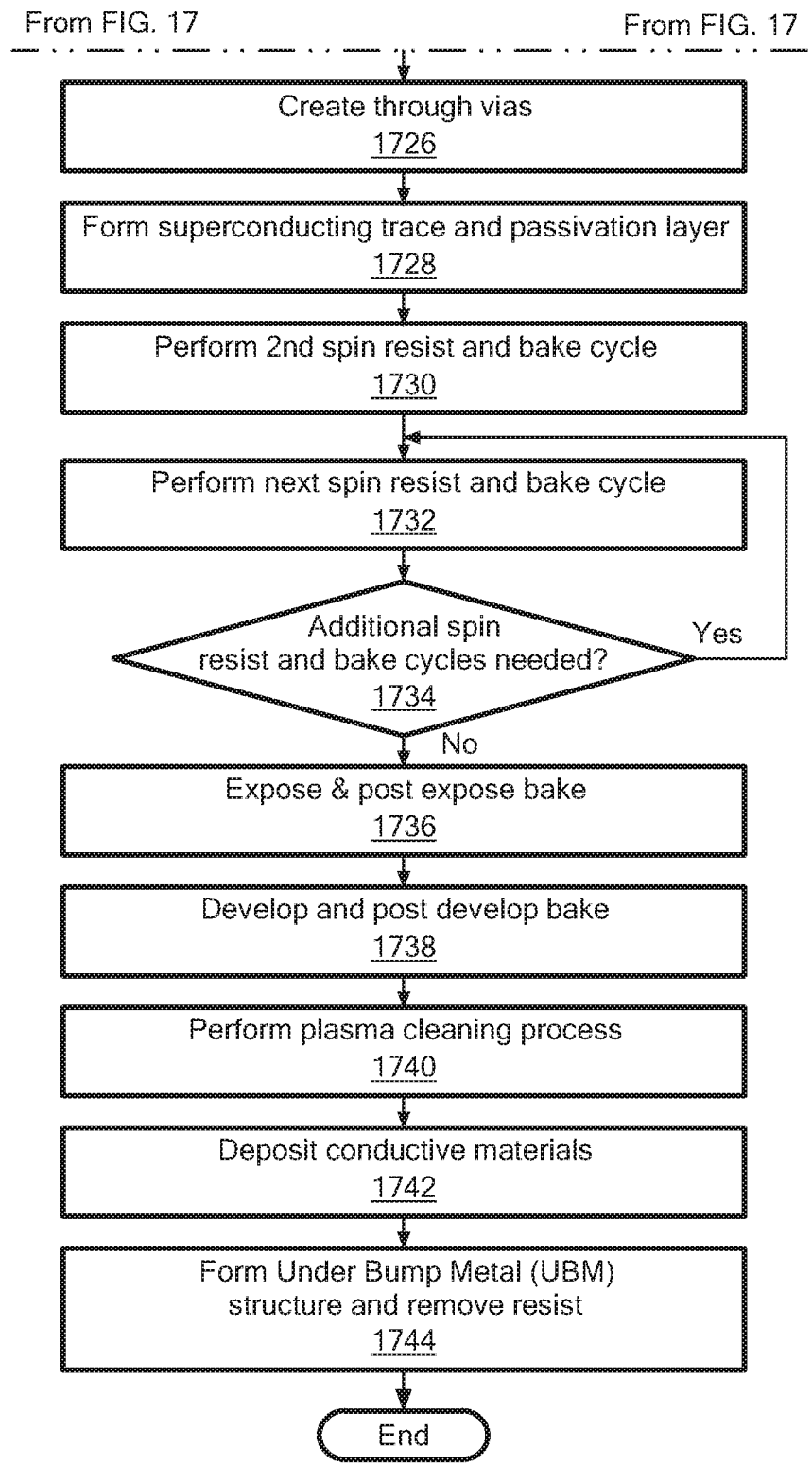

Referring to FIG. 17, a flowchart (or flow diagram) illustrating an example method 1700 for fabricating a semiconductor structure (e.g., 5900, shown in FIG. 19D) as may be used in cryogenic electronic packages according to the disclosure (e.g., 2300, shown in FIG. 23), for example, is shown. The method 1700 may, for example, be implemented in semiconductor manufacturing equipment used for fabricating semiconductor structures.

As illustrated in FIG. 17, an example method 1700 for fabricating a semiconductor and/or superconductor and/or conventional metal structure (e.g., 5900) according to an embodiment of the disclosure begins at block 1702. At block 1702, a semiconductor structure (e.g., 1900, shown in FIG. 19) including a substrate (e.g., 1910, shown in FIG. 19) is provided. The substrate (e.g., a silicon (Si) substrate), which has first and second opposing surfaces, may be a single or multi-layer substrate.

At block 1704, a process for forming one or more conductive structures or vias (e.g., 1913, shown in FIG. 19) between selected portions of the first and second surfaces of the substrate provided at block 1702 begins. At block 1704, a mask (e.g., a hard oxide mask) to be used to create one or more openings in the substrate for forming the vias is deposited or otherwise disposed over a surface (e.g., a second surface) of the substrate. A pattern of the mask may be based upon a material (or materials) from which resist materials are provided at block 1706. For example, the mask of a resist layer provided from a positive photoresist material should have a pattern which corresponds to a pattern of a resist layer to remain on the substrate (e.g., subsequent to development at block 1706). In contrast, the mask of a resist layer provided from a negative photoresist material should have a pattern which is the inverse (i.e., a photographic negative) of a pattern of the resist layer to remain on the substrate.

At block 1706, a first spin resist cycle and bake cycle is performed (e.g., for providing a resist layer for forming the vias in the substrate). In particular, at block 1706, a first predetermined amount of resist material (e.g., a photoresist material) is disposed over one or more portions (e.g., a center portion) of the substrate. At block 1706, the resist material is also disposed over or spread across one or more surfaces of the substrate using spin coating techniques as may be performed in a spin coater machine for example. The spin coater machine may, for example, rotate the substrate about a platform at a predetermined rate (e.g., angular speed) and for a predetermined time period in order to spread the resist material over the substrate. In particular, the substrate may be rotated until a desired thickness of the resist material (i.e., a distance between first and second surfaces of the resist material) is achieved on the substrate.

Additionally, at block 1706, subsequent to the resist material being spread over the substrate, the substrate is baked at a predetermined temperature and for a predetermined time period to form a resist layer from the resist material disposed over the substrate. Further, at block 1706, the resist layer is exposed to an exposure energy (e.g., thermal energy) to form an opening in the resist layer. The opening, which is formed according to a pattern in the mask, has a predetermined shape which is suitable for receiving conductive materials as may be used to form vias in the substrate. Additionally, the exposure energy has a predetermined intensity distribution and the resist layer is exposed to the exposure energy for a predetermined time period.

Further, at block 1706, the resist layer is developed. The resist layer may be developed by immersing the substrate including the resist layer in a developer solution for a predetermined time period. The resist layer may also be developed by spraying the substrate with the developer solution for the predetermined time period. In embodiments in which the resist layer is provided from a positive photoresist material, exposed portions of the resist layer are generally removed (or washed away) by the developer solution. In contrast, in embodiments in which the resist layer is provided from a negative photoresist material, unexposed portions of the resist layer are generally removed by the developer solution.

At block 1706, subsequent to the resist layer being developed in the developer solution, the substrate and remaining portions of the resist layer may also be rinsed (e.g., with deionized water) to remove the developer solution from the substrate and the resist layer. The substrate and remaining portions of the resist layer may also be rinsed to prepare the substrate and the resist layer for the mask etching process performed at block 1708.

At block 1708, the mask is etched through the resist opening formed at block 606 to create openings which may define via diameter. Additionally, at block 1710, via openings having a predetermined shape and aspect ratio (e.g., a high aspect ratio) are formed or otherwise provided in selected portions of the substrate for receiving conductive materials as may be used to form vias. In other words, at block 1710 vias (or via openings) are created or etched through the openings created at block 1708. The via openings may have a first dimension D1 corresponding to a height or depth of the openings. The via openings may also have a second dimension D2 corresponding to a width or diameter of the openings.

In one embodiment, an aspect ratio of the first dimension D1 of the openings to the second dimension D2 of the openings is substantially greater than or equal to about one. In other words, the openings have an aspect ratio of about one to one (1:1) or greater.

The via openings may be etched in the selected portions of the substrate. The via openings may also be drilled or grinded in the selected portions of the substrate. It should be appreciated that the manner in which the via openings are formed or otherwise provided may depend upon the materials from which the substrate is provided.

At block 1712, remaining portions of the resist layer are removed (e.g., stripped with a solvent, such as acetone) from the substrate to expose the substrate. Additionally, at block 1712 the mask deposited at block 1704 is removed from the substrate.

At block 1714, the vias formed in blocks above are cleaned using one or more plasma (e.g., oxygen-helium plasma, oxygen-argon plasma, forming gas, oxygen, carbon tetrafluoride ($CF_4$), etc) and/or chemical (e.g., ACT® 935 etch residue remover, or desmear) cleaning processes. The cleaning processes may, for example, prepare the substrate for providing of a superconducting trace (e.g., 1911, shown in FIG. 19) on the substrate.

At block 1716, the substrate is thermally oxidized to produce a thin layer of oxide (e.g., silicon dioxide ($SiO_2$)) on a surface of the substrate. In one embodiment, the substrate has a thickness (e.g., a distance between first and second surfaces of the substrate) of about one hundred nanometers. A number of oxide and or nitride or inorganic or organic or a combination of dielectric materials having a thickness in a range of about one hundred nanometers (nm) to about one thousand nm can be used to insulate the via. Via dielectrics may be required in some embodiments to provide for vias having substantially good step coverage (e.g., at least 50% through the depth of the trench), substantially good thickness uniformity (e.g., <3% variation across the wafer), a high deposition rate (e.g., >100 nm/min), low stress (e.g., <200 MPa), low leakage current (e.g., <1 nA/cm2), and a high breakdown voltage (e.g., >5 MV/cm).

At block 1718, a liner (e.g., a Ti or TiN liner) or insulator to be used for forming vias is deposited or otherwise disposed in each of the openings formed in the substrate.

At block 1720, the liners or insulators provided at block 1718 are at least partially filled with a conductive material (e.g., using via-last techniques) to form corresponding vias (or electrical connections) in the substrate. The conductive material may be a superconducting material and/or a non-superconducting material.

Plasma-enhanced chemical vapor deposition (PECVD) of $SiO2$ or SiN, or sub-atmospheric chemical vapor depositions (SACVD) of $SiO2$, are some examples of insulator or liner depositions at block 1718. The most commonly used conductors to fill vias (e.g., at block 1720) are doped polysilicon (180 lohm-cm), tungsten (5.6 lohm-cm), or copper (1.7 lohm-cm). W deposited by CVD has a good fill of the via and can be integrated with the contacts to which the vias are to be coupled. A TiN liner may be required to ensure that the $WF6$ precursor does not attack the Si substrate in the via. A disadvantage of W compared to Cu is that it has a high intrinsic stress (1400 MPa for W, 20 MPa for Cu).

The vias which are formed can be superconducting during qubit operation. A superconducting via comprises a Titanium Nitride (TiN) and or poly Si and or Al and or high Q metal. The vias can be provided as a combination of titanium-titanium nitride-tungsten and/or titanium-titanium nitride-high Q materials-tungsten and/or titanium-titanium nitride-high Q materials and/or titanium-high Q materials-tungsten and/or high Q materials-tungsten and/or high Q materials, etc.

Reactive-ion-etching (RIE) may be used to create high aspect ratio vias and deep trench structures in the Si (i.e., for capacitors or for isolation) in which the vias are provided. In one embodiment, a RIE Bosch process may be used to fabricate the vias, with the process alternating between deposition and etching steps to fabricate deep vias. $SF6$ isotropic etching of Si may not be suitable for forming vias (which require a highly anisotropic etch). Fluorocarbon chemistry (e.g., $C4F8$) may be used for anisotropic etching achieved through the deposition of a chemically inert passivation on the sidewall of the vias.

Chemical mechanical polishing (CMP) may be used for planarization of metal filled vias (e.g., micro vias), for example. Additionally, a metal contact (i.e. pad) in an upper device layer (e.g., the second device layer) may be an annulus with an about a one point five micrometer (μm) opening that also functions as a self-aligned mask (e.g., hard mask) during the plasma etch of the oxide beneath it to reach a corresponding metal contact in a lower device layer (e.g., the first device layer). In order to fully dispose and electrically couple the vias, the size of the metal contacts, and thus the pitch of the vertical interconnect, may be made proportional to about twice the misalignment of the wafers (or semiconductor structures).

Returning now to method 1700, at block 1722, one or more conductive materials are deposited over selected ones of the vias formed at block 1720 to form corresponding conductive layers over the vias. The conductive layers may, for example be patterned using a photo process.

At block 1724, the substrate is removably coupled to a mounting surface or structure of semiconductor manufacturing equipment used fabricate an superconducting trace and a under bump metal (UBM) structure at blocks 1726 to 1744 below.

At block 1726, selected portions of the substrate are grinded, etched or planarized through a chemical mechanical planarization or polishing (CMP) process to create one or more through vias in selected portions of the substrate. In one embodiment, the vias formed from the via openings formed at block 1710 are vias going through some depth of Si a wafer. Grinding, etching and CMP may reveal the vias from backside and also convert the via openings formed at block 1710 to through vias at block 1726.

At block 1728, a superconducting trace (e.g., 1911, shown in FIG. 19) is formed. In particular, at block 1728 one or more electrically conductive materials (e.g., superconducting metals) are deposited or otherwise disposed over the selected portions of the substrate in which the through vias are created at block 1726. Additionally, at block 1728 the conductive materials are patterned to form a superconducting trace or interconnect pad (e.g., 1911) over the substrate. The superconducting trace is electrically coupled to the through vias (e.g., using bond wires or via contacts spaced between the interconnect pad and the through vias). The superconducting trace may take the form of a sphere, a cube, a cylinder, a pyramid, a cone, a rectangular prism or any number of other shapes, including irregular shapes, as will be apparent to those of ordinary skill in the art.

At block 1728, a passivation layer (e.g., 1920, shown in FIG. 19A) is also formed. In particular, the passivation layer is disposed over or otherwise applied or coupled to selected portions of the substrate (e.g., 1910) and/or selected portions of the superconducting trace (e.g., 1911). The passivation layer may be formed through deposition or "printing" processes, for example.

At block 1730, a process for forming or otherwise providing an under bump metal (UBM) structure (e.g., 1940, shown in FIG. 19D) on selected portions of the semiconductor structure formed at block 1728 is provided. In particular, at block 1730, a spin resist and bake cycle (here, a second spin resist and bake cycle) is performed on the semiconductor structure formed at block 1728. The second spin resist and bake cycle may be the same as or similar to the first spin resist and bake cycle performed at block 110 of method 100 (as described above in connection with FIG. 1).

Figure 19:
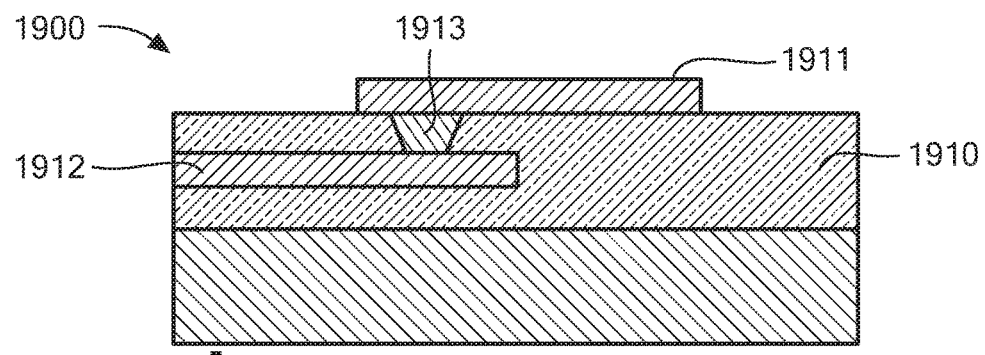
FIGS. 19-19D are cross-sections of example semiconductor structures as may be formed in accordance with the method of FIG. 17, for example.
Figure 19A:
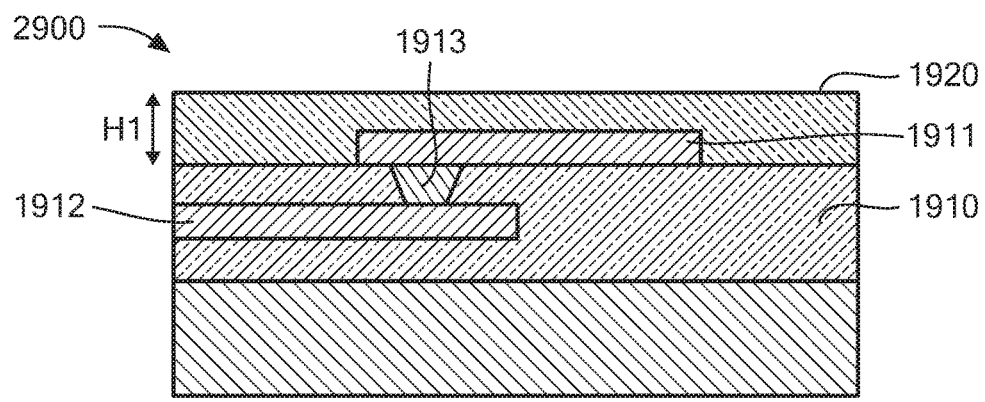
Figure 19B:
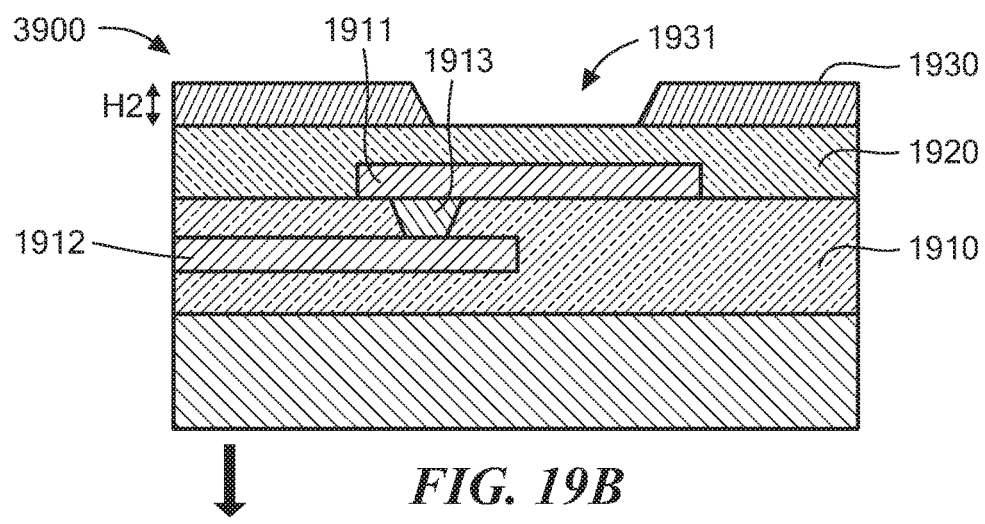

Specifically, during the second spin resist and bake cycle, a first predetermined amount of resist material is disposed over one or more portions of the semiconductor structure (e.g., passivation layer 1920 of semiconductor structure 3900, shown in FIG. 19B). Additionally, during the second spin resist and bake cycle, the resist material is disposed (or spread) over one or more surfaces of the semiconductor structure (e.g., passivation layer 1920) using spin coating techniques. The spin coating techniques may comprise the semiconductor structure being rotated about a platform of a spin coater machine at a predetermined rate and for a predetermined time period in order to spread the resist layer over the passivation layer. The semiconductor structure may, for example, be rotated until a desired thickness of the resist material (i.e., a distance between first and second surfaces of the resist material) is achieved on the semiconductor structure.

At block 1730, subsequent to the resist material being spread over the semiconductor structure, the semiconductor structure is baked at a predetermined temperature and for a predetermined time period to form a first resist layer (or a first portion of a resist layer) from the resist material. The first resist layer formed at block 1730 (e.g., resist 1930, shown in FIG. 19B) has first and second opposing surfaces, with the first surface of the first resist layer disposed (or formed) over a surface (e.g., a second surface) of the passivation layer.

At block 1732, a next spin resist and bake cycle is performed on the semiconductor structure. The next spin resist and bake cycle performed at block 1732 may be the same as or similar to the next spin resist and bake cycle performed at block 115 of method 100.

In particular, during the next spin resist and bake cycle, a second predetermined amount of a resist material is disposed over one or more portions of the second surface of the resist layer formed at block 1730. Additionally, during the next spin resist and bake cycle, the semiconductor structure is rotated by the spin coater machine at a second predetermined rate for a second predetermined time period. Similar to the first spin resist and bake cycle, the semiconductor structure may be rotated until a desired thickness or height of the resist material (e.g., H2, shown in FIG. 19B) is achieved on the semiconductor structure (here, on the resist layer of the semiconductor structure).

At block 1732, the semiconductor structure is also baked at a predetermined temperature and for a predetermined time period to form a second resist layer (or second portion of a resist layer). In embodiments, the second resist layer has a thickness (e.g., a distance between first and second opposing surfaces) which is substantially greater than a thickness of the first resist layer formed at block 1730. Additionally, in embodiments the second resist layer may have a more uniform surface than the first resist layer.

At block 1734, it is determined whether any additional spin resist and bake cycles are needed. If it is determined that additional spin resist and bake cycles are needed, the method 1700 returns to block 1730 and blocks 1730 and 1732 are repeated until it is determined that no additional spin resist and bake cycles are needed. Alternatively, if it is determined that no additional spin resist and bake cycles are needed, the method 1700 may proceed to a block 1736.

A number of spin resist and bake cycles performed in method 1700 may be selected to achieve a resist layer (i.e., a resist layer comprising the first resist layer and the second resist layer) having a predetermined height or thickness (e.g., H2, shown in FIG. 19B). In embodiments, the process performed in blocks 1730-1734 is useful for depositing a thick and planarized resist for contact lithography. Additionally, in embodiments single spin coating techniques performed at block 1730 can create a single thick resist coating on top of the wafer or semiconductor structure. However, the single thick resist coating may create a non-uniformity (e.g., edge-bead) issue (e.g., on one or more surface of the resist) for contact lithography. The next spin resist cycle performed at block 734 may substantially planarize the non-uniformity issues and make the resist coating suitable for contact lithography.

At block 1736, a mask is disposed over the second surface of the resist layer and the resist layer is exposed to an exposure energy to form an opening (e.g., 1931, shown in FIG. 19B) in the resist layer. The opening, which is formed according to a pattern in the mask, has a predetermined shape which is suitable for receiving conductive materials as may be used to form a UBM structure (e.g., 1940, shown in FIG. 19D). Additionally, the exposure energy has a predetermined intensity distribution and the resist layer is exposed to the exposure energy for a predetermined time period. In some embodiments, an opening (e.g., 1921, shown in FIG. 19C) may also be formed in the passivation layer of the semiconductor structure at block 1736. The passivation layer opening, similar to the resist layer opening, may be formed according to a pattern in the mask.

A pattern of the mask may be based upon the material from which the resist layer and/or the passivation layer are provided. For example, the mask of a resist layer provided from a positive photoresist material should have a pattern which corresponds to a pattern of the resist layer to remain on the semiconductor structure (e.g., subsequent to development at block 1738). In contrast, the mask of a resist layer provided from a negative photoresist material should have a pattern which is the inverse (i.e., a photographic negative) of a pattern of the resist layer to remain on the semiconductor structure.

At block 1736, a post expose bake process is also performed on the semiconductor structure. In particular, the semiconductor structure is baked at a predetermined temperature and for a predetermined time period.

At block 1738, the resist layer of the semiconductor structure is developed through a development process (e.g., in a resist developer). The resist layer may, for example, be developed by immersing the semiconductor structure in a developer solution for a predetermined time period (e.g., about two minutes). In embodiments in which the resist layer is provided from a positive photoresist material, exposed portions of the resist layer are generally removed (or washed away) during the development process. In contrast, in embodiments in which the resist layer is provided from a negative photoresist material, unexposed portions of the resist layer are generally removed during the development process.

At block 1738, subsequent to the resist layer being developed, the semiconductor structure may be rinsed to prepare the semiconductor structure for the post development bake process which is also performed at block 1738. In particular, during the post development bake process performed at block 1738, the semiconductor structure is baked at a predetermined temperature and for a predetermined time period. The post development (or develop) bake process performed at block 1738 may, for example, substantially reduce (or, ideally eliminate) residual developer from the resist opening and may necessary in order to harden the photoresist and improve adhesion of the resist to surfaces of the semiconductor structure.

At block 1740, one or more surfaces of the semiconductor structure are cleaned through a cleaning process (e.g., a plasma cleaning process) for a predetermined time period. The cleaning process may, for example, prepare the semiconductor structure for receiving conductive materials at block 1742.

At block 1742, one or more conductive materials (e.g., superconducting and/or partially superconducting materials) are deposited or otherwise disposed in the opening formed in the resist layer (and the opening formed in the passivation layer).

At block 1744, a UBM structure (e.g., 1940, shown in FIG. 19D) is formed from the conductive materials. For example, selected portions of the conductive materials may be lifted-off or etched (e.g., through a flash etch process) to produce the UBM structure. The UBM structure is electrically coupled to the superconducting trace.

Additionally, at block 1744, the resist layer of the semiconductor structure may be removed (e.g., stripped with a solvent, such as acetone) from the semiconductor structure to expose the UBM structure and the substrate of the semiconductor structure. Further, at block 1744, the semiconductor structure may be removed from the temporary mounting surface or structure to which the semiconductor structure was coupled at block 1724.

Upon completion of block 1744, the method 1700 may end. The method 1700 ending may, for example, be indicative of completion of the fabrication process of the semiconductor structure (e.g., 5900, shown in FIG. 19D). The method 1700 may be repeated (e.g., in response to a processor in the semiconductor manufacturing equipment receiving or generating a control signal) for fabricating additional semiconductor structures (e.g., 2320, shown in FIG. 23).

Figure 18:
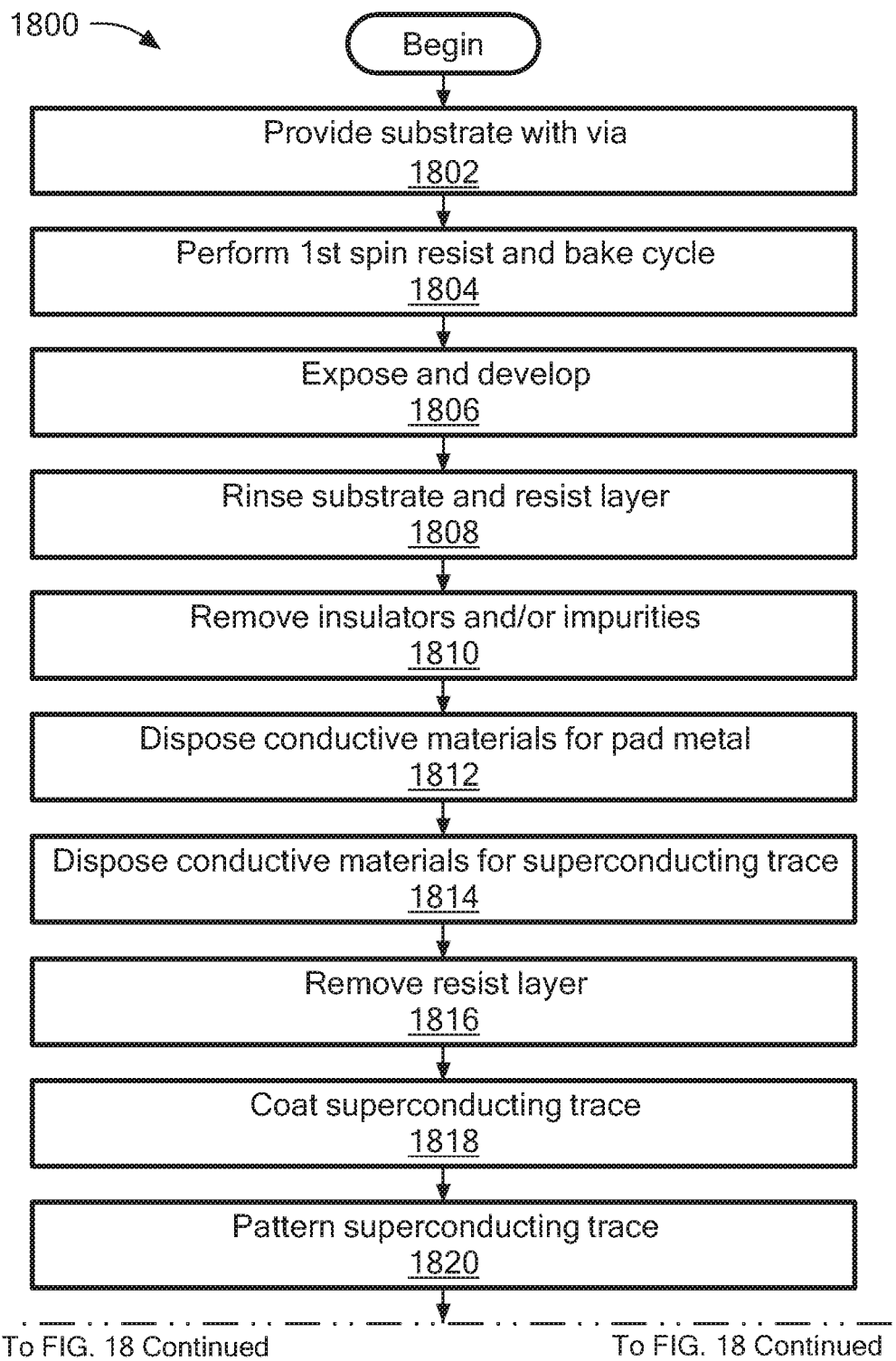
FIG. 18 is a flowchart illustrating another example method for fabricating a semiconductor structure as may be used in a cryogenic electronic package in accordance with an embodiment of the disclosure.
Figure 18:
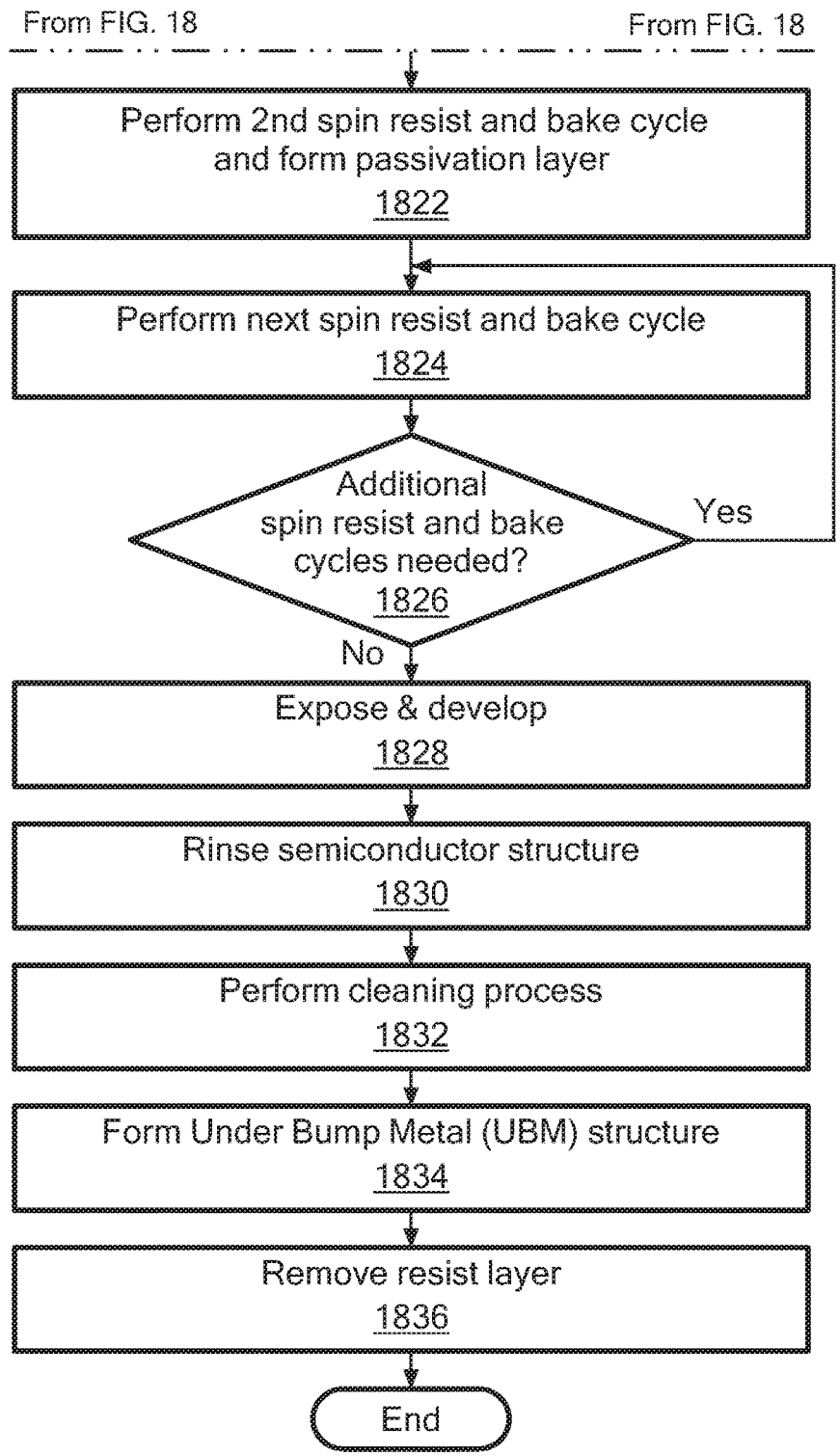

Another example method of fabricating a semiconductor structure according to the disclosure (e.g., 5900, shown in FIG. 19D) is shown in FIG. 18.

As illustrated in FIG. 18, a method 1800 for fabricating a semiconductor structure begins at block 1802. At block 1802, a substrate (e.g., 1910, shown in FIG. 19) is provided. The substrate (e.g., a high resistive or regular Si substrate) has first and second opposing surfaces and includes one or more conductive structures or vias (e.g., 1913, shown in FIG. 19) disposed between selected portions of the first and second surfaces of the substrate. In embodiments, the vias may be fabricated in a manner similar to that which was described above in connection with method 1700.

At block 1804, a first spin resist cycle and bake cycle is performed (e.g., for providing a resist layer for forming a superconducting trace on the substrate). In particular, at block 1804, a first predetermined amount of resist material (e.g., a photoresist material) is disposed over one or more portions (e.g., a center portion) of the substrate. At block 1804, the resist material is also disposed over or spread across one or more surfaces of the substrate using spin coating techniques as may be performed in a spin coater machine for example. The spin coater machine may, for example, rotate the substrate about a platform at a predetermined rate (e.g., angular speed) and for a predetermined time period in order to spread the resist material over the substrate.

Additionally, at block 1804, subsequent to the resist material being spread over the substrate, the substrate is baked at a predetermined temperature and for a predetermined time period to form a resist layer from the resist material disposed over the substrate.

At block 1806, the resist layer is exposed to an exposure energy to form an opening in the resist layer. The opening has a predetermined shape which is suitable for receiving conductive materials as may be used to form a superconducting trace (e.g., 1911, shown in FIG. 19) on the substrate. Additionally, the exposure energy has a predetermined intensity distribution and the resist layer is exposed to the exposure energy for a predetermined time period.

At block 1806, the resist layer is also developed. The resist layer may be developed by immersing the substrate in a developer solution for a predetermined time period. The resist layer may also be developed by spraying the substrate with the developer solution for the predetermined time period. In embodiments in which the resist layer is provided from a positive photoresist material, exposed portions of the resist layer are generally removed (or washed away) by the developer solution. In contrast, in embodiments in which the resist layer is provided from a negative photoresist material, unexposed portions of the resist layer are generally removed by the developer solution.

At block 1808, the substrate and remaining portions of the resist layer may also be rinsed (e.g., with deionized water) to prepare the substrate for deposition of conductive materials to form the superconducting trace. Additionally, at block 1810, insulators and impurities are removed from the substrate (e.g., using plasma and/or sputter etch processes).

At block 1812, conductive materials as may be used to form a pad metal beneath the superconducting trace to be formed may be disposed in the opening in the resist layer. The pad metal may, for example, serve as a conductive interface between the superconducting trace and the pad on top of the vias in the substrate.

At block 1814, conductive materials as may be used to form a superconducting trace are disposed in the opening in the resist layer. Additionally, at block 1816 the resist layer may be removed from the substrate. Further, at block 1818, selected portions of the interconnect pad are coated with one or more UBM metals to produce a corresponding coupling surface or structure on the superconducting trace formed at block 1814.

At block 1820, the superconducting trace and a coupling surface or structure of the superconducting trace of the semiconductor structure are patterned and covered with one or more coupling materials or structures (e.g., fusible coupling materials, similar to that which provided fusible coupling surface 2344 shown in FIG. 13B).

At block 1822, a process for forming or otherwise providing a UBM structure (e.g., 1940, shown in FIG. 19D) on the semiconductor structure formed at block 1820 begins. At block 1822, a passivation layer (e.g., 1920, shown in FIG. 19A) is also formed. In particular, the passivation layer is disposed over or otherwise applied or coupled to selected portions of the substrate (e.g., 1910) and/or selected portions of the superconducting trace (e.g., 1911).

Additionally, at block 1822 a spin resist and bake cycle (here, a second spin resist and bake cycle) is performed on the semiconductor structure. The second spin resist and bake cycle (also sometimes referred to herein as "second cycle") includes disposing a first predetermined amount of resist material over one or more portions of the semiconductor structure (e.g., passivation layer 1920, shown in FIG. 19B). Additionally, the second cycle includes disposing (or spreading) the resist material over one or more surfaces of the semiconductor structure (e.g., passivation layer 1920) using spin coating techniques. The spin coating techniques may include rotating the semiconductor structure about a platform of a spin coater machine at a first predetermined rate and for a first predetermined time period in order to spread the resist material. The semiconductor structure may, for example, be rotated by the spin coater machine until a desired thickness of the resist material (i.e., a distance between first and second opposing surfaces of the resist material) is achieved on the semiconductor structure.

The second cycle performed at block 1822 further comprises baking the semiconductor structure at a predetermined temperature and for a predetermined time period to form a first resist layer (or a first portion of a resistor layer) from the resist material disposed over the semiconductor structure. The first resist layer (e.g., 1930, shown in FIG. 19B) has first and second opposing surfaces, with the first surface of the first resist layer disposed (or formed) over a surface of the superconducting trace and over a surface of the substrate.

At block 1824, a next spin resist and bake cycle (also sometimes referred to herein as a "next cycle") is performed on the semiconductor structure. The next cycle comprises disposing a second predetermined amount of a resist material over one or more portions of the second surface of the first resist layer formed at block 1822. Additionally, the next cycle comprises disposing (or spreading) the resist material over one or more surfaces of the first resist layer using spin coating techniques. The spin coating techniques may comprise rotating the semiconductor structure about a platform of a spin coater machine at a second predetermined rate and for a second predetermined time period in order to spread the resist material. The semiconductor structure may, for example, be rotated by the spin coater machine until a desired thickness of the resist material (i.e., a distance between first and second opposing surfaces of the resist material) is achieved on the first resist layer.

The next cycle performed at block 1824 further comprises baking the semiconductor structure at a predetermined temperature and for a predetermined time period to form a next resist layer (or next portion of a resist layer) from the resist material. In embodiments, the next resist layer has a thickness (e.g., a distance between first and second opposing surfaces) which is substantially greater than a thickness of the first resist layer formed at block 1822. Additionally, in embodiments the next resist layer may have a more uniform surface than the first resist layer.

At block 1826, it is determined whether any additional spin resist and bake cycles are needed. If it is determined that additional spin resist and bake cycles are needed, the method 1800 returns to block 1822 and blocks 1822 and 1824 are repeated until it is determined that no additional spin resist and bake cycles are needed. Alternatively, if it is determined that no additional spin resist and bake cycles are needed, the method 1800 may proceed to a block 1830.

Similar to method 1700, a number of spin resist and bake cycles performed in method 1800 may be selected to achieve a resist layer (i.e., a resist layer comprising the first resist layer and at least one next resist layer) having a predetermined thickness or height (H2, shown in FIG. 19B).

Referring now to block 1828, at block 1828 a mask is disposed over the second surface of the resist layer (e.g., 1930, shown in FIG. 19B) and the resist layer is exposed to an exposure energy (e.g., thermal energy) to form an opening (e.g., 1931, shown in FIG. 19B) in the resist layer. The opening, which is formed according to a pattern in the mask, has a predetermined shape which is suitable for receiving conductive materials as may be used to form a UBM structure (e.g., 1940, shown in FIG. 19D). In some embodiments, an opening (e.g., 1921, shown in FIG. 19C) may also be formed in the passivation layer of the semiconductor structure at block 1828. The passivation layer opening, similar to the resist layer opening, may be formed according to a pattern in the mask.

At block 1828, the resist layer is also developed. The resist layer may be developed, for example, by immersing the semiconductor structure in a developer solution for a predetermined time period. The resist layer may also be developed by spraying the semiconductor structure with the developer solution for the predetermined time period. In embodiments in which the resist layer is provided from a positive photoresist material, exposed portions of the resist layer are generally removed (or washed away) by the developer solution. In contrast, in embodiments in which the resist layer is provided from a negative photoresist material, unexposed portions of the resist layer are generally removed by the developer solution.

At block 1830, the semiconductor structure is rinsed (e.g., with deionized water) to remove leftover developer solution from the semiconductor structure. The semiconductor structure may also be rinsed to prepare the semiconductor structure for a cleaning process performed at block 1832. In particular, at block 1832, the semiconductor structure is cleaned (e.g., using a plasma cleaning process) to prepare the semiconductor structure for receiving conductive materials for forming a UBM structure at block 1834.

At block 1834, a UBM structure is formed on a surface (e.g., a second surface) of the superconducting trace using a thermal evaporation or an electroplating process. Additionally, at block 1836, remaining portions of the resist layer are removed from the semiconductor structure to form a semiconductor structure including a UBM structure.

Upon completion of block 1836, the method 1800 may end. The method 1800 ending may, for example, be indicative of completion of the fabrication process of the semiconductor structure (e.g., 5900, shown in FIG. 19D). The method 1800 may be repeated (e.g., in response to a processor in the semiconductor manufacturing equipment receiving or generating a control signal) for fabricating additional semiconductor structures.

Figure 19C:
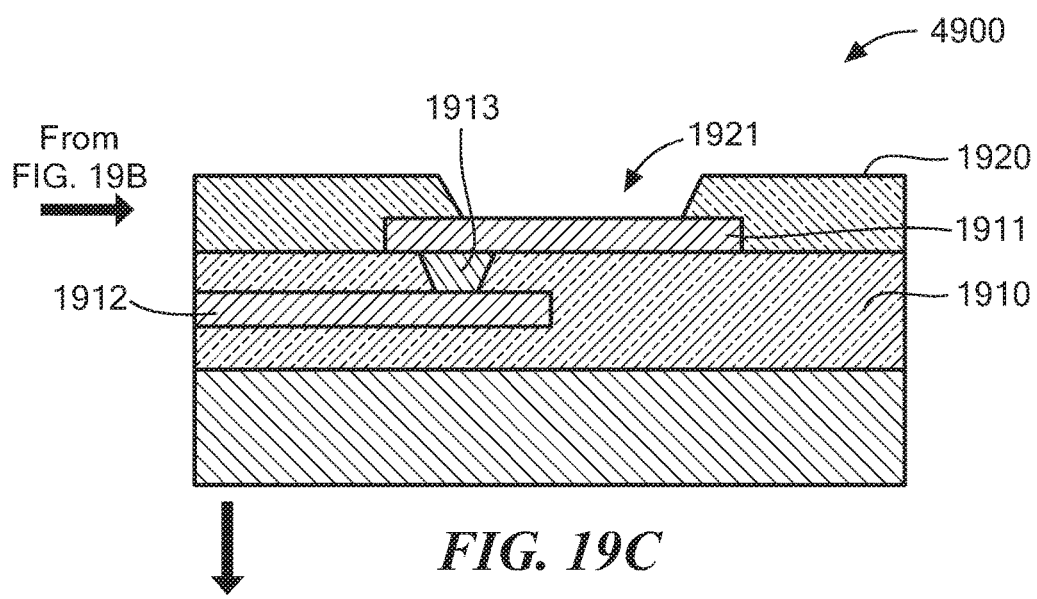
Figure 19D:
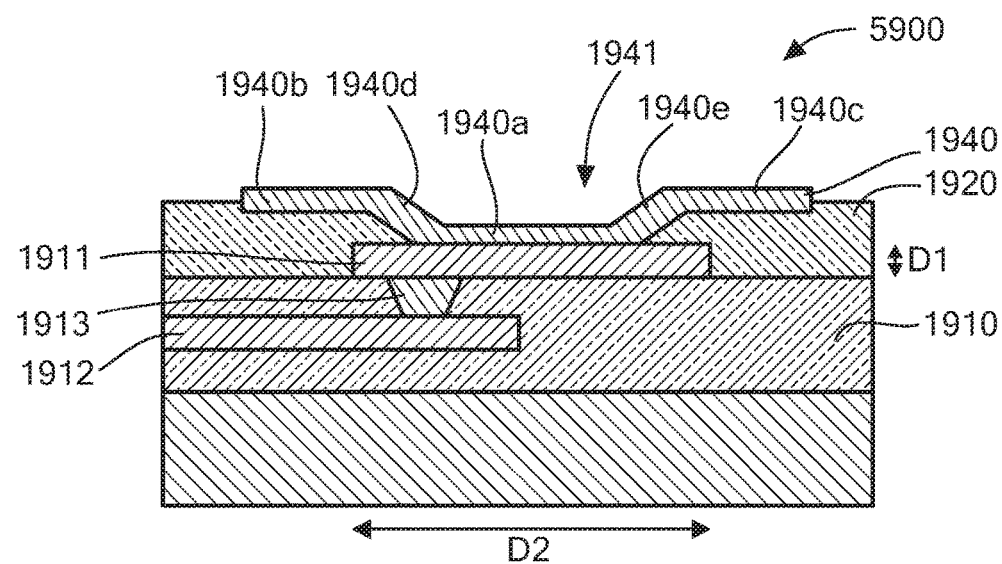

Referring now to FIGS. 19-19D, example semiconductor structures as may be formed or otherwise provided in an example method (e.g., 1700, shown in FIG. 17) for fabricating a cryogenic electronic package in accordance with an embodiment of the disclosure are shown. While FIGS. 19-19D generally illustrate progression of a sequence of processes by which semiconductor structures (e.g., 5900, shown in FIG. 19D) in a cryogenic electronic package may be fabricated, the illustrated process progression need not occur in the particular sequence shown. Rather, the processes may be re-ordered, combined or removed, performed in parallel or in series to fabricate semiconductor structure 5900 shown in FIG. 19D, for example.

Referring to FIG. 19, an example semiconductor structure 1900 (e.g., a superconducting device or IC) includes a substrate 1910, a plurality of superconducting traces or interconnect pads (here, superconducting traces 1911, 1912), and a conductive structure 1913. The substrate 1910 (e.g., a superconducting substrate) has first and second opposing surfaces and the superconducting traces 1911, 1912 have first and second opposing surfaces and one or more sides. Superconducting trace 1911 has a surface (e.g., a first surface) disposed over or otherwise coupled to selected portions of a surface (e.g., a second surface) of substrate 1910. Additionally, superconducting trace 1912 is disposed between the first and second surfaces of the substrate 1910.

Superconducting trace 1911 is coupled to superconducting trace 1912 through conductive structure 1913 (e.g., a via) in the illustrated embodiment. Conductive structure 1913, which is disposed between selected portions of the first and second surfaces of the substrate 1910, has a first portion coupled to a surface (e.g., a first surface) of superconducting trace 1911. Additionally, conductive structure 1913 has a second opposing portion coupled to a surface (e.g., a second surface) of superconducting trace 1911.

In embodiments, the substrate 1910 includes one or more electrical connections (not shown) disposed between selected portions of the first and second surfaces of the substrate 1910. In such embodiments at least one of the superconducting traces 1911, 1912 and the conductive structure 1913 may be electrically coupled to selected ones (or a selected one) of the electrical connections disposed in the substrate 1910. The electrical connections can be filled or coated with one or more metal layers. At least one of the metal layers may include a superconducting and/or partially superconducting material (e.g., Niobium) in embodiments.

Additionally, in embodiments at least one of the superconducting traces 1911, 1912 has one or more characteristics (e.g., materials and/or dimensions) selected such that the superconducting traces 1911, 1912 have or support a predetermined critical current density. For example, superconducting trace 1911 may have a first dimension D1 corresponding to a height or thickness of the superconducting trace 1911 (here, a distance between first and second opposing surfaces of the superconducting trace 1911) and the first dimension D1 may correspond to a characteristic selected to provide the predetermined critical current density. Additionally, superconducting trace 1911 may have a second dimension D2 (here, a distance between first and second opposing sides of the superconducting trace 1911) corresponding to a width, length or diameter of the superconducting trace 1911 and the second dimension D2 may correspond to a characteristic selected to provide the predetermined critical current density.

In embodiments, the predetermined critical current density includes a range of critical currents and the range of critical currents is based upon at least one of the selected characteristics In one embodiment, superconducting trace 1911 is or includes an about 5 um wide Nb line attached with an about 19 um diameter Nb pad. In another embodiment, superconducting trace 1911 is or includes an about 5 um wide Nb line attached with an about 17 um diameter Nb pad. Additionally, in another embodiment superconducting trace 1911 is or includes an about 5 um wide Nb line attached with an about 14 um diameter Nb pad. In embodiments, all (or substantially all) of these Nb traces have a same or similar critical current (e.g., about 140 mA) because the Nb traces have same or similar minimum line width.

In a further embodiment, superconducting trace 1911 is or includes an about 2 um wide Nb line attached with an about 9 um diameter Nb pad. Additionally, in another embodiment superconducting trace 1911 is or includes an about 2 um wide Nb line attached with an about 7 um diameter Nb pad. In a further embodiment, superconducting trace 1911 is or includes an about 2 um wide Nb line attached with an about 5 um diameter Nb pad. In embodiments, all (or substantially all) of these Nb traces have a same or similar critical current (e.g., about 50 mA or more) because the Nb traces have same or similar minimum line width.

The conductive structure 1913 to which the superconducting traces 1911, 1912 are coupled may also have one or more characteristics selected such that the conductive structure 1913 has or supports the predetermined critical current density in some embodiments. The conductive structure 1913 may be a conventional conductive structure including one or more conventional or non-superconducting materials (e.g., Copper (Cu)) in some embodiments. Additionally, in some embodiments conductive structure 1913 may be a superconducting or partially superconducting conductive structure including one or more superconducting or partially superconducting materials (e.g., Niobium (Nb)).

At least one of superconducting traces 1911 , 1912 and conductive structure 1913 may be formed through at least one of: a physical vapor deposition (PVD), chemical vapor deposition (CVD), a sputtered, a magnetron sputtered, a reactive sputtered, an atomic layer deposition (ALD), a pulsed laser deposition (PLD), a plasma enhanced, and an inductive plasma (IMP) process in embodiments.

Referring to FIG. 19A, in which like elements of FIG. 19 are shown having like reference designations, a semiconductor structure 2900 includes substrate 1910, superconducting traces 1911, 1912, and conductive structure 1913. Semiconductor structure 2900 also includes a passivation layer 1920. Passivation layer 1920 is disposed over or otherwise applied or formed on selected portions of superconducting trace 1911 and selected portions of the substrate 1910 in the illustrated embodiment. In particular, passivation layer 1920 has a surface (e.g., a first surface) disposed over a surface (e.g., a second surface) and at least one side of superconducting trace 1911. Additionally, the passivation layer 1920 has a surface (e.g., a first surface) disposed over a surface (e.g., a second surface) of substrate 1910.

In embodiments, the passivation layer 1920 is disposed over the superconducting trace 1911 and substrate 1910 through deposition or "printing." For example, in one embodiment passivation layer 1920 is created by selective deposition of an electrically insulating material (e.g., nanopourous silica, silicon oxyflouride) using a physical vapor deposition (PVD) and/or a chemical vapor deposition (CVD) process. Additionally, in embodiments in which the passivation layer 1920 is provided from a semisolid material (e.g., a photoimageable polymer), for example, passivation layer 1920 may be "soft baked" over superconducting trace 1911 and substrate 1910 to form a substantially solid passivation layer 1920. In one embodiment, passivation layer 1920 is created by thin film deposition of an electrically insulating material (e.g., PECVD silica).

Passivation layer 1920 has an associated height or thickness H1 (here, a distance between first and second opposing surfaces of passivation layer 1920). In one embodiment, the height H1 of the passivation layer 1920 is selected based upon one or more characteristics (e.g., dimensions) of an opening to be formed in the passivation layer 1920 (e.g., opening 1921, shown in FIG. 19C, as will be discussed). Additionally, in one embodiment, the height H1 of the passivation layer 1920 is selected based upon one or more characteristics (e.g., dimensions) of a UBM structure to be formed in the passivation layer opening (e.g., UBM structure 1940, shown in FIG. 19D, as will be discussed).

Passivation layer 1920 may be a solder mask in some embodiments and protect the superconducting trace 1911 from oxidation. Additionally, passivation layer 1920 may reduce (or ideally prevent) solder shorting between the superconducting trace 1911 and other superconducting traces disposed proximate to superconducting trace 1911.

Referring to FIG. 19B, a semiconductor structure 3900 includes substrate 1910, superconducting traces 1911, 1912, conductive structure 1913 and passivation layer 1920. Semiconductor structure 3900 also includes a resist layer 1930. The resist layer 1930 is disposed over or otherwise applied or formed on selected portions of the passivation layer 1920. In particular, the resist layer 1930 has a surface (e.g., a first surface) disposed over a surface (e.g., a second surface) of the passivation layer 1920 in the illustrated embodiment.

The resist layer 1930 is provided from one or more resist materials (e.g., positive and/or negative photoresist materials), which resist materials can be applied during one or more spin resist and bake cycles. The spin resist and bake cycles may be the same as or similar to those described above in connection with FIGS. 17 and 18, for example.

Resist layer 1930 has an associated height or thickness H2 (here, a distance between first and second opposing surfaces of resist layer 1930). In one embodiment, the height H2 of the resist layer 1930 is selected based upon one or more characteristics (e.g., dimensions) of an opening to be formed in the resist layer 1930 (e.g., opening 1931, shown in FIG. 19C, as will be discussed). Additionally, in one embodiment a number of spin and bake cycles used to produce the resist layer 1930 may be based upon the selected height H2.

An opening 1931 is formed or otherwise provided in a selected portion of the resist layer 1930. The resist layer opening 1931 has a predetermined shape and extends between the second surface of the resist layer 1930 and the second surface of the passivation layer 1920 over which the first surface of the resist layer 1930 is disposed. In embodiments, a mask (not shown) is disposed over a surface (e.g., a second surface) of the resist layer 1930 and the resist layer opening 1931 is formed based upon a pattern of the mask.

In one embodiment, the predetermined shape of the resist layer opening 1931 is selected based upon one or more characteristics (e.g., dimensions) of an opening to be formed in the passivation layer 1920 (e.g., opening 1921, shown in FIG. 19C, as will be discussed). Additionally, in one embodiment, the predetermined shape of the resist layer opening 1931 is selected based upon one or more characteristics (e.g., dimensions) of a UBM structure to be formed in the passivation layer opening (e.g., UBM structure 1940, shown in FIG. 19D, as will be discussed).

Referring to FIG. 19C, a semiconductor structure 4900 includes substrate 1910, superconducting traces 1911, 1912, conductive structure 1913 and passivation layer 1920.

An opening 1921 is formed or otherwise provided in a selected portion of the passivation layer 1920. The passivation layer opening 1921 has a predetermined shape and extends between the second surface of the passivation layer 1920 and the second surface of the superconducting trace 1911 over which the first surface of the passivation layer 1920 is disposed. In embodiments, the predetermined shape of passivation layer opening 1921 is selected based upon a shape of the UBM structure to be formed in the opening 1921 (e.g., UBM structure 1940, shown in FIG. 19D).

Similar to resist layer opening 1931 shown in FIG. 19B, the manner in which the passivation layer opening 1921 is formed may depend upon the materials from which the passivation layer 1920 is provided. In one embodiment, a mask (not shown) is disposed over the second surface of the passivation layer 1920 and passivation layer opening 1921 is formed according to a pattern of the mask. In another embodiment the passivation layer opening 1921 is formed by disposing a mask over a resist layer (e.g., 1930, shown in FIG. 19C) and etching or otherwise forming openings in the resist layer and the passivation layer 1920 according to a pattern of the mask. In embodiments, subsequent to forming passivation layer opening 1921, the resist layer may be removed from surfaces (e.g., the second surface) of the passivation layer 1920. The passivation layer opening 1921 and selected surfaces (e.g., a second surface) of the passivation layer 1920 may be cleaned (e.g., through a plasma cleaning process). Additionally, exposed portions (e.g., the second surface) of the superconducting trace 1911 may be cleaned and otherwise prepared for UBM structure deposition.

Referring to FIG. 19D, a semiconductor structure 5900 includes substrate 1910, superconducting traces 1911, 1912, conductive structure 1913 and passivation layer 1920. Semiconductor structure 5900 also includes a UBM structure 1940.

The UBM structure 1940 is disposed or otherwise formed in passivation layer opening 1921 and includes a first pad portion 1940a, a plurality of second pad portions (here, second pad portions 1940b, 1940c), and a plurality of pad interconnects (here, pad interconnects 1940d, 1940e). First pad portion 1940a of the UBM structure 1940 has a surface (e.g., a first surface) disposed over and coupled to a surface (e.g., an exposed surface) of superconducting trace 1911 in the illustrated embodiment. Additionally, second pad portions 1940b, 1940c of the UBM structure 1940 each have a surface disposed over selected portions of the second surface of the passivation layer 1920 surrounding edges of the passivation layer opening 1921.

Pad interconnect 1940*d* of UBM structure 1940 is disposed over a surface of passivation layer opening 1921 and has a first portion coupled to a surface and/or side of second pad portion 1940*b*. Additionally, pad interconnect 1940*d* also has a second opposing portion coupled to a surface and/or side of first pad portion 1940*a*.

Pad interconnect 1940*e* of UBM structure 1940 is disposed over a surface of a passivation layer opening 1921 and has a first portion coupled to a surface and/or side of second pad portion 1940*c*. Additionally, pad interconnect 1940*e* has a second opposing portion coupled to a surface and/or side of first pad portion 1940*a*.

The UBM structure 1940 also has an opening 1941 shaped to receive an interconnect structure (e.g., 1960, shown in FIG. 22C, as will be discussed). The UBM structure opening 1941 extends between a surface (e.g., a second surface) of first pad portion 1940*a* and respective surfaces (e.g., second surfaces) of second pad portions 1940*b*, 1940*c*.

In embodiments, one or more characteristics (e.g., dimensions) of the UBM structure 1940 are selected based upon one or more characteristics (e.g., dimensions) of the interconnect structure. For example, the UBM structure opening 1941 may have a first diameter (or first diameters), width and/or length selected to be greater than a second diameter (or second diameters), width and/or length of the interconnect structure in some embodiments. Additionally, the first diameter, width and/or length of the UBM structure opening 1941 may be selected to be less than the second diameter, width and/or length of the interconnect structure in some embodiments.

In embodiments, the UBM structure 1940 is formed by disposing an electrically conductive material (e.g., copper, gold, or aluminum) in passivation layer opening 1921 and developing the conductive material to form the UBM structure 1940. Additionally, in embodiments the UBM structure is electrically coupled to selected ones of a plurality of electrical connections in substrate 1910 (e.g., through superconducting trace 1911). In one embodiment, resist layer opening 1931 of FIG. 19B can be used to create passivation layer opening 1921 of FIG. 19C and subsequent UBM deposition and liftoff may create UBM structure 1941 of FIG. 19D. In another embodiment, there will be ion assisting and/or ion etching of superconducting trace 1911 before UBM deposition and liftoff to create UBM structure 1941.

In one embodiment, semiconductor structure 5900 further includes an interconnect pad (not shown). The interconnect pad, which may be the same as or similar to interconnect pad 220 shown in FIG. 2, for example, may be disposed between the second surface of the substrate 1910 and the first surface of the superconducting trace 1911 in some embodiments. Additionally, the interconnect pad may be disposed between the second surface of the superconducting trace 1911 and a surface (e.g., a first surface) of the UBM structure 1940 in some embodiments. A surface (e.g., a first surface) of the interconnect pad may be coupled to the superconducting trace 1911. Additionally, a surface (e.g., a second opposing surface) of the interconnect pad may be coupled to the UBM structure 1940 (e.g., first pad portion 1940*a* of UBM structure 1940).

In embodiments, the interconnect pad includes one or more superconducting materials (e.g., Niobium) and is provided as a superconducting pad. Additionally, in embodiments, one or more openings may be formed in selected portions of the superconducting pad (e.g., through one or more etching processes). For example, the pad openings may be formed through an etching process (or processes) used to form passivation layer opening 1921 and/or resist layer opening 1931. UBM structure 1940 may be disposed over or within the pad openings in embodiments in which the superconducting pad is disposed between the superconducting trace 1911 and the UBM structure 1940. The superconducting pad may have an associated width or diameter that is greater than a width or diameter of first pad portion 1940*a* of UBM structure 1940, for example. Additionally, superconducting trace 1911 may have an associated width or diameter that is greater than the width or diameter of the pad.

Figure 20:
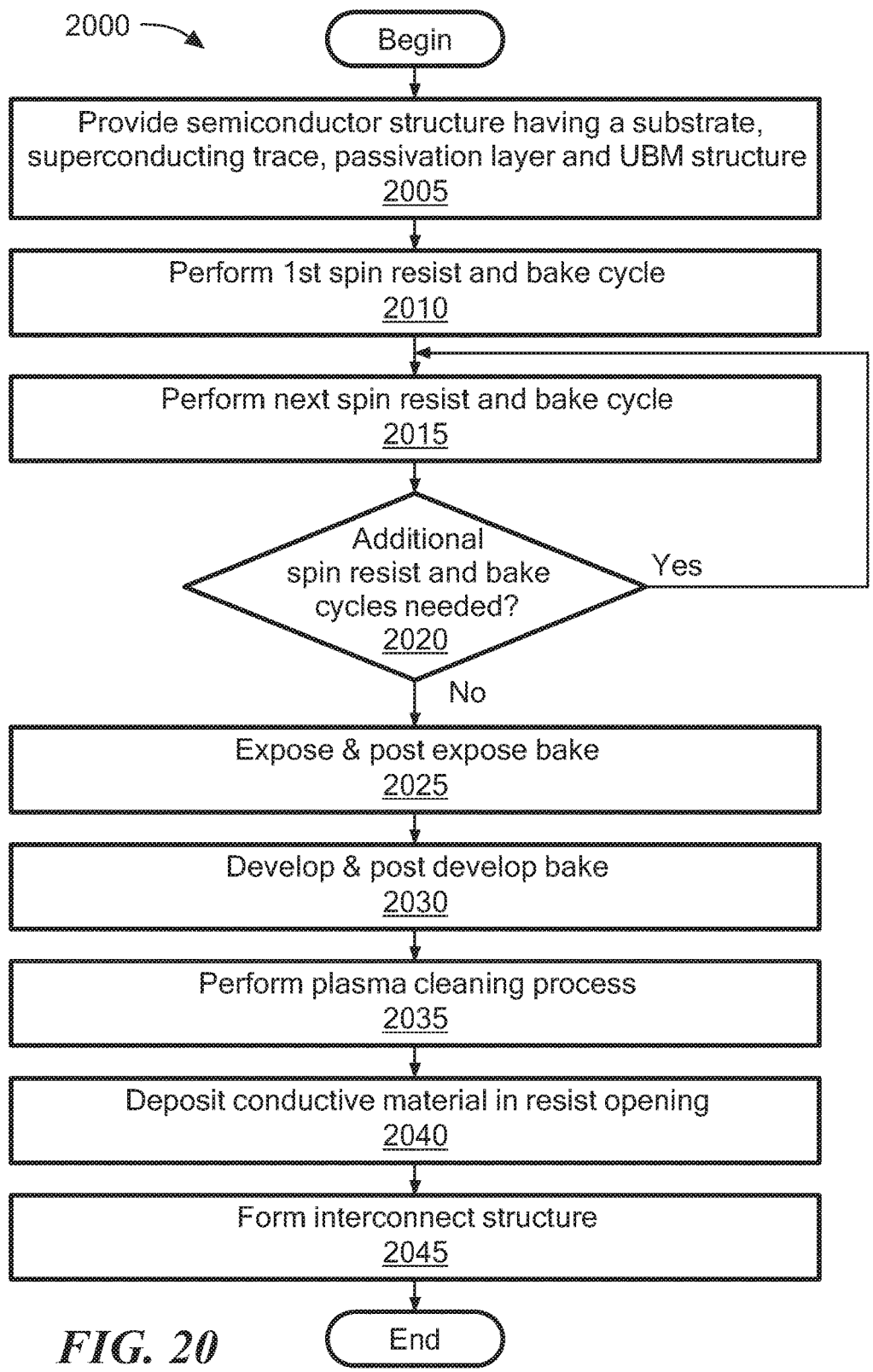
FIG. 20 is a flowchart illustrating an example method for fabricating an interconnect structure in accordance with an embodiment of the disclosure.

Referring to FIG. 20, a flowchart (or flow diagram) illustrating an example method 2000 for forming an interconnect structure (e.g., interconnect structure 1960, shown in FIG. 22C) on a semiconductor structure (e.g., semiconductor structure 5900, shown in FIG. 19C) according to the disclosure is shown. The method 2000 may, for example, be implemented in semiconductor manufacturing equipment used for fabricating interconnect structures.

As illustrated in FIG. 20, an example method 2000 for forming an interconnect structure (e.g., 1960) on a semiconductor structure (e.g., 5900) begins at block 2005. At block 2005, a semiconductor structure is provided. The semiconductor structure includes a substrate (e.g., 1910, shown in FIG. 22) and a superconducting trace (e.g., 1920, shown in FIG. 22). The semiconductor structure also includes a passivation layer (e.g., 1930, shown in FIG. 22) and a UBM structure (e.g., 1940, shown in FIG. 22). The superconducting trace has a surface (e.g., a first surface) disposed over a selected portion of a surface (e.g., a second surface) of the substrate. Additionally, the passivation layer has a surface (e.g., a first surface) disposed over a selected portion of a surface (e.g., a second surface) of the superconducting trace. Further, the UBM structure is disposed or otherwise formed in an opening (e.g., 1931, shown in FIG. 22) provided in the passivation layer and is coupled to the superconducting trace.

At block 2010, a first spin resist and bake cycle (also sometimes referred to herein as a "first cycle") is performed on the semiconductor structure provided at block 2005. The first cycle includes disposing a first predetermined amount of resist material over one or more portions of the semiconductor structure (e.g., passivation layer 1930 and UBM structure 1940 of semiconductor structure 5900). Additionally, the first cycle includes disposing (or spreading) the resist material over one or more portions of the semiconductor structure (e.g., passivation layer 1930 and UBM structure 1940) using spin coating techniques. The spin coating techniques may include rotating the semiconductor structure about a platform of a spin coater machine at a first predetermined rate and for a first predetermined time period in order to spread the resist material. The semiconductor structure may, for example, be rotated by the spin coater machine until a desired thickness of the resist material (i.e., a distance between first and second opposing surfaces of the resist material) is achieved on the semiconductor structure.

The first cycle performed at block 2010 further includes baking the semiconductor structure at a predetermined temperature and for a predetermined time period to form a first resist layer (or a first portion of a resistor layer) from the resist material disposed over the semiconductor structure. The first resist layer has first and second opposing surfaces, with the first surface of the first resist layer disposed (or formed) over selected portions (or surfaces) of the semiconductor structure. For example, the first surface of the first resist layer may be disposed over selected portions of a surface (e.g., a second surface) of the passivation layer of the semiconductor structure. Additionally, the first surface of the first resist layer may be disposed over a surface (e.g., a second surface) of the UBM structure of the semiconductor structure. In some embodiments, the first cycle performed at block 2010 is the same as or similar to the first cycle performed at block 110 of method 100.

At block 2015, a next spin resist and bake cycle (also sometimes referred to herein as a "next cycle") is performed on the semiconductor structure. The next cycle includes disposing a second predetermined amount of a resist material over one or more portions of the second surface of the first resist layer formed at block 2010. Additionally, the next cycle includes disposing (or spreading) the resist material over one or more surfaces of the first resist layer using spin coating techniques. The spin coating techniques may include rotating the semiconductor structure about a platform of a spin coater machine at a second predetermined rate and for a second predetermined time period in order to spread the resist material. The semiconductor structure may, for example, be rotated by the spin coater machine until a desired thickness of the resist material (i.e., a distance between first and second opposing surfaces of the resist material) is achieved on the first resist layer.

The next cycle performed at block 2015 further includes baking the semiconductor structure at a predetermined temperature and for a predetermined time period to form a next resist layer (or next portion of a resist layer) from the resist material. In one embodiment, the next resist layer has a thickness (e.g., a distance between first and second opposing surfaces) which is substantially greater than a thickness of the first resist layer formed at block 2010. Additionally, the next resist layer may have a more uniform surface than the first resist layer. In some embodiments, the next cycle performed at block 2015 is the same as or similar to the next cycle performed at block 115 of method 100.

At block 2020, it is determined whether any additional spin resist and bake cycles are needed. If it is determined that additional spin resist and bake cycles are needed, the method 2020 returns to block 2015 and blocks 2015 and 2020 are repeated until it is determined that no additional spin resist and bake cycles are needed. Alternatively, if it is determined that no additional spin resist and bake cycles are needed, the method 2000 may proceed to a block 2025.

Figure 22:
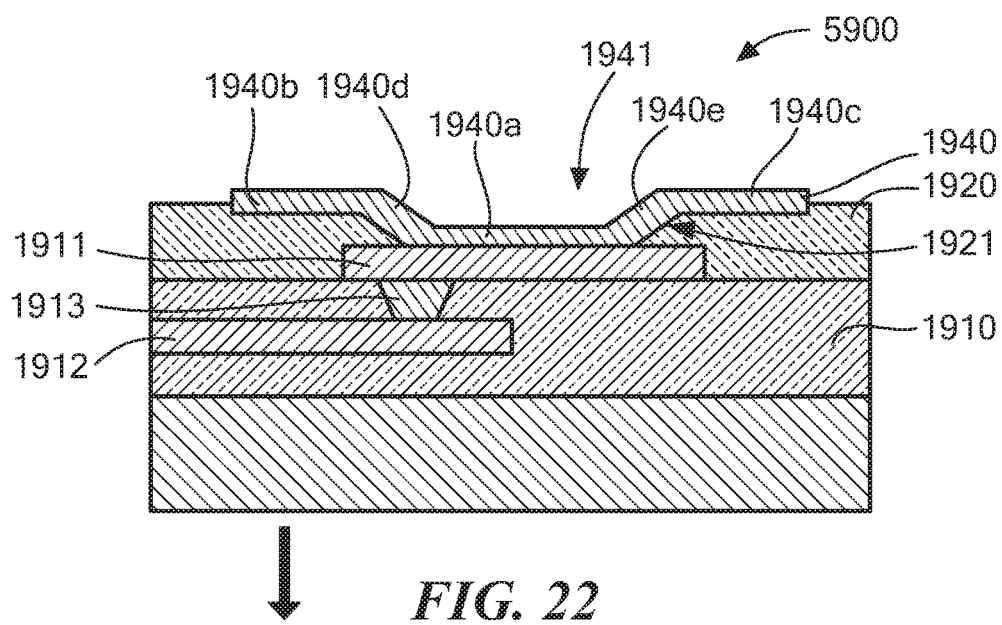
FIGS. 22-22C are cross-sections of example semiconductor structures and an example interconnect structure as may be formed in accordance with the method of FIG. 20, for example.
Figure 22A:
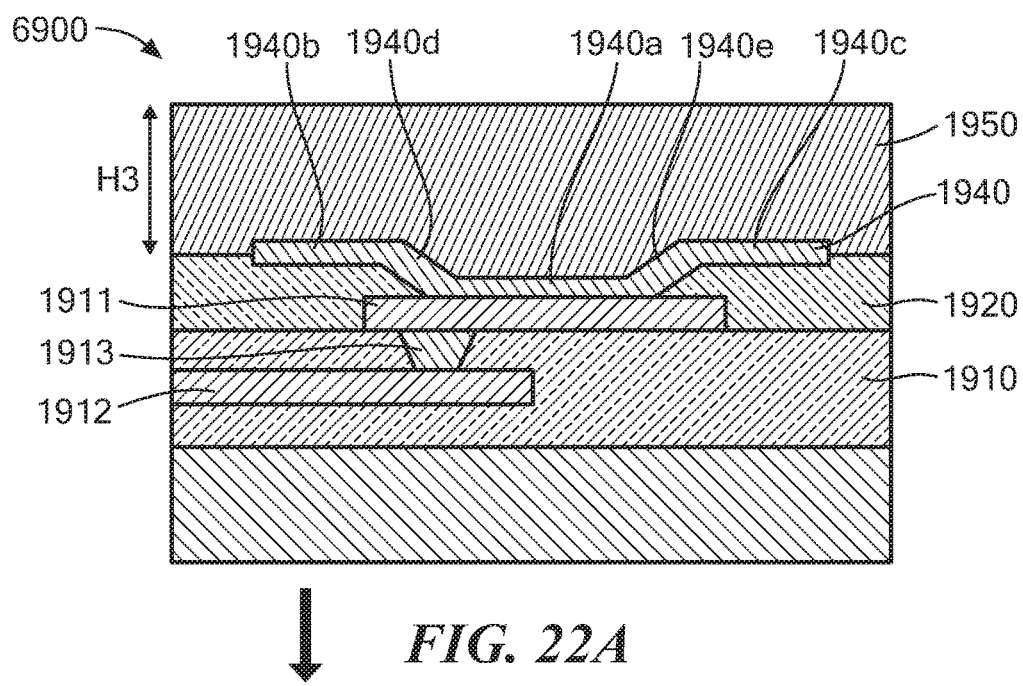

Similar to method 400, a number of spin resist and bake cycles performed in method 2000 may be selected to achieve a resist layer (i.e., a resist layer comprising the first resist layer and at least one next resist layer) having a predetermined height thickness (e.g., H3, shown in FIG. 22A). Additionally, similar to method 400, the number of spin resist and bake cycles performed in method 2000 may be based, at least in part, on a desired aspect ratio of an interconnect structure (e.g., 1960) to be formed on the semiconductor structure.

Referring now to block 2025, at block 2025 a mask is disposed over the second surface of the resist layer (e.g., 1950, shown in FIG. 22A) and the resist layer is exposed to an exposure energy (e.g., thermal energy) to form an opening (e.g., 1951, shown in FIG. 22B) in the resist layer. The opening, which is formed according to a pattern in the mask, has a predetermined shape which is suitable for receiving conductive materials as may be used to form an interconnect structure (e.g., 1960).

In embodiments in which the resist layer is provided from a positive photoresist material, exposure to the exposure energy causes the resist layer to become more soluble (e.g., easier to dissolve when developed at block 2030). In contrast, in embodiments in which the resist layer is provided from a negative photoresist material, exposure to the expo- sure energy causes the resist layer to become polymerized and, thus, more difficult to dissolve.

It follows that a pattern of the mask disposed over the resist layer at block 2025 is based upon the material from which the resist layer is provided. For example, the mask of a resist layer provided from a positive photoresist material should have a pattern which corresponds to a pattern of the resist layer to remain on the semiconductor structure (e.g., subsequent to development at block 2030). In contrast, the mask of a resist layer provided from a negative photoresist material should have a pattern which is the inverse (i.e., a photographic negative) of a pattern of the resist layer to remain on the semiconductor structure.

At block 2025, a post expose bake (PEB) process is also performed on the semiconductor structure. In particular, the semiconductor structure is baked at a predetermined temperature and for a predetermined time period. The PEB process may, for example, be used to induce diffusion of the photogenerated compound in order to smooth out the interference effect on the resist profile.

At block 2030, the resist layer of the semiconductor structure is developed. The resist layer may be developed, for example, by immersing the semiconductor structure in a developer solution for a predetermined time period. The resist layer may also be developed by spraying the semiconductor structure with the developer solution for the predetermined time period. In embodiments in which the resist layer is provided from a positive photoresist material, exposed portions of the resist layer are generally removed (or washed away) by the developer solution. In contrast, in embodiments in which the resist layer is provided from a negative photoresist material, unexposed portions of the resist layer are generally removed by the developer solution.

At block 2030, subsequent to the resist layer being developed, the semiconductor structure may also be rinsed (e.g., with deionized water), for example, to remove leftover developer solution from the semiconductor structure. The semiconductor structure may also be rinsed to prepare the semiconductor structure for a post development bake process performed at block 2030. In particular, at block 2030, the semiconductor structure is baked at a predetermined temperature and for a predetermined time period (e.g., to solidify the resist layer). The post develop bake process performed at block 2030 may reduce or eliminate residual developer from the resist opening and may be necessary in order to harden the photoresist and improve adhesion of the resist layer to the passivation layer and the UBM structure.

At block 2035, one or more surfaces of the semiconductor structure are cleaned through a plasma cleaning process for a predetermined time period (e.g., about two minutes). The cleaning process may, for example, prepare the semiconductor structure for receiving conductive materials at block 2040.

Figure 22B:
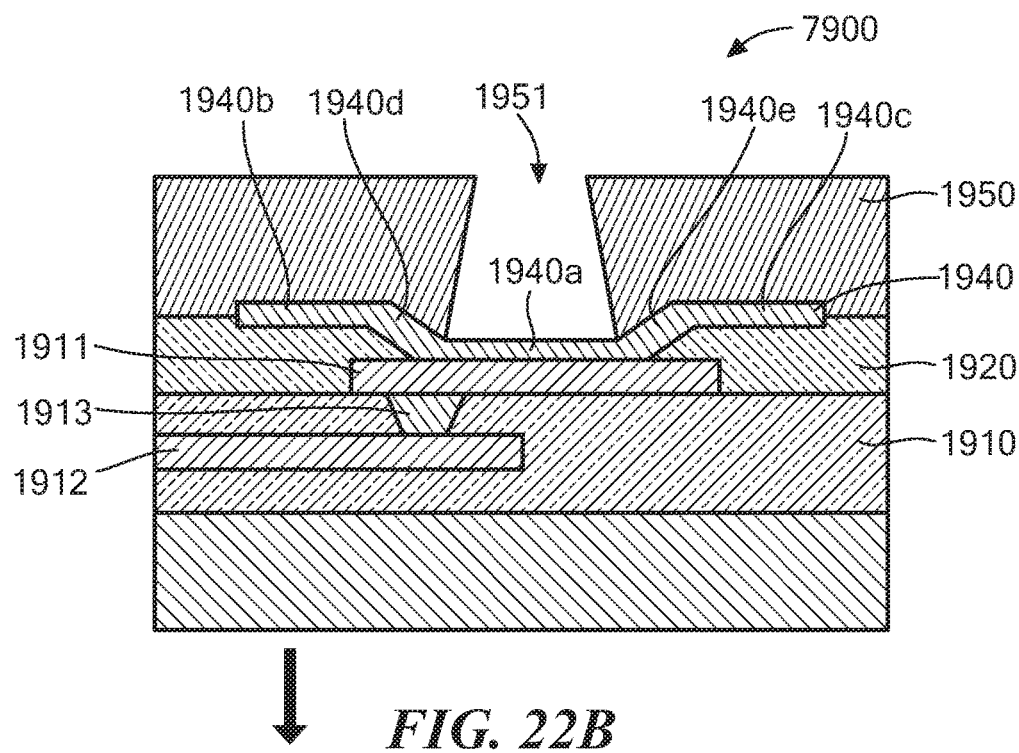
Figure 22C:
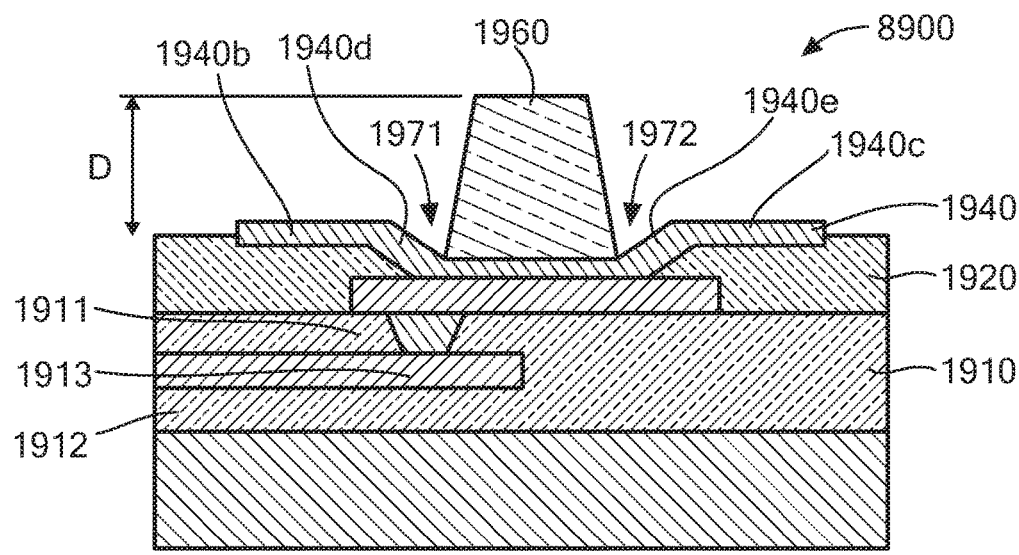

At block 2040, one or more conductive materials (e.g., superconducting and/or partially superconducting materials) are deposited or otherwise disposed in the resist layer opening and onto selected portions of the UBM structure (e.g., first pad portion 1940a of UBM structure 1940, shown in FIG. 22C) of the semiconductor structure. At block 2045, an interconnect structure (e.g., 1960, shown in FIG. 22C) is formed from the conductive materials. For example, selected portions of the conductive materials may be lifted-off or etched (e.g., through a flash etch process) to produce the interconnect structure. Additionally, at block 2045, remaining portions of the resist layer which are disposed on the semiconductor structure may be removed (e.g., stripped with a solvent, such as acetone) such that the passivation layer and the UBM structure of the semiconductor structure are exposed.

Upon completion of block 2045, the method 2000 may end. The method 2000 ending may, for example, be indicative of completion of the fabrication process of the interconnect structure (e.g., 1960). The method 2000 may be repeated (e.g., in response to a processor in the semiconductor manufacturing equipment receiving or generating a control signal) for fabricating additional interconnect structures on the semiconductor structure provided at block 2005 (or other semiconductor structures).

Figure 21:
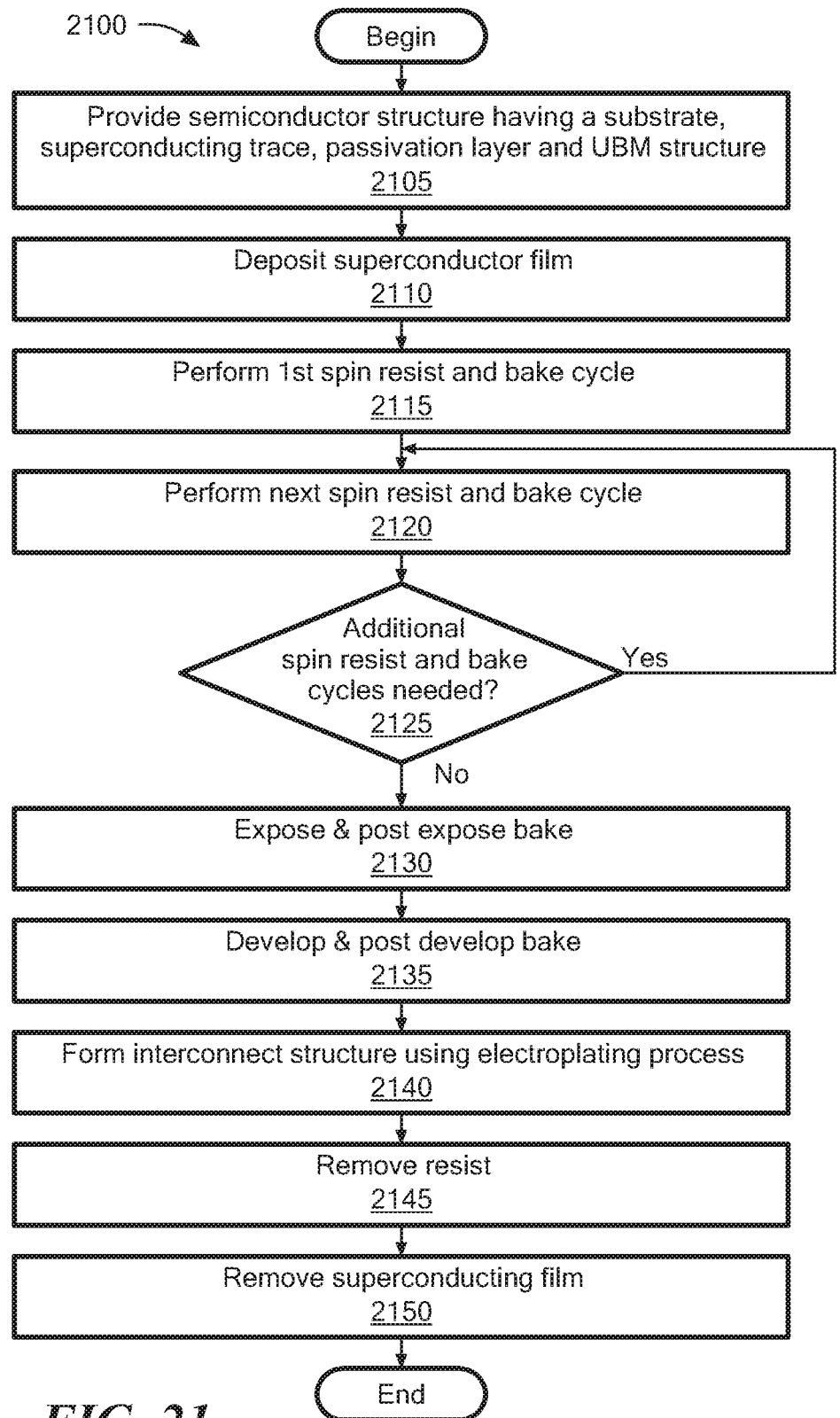
FIG. 21 is a flowchart illustrating another example method for fabricating an interconnect structure in accordance with an embodiment of the disclosure.

Referring to FIG. 21, another example method of fabricating an interconnect structure (e.g., 1960, shown in FIG. 22C) on a semiconductor and/or conventional metal and/or superconductor structure (e.g., 5900, shown in FIG. 22) is shown.

As illustrated in FIG. 21, a method 2100 for fabricating a interconnect structure begins at block 2105. At block 2105, a semiconductor structure (e.g., 5900) is provided. The semiconductor structure provided at block 2105, similar to the semiconductor structure provided at block 2005 of method 2000, includes a substrate (e.g., 1910, shown in FIG. 22), a superconducting trace (e.g., 1920, shown in FIG. 22), a passivation layer (e.g., 1930, shown in FIG. 22) and a UBM structure (e.g., 1940, shown in FIG. 22). The superconducting trace has a surface (e.g., a first surface) disposed over a selected portion of a surface (e.g., a second surface) of the substrate. Additionally, the passivation layer has a surface (e.g., a first surface) disposed over a selected portion of a surface (e.g., a second surface) of the superconducting trace. Further, the UBM structure is disposed or otherwise formed in an opening (e.g., 1931, shown in FIG. 22) provided in the passivation layer and is coupled to the superconducting trace.

At block 2110, a superconducting film (e.g., 550, shown in FIG. 5) is deposited over one or more portions of the semiconductor structure provided at block 2105. In embodiments, the one or more portions of the semiconductor structure include one or more portions of the UBM structure (e.g., first pad portion 1940a of UBM structure 1940, shown in FIG. 22) of the semiconductor structure. Additionally, in some embodiments, only the UBM structure of the semiconductor structure is exposed and the superconducting trace (or traces) is/are covered by passivation layer. In one embodiment, a thickness of superconducting film (e.g., a distance between first and second opposing surfaces of the superconducting film) is substantially less than a thickness of the UBM structure (e.g., a distance between first and second opposing surfaces of the UBM structure). As one example, the superconducting film may have a thickness of about 50 nm and the UBM structure may have a thickness of about 500 nm.

In some embodiments, the superconducting film may alternatively be a conventional metal film. Additionally, in some embodiments the superconducting film may include multiple thin films. For example, the film can include an about 40 nm superconducting (e.g., Nb, Ti) film and an about 10 nm conventional metal (e.g., Au, Cu, Ag) film. Adding a conventional metal film to the superconducting film may, for example, protect the superconducting film from oxidation and thus provide for better plating quality. In one embodiment, the conventional metal thickness is chosen such that it becomes superconducting due to proximity to the superconducting film. In another embodiment, the superconducting film may become a UBM or part of the UBM structure of the semiconductor structure.

At block 2115, a first spin resist and bake cycle (also sometimes referred to herein as a "first cycle") is performed on the semiconductor structure. The first cycle is substantially the same as the first cycle described above in connection with block 2010 of method 2000 and, thus, will not be described again in detail herein.

At block 2120, a next spin resist and bake cycle (also sometimes referred to herein as a "next cycle") is performed on the semiconductor structure. The next cycle is substantially the same as the next cycle described above in connection with block 2015 of method 2000 and, thus, will not be described again in detail herein.

At block 2125, it is determined whether any additional spin resist and bake cycles are needed. If it is determined that additional spin resist and bake cycles are needed, the method 2100 returns to block 2120 and blocks 2120 and 2125 are repeated until it is determined that no additional spin resist and bake cycles are needed. Alternatively, if it is determined that no additional spin resist and bake cycles are needed, the method 2100 may proceed to a block 2130.

Similar to method 2000, a number of spin resist and bake cycles performed in method 2100 may be selected to achieve a resist layer (i.e., a resist layer comprising the first resist layer and at least one next resist layer) having a predetermined thickness. Additionally, similar to method 2000, the number of spin resist and bake cycles performed in method 2100 may be based, at least in part, on a desired aspect ratio of an interconnect structure (e.g., 1960) to be formed on the semiconductor structure (e.g., 5900).

Referring now to block 2130, at block 2130 a mask is disposed over the second surface of the resist layer and the resist layer (e.g., 1950, shown in FIG. 22A) is exposed to an exposure energy to form an opening (e.g., 1951, shown in FIG. 22B) in the resist layer. The opening, which is formed according to a pattern in the mask, has a predetermined shape which is suitable for receiving conductive materials as may be used to form an interconnect structure (e.g., 1960).

At block 2130, a post expose bake process is also performed on the semiconductor structure. In particular, at block 2130 the semiconductor structure is baked at a predetermined temperature and for a predetermined time period.

At block 2135, the resist layer of the semiconductor structure is developed. In embodiments, the resist layer is developed in a same or similar manner at block 2135 as in block 2030 of method 2000. At block 2135, the semiconductor structure is also baked in a post development process at a predetermined temperature and for a predetermined time period (e.g., to solidify the resist layer). In one embodiment, additional plasma cleaning can be used before electroplating.

At block 2140, an interconnect structure (e.g., 1960, shown in FIG. 22C) is formed or otherwise provided on a surface of the UBM structure (e.g., first pad portion 1940a of UBM structure 1940, shown in FIG. 22C) using an electroplating process. The electroplating process is substantially the same as the electroplating process 440 of method 400 and, thus, will not be described again in detail herein.

At block 2145, remaining portions of the resist layer are removed from the semiconductor structure. Additionally, in some embodiments, selected portions of the interconnect structure formed in block 2140 may be etched at block 2145 to further define a shape of the interconnect structure. Removal of the resist may define interconnect structures connected with each other by the superconducting film (e.g., in embodiments in which more than one interconnect structure is to be formed).

At block 2150, the superconducting film deposited at block 2110 is removed (e.g., etched through a flash etch process) from the semiconductor structure. Upon completion of block 2150, the method 2100 may end. The method 2100 ending may, for example, be indicative of completion of the fabrication process of the interconnect structure (e.g., 1960) on the semiconductor structure (e.g., 5900). The method 2100 may be repeated (e.g., in response to a processor in the semiconductor manufacturing equipment receiving or generating a control signal) for fabricating additional interconnect structures on the semiconductor structure provided at block 2105 (or other semiconductor structures). In one embodiment, the etching process used to etch the superconducting film may also etch interconnect materials. Additionally, in one embodiment, an etch rate of interconnect materials is faster than an etch rate of the superconducting film. In one example, interconnect thickness is between about 6 micron and about 100 micron, and superconducting film thickness is between about 10 micron and about 100 nm. In another example, the superconducting film etching process will not etch the interconnect material or will etch significantly less of the interconnect materials than the superconducting film.

Referring now to FIGS. 22-22C, example semiconductor structures as may be formed or otherwise provided in an example method for fabricating a cryogenic electronic package in accordance with an embodiment of the disclosure are shown. While FIGS. 22-22C generally illustrate progression of a sequence of processes by which semiconductor structures (e.g., 8900, shown in FIG. 22C) and an interconnect structure (e.g., 1960, shown in FIG. 22C) in a cryogenic electronic package may be fabricated, the illustrated process progression need not occur in the particular sequence shown. Rather, the processes may be re-ordered, combined or removed, performed in parallel or in series to fabricate semiconductor structure 8900 and interconnect structure 1960 shown in FIG. 22C, for example.

Referring to FIG. 22, in which like elements of FIG. 19D are provided having like reference designations, semiconductor structure 5900 includes substrate 1910, superconducting traces 1911, 1912, and conductive structure 1913. Semiconductor structure 5900 also includes passivation layer 1920 and UBM structure 1940. UBM structure 1940 is disposed or formed in passivation layer opening 1921 and includes first pad portion 1940a, second pad portions 1940b, 1940c, and pad interconnects 1940d, 1940e. UBM structure 1940 also has opening 1941 shaped to receive an interconnect structure (e.g., 1960, shown in FIG. 22C, as will be discussed).

Referring to FIG. 22A, in which like elements of FIG. 22 are shown having like reference designations, a semiconductor structure 6900 includes substrate 1910, superconducting traces 1911, 1912, and conductive structure 1913. Semiconductor structure 6900 also includes passivation layer 1920, UBM structure 1940 and a resist layer 1950.

Resist layer 1950 is disposed over or otherwise applied or formed on selected portions of UBM structure 1940 and selected portions of passivation layer 1920 in the illustrated embodiment. In particular, resist layer 1950 has a surface (e.g., a first surface) disposed over surfaces (e.g., second surfaces) of first pad portion 1940a, second pad portions 1940b, 1940c and pad interconnects 1940d, 1940e of UBM structure 1940. Resist layer 1950 is also received in UBM structure opening 1941. Additionally, the resist layer 1950 has a surface (e.g., a first surface) disposed over a surface (e.g., a second or exposed surface) of passivation layer 1920.

Similar to resist layer 1930 shown in FIG. 19B, for example, resist layer 1950 is provided from one or more resist materials (e.g., positive and/or negative photoresist materials) which can be applied during one or more spin resist and bake cycles. The spin resist and bake cycles may be the same as or similar to those described above in connection with FIGS. 20 and 21, for example.

Resist layer 1950 has an associated height or thickness H3 (here, a distance between first and second opposing surfaces of resist layer 1950). In one embodiment, the height H3 of the resist layer 1950 is selected based upon one or more characteristics (e.g., dimensions) of an interconnect structure to be disposed or formed on UBM structure 1940 (e.g., interconnect structure 1960, shown in FIG. 22C, as will be discussed). Additionally, in one embodiment a number of spin and bake cycles used to produce the resist layer 1950 may be based upon the selected height H3.

Referring to FIG. 22B, a semiconductor structure 7900 includes substrate 1910, superconducting traces 1911, 1912, and conductive structure 1913. Semiconductor structure 6900 also includes passivation layer 1920, UBM structure 1940 and resist layer 1950.

An opening 1951 is formed or otherwise provided in a selected portion of the resist layer 1950. The resist layer opening 1951 has a predetermined shape and extends between the second surface of the resist layer 1950 and selected portions of the UBM structure 1940 over which the first surface of the resist layer 1950 is disposed. In particular, the resist layer opening 1951 extends between the second surface of the resist layer 1950 and the second surface of first pad portion 1940a in the illustrated embodiment. In embodiments, a mask (not shown) is disposed over a surface (e.g., a second surface) of the resist layer 1950 and the resist layer opening 1951 is formed based upon a pattern of the mask.

In one embodiment, the predetermined shape of the resist layer opening 1951 is selected based upon one or more characteristics (e.g., dimensions) of an interconnect structure to be formed in the resist layer opening 1951 (e.g., interconnect structure 1960, shown in FIG. 22C, as will be discussed).

In embodiments, the resist layer opening 1951 and exposed portions (e.g., the second surface) of the first pad portion 1940a of the UBM structure 1940 may be cleaned (e.g., through plasma cleaning processes) to prepare the resist layer 1950 and the UBM structure 1940 for the interconnect structure.

Referring to FIG. 22C, a semiconductor structure 8900 includes substrate 1910, superconducting traces 1911, 1912, conductive structure 1913 and passivation layer 1920. Semiconductor structure 8900 also includes UBM structure 1940 and an interconnect structure 1960.

The interconnect structure 1960 is disposed or otherwise formed in resist layer opening 1951. Interconnect structure 1960 has a first portion disposed over and coupled to selected portions of the UBM structure 1940 (here, first pad portion 1940a of UBM structure 1940). Additionally, interconnect structure 1960 has a second opposing portion that extends a predetermined distance D above the second surface of the passivation layer 1920 in the illustrated embodiment. Those of ordinary skill in the art will understand how to select the predetermined distance D for a particular application (e.g., for finer pitch applications). As one example, the predetermined distance D, which is related to a height of the interconnect structure 1960 (e.g., a distance between the first and second opposing portions of the interconnect structure 1960), may compensate for structural misalignment between semiconductor structure 8900 and another semiconductor structure to which the semiconductor structure 8900 may be coupled (e.g., 2310, shown in FIG. 23), as will be discussed further below in connection with FIGS. 23-23C, for example.

Figure 23:
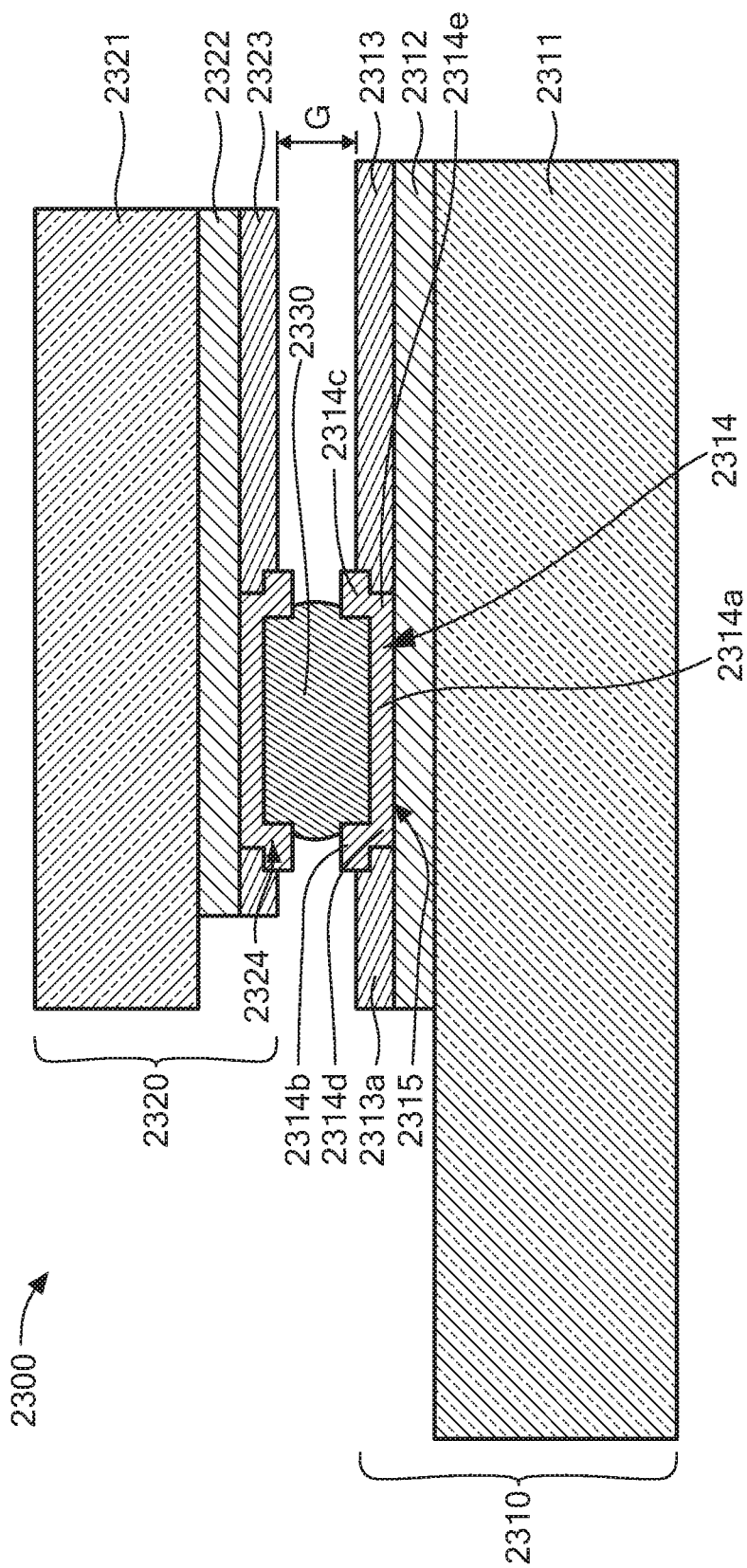
FIGS. 23-23C are block diagrams of example cryogenic electronic packages in accordance with an embodiment of the disclosure.

The interconnect structure 1960 has a predetermined shape corresponding to a trapezoidal prism in the illustrated embodiment. In other embodiments, however, the interconnect structure 1960 may have a predetermined shape corresponding to a sphere, cube, cylinder, cone, rectangular prism, triangular prism, trapezoidal prism, octagonal prism, square pyramid or any number of other shapes. The predetermined shape of the interconnect structure 1960 may, for example, be selected based upon an application of the semiconductor structure (e.g., 8900) in which the interconnect structure 1960 is disposed or formed. Another example shape of an interconnect structure is shown in FIG. 23, for example, as described below.

In some embodiments, such as that which is shown in FIG. 22D, the interconnect structure 1960 may have one or more dimensions (e.g., a length, width and/or diameter) which are smaller than one or more dimensions of the UBM structure opening 1941. Additionally, in some embodiments the interconnect structure 1960 may have one or more dimensions (e.g., a length, width and/or diameter) which are larger than one or more dimensions of the UBM structure opening 1941 in which the interconnect structure 1960 is disposed or formed. In such embodiments, during coupling of the semiconductor structure 8900 to one or more other semiconductor structures, the interconnect structure 8900 may melt and spread within the cavities 1971, 1972 and onto selected portions (or surfaces) of the second pad portions 1940b, 1940c. Such may, for example, provide a more robust electrical connection than conventional configurations.

One or more portions (or surfaces) of interconnect structure 1960 may be coated with one or more fusible conductive materials (e.g., a solderable surface finish) or structures similar to surfaces 1344 shown in FIG. 13, for example, in embodiments. Additionally, in embodiments interconnect structure 1960 may be an interconnect portion (or part of an interconnect portion) of an interconnect structure including a plurality of interconnect structures, similar to interconnect structure 1330 shown in FIG. 13A, for example.

In embodiments, the interconnect structure 1960 is formed by disposing one or more electrically conductive materials in resist layer opening 1951 shown in FIG. 22B and developing the conductive materials to form the interconnect structure 1960. In such embodiments, subsequent to the interconnect structure 1960 being developed, remaining portions of the resist layer 1950 shown in FIG. 22B may be removed (e.g., stripped with a solvent) from the passivation layer 1920 and the UBM structure 1940, for example, to expose selected portions of the passivation layer 1920 and the UBM structure 1940. In some embodiments, the electrically conductive materials include one or more superconducting and/or a partially superconducting materials (e.g., Indium or Niobium). Additionally, in some embodiments the electrically conductive materials include one or more conventional conducting materials (e.g., Copper, Gold, or Aluminum).

Spaces or cavities 1971, 1972 exist between edges of UBM structure 1940 and edges of the interconnect structure 1960 in the illustrated embodiment. The cavities 1971, 1972 may, for example, store selected portions of the interconnect structure 1960 that melt (or deform) when coupling semiconductor structure 8900 to one or more other semiconductor structures (e.g., 2320, shown in FIG. 23), for example, through a reflow process. By storing the selected portions of the interconnect structure 1960, the cavities 1971, 1972 may reduce (or ideally prevent) risk of an electrical short between semiconductor structure 8900 and the other semiconductor structures. Additionally, by storing the selected portions of the interconnect structure 1960 the cavities 1971, 1972 may provide for increased electrical connectivity between semiconductor structure 8900 and the other semiconductor structures. The foregoing may, for example, be due to interconnect structure 1960 being disposed over and coupled to an increased surface area of the UBM structure 1940. In embodiments, dimensions (e.g., predetermined shapes) of the cavities 1971, 1972 (and thus dimensions of the UBM structure 1940) may be selected based upon a desired spread of the selected portions of the interconnect structure 1960 within the cavities 1971, 1972.

Interconnect structure 1960 may be electrically coupled to selected ones of a plurality of electrical connections in substrate 1910 (e.g., through UBM structure 1940 and superconducting trace 1911). Additionally, interconnect structure 1960 may form an interconnect for electrically and mechanically coupling semiconductor structure 8900 to one or more other semiconductor structure (e.g., to form a cryogenic electronic package, as will be discussed).

As illustrated, a contact area exists between interconnect structure 1960 (e.g., a surface or portion of interconnect structure 1960) and the UBM structure 1940 (e.g., a surface or portion of UBM structure 1940) to which the interconnect structure 1960 is coupled. The contact area can take a variety of shapes, for example, depending upon a shape of the interconnect structure and/or the UBM structure. For example, the contact area can be circular in embodiments in which the interconnect structure 1960 has a circular surface coupled to the UBM structure 1940 (e.g., first pad portion 1940a of UBM structure 1940). Additionally, the contact area can be rectangular or square in embodiments in which the interconnect structure 1960 has a rectangular or square surface coupled to the UBM structure 1940. For a circular contact area, a diameter of the contact area may be selected to be more than a width of a superconducting trace 1911 to which the UBM structure 1940 is coupled such that the interconnect structure 1960 achieves or maintains a substantially same critical current capability as the superconducting trace 1911. Similarly for a rectangle contact area, a width of the contact area may be selected to be more than the superconducting trace width such that the interconnect structure 1960 achieves or maintains a substantially same critical current capability as the superconducting trace 1911. In general, a contact area between an interconnect structure and a respective one or more UBM structures to which the interconnect structure is coupled may be selected to be larger than a width of a superconducting trace disposed beneath the UBM structures. The foregoing such that the interconnect structure achieves or maintains a substantially same critical current capability as the superconducting trace.

In embodiments, such as the illustrated embodiment, the surface of a UBM structure (e.g., 1940) to which an interconnect structure (e.g., 1960) is coupled has dimensions which are larger than dimensions of the surface or portion of the interconnect structure coupled to the UBM structure surface. During coupling or formation of the interconnect structure, at least a portion of the interconnect structure may coat substantial portions of the UBM structure. Remaining portions of the interconnect structure may be used to form an electrical interconnect between two structures or devices (e.g., semiconductor structures or device). In one embodiment, interconnect structure has a diameter or width of between about 10 micron and about 15 micron prior to coupling to the UBM structure surface, and a diameter or width of between about 20 micron and about 30 micron after coupling and coating the UBM structure surface. Additionally, in one embodiment, at least one of the UBM structure surface or the superconducting surface (e.g., 1911) disposed beneath the UBM structure surface has surface dimensions of about 100 micron×about 100 micron and includes multiple 15-20 micron interconnect structures disposed thereon.

Additionally, in embodiments it is possible to develop scalable indium-based microbump interconnect structures to create interconnections between at least two semiconductor structures (e.g., niobium superconducting MCMs and niobium superconducting chips). In embodiments, the microbump interconnect structures do not degrade the critical currents of superconducting traces (e.g., 1911) during operation of the cryogenic electronic package. In one embodiment, 6-20 micron Indium or related alloy based microbumps having a pitch in the range of about 12-50 microns having density of up to about 688-2752 interconnects per square mm are capable of maintaining a relatively low resistance. The microbumps generate relatively low heat and allow for the superconducting traces (e.g., Niobium traces or lines) to which the microbumps are coupled (e.g., via a UBM structure) to maintain a relatively high critical current and also have a relatively high current carrying capacity.

Figure 23A:
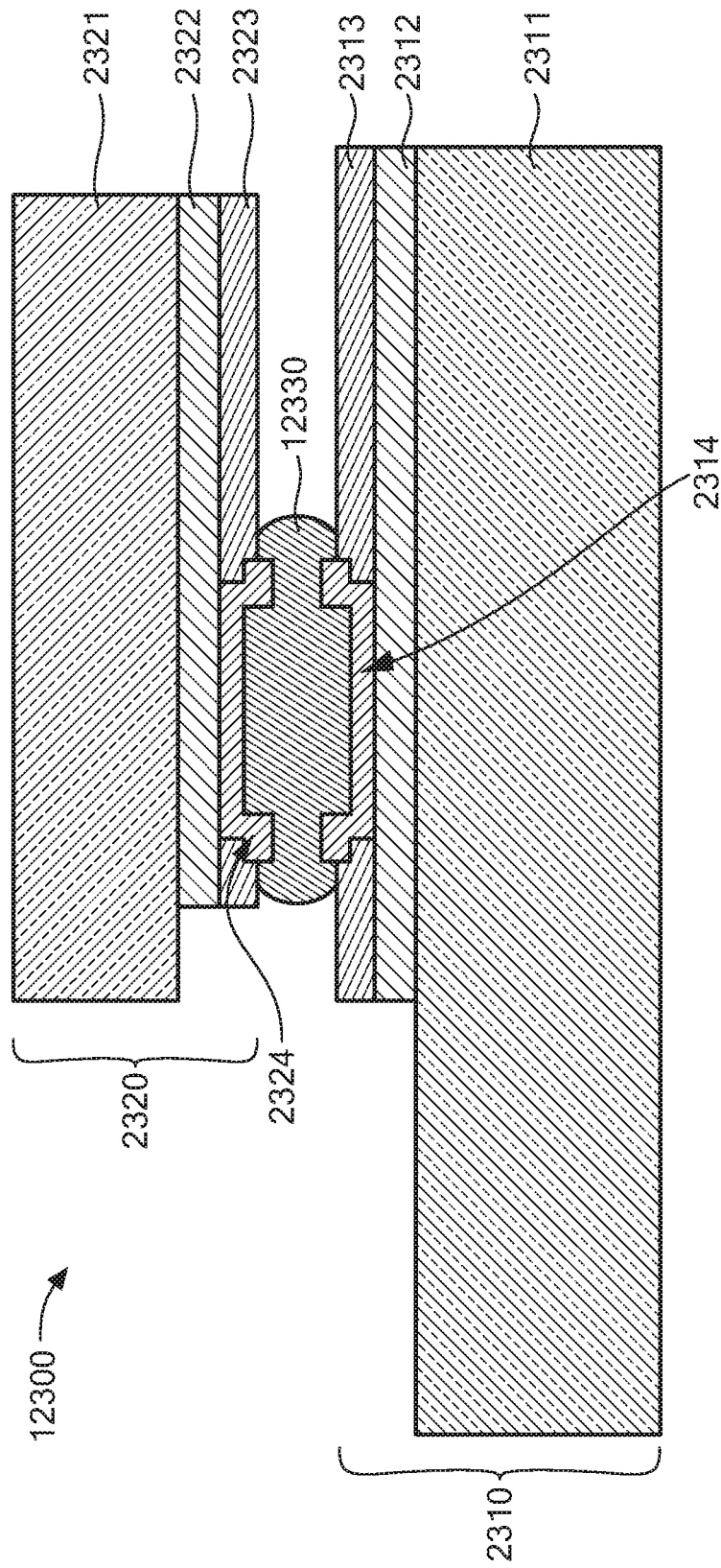
Figure 23B:
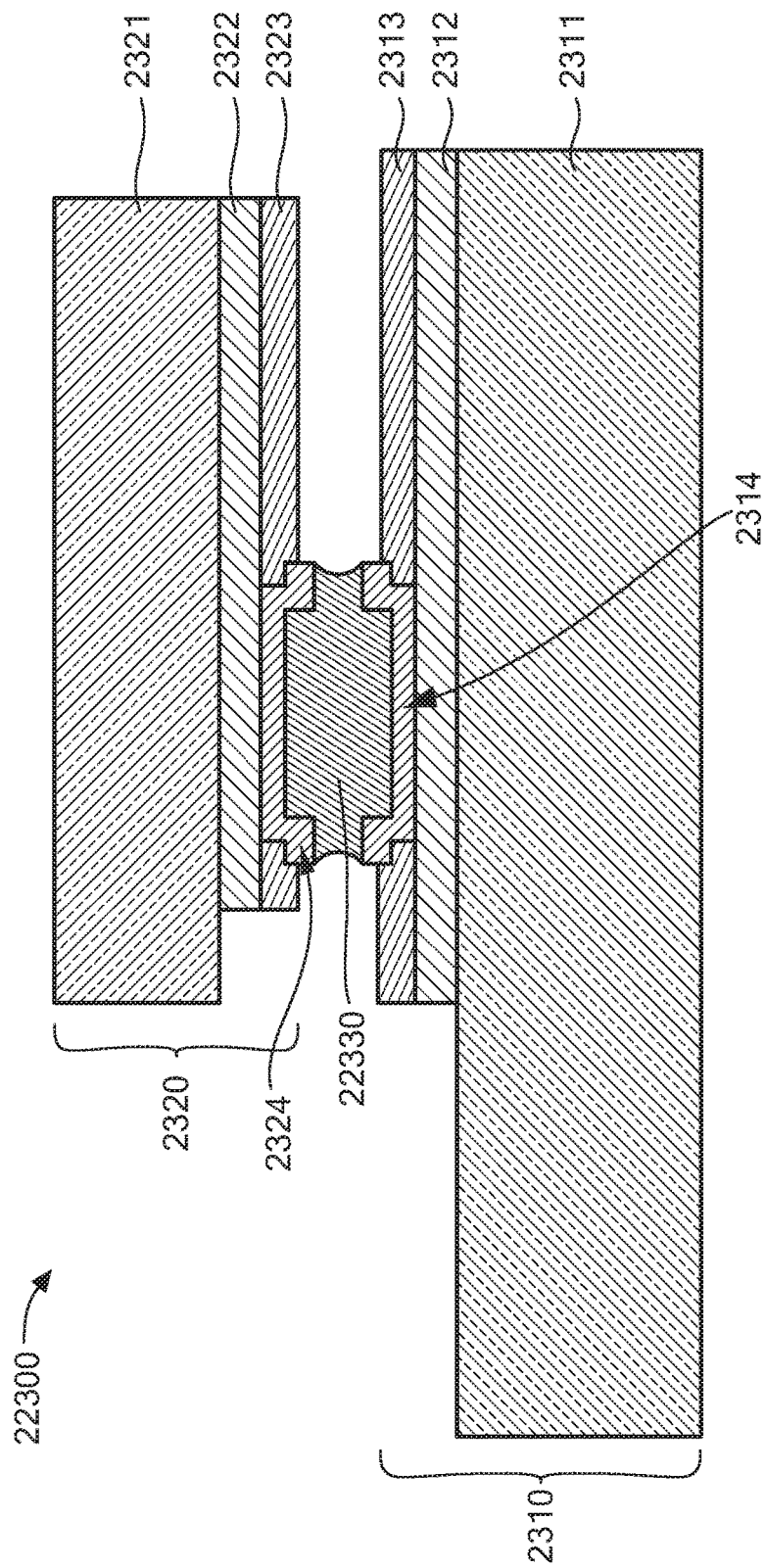
Figure 23C:
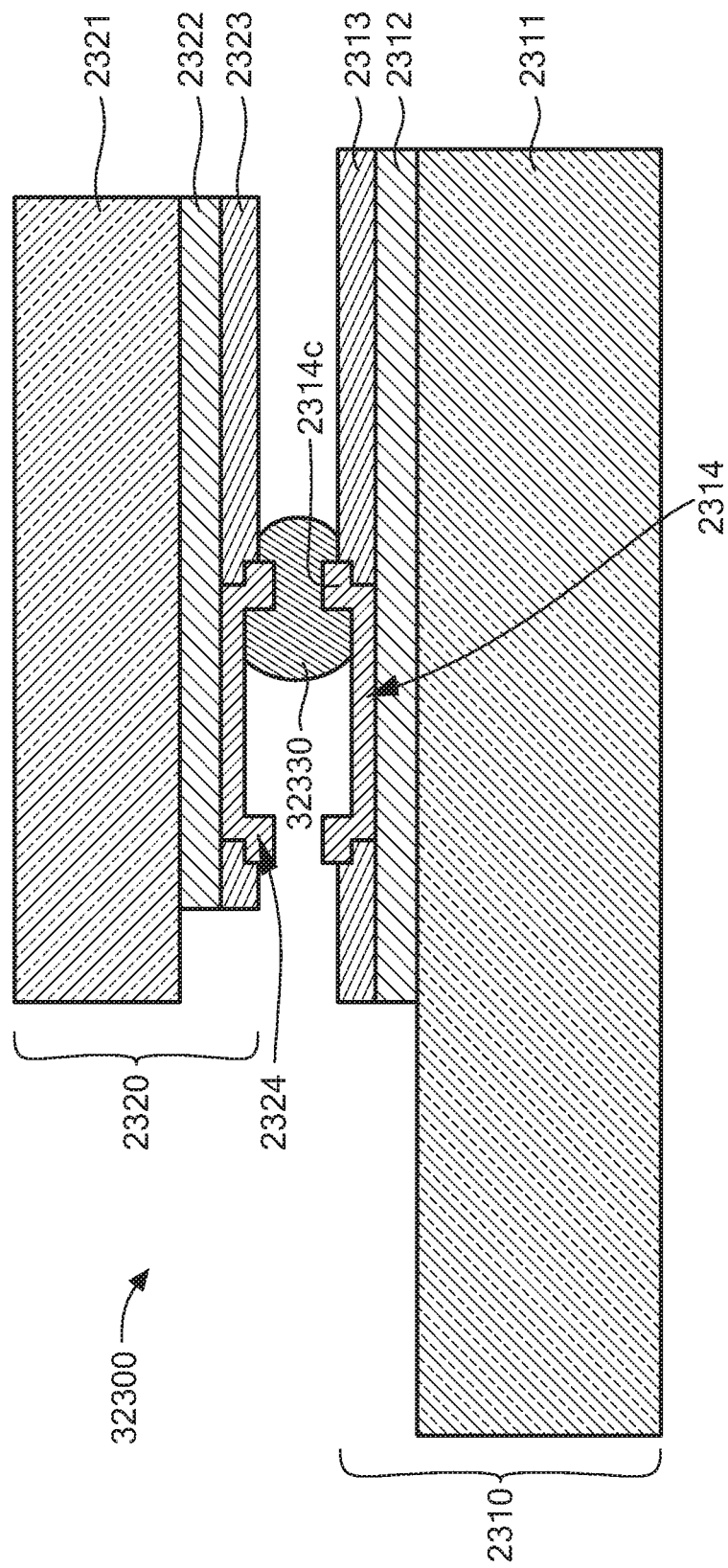

Referring now to FIGS. 23-23C, in which like elements are provided having like reference designations, several example cryogenic electronic packages (e.g., 2300, shown in FIG. 23) as may be fabricated using interconnect structures (e.g., 1960, shown in FIG. 22C) and semiconductor structures (e.g., 5900, shown in FIG. 22) according to the disclosure are shown.

Referring to FIG. 23, an example cryogenic electronic package 2300 includes a first superconducting semiconductor structure 2310 and a second superconducting semiconductor structure 2320. Cryogenic electronic package 2300 also includes an interconnect structure 2330 for coupling (e.g., electrically, mechanically and/or inductively coupling) the second semiconductor structure 2320 to the first semiconductor structure 2310.

First semiconductor structure 2310 (e.g., a first superconducting device or IC) includes a substrate 2311 and a superconducting trace 2312. First semiconductor structure 2310 also includes a passivation layer 2313 and a UBM structure 2314. Superconducting trace 2312 has a surface (e.g., a first surface) disposed over a selected portion of a surface (e.g., a second surface) of substrate 2310. Additionally, passivation layer 2313 has a surface (e.g., a first surface) disposed over a selected portion of a surface (e.g., a second surface) of the superconducting trace 2312.

Passivation layer 2313 has an opening 2313*a* formed or otherwise provided in selected portions of the passivation layer 2313. The opening 2313*a* is shaped to receive a UBM structure (e.g., UBM structure 2314, as will be discussed further below), and extends from the second surface of the passivation layer 2313 to the second surface of the superconducting trace 2312 (and thus the first surface of the passivation layer 2313).

UBM structure 2314, which may be the same as or similar to UBM structure 1940 of FIG. 22C in embodiments, is disposed or otherwise provided or formed in passivation layer opening 2313*a*. UBM structure 2314 includes a first pad portion 2314*a*, a plurality of second pad portions (here, second pad portions 2314*b*, 2314*c*), and a plurality of pad interconnects (here, pad interconnects 2314*d*, 2314*e*). First pad portion 2314*a* has a surface disposed over and coupled to the second surface of the superconducting trace 2312. Second pad portion 2314*b* has a surface disposed over and coupled to a first selected portion of the second surface of the passivation layer 2313. Second pad portion 2314*c* has a surface disposed over and coupled to a second selected portion of the second surface of the passivation layer 2314. Pad interconnect 2314*d* has a surface disposed over an edge of the passivation layer opening 2313*a*, and extends from first pad portion 2314*a* to second pad portion 2314*b*. Additionally, pad interconnect 2314*e* has a surface disposed over an edge of the passivation layer opening 2313*a*, and extends from first pad portion 2314*a* to second pad portion 2314*c*.

UBM structure 2314 also has an opening 2315 shaped to receive an interconnect structure (here, interconnect structure 2330). The opening 2315 is formed between selected surfaces of the first pad portion 2314*a*, second pad portions 2314*b*, 2314*c*, and pad interconnects 2314*d*, 2314*e* of the UBM structure 2314. Additionally, the opening 2315 extends between first pad portion 2314*a* and second pad portions 2314*b*, 2314*c*.

In embodiments, dimensions of first pad portion 2314*a*, second pad portions 2314*b*, 2314*c*, and pad interconnects 2314*d*, 2314*e* may be selected based upon dimensions of the interconnect structure to be received in UBM structure opening 2315. Additionally, in embodiments dimensions of first pad portion 2314*a*, second pad portions 2314*b*, 2314*c*, and pad interconnects 2314*d*, 2314*e* may be selected based upon a desired spread of electrical materials of the interconnect structure within the UBM structure opening 2315. Further, in embodiments dimensions of first pad portion 2314*a*, second pad portions 2314*b*, 2314*c*, and pad interconnects 2314*d*, 2314*e* may be selected based upon a desired interconnect height and/or width.

Second semiconductor structure 2320 (e.g., a second superconducting device), which may be the same as or similar to first semiconductor structure 2310 in embodiments, includes a substrate 2321 and a superconducting trace 2323. Second semiconductor structure 2320 also includes a passivation layer 2324 and a UBM structure 2325.

Superconducting trace 2322 has a surface (e.g., a first surface) disposed over a selected portion of a surface (e.g., a second surface) of substrate 2320. Additionally, passivation layer 2323 has a surface (e.g., a first surface) disposed over a selected portion of a surface (e.g., a second surface) of the superconducting trace 2322.

UBM structure 2324 is disposed in an opening formed in passivation layer 2323 and includes a first pad portion, a plurality of second pad portions, and a plurality of pad interconnects. UBM structure 2324 also has an opening shaped to receive an interconnect structure (here, interconnect structure 2330). UBM structure 2324 is similar to UBM structure 2314 in the illustrated embodiment and thus the various portions of the UBM structure 2324 (e.g., the openings) will not be described again in detail herein.

Second semiconductor structure 2320 may be coupled to first semiconductor structure 2310 via interconnect structure 2330 through a bonding or coupling process. The coupling process may include disposing or forming interconnect structure 2330 (e.g., a solder ball, sphere, pillar, or microbump) on selected portions (or a selected portion) of a UBM structure (e.g., UBM structure 2314) of at least one of the first and second semiconductor structures 2310, 2320. For example, a first portion of interconnect structure 2330 may be received in UBM structure opening 2315 and disposed over and coupled to first pad portion 2314*a* of UBM structure 2314 of first semiconductor structure 2310. This is similar to interconnect structure 1960 shown in FIG. 22C, for example, which is received in UBM structure opening 1941 and disposed over and coupled to first pad portion 1940*a* of UBM structure 1940.

The coupling process may also include aligning UBM structure 2324 of second semiconductor structure 2320 with UBM structure 2314 of first semiconductor structure 2310 such that the first pad portions (e.g., 2314*a*) of the UBM structures (e.g., 2314) are substantially parallel with each other and spaced apart from each other by a predetermined separation distance. The coupling process may additionally include decreasing the predetermined separation distance from a first distance to a second distance that is less than the first distance, for example, such that a second opposing portion of the interconnect structure 2330 is received in the UBM structure opening of UBM structure 2324 of second semiconductor structure 2320 (and is in contact with at least the first pad interconnect of UBM structure 2324).

The coupling process may further include exposing the interconnect structure 2330 to an exposure energy such that selected portions of the interconnect structure 2330 melt onto selected portions of the UBM structures and form an electrical connection between the first semiconductor structure 2310 and the second semiconductor structure 2320. The exposure energy (e.g., thermal energy from a heat-treatment or reflow process) may have a predetermined intensity distribution and be applied for a predetermined time period. In some embodiments, the selected portions of the interconnect structure 2330 that melt may substantially fill the openings in the UBM structures, as shown (e.g., to prevent electrical shorts between the first and second semiconductor structures). Additionally, in some embodiments the selected portions of the interconnect structure 2330 that melt may overcoat selected portions of the second pad portions of the UBM structures, as is also shown (e.g., to form a robust electrical connection between the first and second semiconductor structure 2310, 2320).

One or more characteristics (e.g., dimensions) of interconnect structure 2330 and/or the UBM structures may provide for a specific gap or spacing G between the first semiconductor structure 2310 and the second semiconductor structure 2320. In embodiments, the gap G may be selected to provide a predetermined amount of isolation (e.g., signal isolation) between the first semiconductor structure 2310 and the second semiconductor structure 2320. The gap G may be "underlined" with one or more electrically insulating materials, for example to provide a stronger mechanical connection and a heat bridge between the first semiconductor structure 2310 and the second semiconductor structure 2320.

Interconnect structure 2330 may be the same as or similar to interconnect structures described in figures above. In one embodiment, interconnect structure 2330 includes a plurality of interconnect sections, each of which may include one or more superconducting or partially superconducting materials. Example materials and material compositions for the interconnect sections include: (40-400)nm Al-(5-20)nm Ti-(10-50)nm Pt-(40-200)nm Au-(1-5)μm In-(40-400)nm Au-(10-50)nm Pt-(5-20)nm Ti-(40-400)nm Al, (40-400)nm Al-(5-20)nm Ti-(10-50)nm Pt-(40-200)nm Au-(1-3)μm In-(1-3)μm Sn-(40-400)nm Au-(10-50)nm Pt-(5-20)nm Ti-(40-400)nm Al, (40-400)nm Al-(5-20)nm Ti-(100-1000)nm Sn-(1-5)μm In-(100-1000)nm Sn-(5-20)nm Ti-(40-400)nm Al).

In embodiments, superconducting trace 2312 of first superconducting semiconductor structure 2310 and/or superconducting trace 2322 of second semiconductor structure 2320 have one or more characteristics (e.g., dimensions and/or materials) selected such that at least one of the superconducting traces 2312, 2322 has or supports a same or similar predetermined critical current density as interconnect structure 2330. As one example, superconducting traces 2312, 2322 may include a same superconducting and/or partially superconducting material (e.g., Niobium (Nb) as the interconnect structure 2330 such that the superconducting traces 2312, 2322 have or support a same or similar predetermined critical current density as interconnect structure 2330.

Increasing the integration scale of SFQ circuits typically requires reducing the area occupied by Josephson junctions and shunt resistors. High critical current self-shunted junctions generally do not require external shunting. Additionally, high critical current, self-shunted junctions generally favor relatively high clock frequencies. Designing appropriate superconducting line width and maintain high critical current superconducting circuits allows for high-critical current junctions to function during system operation. On-chip, high-frequency clock sources are essential for superconductor digital circuits and systems. High-quality Long Josephson junction (LJJ) resonant oscillators with extremely low jitter are used as clock sources for single flux quantum (SFQ) digital circuits. A LJJ can have linear and/or annular geometry. Several SFQ circuits require high bias lines. Maintaining a high critical current, lossless (or substantially lossless) electrical path will allow for applying of high bias current to the junctions. In one example, a LJJ is biased. In another example, toggle flip-flops (TFFs) use high critical current bias lines.

In one embodiment, first semiconductor structure 2310 includes one or more first superconducting resonator and/or qubit and/or coupler devices and second semiconductor structure 2320 includes one or more second superconducting resonator and/or qubit and/or coupler devices. In such embodiment, interconnect structure 2330 may form a coupling or conductive path for coupling the first superconducting resonator and/or qubit and/or coupler devices to the second first superconducting resonator and/or qubit and/or coupler devices. It is to be appreciated that first semiconductor structures 2310 and second semiconductor structure 2320 may include any number of superconducting and/or partially superconducting and/or conventional (i.e., non-superconducting) circuits and devices.

Referring to FIG. 23A, another example cryogenic electronic package 12300 includes first superconducting semiconductor structure 2310, second superconducting semiconductor structure 2320, and an interconnect structure 12330 for coupling the second semiconductor structure 2320 to the first semiconductor structure 2310.

As illustrated, the interconnect structure 12330 (e.g., a microbump) has dimensions (e.g., a diameter) which are larger than dimensions of the UBM structure openings of the UBM structures 2314, 2324 in which the interconnect structure 12330 is received. One example result of the foregoing is that during coupling of second semiconductor structure 2320 to the first semiconductor structure 2310, the interconnect structure 12330 overcoats substantially all portions (e.g., pad portions and pad interconnects) of the UBM structures 2314, 2324. The interconnect structure 12330 also "spills" over onto selected portions (or surfaces) of the passivation layers 2313, 2323 of the semiconductor structures 2310, 2320. The passivation layers 2313, 2323 reduce (or ideally prevent) portions of the interconnect structure 12330 from also spilling over onto the superconducting traces 2312, 2322 of the semiconductor structures 2310, 2320, thereby reducing (or ideally preventing) electrical short which may otherwise occur. In one aspect of the disclosure, the electrical connection resulting from interconnect structure 12330 coupling second semiconductor structure 2320 to first semiconductor structure 2310 is representative of an example "electrically good" connection.

Referring to FIG. 23B, another example cryogenic electronic package 22300 includes first superconducting semiconductor structure 2310, second superconducting semiconductor structure 2320, and an interconnect structure 22330 for coupling the second semiconductor structure 2320 to the first semiconductor structure 2310.

As illustrated, the interconnect structure 22330 (e.g., a microbump), similar to interconnect structure 12330 shown in FIG. 23A, has dimensions (e.g., a diameter) which are larger than dimensions of the UBM structure openings of the UBM structures 2314, 2324 in which the interconnect structure 22330 is received. Here, however, during coupling of the second semiconductor structure 2320 to the first semiconductor structure 2310 the interconnect structure 22330 remains either disposed in the UBM structure openings in which the interconnect structure 22330 is received on spills over onto selected portions of the UBM structures. In other words, the interconnect structure 22330 does not spill onto the passivation layer 22330. In one aspect of the disclosure, the electrical connection resulting from interconnect structure 22330 coupling second semiconductor structure 2320 to first semiconductor structure 2310 is representative of another example "electrically good" connection.

Referring to FIG. 23C, a further example cryogenic electronic package 32300 includes first superconducting semiconductor structure 2310, second superconducting semiconductor structure 2320, and an interconnect structure 32330 for coupling the second semiconductor structure 2320 to the first semiconductor structure 2310.

As illustrated, the interconnect structure 32330 (e.g., a microbump) has dimensions (e.g., a diameter) which are less than dimensions of the UBM structure openings of the UBM structures 2314, 2324 in which the interconnect structure 32330 is received. As is also illustrated, the interconnect structure 32330 is misaligned between the UBM structures 2314, 2324 (and thus the semiconductor structures 2310, 2320). Misalignment may, for example, occur due to design or fabrication errors with the semiconductor structures 2310, 2320, or imprecisions in methods and/or apparatuses used to align the semiconductor structures 2310, 2320. In accordance with the concepts, systems, circuits and techniques disclosed herein, even though the first and second semiconductor structures 2310, 2320 are misaligned in the illustrated embodiment, cryogenic electronic package 32300 is still "electrically good" (albeit less "electrically good" than cryogenic electronic packages 2300, 12300, 22300, 32300) as long as the interconnect structure 32330 is electrically coupled to at least a portion of the UBM structures (e.g., second pad portion 2314c of UBM structure 2314). The foregoing may, for example, substantially reduce or eliminate electrical opens in cryogenic electronic packages including at least two semiconductor structures where an interconnect structure used to couple the semiconductor structures together is misaligned with respect to one or more portions (e.g., UBM structures) of the semiconductor structures.

In one embodiment, at least one of interconnect structures 2330, 12330, 22330, 32330 of FIGS. 23-23C includes an indium microbump. Additionally, in one embodiment, at least one of superconducting traces 2312, 2322 includes a superconducting niobium trace. In such embodiments, the microbumps may act as a resistor attached to the superconducting niobium trace (e.g., at a temperature of about 4.2K), and an I-V curve may be used to measure a resistance of the microbumps. Above a critical current, the superconducting niobium trace may become a conventional conductor, and the I-V curve may become nonlinear. When current flows along a daisy chain of superconducting niobium traces interrupted by non-superconducting microbumps, for example, it has been observed that there is a power ($i^2R$) loss that results in localized heating. Such causes the niobium daisy chain to increase in temperature. The superconducting niobium trace may cool by conduction into neighboring materials and into cryogenic cooling materials (e.g., a liquid helium environment). Equilibrium temperature is achieved when the rate of heating equals the rate of cooling. Although the daisy chain consists of superconducting niobium, non-superconducting under bump metal, and non-superconducting indium microbump and their interfaces in the above-described embodiment, electrically this type of daisy chain shows a well-controlled, high current carrying capacity similar to a solid niobium line system.

It should be appreciated that although example interconnect structures having particular shapes and dimensions are shown and described with respect to the above figures, other suitable interconnect structures (e.g., solder bumps, solder coated bumps, solder coated micro pillars) may be used in cryogenic electronic packages according to the disclosure.

Figure 24:
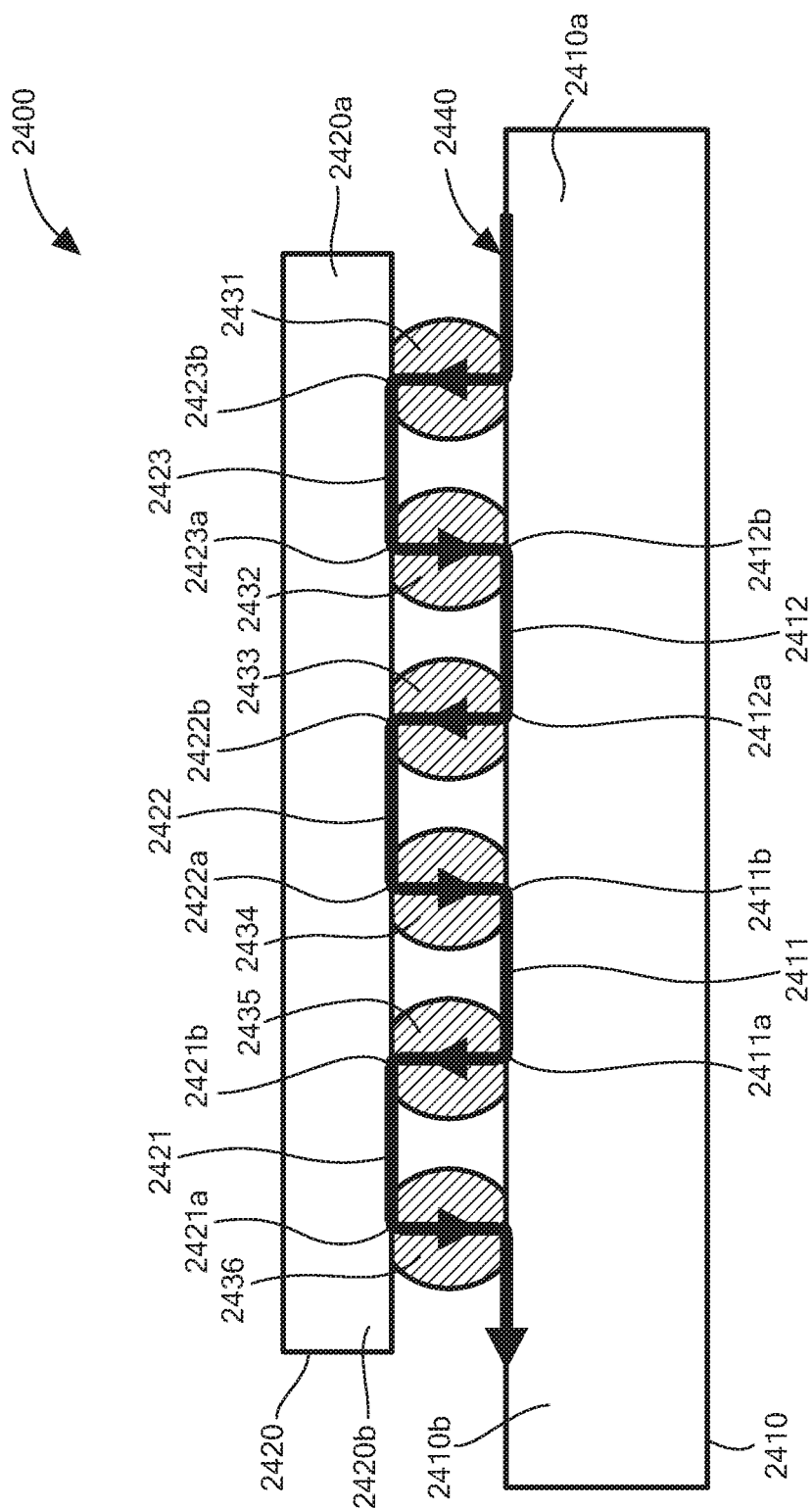
FIG. 24 is a block diagram of an example cryogenic electronic package in accordance with an embodiment of the disclosure.

Referring now to FIG. 24, another example cryogenic electronic package 2400 includes a first superconducting semiconductor structure 2410 (e.g., a qubit IC) and a second superconducting semiconductor structure 2420 (e.g., an SMCM). Cryogenic electronic package 2400 also includes plurality of interconnect structures (here, interconnect structures 2431, 2432, 2433, 2434, 2435, 2436) for coupling (e.g., electrically, mechanically and/or inductively coupling) second semiconductor structure 2420 to first semiconductor structure 2410.

As illustrated, a signal 2440 may propagate between the first semiconductor structure 2410 and the second semiconductor structure 2420 through the interconnect structures 2431, 2432, 2433, 2434, 2435, 2436. More particularly, the signal 2440 may propagate between selected portions of the first semiconductor structure 2410 and selected portions of the second semiconductor structure 2420 through selected ones of the interconnect structures 2431, 2432, 2433, 2434, 2435, 2436. For example, the signal 2440 may propagate between a first portion 2410a of first semiconductor structure 2410 and a second portion 2420b of second semiconductor structure 2410 through interconnect structures 2431, 2432, 2433, 2434, 2435. Additionally, the signal 2440 may propagate between a first portion 2420a of second semiconductor structure 2420 and a second portion 2410b of first semiconductor structure 2410 through interconnect structures 2432, 2433, 2434, 2435, 2436. First portions 2410a, 2420a of the first and second semiconductor structures 2410, 2420 may include first electrical connections or components (not shown) in embodiments. Additionally, second portions 2410b, 2420b of the first and second semiconductor structures 2410, 2420 may include second electrical connections or components (not shown) in embodiments.

In embodiments, signal 2440 propagates between the first semiconductor structure 2410 and the second semiconductor structure 2420 through use of the interconnect structures 2432, 2433, 2434, 2435, 2436 in conjunction with coupler circuits (not shown) provided in the first semiconductor structure 2410 and/or the second semiconductor structure 2420. The coupler circuits may be controlled by coupler control circuits or systems (not shown) which may be configured to tune coupling between the first semiconductor structure 2410 and the second semiconductor structure 2420.

The interconnect structures 2431, 2432, 2433, 2434, 2435, 2436 may be superconducting and/or partially superconducting interconnect structures similar to those described in figures above. At least one of first semiconductor structure 2410 and second semiconductor structure 2420 may include a superconducting trace (e.g., 2311) and a UBM structure (e.g., 2313) to which the interconnect structures 2431, 2432, 2433, 2434, 2435, 2436 may be coupled. The superconducting trace may have a first predetermined critical current density and the interconnect structures 2431, 2432, 2433, 2434, 2435, 2436 may have a second predetermined critical current density. In some embodiments, the first predetermined density is substantially the same as the second predetermined critical current density. Additionally, in some embodiments the first predetermined density is substantially greater than or less than the second predetermined critical current density.

In one embodiment, first superconducting structure 2410 includes multiple superconducting traces (e.g., here, traces 2411, 2412) and each trace includes at least one single and/or double superconducting pad (e.g., a multi-layer superconducting pad or multiple superconducting pads) (not shown) attached or otherwise coupled to the trace. Superconducting trace 2411 may have a first superconducting pad coupled to (or proximate to) a first end 2411*a* of the trace 2411 and a second superconducting pad coupled to (or proximate to) a second opposing end 2411*b* of the trace 2411. The superconducting pads (i.e., superconducting interconnect pads) may be disposed between a surface of the superconducting trace (e.g., 1911, shown in FIG. 19D) and a surface of respective UBM structures (e.g., 1940, shown in FIG. 19D) in embodiments. The superconducting pads may be coupled to the UBM structures through respective passivation layer openings (e.g., 1921, shown in FIG. 19C), as described above in connection with FIGS. 19-19D. The superconducting pads may also be coupled to respective interconnect structures (e.g., 1960, shown in FIG. 22C) through the passivation layer openings (and the UBM structures), as described above in connection with FIG. 22C, for example.

Similarly, superconducting trace 2412 may have a superconducting pad coupled to (or proximate to) a first end 2412*a* of the trace 2412 and a second superconducting pad coupled to (or proximate to) a second opposing end 2412*b* of the trace 2412. The superconducting pads may be coupled to respective UBM structures through passivation layer openings in embodiments.

In embodiments, single and or multiple conventional and/or superconducting bumps are disposed or formed on the UBM structures, as described above in connection with FIG. 22C, for example. Additionally, in embodiments the UBM structures are disposed over or into portions of openings formed in the superconducting pads of the traces 2411, 2412. In one embodiment, the bump can be the same as or similar to the interconnect structures shown in FIG. 2A and FIG. 5A, for example.

Additionally, in one embodiment second superconducting structure 2420 includes multiple superconducting traces (here, traces 2421, 2422, 2423) and each trace includes at least one single and/or double superconducting pad attached or otherwise coupled to the trace. Similar to traces 2411, 2412 described above in connection with first semiconductor structure 2410, superconducting traces 2421, 2422, 2423 may each have a first superconducting pad coupled to (or proximate to) a first end of the trace and a second superconducting pad coupled to (or proximate to) a second opposing end of the trace. Additionally, similar to the superconducting pads described above in connection with first superconducting structure 2410, the superconducting pads of the second superconducting structure 2420 may be coupled to respective UBM structures through passivation layer openings in embodiments.

First superconducting structure 2410 and second superconducting structure 2420 may be aligned and bonded with each other to produce electrical continuity (e.g., for signal 2440) in cryogenic electronic package 2400. In one embodiment, interconnect structure 2435 (e.g., a bump) may be coupled to a UBM structure coupled to a superconducting pad proximate to a first end 2411*a* of superconducting trace 2411, and to a UBM structure coupled to a superconducting pad proximate to a second end 2421*b* of superconducting trace 2421 to create an interconnect for electrical continuity. In another embodiment, interconnect structure 2434 (e.g., a bump) may be coupled to a UBM structure coupled to a superconducting pad proximate to a second end 2411*b* of superconducting trace 2411, and to a UBM structure coupled to a superconducting pad proximate to a first end 2422*a* of superconducting trace 2422 to create an interconnect for electrical continuity. In one embodiment, interconnect structures 2431, 2432, 2433, 2434, 2435, 2436 may be the same as or similar to the interconnect structures (e.g., 2330) described above in connection with FIGS. 23, 23A and 23B, for example.

In embodiments, interconnect structures 2431, 2432, 2433, 2434, 2435, 2436 create electrical continuity in cryogenic electronic package 2400 using bump interrupted continuous superconducting traces (e.g., 2411, 2412, 2421, 2422, 2423). Additionally, in embodiments interconnect structures 2431, 2432, 2433, 2434, 2435, 2436 maintain a substantially similar critical current of individual ones of the superconducting traces.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A cryogenic electronic package, comprising:
   at least two superconducting and/or conventional metal semiconductor structures, each of the semiconductor structures including:
      a substrate having first and second opposing surfaces;
      a superconducting trace having first and second opposing surfaces, wherein the first surface of the superconducting trace is disposed over the second surface of the substrate;
      a passivation layer having first and second opposing surfaces and one or more openings formed in selected portions of the passivation layer, wherein the first surface of the passivation layer is disposed over the second surface of the superconducting trace, and the passivation layer openings extend from the second surface of the passivation layer to the second surface of the superconducting trace over which the first surface of the passivation layer is disposed; and one or more under bump metal (UBM) structures disposed in respective ones of the passivation layer openings, wherein the UBM structures are electrically coupled to the second surface of the superconducting trace, and have a surface disposed over selected portions of the second surface of the passivation layer surrounding edges of the passivation layer openings; and one or more superconducting and/or conventional metal interconnect structures disposed between selected ones of the at least two semiconductor structures, and electrically coupled to respective ones of the UBM structures of the semiconductor structures to form one or more electrical connections between the semiconductor structures, wherein a first respective one of the electrical connections formed between a first one of the semiconductor structures and a second one of the semiconductor structures includes: the superconducting trace of the first one of the semiconductor structures, a first one of the UBM structures of the first one of the semiconductor structures, a second one of the UBM structures of the second one of the semiconductor structures, the superconducting trace of the second one of the semiconductor structures, and a first respective one of the interconnect structures coupled to the first and second ones of the UBM structures, and wherein a contact area between the interconnect structures and the respective ones of the UBM structures of the semiconductor structures to which the interconnect structures are coupled is provided as having one of:

a circular shape; and a rectangular or square shape, wherein in the case of a circular-shape contact area, a diameter of the contact area is greater than a width of the semiconductor trace of the semiconductor structures, and in the case of a rectangular—or square-shaped contact area, a width of the contact area is greater than a width of the semiconductor trace of the semiconductor structures such that in response to a critical current flow at the superconducting trace of the first superconducting structure, a substantially same critical current flows from the first superconducting structure through the interconnect structures such that a substantially same critical current flows through both the superconducting trace of the first semiconductor structure and the superconducting trace of the second semiconductor structure;

wherein at least one of the one or more interconnect structure has a diameter that is less than a diameter of the UBM structure to which it is coupled.

2. The cryogenic electronic package of claim 1 wherein the UBM structures have openings shaped to receive the interconnect structures, and the UBM structures include:

a first pad portion having a surface disposed over the second surface of the superconducting trace;

one or more second pad portions having a surface disposed over the selected portions of the second surface of the passivation layer; and one or more pad interconnects extending from the first pad portion to the second pad portions, wherein the UBM structure openings extend between the first and second pad portions of the UBM structures.

3. The cryogenic electronic package of claim 2 wherein the interconnect structures are received in the UBM structure openings.

4. The cryogenic electronic package of claim 3 wherein the UBM structure openings have a first associated diameter, and the interconnect structures have a second associated diameter that is substantially less than the first diameter.

5. The cryogenic electronic package of claim 2 wherein the semiconductor structures further comprise:

an interconnect pad disposed between the second surface of the substrate and the first surface of the superconducting trace such that the first respective one of the electrical connections formed between the first one of the semiconductor structures and the second one of the semiconductor structures further includes: the interconnect pad of the first one of the semiconductor structures, and the interconnect pad of the second one of the semiconductor structures such that the electrical connection include first superconducting trace-first superconducting pad-first UBM structure-interconnect structure-second UBM structure-second superconducting pad-second superconducting trace.

6. The cryogenic electronic package of claim 5 wherein the interconnect pad has first and second opposing surfaces, with the first surface of the interconnect pad disposed proximate to the second surface of the substrate, and the second surface of the interconnect pad disposed proximate to the first surface of the superconducting trace, and wherein the first pad portion of the UBM structures has first and second opposing surfaces, with the first surface corresponding to the surface of the first pad portion disposed over the second surface of the superconducting trace, wherein the first and second surfaces of the interconnect pad each have a first associated diameter, and the first and second surfaces of the first pad portion each have a second associated diameter that is substantially less than the first diameter.

7. The cryogenic electronic package of claim 1 wherein the interconnect structures are disposed over and coupled to first selected ones of the UBM structures of the selected ones of the semiconductor structures prior to coupling the first selected ones of the UBM structures to second selected ones of the UBM structures of the semiconductor structures to form the electrical connections, wherein at least one of the interconnect structures includes a superconducting, partially superconducting and/or conventional metal bump.

8. The cryogenic electronic package of claim 1 wherein the interconnect structures include a first interconnect portion and a second interconnect portion, wherein the first interconnect portion is disposed over and coupled to first selected ones of the UBM structures of the selected ones of the semiconductor structures, and the second interconnect portion is disposed over and coupled to second selected ones of the UBM structures of the selected ones of the semiconductor structures, wherein the first interconnect portion has a first melting point, the second interconnect portion has a second melting point, and the interconnect structures including the first interconnect portion and the second interconnect portion has a third melting point and concentration gradient at the coupling surface of the second interconnect section that is different from both the first melting point and the second melting point when the first and second interconnect portions are coupled together during coupling of the semiconductor structures, wherein at least one of the first and second interconnect portions includes a superconducting bump.

9. The cryogenic electronic package of claim 1 wherein the interconnect structures are provided having a critical current density characteristic which is substantially the same as a critical current density characteristic of the superconducting trace of the first and second semiconductor structure to which the UBM structure are coupled, and a critical current density characteristic of the cryogenic electronic package is based, at least in part, upon a minimum width value of the width of the superconducting trace.

10. The cryogenic electronic package of claim 1 wherein the superconducting trace has one or more first characteristics selected such that the superconducting trace has a first predetermined critical current density, and the interconnect structures have one or more second characteristics selected such that the interconnect structures have a second predetermined critical current density that is substantially similar to the first predetermined critical current density, wherein the first characteristics include materials and/or dimensions of the superconducting trace, and the second characteristics include materials and/or dimensions of the interconnect structures, and wherein the first and second predetermined critical current densities include a range of critical currents and the range of critical currents is based upon at least one of the selected first and second characteristics.

11. The cryogenic electronic package of claim 1 wherein the interconnect structures have first and second opposing portions, and a distance between the first and second portions corresponds to a height of the interconnect structures, and wherein the interconnect structures have third and fourth opposing portions that are substantially perpendicular to the first and second portions, and a distance between the third and fourth portions corresponds to a diameter, width or length of the interconnect structures.

12. The cryogenic electronic package of claim 11 wherein the interconnect structures have a first height and a first diameter prior to coupling the semiconductor structures together, and at least a second height that is less than the first height subsequent to coupling the semiconductor structures together.

13. The cryogenic electronic package of claim 12 wherein the first height is less than or equal to about six micron, the first diameter is less than or equal to about fifteen micron, and the second height is between about two micron and about four micron.

14. The cryogenic electronic package of claim 12 wherein the first height is between about eight micron and about twelve micron, the first diameter is less than or equal to about fifteen micron, and the second height is between about two micron and about four micron.

15. The cryogenic electronic package of claim 12 wherein the critical current density of the interconnect structures is based, at least in part, upon the second height of the interconnect structures.

16. The cryogenic electronic package of claim 11 wherein the height of the interconnect structures is selected to be greater than a predetermined threshold, wherein the predetermined threshold is based upon a maximum acceptable non-uniformity between the semiconductor structures to which are interconnect structures are coupled, and a predetermined misalignment tolerance of the cryogenic electronic package.

17. The cryogenic electronic package of claim 11 wherein the semiconductor structures includes a low surface energy barrier layer disposed on the UBM surface and surrounding the interconnect structure to control the associated package pitch, and the height of the interconnect structures and the surrounded barrier layer is selected based upon the package pitches of the semiconductor structures between which the interconnect structures are disposed.

18. The cryogenic electronic package of claim 1 wherein the at least two semiconductor structures include three semiconductor structures, and a selected one of the three semiconductor structures includes one or more through via structures, each of the through via structures including at least a through via extending from selected portions of the first surface of the substrate of the selected one of the semiconductor structures to selected portions of the second surface of the substrate, and remaining ones of the three semiconductor structures are disposed over opposing surfaces of the selected one of the semiconductor structures and coupled to each other through an electrical connection including at least one of the through via structures of the selected one of the semiconductor structures.

19. The cryogenic electronic package of claim 1 wherein the first one of the semiconductor structures includes one or more first through vias, each of the first through vias extending from selected portions of the first surface of the substrate of the first one of the semiconductor structures to selected portions of the second surface of the substrate of the first one of the semiconductor structures, wherein the first through vias include one or more conventional and/or superconducting and/or partially superconducting metals, and at least one of the first through vias is electrically coupled to the superconducting trace of the first one of the semiconductor structures, and wherein the second one of the semiconductor structures includes one or more through via structures, each of the through via structures including a first trace interconnect, a second trace interconnect and a second through via, wherein the first and second trace interconnects each extend from selected portions of the first surface of the substrate of the second one of the semiconductor structures to selected portions of the second surface of the substrate of the second one of the semiconductor structures, and the second through via is disposed or otherwise provided in a cavity formed between the first and second trace interconnects, wherein the first trace interconnect, the second trace interconnect and the second through via of the through via structures each include one or more conventional and/or superconducting and/or partially superconducting metals, and at least one of the through via structures is electrically coupled to the superconducting trace of the second one of the semiconductor structures.

20. A method of fabricating a cryogenic electronic package, the method comprising:
providing at least two superconducting and/or conventional metal semiconductor structures, each of the semiconductor structures including:
a substrate having first and second opposing surfaces;
a superconducting trace having first and second opposing surfaces, wherein the first surface of the superconducting trace is disposed over the second surface of the substrate;
a passivation layer having first and second opposing surfaces and one or more openings formed in selected portions of the passivation layer, wherein the first surface of the passivation layer is disposed over the second surface of the superconducting trace, and the passivation layer openings extend from the second surface of the passivation layer to the second surface of the superconducting trace over which the first surface of the passivation layer is disposed; and one or more under bump metal (UBM) structures disposed in respective ones of the passivation layer openings, wherein the UBM structures are electrically coupled to the second surface of the superconducting trace, and have a surface disposed over selected portions of the second surface of the passivation layer surrounding edges of the passivation layer openings;

forming one or more superconducting and/or conventional metal interconnect structures on at least a first selected one of the semiconductor structures such that the interconnect structures are coupled to respective ones of the UBM structures of the first selected one of the semiconductor structures; and coupling the first selected one of the semiconductor structures to at least a second selected one of the semiconductor structures through the interconnect structures such that the interconnect structures are coupled to respective ones of the UBM structures of the second selected one of the semiconductor structures, and form one or more electrical connections between the first and second selected ones of the semiconductor structures;

wherein a diameter of at least one or more interconnect structure is less than a diameter of the a recessed portion of one or more corresponding UBM structure.

21. The method of claim 20, wherein the forming one or more superconducting and/or conventional metal interconnect structures includes forming the one or more superconducting and/or conventional metal interconnect structures on at least a first selected one of the semiconductor structures such that the interconnect structures received in the UBM structure openings create cavities between edges of the UBM structures, and edges of the interconnect structures are coupled to the respective ones of the UBM structures of the first selected one of the semiconductor structures.

22. The method of claim 20, the UBM structures include:
a first pad portion having a surface disposed over the second surface of the superconducting trace;
one or more second pad portions having a surface disposed over the selected portions of the second surface of the passivation layer; and
one or more pad interconnects extending from the first pad portion to the second pad portions, wherein the UBM structure openings extend between the first and second pad portions of the UBM structures;
wherein at least one of the one or more interconnect structures is shaped to produce a cavity on each of opposing sides of the respective interconnect structure, each cavity formed in the recessed portion of the respective UBM structure and configured to receive, upon electrical connection, a melted portion of the respective interconnect structure onto selected portions of surfaces of respective one or more pad interconnects.

* * * * *